United States Patent
Ye et al.

(10) Patent No.: US 11,864,369 B2
(45) Date of Patent: *Jan. 2, 2024

(54) MEMORY DEVICE AND SRAM CELL

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Hung-Yu Ye, Taichung (TW); Chung-Yi Lin, New Taipei (TW); Yun-Ju Pan, Taipei (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 13 days.

This patent is subject to a terminal disclaimer.

(21) Appl. No.: 17/691,879

(22) Filed: Mar. 10, 2022

(65) Prior Publication Data
US 2022/0199630 A1 Jun. 23, 2022

Related U.S. Application Data

(63) Continuation of application No. 16/943,916, filed on Jul. 30, 2020, now Pat. No. 11,282,843.
(Continued)

(51) Int. Cl.
*H01L 27/11* (2006.01)
*H01L 29/66* (2006.01)
(Continued)

(52) U.S. Cl.
CPC ....... *H10B 10/125* (2023.02); *H01L 21/3247* (2013.01); *H01L 21/823807* (2013.01);
(Continued)

(58) Field of Classification Search
CPC ... H10B 10/125; H10B 10/12; H01L 21/3247; H01L 21/823807; H01L 21/823814;
(Continued)

(56) References Cited

U.S. PATENT DOCUMENTS 8,445,384 B2  5/2013  Dixit
9,105,490 B2  8/2015  Wang et al.
(Continued)

OTHER PUBLICATIONS

L. Witters et al., "Integration of Tall Triple-Gate Devices with Inserted-TaxNy Gate in a 0.274μm2 6T-SRAM Cell and Advanced CMOS Logic Circuits." Symposium on VLSI Technology Digest of Technical Papers, 7A-1, p. 106-107, 2005.
(Continued)

*Primary Examiner* — Tong-Ho Kim
(74) *Attorney, Agent, or Firm* — Maschoff Brennan

(57) ABSTRACT

A device includes a first horizontal-gate-all-around (HGAA) transistor, a second HGAA transistor, a first vertical-gate-all-around (VGAA) transistor, and a second VGAA transistor. The first HGAA transistor and the second HGAA transistor are adjacent to each other. The first VGAA transistor is over the first HGAA transistor. The second VGAA transistor is over the second HGAA transistor. A top surface of the first VGAA transistor is substantially coplanar with a top surface of the second VGAA transistor.

20 Claims, 168 Drawing Sheets

Related U.S. Application Data

(60) Provisional application No. 63/029,187, filed on May 22, 2020.

(51) Int. Cl.

| | | |
|---|---|---|
| *H01L 27/092* | (2006.01) | |
| *H01L 29/08* | (2006.01) | |
| *H01L 29/423* | (2006.01) | |
| *H01L 29/786* | (2006.01) | |
| *H01L 23/535* | (2006.01) | |
| *H01L 21/324* | (2006.01) | |
| *H01L 21/8238* | (2006.01) | |
| *H10B 10/00* | (2023.01) | |

(52) U.S. Cl.
CPC .............. *H01L 21/823814* (2013.01); *H01L 21/823821* (2013.01); *H01L 21/823864* (2013.01); *H01L 21/823878* (2013.01); *H01L 21/823885* (2013.01); *H01L 23/535* (2013.01); *H01L 27/0922* (2013.01); *H01L 27/0924* (2013.01); *H01L 29/0847* (2013.01); *H01L 29/42392* (2013.01); *H01L 29/66545* (2013.01); *H01L 29/66742* (2013.01); *H01L 29/78618* (2013.01); *H01L 29/78642* (2013.01); *H01L 29/78696* (2013.01)

(58) Field of Classification Search
CPC ..... H01L 21/823821; H01L 21/823864; H01L 21/823878; H01L 21/823885; H01L 23/535; H01L 27/0922; H01L 27/0924; H01L 29/0847; H01L 29/42392; H01L 29/66545; H01L 29/66742; H01L 29/78618; H01L 29/78642; H01L 29/78696; H01L 21/76895; H01L 23/5286; H01L 29/165; H01L 29/7848; H01L 27/092
USPC ....................................................... 257/329
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,236,300 B2 | 1/2016 | Liaw |
| 9,406,804 B2 | 8/2016 | Huang et al. |
| 9,412,817 B2 | 8/2016 | Yang et al. |
| 9,412,828 B2 | 8/2016 | Ching et al. |
| 9,443,769 B2 | 9/2016 | Wang et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,366 B1 | 1/2017 | Ho et al. |
| 9,576,814 B2 | 2/2017 | Wu et al. |
| 9,608,116 B2 | 3/2017 | Ching et al. |
| 9,831,183 B2 | 11/2017 | Lin et al. |
| 9,859,386 B2 | 1/2018 | Ho et al. |
| 11,282,843 B2 * | 3/2022 | Ye ................... H01L 21/823864 |
| 2018/0122793 A1 | 5/2018 | Moroz |
| 2019/0304974 A1 * | 10/2019 | Sharma ............... H01L 27/1207 |
| 2021/0193834 A1 * | 6/2021 | Yun ..................... H01L 29/7827 |

OTHER PUBLICATIONS

Huynh-Bao, Trong et al., "A Comprehensive Benchmark and Optimization of 5-nm Lateral and Vertical GAA 6T-SRAMs." IEEE Transactions on Electron Devices, vol. 63, No. 2, p. 643-651, 2016.

M.-S. Kim et al., "12-EUV Layer Surrounding Gate Transistor (SGT) for Vertical 6-T SRAM: 5-nm-Class Technology for Ultra-Density Logic Devices." 2019 Symposium on VLSI Technology Digest of Technical Papers, p. T198-T199; Jun. 9, 2019.

Eric Karl et al., "A 4.6GHz 162Mb SRAM Design in 22nm Tri-Gate CMOS Technology with Integrated Active VMIN-Enhancing Assist Circuitry." 2012 IEEE International Solid-State Circuits Conference; Feb. 19, 2012.

Taejoong Song et al., "A 14nm FinFET 128Mb 6T SRAM with VMIN-Enhancement Techniques for Low-Power Applications." 2014 IEEE International Solid-State Circuits Conference (ISSCC). Feb. 9, 2014.

J. Ryckaert et al., "The Complementary FET (CFET) for CMOS Scaling beyond N3." 2018 IEEE Symposium on VLSI Technology Digest of Technical Papers, p. 141-142. Jun. 18, 2018.

J.-S. Park et al., "Low-Defect-Density Ge Epitaxy on Si(001) Using Aspect Ratio Trapping and Epitaxial Lateral Overgrowth." Electrochemical and Solid-State Letters, vol. 12, No. 4, p. H142-144, 2009.

Cyril Bellegarde et al., "Optimization of H2 thermal annealing process for the fabrication of ultra-low loss sub-micron silicon-on-insulator rib waveguides", Proc. Of SPIE vol. 10537, Silicon Photonics XIII, p. 1053706-1~1053706-10, 2018.

Zuhal Tasdemir., "Pushing the Limits of Nanopatterning via Extreme Ultraviolet Lithography", EMPA, Sep. 21, 2018.

C.-H. Jan et al., "A 22nm SoC platform technology featuring 3-D tri-gate and high-k/metal gate, optimized for ultra low power, high performance and high density SoC applications", International Electron Devices Meeting, IEEE, p. 3.1.1-p. 3.1.4, 2012.

* cited by examiner

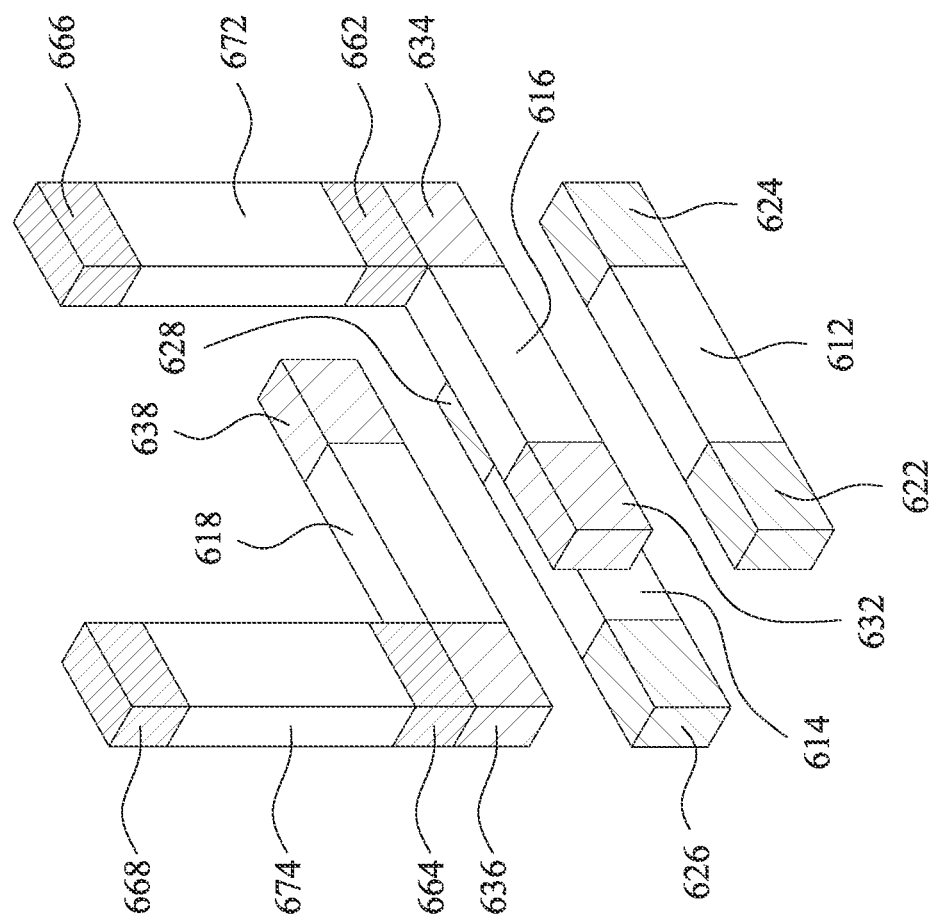
Fig. 25B
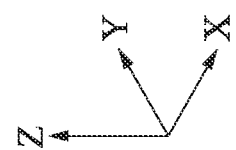

> US 11,864,369 B2

MEMORY DEVICE AND SRAM CELL

PRIORITY CLAIM AND CROSS-REFERENCE

This application is a continuation application of U.S. patent application Ser. No. 16/943,916, filed Jul. 30, 2020, now U.S. Pat. No. 11,282,843, issued on Mar. 22, 2022, which claims priority to U.S. Provisional Application Ser. No. 63/029,187, filed May 22, 2020, which is herein incorporated by reference in its entirety.

BACKGROUND

Static random access memory ("SRAM") arrays are commonly used for storage on integrated circuit devices. Recent advances in finFET transistor technology have made advanced SRAM cells using finFET transistors possible. In contrast to the prior planar MOS transistor, which has a channel formed at the surface of a semiconductor substrate, a finFET has a three dimensional channel region. In the finFET, the channel for the transistor is formed on the sides, and sometimes also the top, of a "fin" of semiconductor material. The gate, typically a polysilicon or metal gate, extends over the fin and a gate dielectric is disposed between the gate and the fin. The three-dimensional shape of the finFET channel region allows for an increased gate width without increased silicon area, even as the overall scale of the devices is reduced with semiconductor process scaling and in conjunction with a reduced gate length; providing a reasonable channel width characteristic at a low silicon area cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25B is a schematic diagram of a perspective view of a layout structure of the memory cell without gate structures and conductive features, in accordance with some embodiments of the present disclosure.

DETAILED DESCRIPTION

Figure 1A:
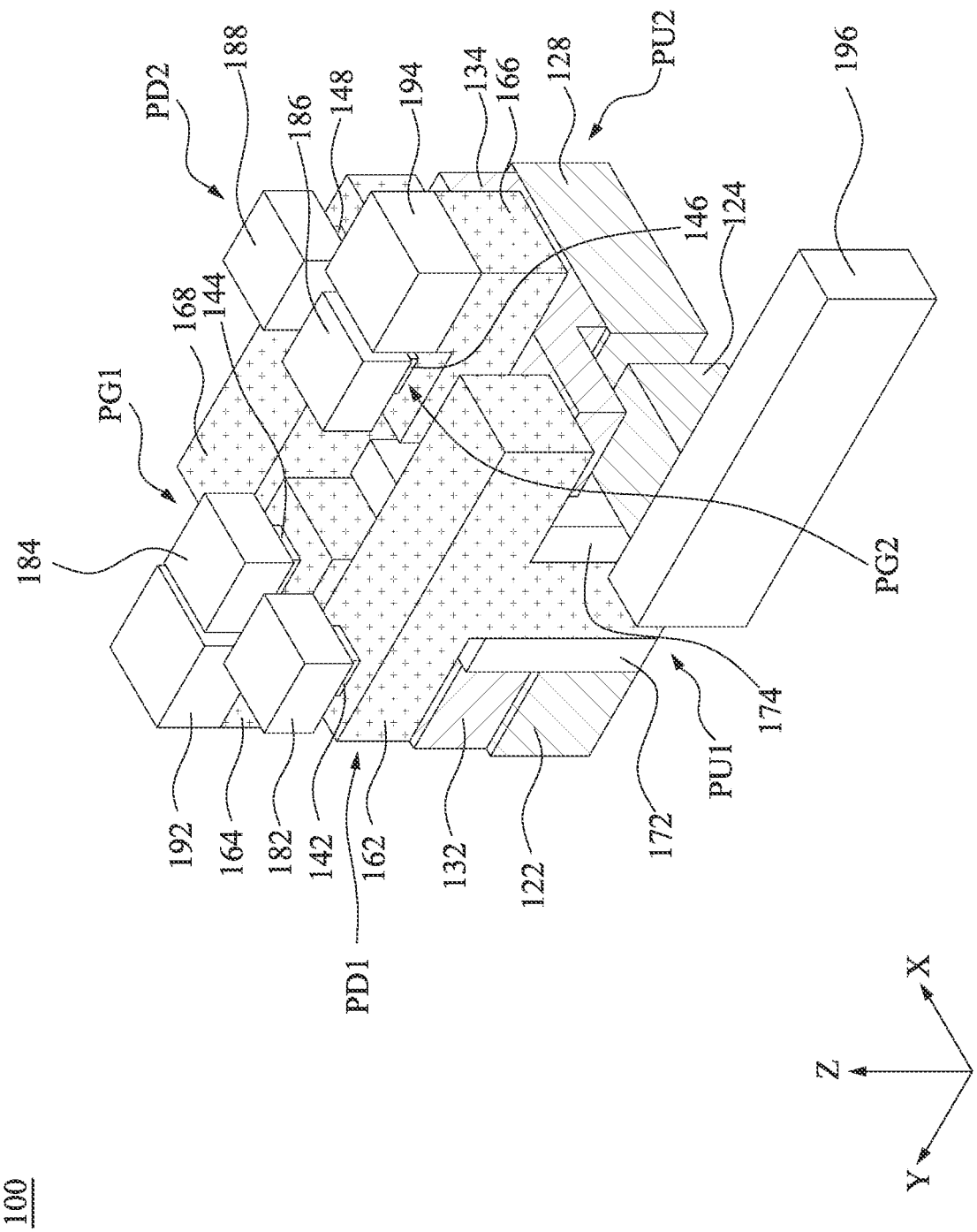
FIG. 1A is a schematic diagram of a perspective view of a layout structure corresponding to a memory cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to static random-access memory (SRAM) devices including horizontal FETs and vertical FETs. The term of "horizontal FET" herein is a transistor including a channel extending in an X-axis or a Y-axis direction, while the term of "vertical FET" herein is a transistor including a channel extending in a Z-axis direction. The horizontal FETs may be FinFETs or horizontal GAAs, and the vertical FETs may be vertical GAAs. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

SRAM is a type of volatile semiconductor memory that uses bistable latching circuitry to store each bit. Each bit in an SRAM is stored on four transistors (PU1, PU2, PD1, and PD2) that form two cross-coupled inverters. This memory cell has two stable states which are used to denote 0 and 1. Two additional access transistors (PG1 and PG2) are electrically connected to the two cross-coupled inventers and serve to control the access to a storage cell during read and write operations.

Figure 1B:
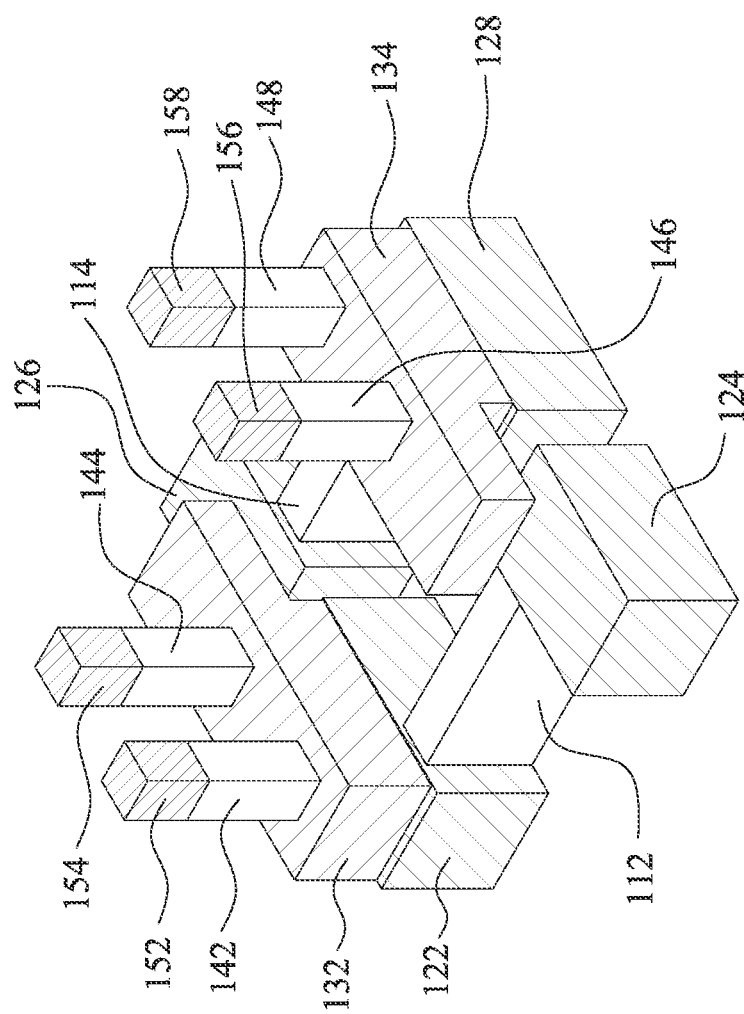
FIG. 1B is a schematic diagram of a perspective view of a layout structure of the memory cell without gate structures and conductive features, in accordance with some embodiments of the present disclosure.
Figure 1B:
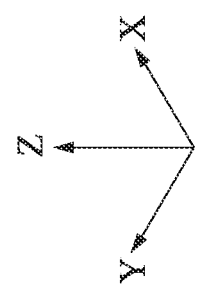

FIG. 1A is a schematic diagram of a perspective view of a layout structure corresponding to a memory cell 100, in accordance with some embodiments of the present disclosure, and FIG. 1B is a schematic diagram of a perspective view of a layout structure of the memory cell 100 without gate structures and conductive features, in accordance with some embodiments of the present disclosure. In addition to the memory cell 100, FIGS. 1A and 1B depict X-axis, Y-axis, and Z-axis directions. FIGS. 1A and 1B depict a simplified version of the memory cell 100 for the purpose of illustrating the general spatial relationships between the various features; the specific spatial relationships of the various embodiments are discussed below with respect to FIGS. 19A-19E.

The memory cell 100 may be a static random access memory (SRAM) device. As illustratively shown in FIGS. 1A and 1B, the memory cell 100 includes a first horizontal channel 112 and a second horizontal channel 114 extending in the Y direction. The first horizontal channel 112 and the second horizontal channel 114 are spaced apart from each other. In some embodiments, the first horizontal channel 112 and the second horizontal channel 114 are fin structures. In some other embodiments, the first horizontal channel 112 and the second horizontal channel 114 are nanosheets, nanowires, or combinations thereof.

The memory cell 100 further includes a first source/drain feature 122, a second source/drain feature 124, a third source/drain feature 126, and a fourth source/drain feature 128. The first source/drain feature 122 and the second source/drain feature 124 are on opposite sides of the first horizontal channel 112, and the third source/drain feature 126 and the fourth source/drain feature 128 are on opposite sides of the second horizontal channel 114. The first source/drain feature 122 and the third source/drain feature 126 are spaced apart from each other, and the second source/drain feature 124 and the fourth source/drain feature 128 are spaced apart from each other. In some embodiments, the first source/drain feature 122, the second source/drain feature 124, the third source/drain feature 126, and the fourth source/drain feature 128 are epitaxial structures or doped fin structures.

The memory cell 100 further includes a fifth source/drain feature 132 and a sixth source/drain feature 134. The fifth source/drain feature 132 is above and in contact with the first source/drain feature 122, and the sixth source/drain feature 134 is above and in contact with the fourth source/drain feature 128. In some embodiments, a portion of the fifth source/drain feature 132 is suspended above the third source/drain feature 126, and a portion of the sixth source/drain feature 134 is suspended above the second source/drain feature 124. In some embodiments, the fifth source/drain feature 132 and the sixth source/drain feature 134 are epitaxial structures.

The memory cell 100 further includes a first vertical channel 142, a second vertical channel 144, a third vertical channel 146, and a fourth vertical channel 148 extending in the Z direction. The first vertical channel 142 and the second vertical channel 144 are above and in contact with the fifth source/drain feature 132, and the third vertical channel 146 and the fourth vertical channel 148 are above and in contact with the sixth source/drain feature 134. In some embodiments, the first vertical channel 142, the second vertical channel 144, the third vertical channel 146, and the fourth vertical channel 148 are nanowires, nano-columns, nano-tubes, or combinations thereof.

The memory cell 100 further includes a seventh source/drain feature 152, an eighth source/drain feature 154, a ninth source/drain feature 156, and a tenth source/drain feature 158 respectively above the first vertical channel 142, the second vertical channel 144, the third vertical channel 146, and the fourth vertical channel 148. In some embodiments, the seventh source/drain feature 152, the eighth source/drain feature 154, the ninth source/drain feature 156, and the tenth source/drain feature 158 are epitaxial structures.

The memory cell 100 further includes a first gate structure 162, a second gate structure 164, a third gate structure 166, and a fourth gate structure 168. The first gate structure 162 crosses over the first horizontal channel 112, wraps around the first vertical channel 142, is in contact with the sixth source/drain feature 134, and is spaced apart from the fifth source/drain feature 132. The second gate structure 164 wraps around the second vertical channel 144. The third gate structure 166 wraps around the third vertical channel 146. The fourth gate structure 168 crosses over the second horizontal channel 114, wraps around the fourth vertical channel 148, is in contact with the fifth source/drain feature 132, and is spaced apart from the sixth source/drain feature 134. In some embodiments, the first gate structure 162, the second gate structure 164, the third gate structure 166, and the fourth gate structure 168 may be polysilicon gates or metal gate structures.

In some embodiments, the first source/drain feature 122, the second source/drain feature 124, the third source/drain feature 126, and the fourth source/drain feature 128 have a first conductivity type while the fifth source/drain feature 132, the sixth source/drain feature 134, the seventh source/drain feature 152, the eighth source/drain feature 154, the ninth source/drain feature 156, and the tenth source/drain feature 158 have a second conductivity type different from the first conductivity type. For example, the first conductivity type is P-type, and the second conductivity type is N-type.

With such conductivity configuration, the first horizontal channel 112, the first source/drain feature 122, the second source/drain feature 124, and the first gate structure 162 form a first pull-up transistor PU1, the second horizontal channel 114, the third source/drain feature 126, the fourth source/drain feature 128, and the fourth gate structure 168 form a second pull-up transistor PU2, the first vertical channel 142, the fifth source/drain feature 132, the seventh source/drain feature 152, and the first gate structure 162 form a first pull-down transistor PD1, the second vertical channel 144, the fifth source/drain feature 132, the eighth source/drain feature 154, and the second gate structure 164 form a first pass gate transistor PG1, the third vertical channel 146, the sixth source/drain feature 134, the ninth source/drain feature 156, and the third gate structure 166 form a second pass gate transistor PG2, and the fourth vertical channel 148, the sixth source/drain feature 134, the tenth source/drain feature 158, and the fourth gate structure 168 form a second pull down transistor PD2.

The first pull-up transistor PU1 and the second pull-up transistor PU2 are horizontal FETs, and the first pull-down transistor PD1, the first pass gate transistor PG1, the second pass gate transistor PG2, and the second pull down transistor PD2 are vertical FETs. The first pull-up transistor PU1 and the second pull-up transistor PU2 are P-type transistors, and the first pull-down transistor PD1, the first pass gate transistor PG1, the second pass gate transistor PG2, and the second pull-down transistor PD2 are N-type transistors.

In some other embodiments, the first conductivity type is N-type, and the second conductivity type is P-type. With such conductivity configuration, the first horizontal channel 112, the first source/drain feature 122, the second source/drain feature 124, and the first gate structure 162 form a first pull-down transistor, the second horizontal channel 114, the third source/drain feature 126, the fourth source/drain feature 128, and the fourth gate structure 168 form a second pull-down transistor, the first vertical channel 142, the fifth source/drain feature 132, the seventh source/drain feature 152, and the first gate structure 162 form a first pull-up transistor, the second vertical channel 144, the fifth source/drain feature 132, the eighth source/drain feature 154, and the second gate structure 164 form a first pass gate transistor, the third vertical channel 146, the sixth source/drain feature 134, the ninth source/drain feature 156, and the third gate structure 166 form a second pass gate transistor, and the fourth vertical channel 148, the sixth source/drain feature 134, the tenth source/drain feature 158, and the fourth gate structure 168 form a second pull-up transistor. The first pull-down transistor and the second pull-down transistor are N-type transistors, and the first pull-up transistor, the first pass gate transistor, the second pass gate transistor, and the second pull-up transistor are P-type transistors.

In some embodiments, the memory cell 100 further includes isolation structures 172 and 174 for isolating gate structures (e.g., the first gate structure 162 and the fourth gate structure 168) from source/drain features (e.g., the first to sixth source/drain features 122, 124, 126, 128, 132, and 134). For example, the isolation structure 172 is between the first gate structure 162 and the first source/drain feature 122 (or the fifth source/drain feature 132) and between the fourth gate structure 168 and the third source/drain feature 126, and the isolation structure 174 is between the first gate structure 162 and the second source/drain feature 124 (or the sixth source/drain feature 134) and between the fourth gate structure 168 and the fourth source/drain feature 128.

In some embodiments, the memory cell 100 further includes conductive features 182, 184, 186, 188, 192, 194, and 196. The conductive features 182, 184, 186, 188 are respectively couple to the seventh to tenth source/drain features 152, 154, 156, and 158. The conductive features 192 and 194 are respectively couple to the second and third gate structures 164 and 166. The conductive feature 196 is couple to the second source/drain feature 124. The conductive features 182, 184, 186, 188, 192, 194, and 196 are configured to interconnect the corresponding element to other circuits or interconnect structure.

Figure 2:
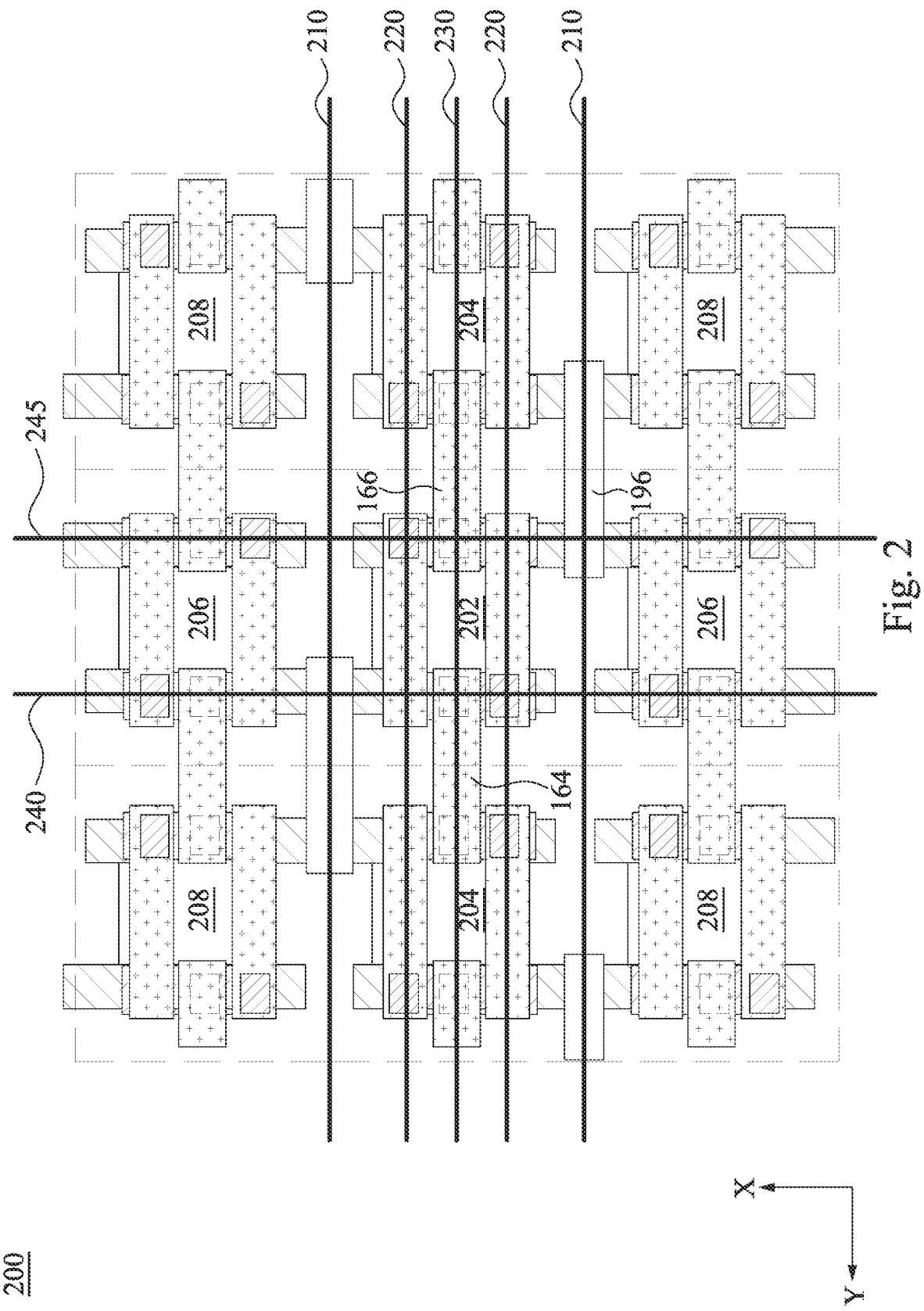
FIG. 2 is a schematic diagram of a top view of a memory device, in accordance with some embodiments of the present disclosure.

FIG. 2 is a schematic diagram of a top view of a memory device 200, in accordance with some embodiments of the present disclosure. As shown in FIG. 2, the memory device 200 includes an array of memory cells 202, 204, 206, and 208. All of the memory cells 202, 204, 206, and 208 have an identical structure as the memory cell 100 of FIG. 1A but different orientations. In greater detail, the memory cells 202 and 204 are symmetric with relative to the illustrated X axis, and the memory cells 206 and 208 are symmetric with relative to the illustrated X axis. The memory cells 202 and 206 are symmetric with relative to the illustrated Y axis, and the memory cells 204 and 208 are symmetric with relative to the illustrated Y axis. The memory cells 202, 204, 206, and 208 as a group may be reproduced and allocated as a plurality of rows and columns to form a memory cell array.

In FIG. 2, the conductive feature 196 can be formed to interconnect second source/drain features 124 in adjacent memory cells 202, 204, 206, and 208. The second gate structures 164 of adjacent memory cells 202 and 204 (or 206 and 208) can be integrally formed, and the third gate structures 166 of adjacent memory cells 202 and 204 (or 206 and 208) can be integrally formed.

The memory device 200 further includes conductive lines. For example, the conductive lines include VDD power lines 210, VSS power lines 220, at least a word line 230, and bit lines 240 and 245 above the array of memory cells. For clarity, FIG. 2 only show the conductive lines connected to the memory cell 202. The VDD power lines 210, the VSS power lines 220, and the word line 230 extend in the Y direction, and the bit lines 240 and 245 extend in the X direction. The VDD power lines 210 are connected to the conductive features 196, respectively, such that the second source/drain features 124 (see FIG. 1A) can be connected to the VDD power lines 210 through the conductive features 196. The VSS power lines 220 are respectively connected to the seventh and tenth source/drain features 152 and 158 (see FIG. 1B) respectively through the conductive features 182 and 188 (see FIG. 1A). The word line 230 is connected to the second and third gate structures 164 and 166 (see FIG. 1A) respectively through the conductive features 192 and 194 (see FIG. 1A). The bit line 240 is connected to the eighth source/drain feature 154 (see FIG. 1B) through the conductive feature 184 (see FIG. 1A), and the bit line 245 is connected to the ninth source/drain feature 156 (see FIG. 1B) through the conductive feature 186 (see FIG. 1A).

Figure 3A:
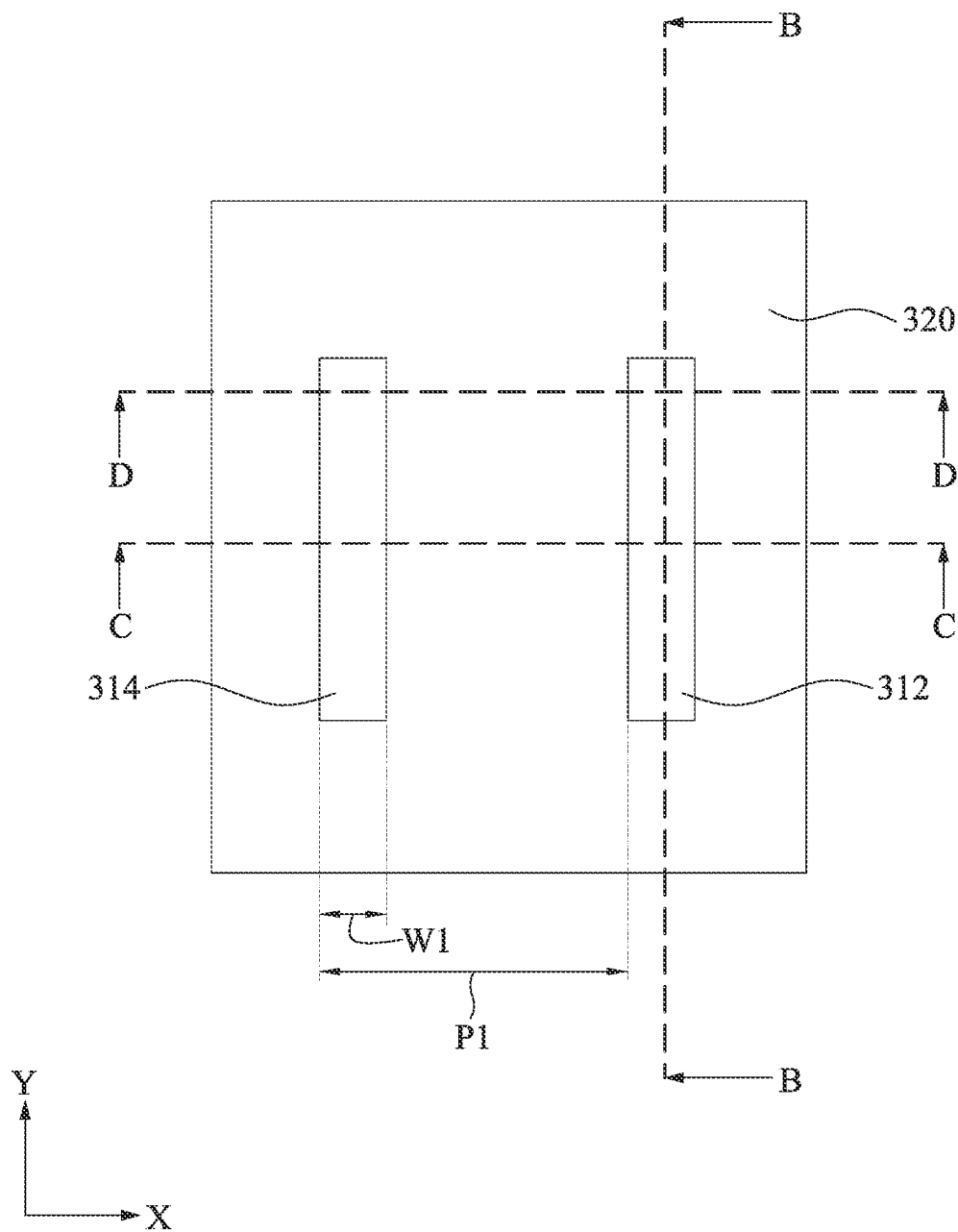
FIG. 3A-19E illustrate a method for manufacturing a memory cell at various stages in accordance with some embodiments of the present disclosure.
Figure 3B:
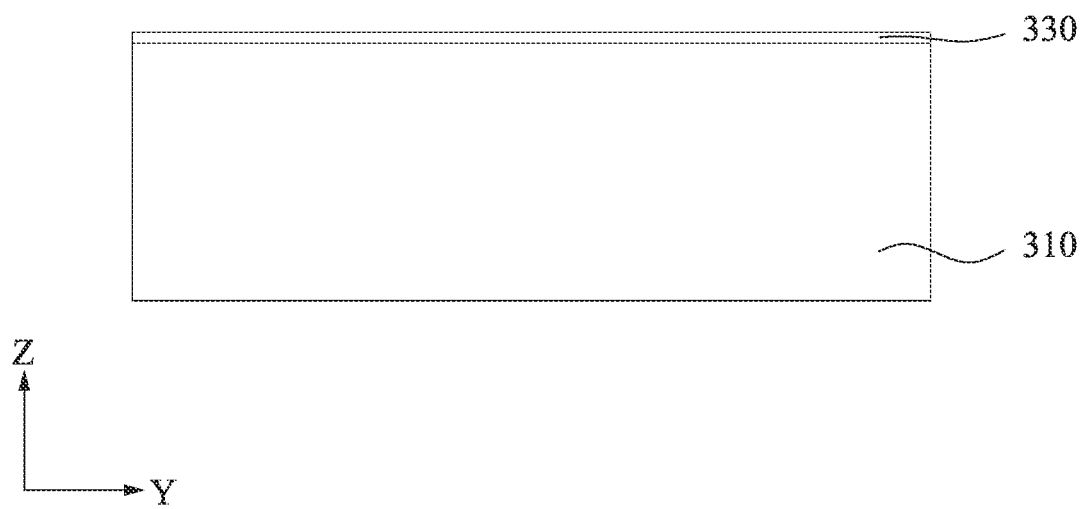
Figure 3C:
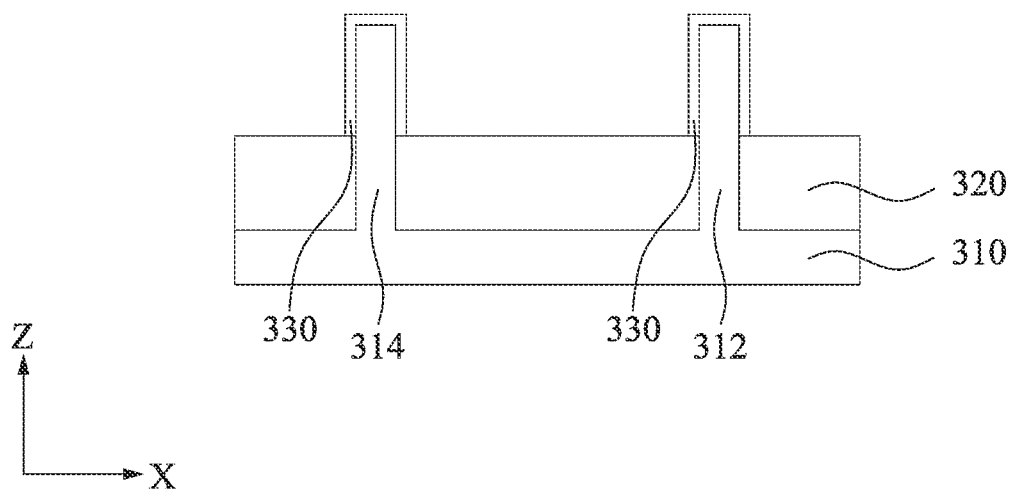
Figure 3D:
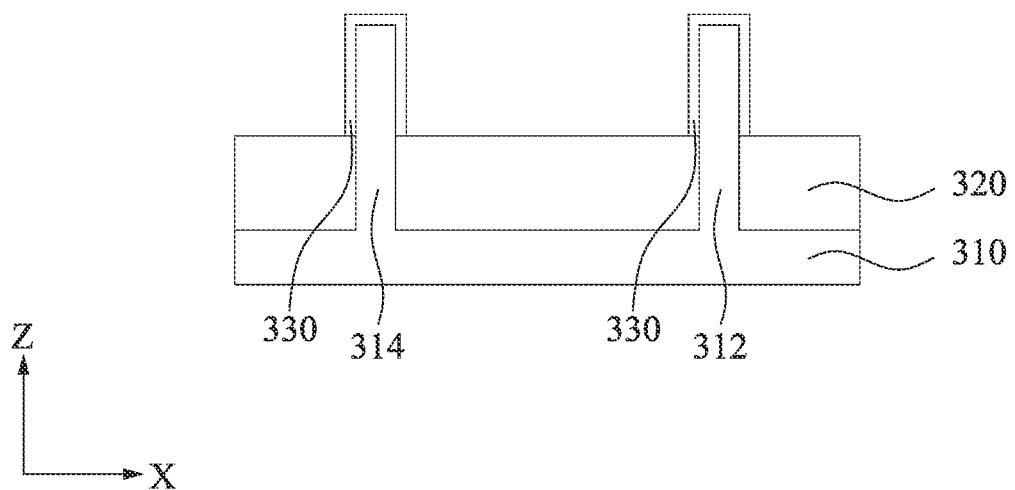

FIG. 3A-19E illustrate a method for manufacturing a memory cell at various stages in accordance with some embodiments of the present disclosure. FIG. 3A is a top view of a memory cell at various stages in accordance with some embodiments of the present disclosure, FIG. 3B is a cross-sectional view taken along line B-B in FIG. 3A, FIG. 3C is a cross-sectional view taken along line C-C in FIG. 3A, and FIG. 3D is a cross-sectional view taken along line D-D in FIG. 3A. A substrate 310 is provided. In some embodiments, the substrate 310 may include silicon (Si). Alternatively, the substrate 310 may include germanium (Ge), silicon germanium (SiGe), gallium arsenide (GaAs) or other appropriate semiconductor materials. In some embodiments, the substrate 310 may include a semiconductor-on-insulator (SOI) structure such as a buried dielectric layer. Also alternatively, the substrate 310 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 310 may include any of a variety of substrate structures and materials.

A plurality of semiconductor fins 312 and 314 are formed over the substrate 310. The semiconductor fins 312 and 314 may serve as active regions (e.g., (horizontal) channels and source/drain features) of transistors. It is noted that the numbers of the semiconductor fins 312 and 314 in FIGS. 3A-3D are illustrative, and should not limit the claimed scope of the present disclosure. In addition, one or more dummy fins may be disposed adjacent both sides of the semiconductor fins 312 and/or 314 to improve pattern fidelity in patterning processes. In some embodiments, a distance P1 between adjacent semiconductor fins 312 and 314 (i.e., the fin pitch) is in a range of about 40 nm to about 200 nm. In some embodiments, a width W1 of each of the semiconductor fins 312 and 314 is in a range of about 4 nm to about 20 nm.

The semiconductor fins 312 and 314 may be formed, for example, by patterning and etching the substrate 310 using photolithography techniques. In some embodiments, a layer of photoresist material (not shown) is deposited over the substrate 310. The layer of photoresist material is irradiated (exposed) in accordance with a desired pattern (the semiconductor fins 312 and 314 in this case) and developed to remove a portion of the photoresist material. The remaining photoresist material protects the underlying material from subsequent processing operations, such as etching. It should be noted that other masks, such as an oxide or silicon nitride mask, may also be used in the etching process. The semiconductor fins 312 and 314 may be made of the same material as the substrate 310 and may continuously extend or protrude from the substrate 310. The semiconductor fins 312 and 314 may be intrinsic, or appropriately doped with an n-type impurity or a p-type impurity.

In some other embodiments, the semiconductor fins 312 and 314 may be epitaxially grown. For example, exposed portions of an underlying material, such as an exposed portion of the substrate 310, may be used in an epitaxial process to form the semiconductor fins 312 and 314. A mask may be used to control the shape of the semiconductor fins 312 and 314 during the epitaxial growth process.

After the semiconductor fins 312 and 314 are formed, isolation structures 320 are formed so that the upper portions of the semiconductor fins 312 and 314 are exposed. For example, an insulating material layer including one or more layers of insulating material is formed over the substrate 310 so that the semiconductor fins 312 and 314 are fully embedded in the insulating material layer. The insulating material for the insulating material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer, especially when the insulating material layer is formed using flowable CVD. Subsequently, a planarization operation, such as a chemical mechanical polishing (CMP) method or an etch-back method, is performed such that the upper surface of the semiconductor fins 312 and 314 are exposed from the insulating material layer. In some embodiments, a liner layer is formed before forming the insulating material layer. The first liner layer is made of SiN or a silicon nitride-based material (e.g., SiON, SiCN or SiOCN). The insulating material layer is then recessed to form the isolation structures 320 so that the upper portions of the semiconductor fins 312 and 314 are exposed. With this operation, the semiconductor fins 312 and 314 are electrically insulated from each other by the isolation structures 320, which are also referred to as an STI structure.

Subsequently, a sacrificial gate dielectric layer 330 is conformally formed above the semiconductor fins 312 and 314 and the isolation structures 320. For clarity, the sacrificial gate dielectric layer 330 is shown in FIGS. 3B-3D and is omitted in FIG. 3A. In some embodiments, the sacrificial gate dielectric layer 330 may include silicon dioxide, silicon nitride, a high-κ dielectric material or other suitable material. In various examples, the sacrificial gate dielectric layer 330 may be deposited by a thermal process, an ALD process, a CVD process, a subatmospheric CVD (SACVD) process, a flowable CVD process, a PVD process, or other suitable process. By way of example, the sacrificial gate dielectric layer 330 may be used to prevent damage to the semiconductor fins 312 and 314 by subsequent processing (e.g., subsequent formation of the dummy gate structure).

Figure 4A:
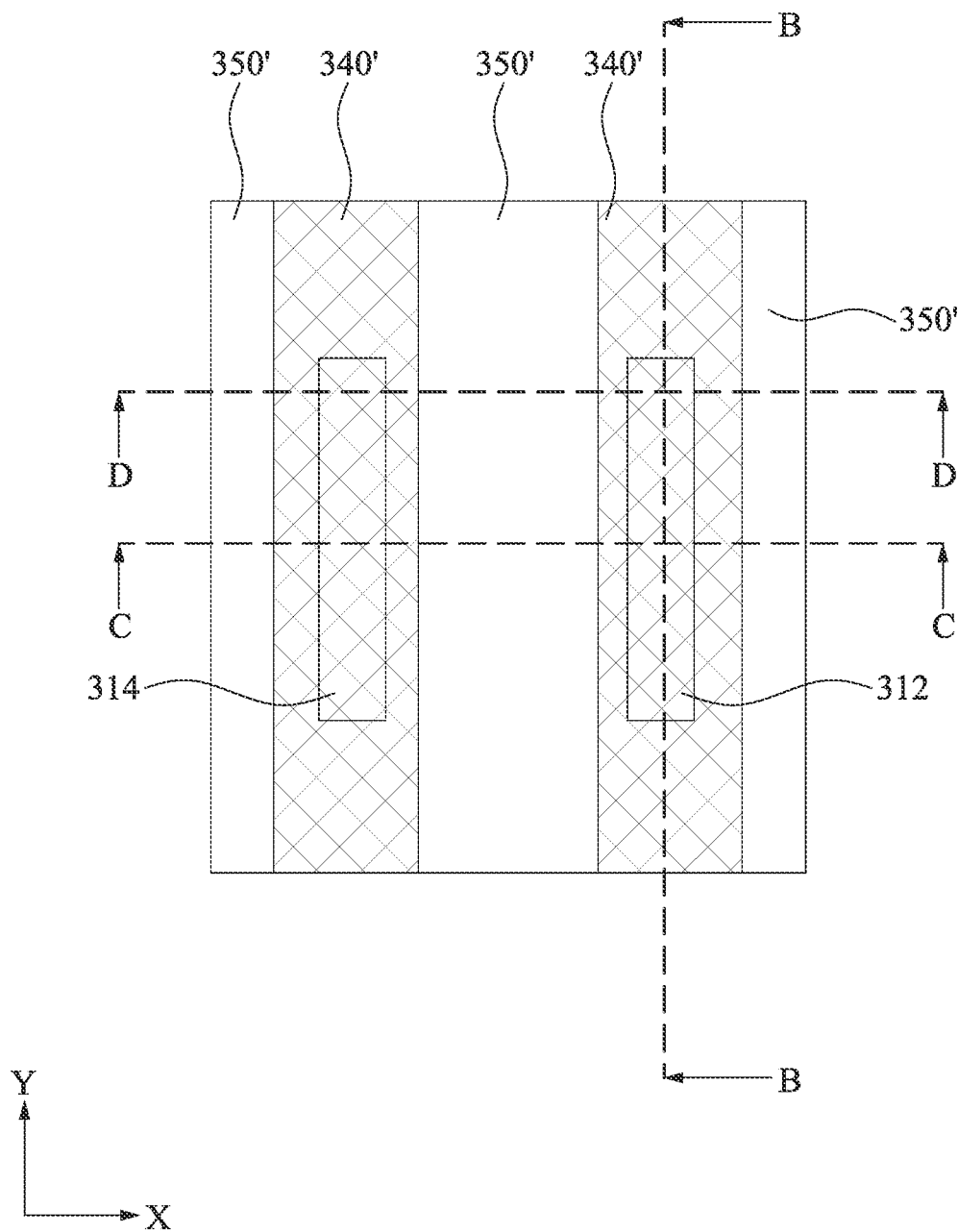
Figure 4B:
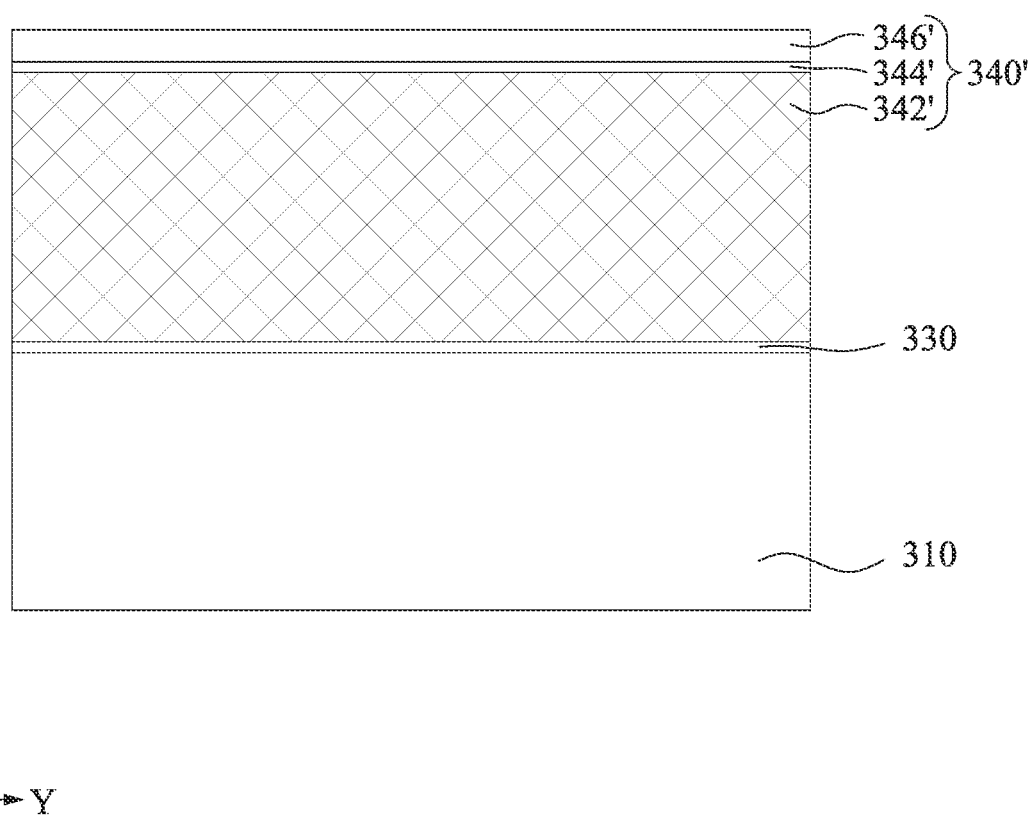
Figure 4C:
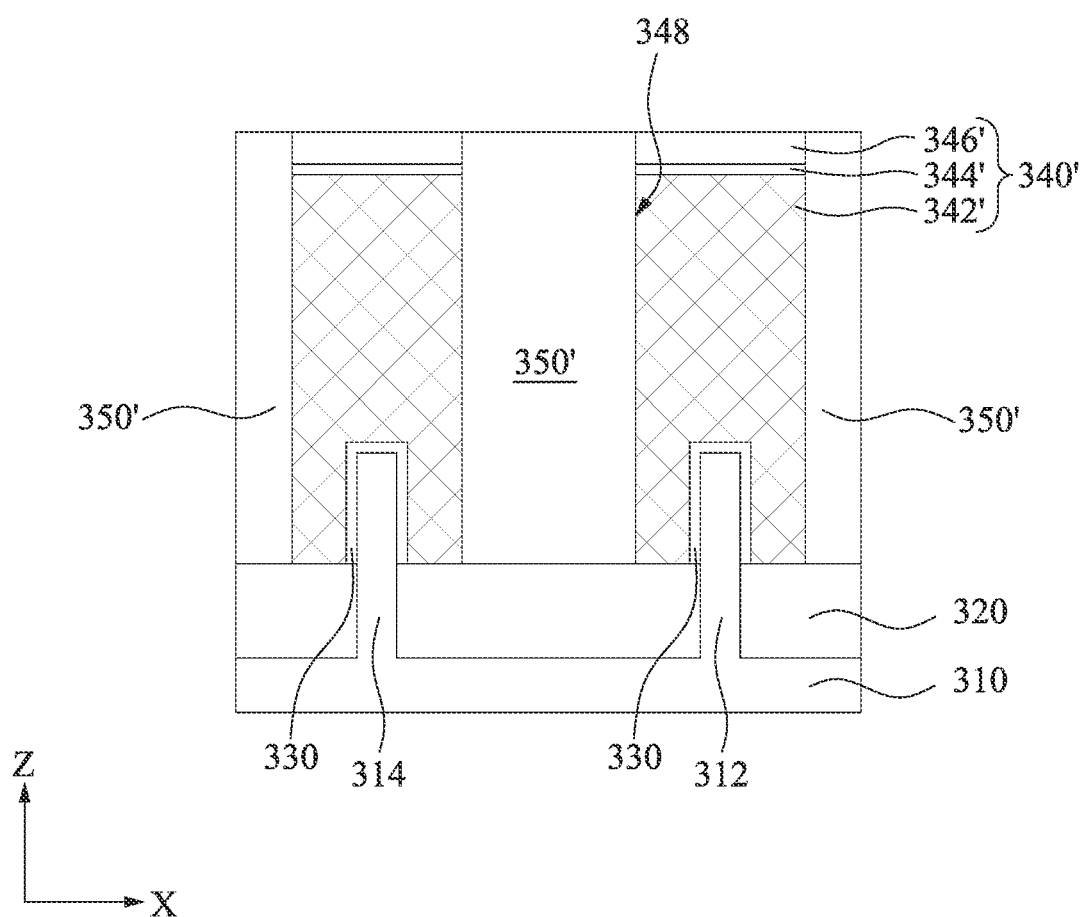
Figure 4D:
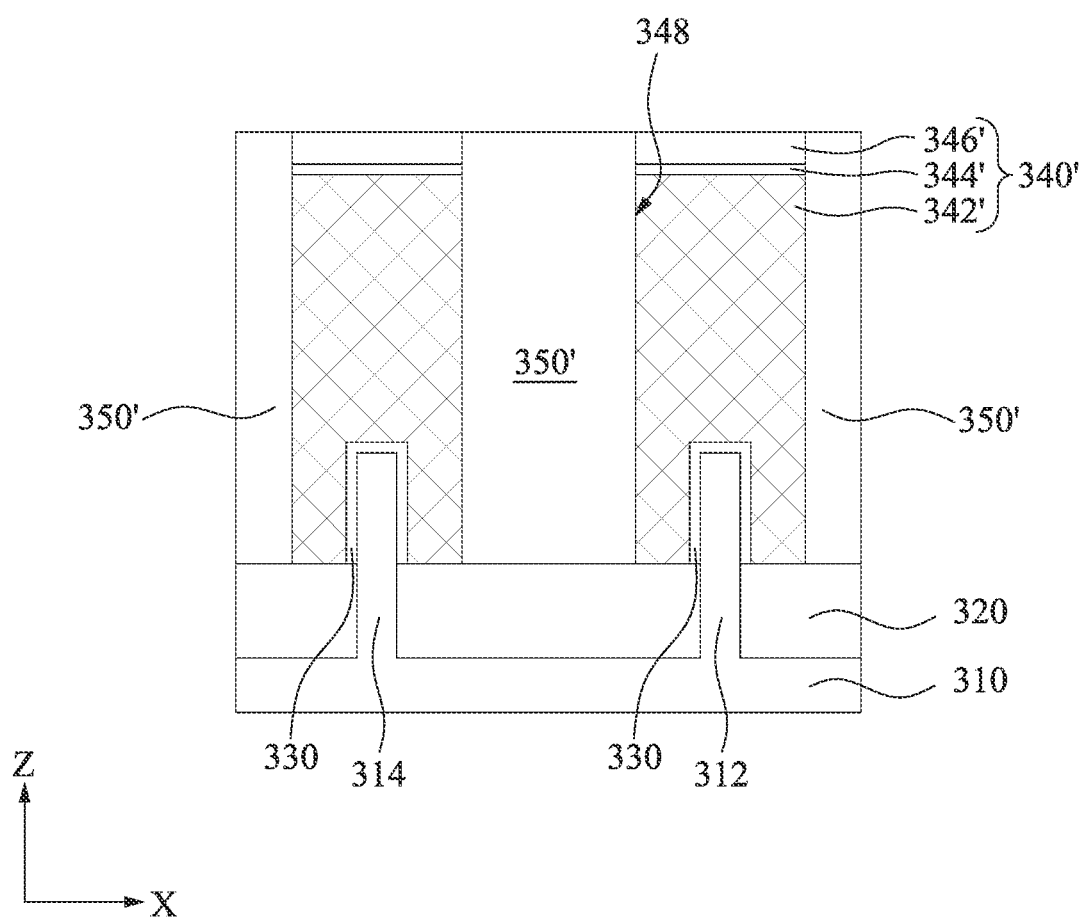

FIG. 4A is a top view of a memory cell at various stages in accordance with some embodiments of the present disclosure, FIG. 4B is a cross-sectional view taken along line B-B in FIG. 4A, FIG. 4C is a cross-sectional view taken along line C-C in FIG. 4A, and FIG. 4D is a cross-sectional view taken along line D-D in FIG. 4A. A plurality of dummy structures 340' are formed above the structure of FIGS. 3A-3D. Each of the dummy structures 340' extends in the Y direction and includes a dummy layer 342', a pad layer 344' formed over the dummy layer 342', and a mask layer 346' formed over the pad layer 344'. Formation of the dummy structures 340' includes depositing in sequence a dummy layer, a pad layer and a mask layer over the substrate 310, patterning the pad layer and mask layer into patterned pad layer 344' and mask layer 346' using suitable photolithography and etching techniques, followed by patterning the dummy layer using the pad layer 344' and the mask layer 346' as masks to form the patterned dummy layer 342'. As such, the dummy layer 342', the pad layer 344', and the mask layer 346' are referred to as the dummy structure 340'. The dummy structures 340' define openings 348 therebetween, and the openings 348 do not expose the semiconductor fins 312 and 314. That is, the dummy structures 340' respectively cover the semiconductor fins 312 and 314. In some embodiments, the dummy layer 342' may be made of polycrystalline-silicon (poly-Si), poly-crystalline silicon-germanium (poly-SiGe), or other suitable materials. The pad layer 344' may be made of silicon nitride or other suitable materials, and the mask layer 346' may be made of silicon dioxide or other suitable materials.

Subsequently, a plurality of isolation strips 350' are formed in the openings 348. In some embodiments, the isolation strips 350' are filled in the openings 348. For example, an insulating material is filled in the openings 348, and a planarization process (e.g., a CMP process) is performed to remove portions of the insulating material outside the openings 348 to form the isolation strips 350'. As such, the isolation strips 350' and the dummy structures 340' are alternately arranged in the top view (see FIG. 4A). In some embodiments, the isolation strips 350' are dielectric materials, such as SiN, SiON, SiOCN, SiCN, or combinations thereof.

Figure 5A:
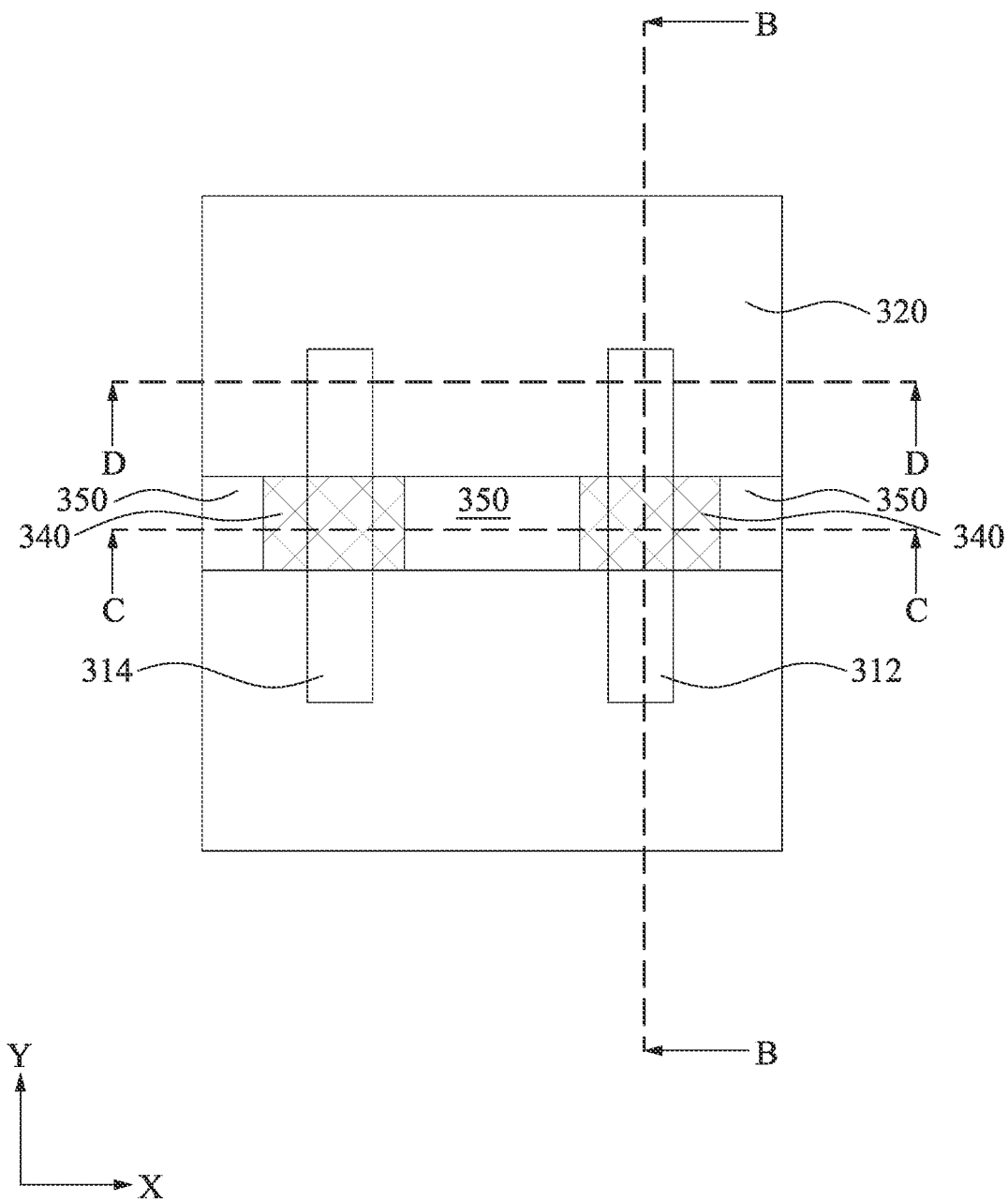
Figure 5B:
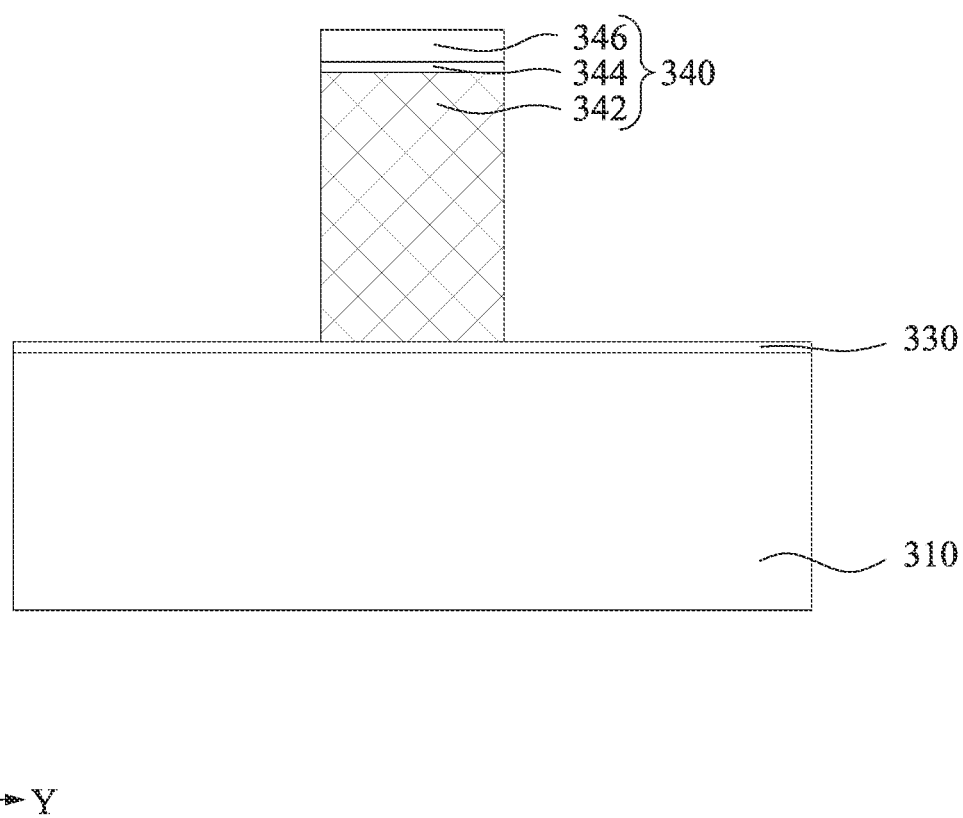
Figure 5C:
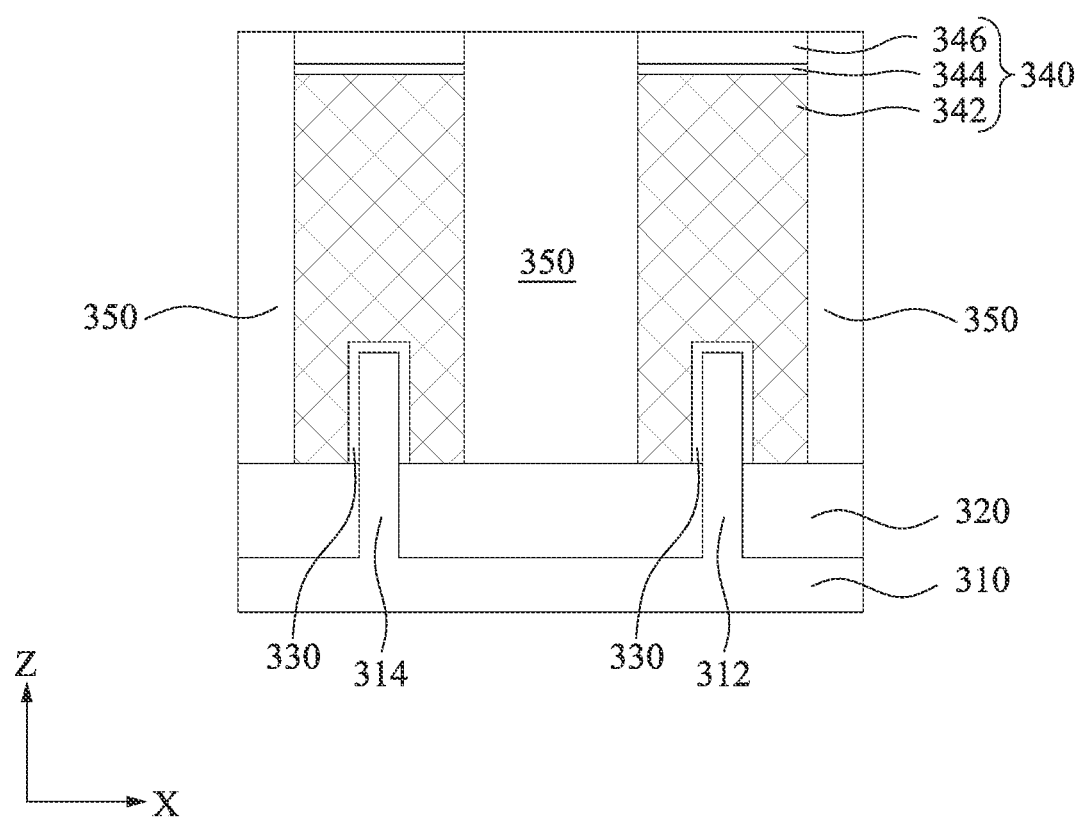
Figure 5D:
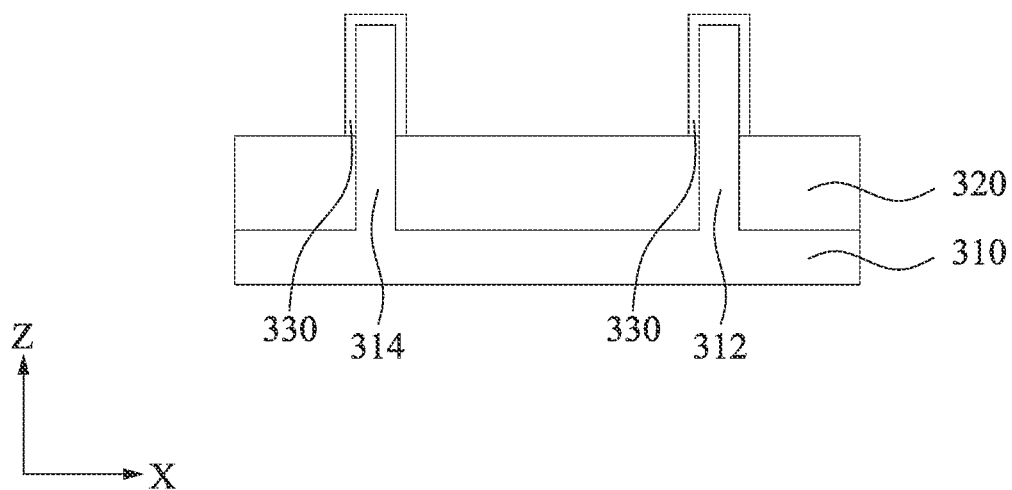

FIG. 5A is a top view of a memory cell at various stages in accordance with some embodiments of the present disclosure, FIG. 5B is a cross-sectional view taken along line B-B in FIG. 5A, FIG. 5C is a cross-sectional view taken along line C-C in FIG. 5A, and FIG. 5D is a cross-sectional view taken along line D-D in FIG. 5A. The dummy structures 340' and the isolation strips 350' of FIGS. 4A-4D are further patterned to form dummy gate structures 340 and isolation blocks 350. Each of the dummy gate structures 340 includes a dummy gate layer 342, a pad layer 344 formed over the dummy gate layer 342, and a mask layer 346 formed over the pad layer 344. The dummy gate structures 340 are respectively above the semiconductor fins 312 and 314, and one of the isolation blocks 350 is between the dummy gate structures 340.

Figure 6A:
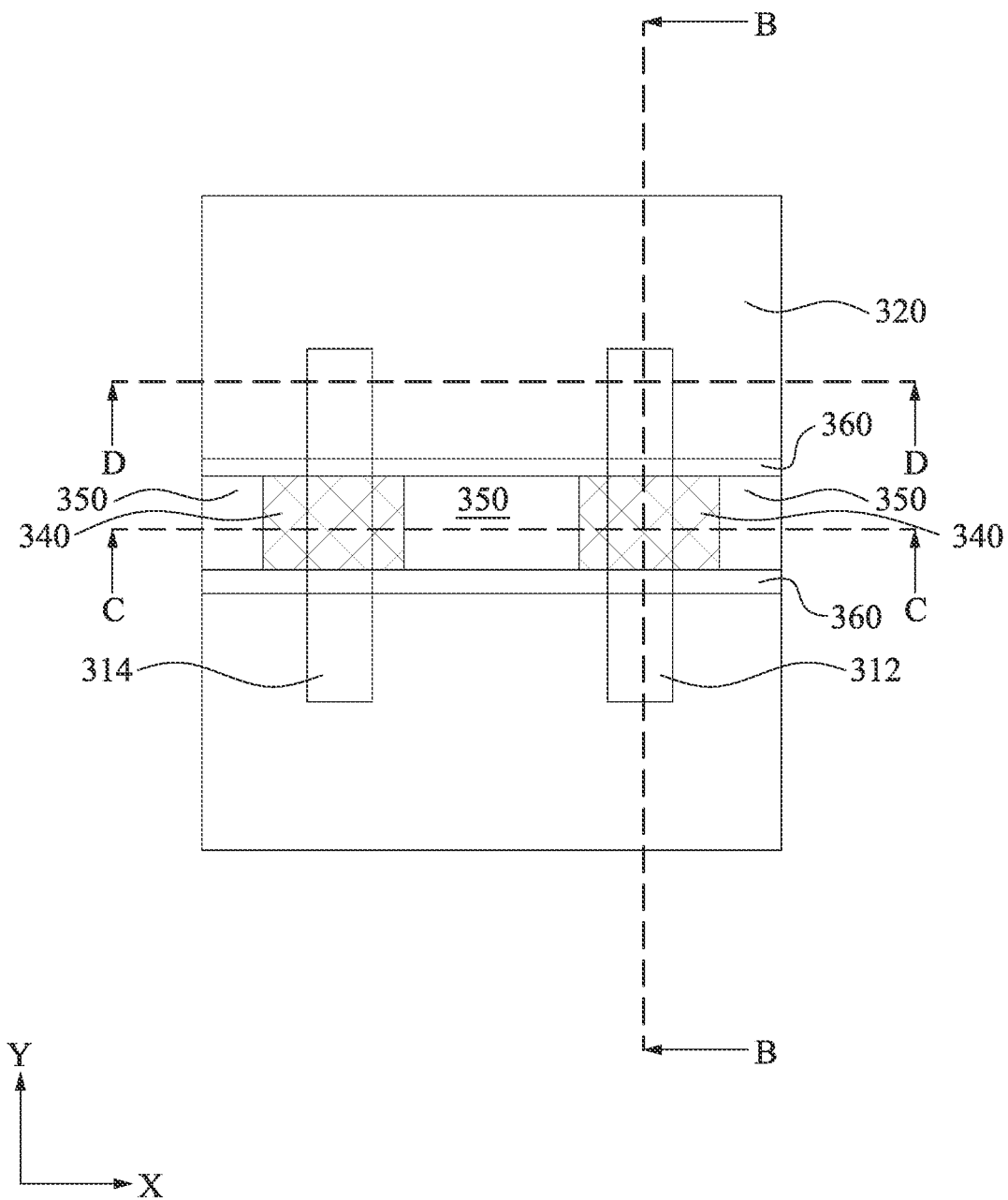
Figure 6B:
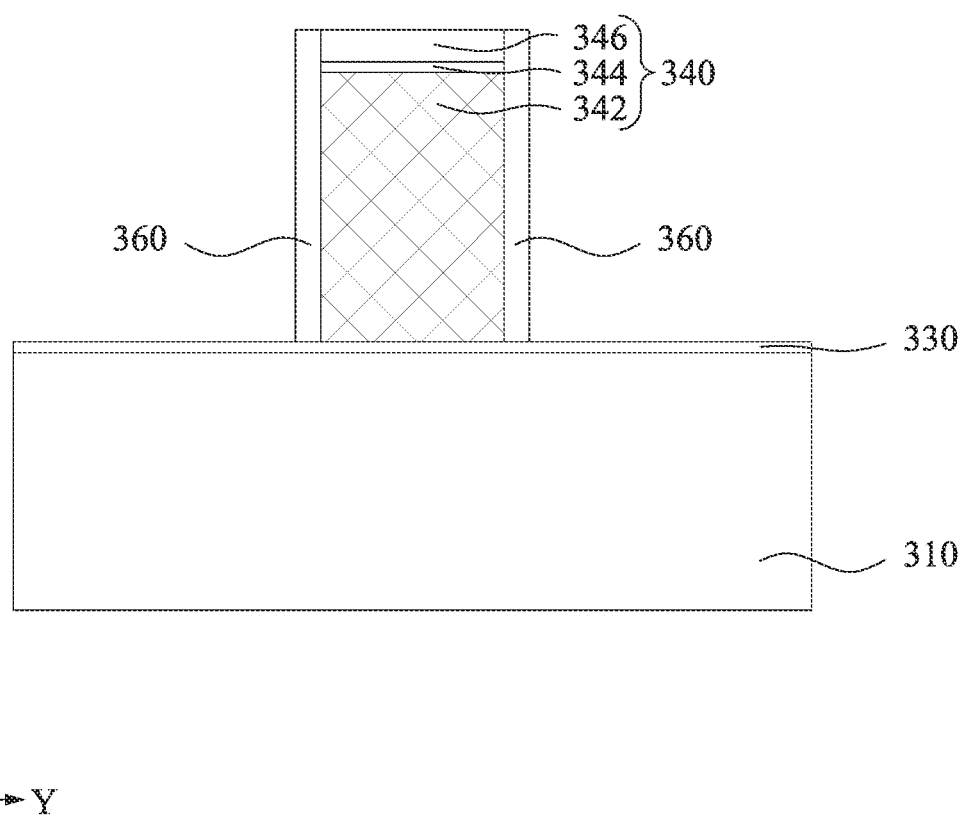
Figure 6C:
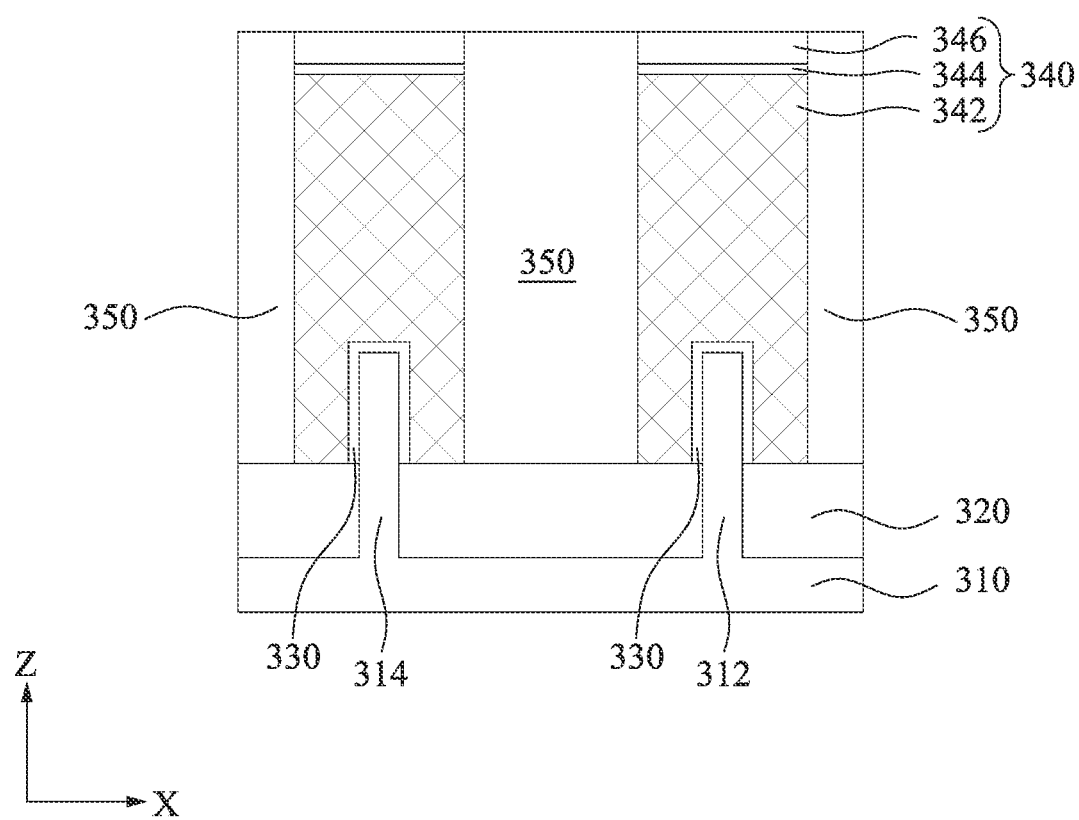
Figure 6D:
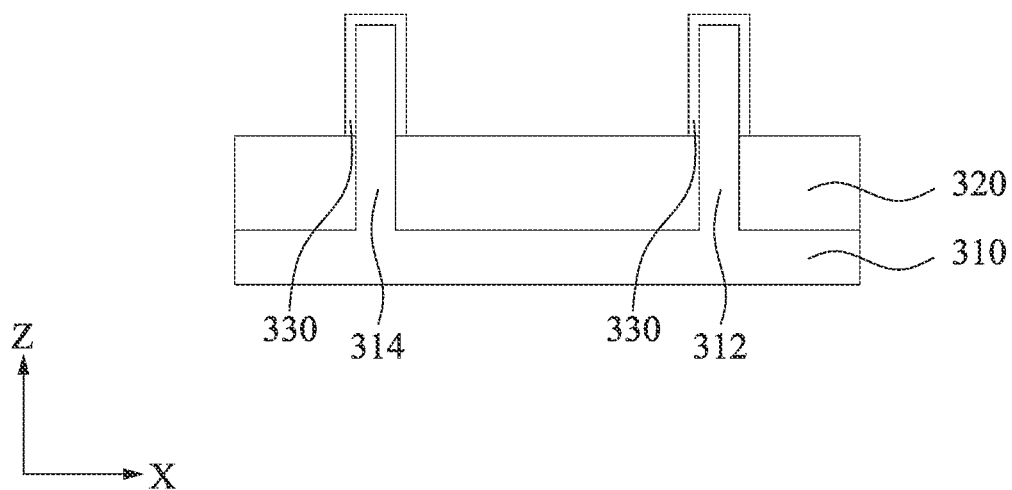

FIG. 6A is a top view of a memory cell at various stages in accordance with some embodiments of the present disclosure, FIG. 6B is a cross-sectional view taken along line B-B in FIG. 6A, FIG. 6C is a cross-sectional view taken along line C-C in FIG. 6A, and FIG. 6D is a cross-sectional view taken along line D-D in FIG. 6A. Gate spacers 360 are formed on opposite sidewalls of the dummy gate structures 340 and opposite sidewalls of the isolation blocks 350. For example, a blanket layer of an insulating material for sidewall spacers is conformally formed to cover the dummy gate structures 340 and the isolation blocks 350 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 340. In some embodiments, the insulating material of the blanket layer is a silicon nitride-based material, such as SiN, SiON, SiOCN, SiCN, or combinations thereof. The blanket layer is then etched using an anisotropic process to form the gate spacers 360 on opposite sidewalls of the dummy gate structures 340 and the isolation blocks 350.

The gate spacers 360 may include a seal spacer and a main spacer (not shown). The seal spacers may be formed on sidewalls of the dummy gate structure 340 and the isolation blocks 350 and the main spacers are formed on the seal spacers. The anisotropic etching performed on the blanket layer can be, for example, reactive ion etching (RIE). During the anisotropic etching process, most of the insulating material is removed from horizontal surfaces, leaving the dielectric spacer layer on the vertical surfaces such as the sidewalls of the dummy gate structures 340 and the isolation blocks 350. In some embodiments, the gate spacers 360 and the isolation blocks 350 are made of the same material, such that there is no or unapparent interface between the gate spacers 360 and the isolation blocks 350. In some other embodiments, the gate spacers 360 and the isolation blocks 350 are made of different materials, such that an apparent interface is between the gate spacers 360 and the isolation blocks 350.

Figure 7A:
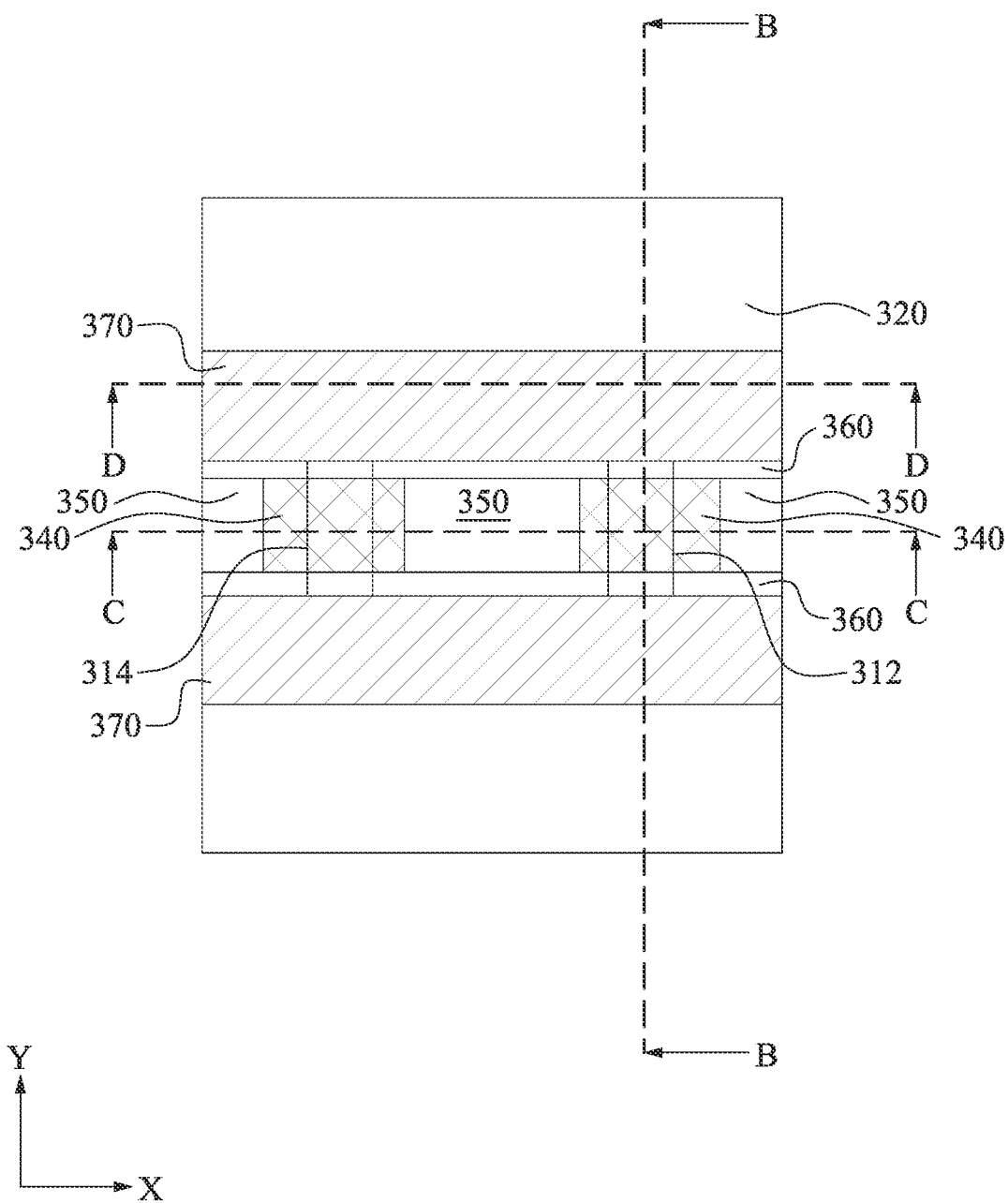
Figure 7B:
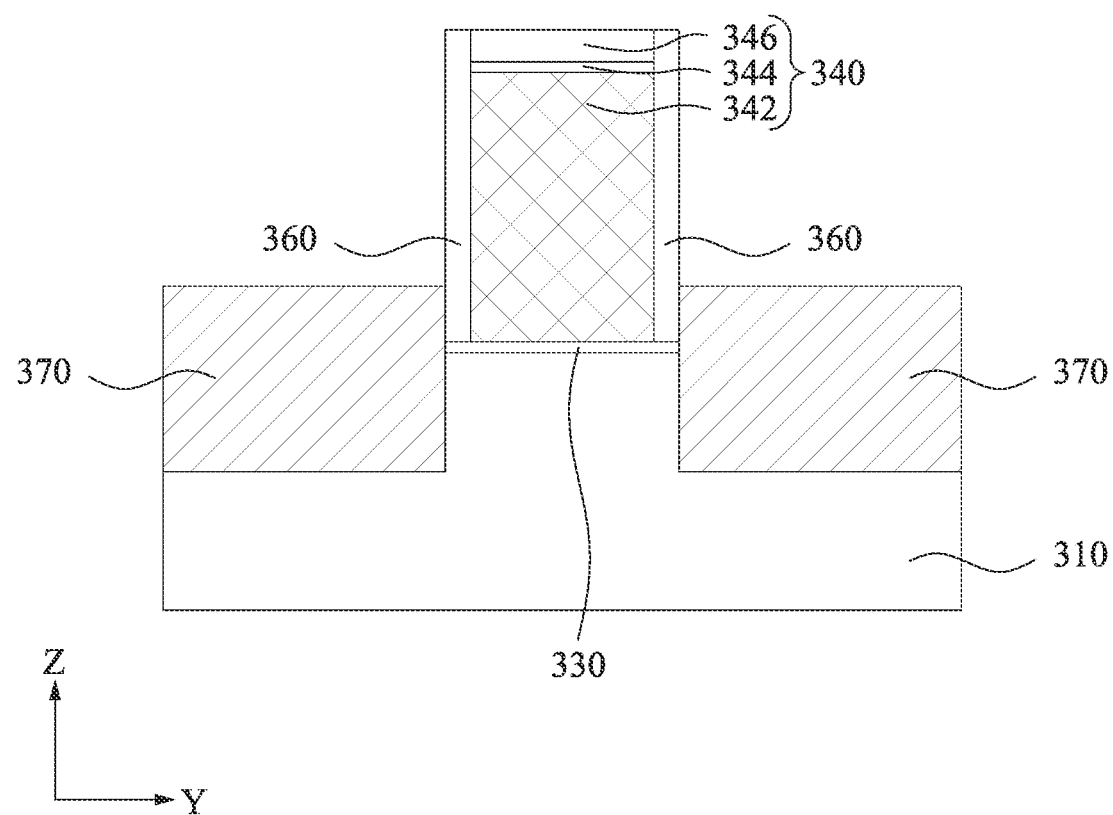
Figure 7C:
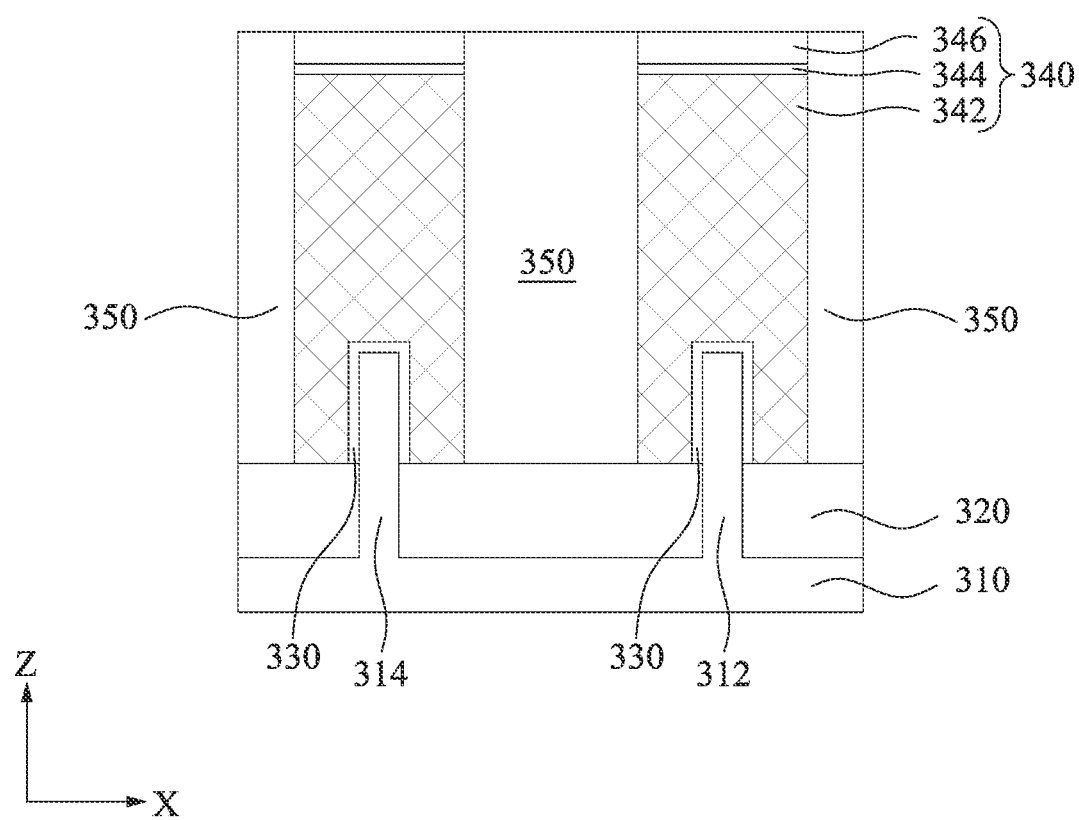
Figure 7D:
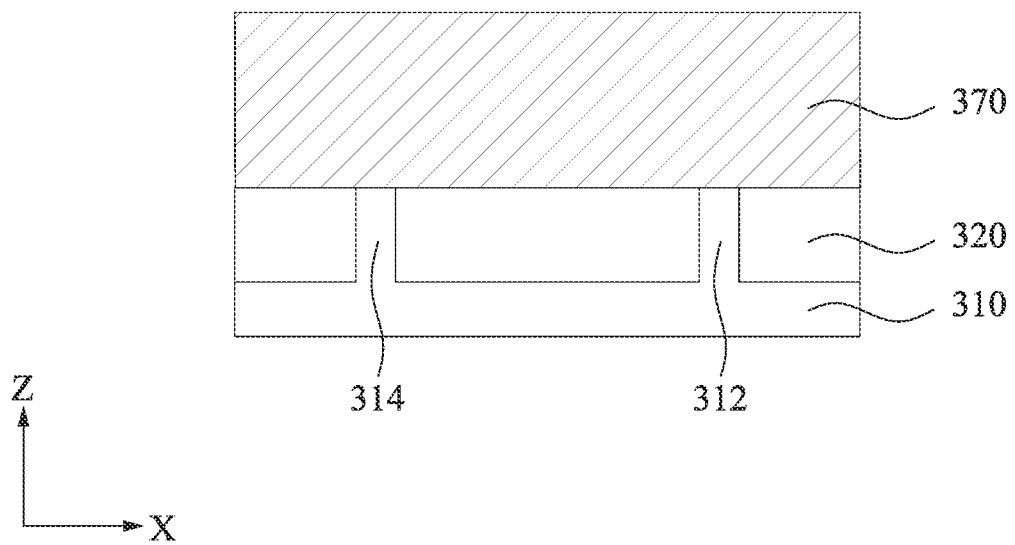

FIG. 7A is a top view of a memory cell at various stages in accordance with some embodiments of the present disclosure, FIG. 7B is a cross-sectional view taken along line B-B in FIG. 7A, FIG. 7C is a cross-sectional view taken along line C-C in FIG. 7A, and FIG. 7D is a cross-sectional view taken along line D-D in FIG. 7A. Exposed portions of the semiconductor fins 312 and 314 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

Subsequently, epitaxial structures 370 are epitaxially grown from the recessed semiconductor fins 312 and 314. The epitaxial structures 370 includes one or more layers of Si, SiP, SiC and SiCP for an n-channel FET or Si, SiGe, Ge for a p-channel FET. The epitaxial structures 370 are formed by an epitaxial growth method using CVD, ALD or molecular beam epitaxy (MBE). In some embodiments as depicted in FIGS. 7A-7D, the epitaxial structures 370 grown from neighboring semiconductor fins 312 and 314 merge above the isolation structures 140. In some embodiments, the epitaxial structures 370 have the same conductivity type. For example, the epitaxial structures 370 may both be N-type epitaxial structures or both be P-type epitaxial structures. The epitaxial structures 370 are grown from top surfaces of the semiconductor fins 312 and 314. In some embodiments, epitaxial materials are respectively grown from the top surfaces of the semiconductor fins 312 and 314, and the epitaxial materials are laterally overgrown such that the epitaxial materials are merged together to form the epitaxial structure 370.

Figure 20A:
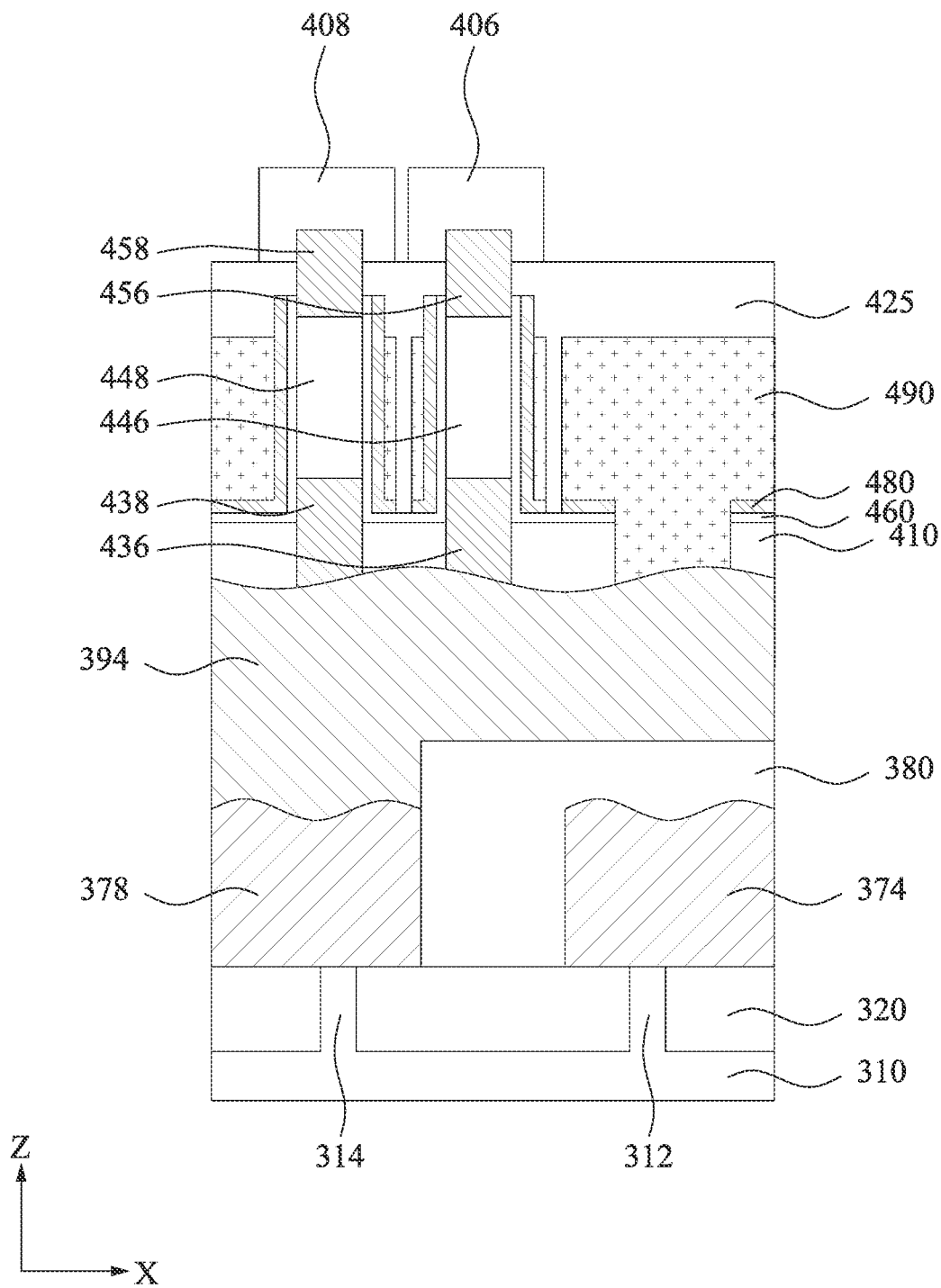
FIGS. 20A and 20B are cross-sectional views of a memory cell, in accordance with some embodiments of the present disclosure.
Figure 20B:
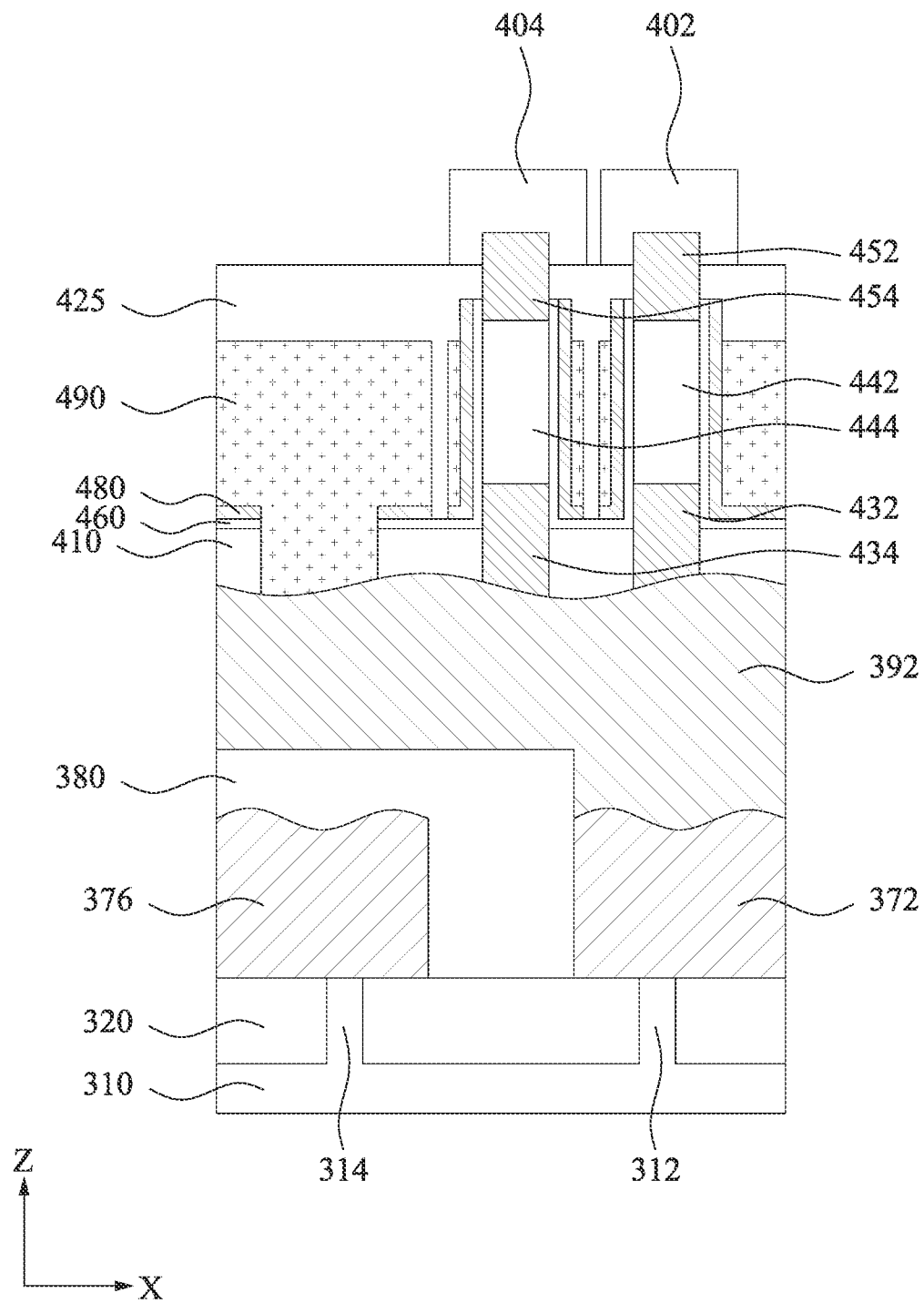

In some embodiments, the merged epitaxial materials have facets such that the top surfaces of the merged epitaxial materials may be zig-zag-shaped. Alternatively, the top surfaces of the merged epitaxial materials have sharp corners. As such, a hydrogen reflow process can be performed to the merged epitaxial materials to reshape the profile of the merged epitaxial materials. For example, hydrogen-containing gases or materials are provided to the merged epitaxial materials, and a thermal process (e.g., an annealing process or a reflow process) is performed to the merged epitaxial materials with the hydrogen-containing gases or materials. As the processing temperature is increased, the top surfaces of the merged epitaxial materials are rounded or smoothed. As such, after the hydrogen reflow process, the top surfaces of the merged epitaxial materials may be flat or wavy as shown in FIG. 7D or FIGS. 20A and 20B. In some embodiments, the processing temperature of the hydrogen reflow process may be greater than about 700° C., e.g., about 750° C. to about 1000° C.

Figure 8A:
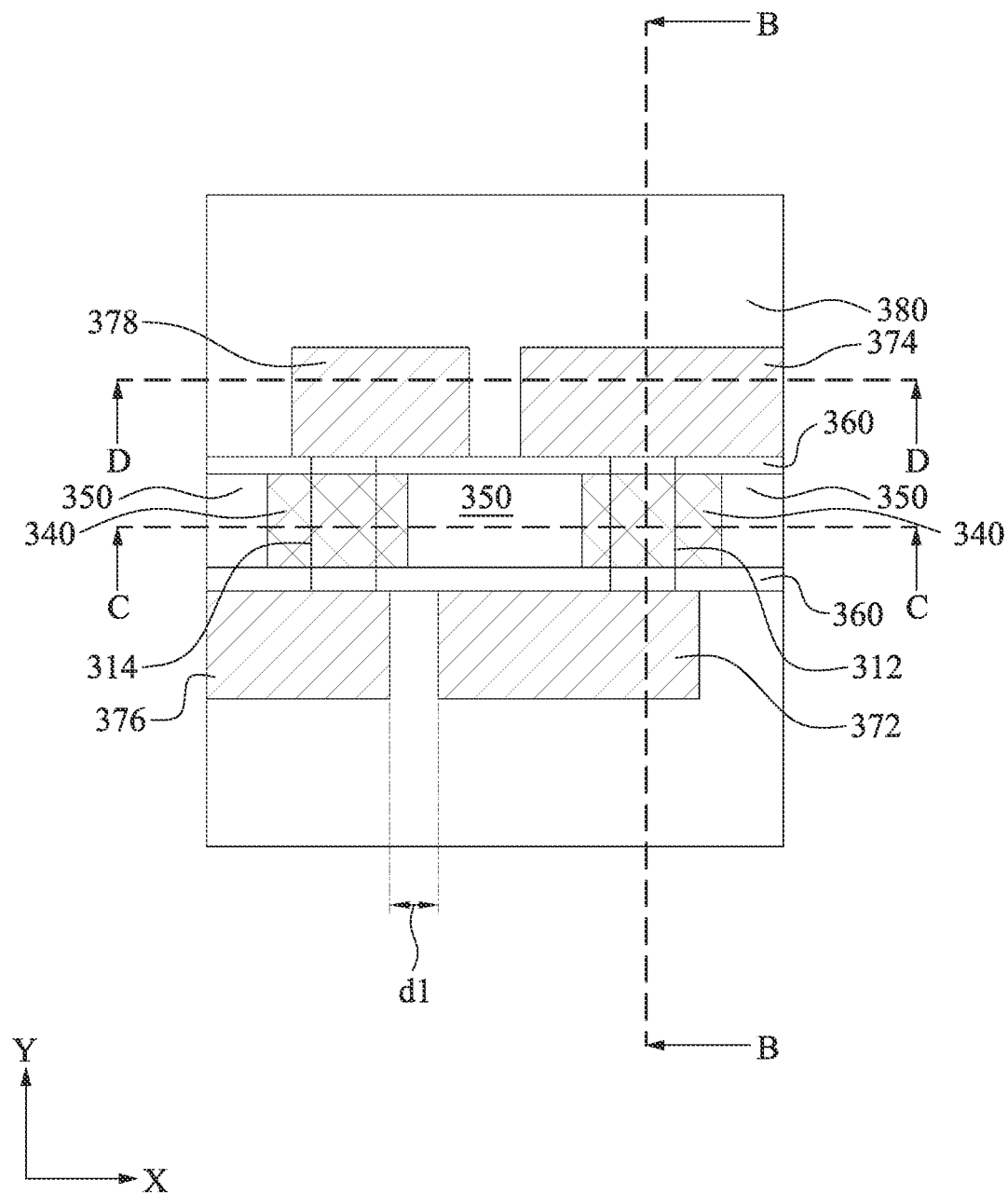
Figure 8B:
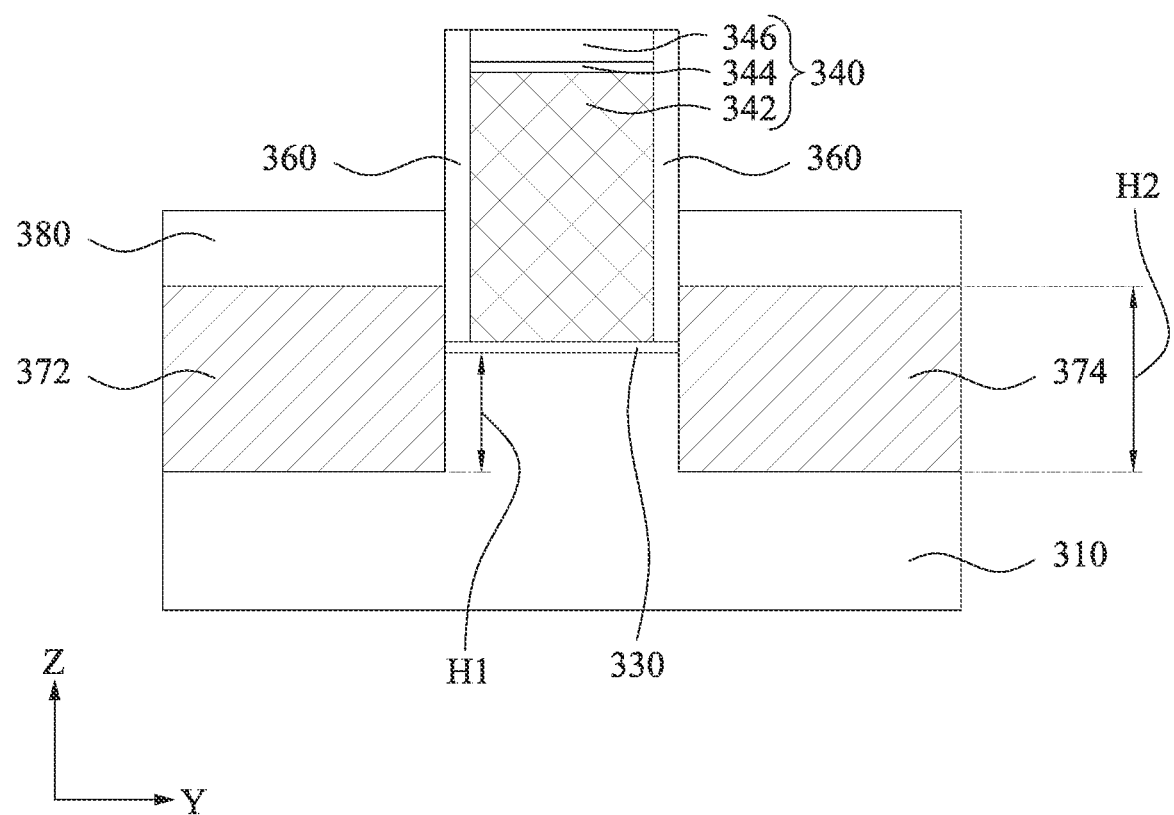
Figure 8C:
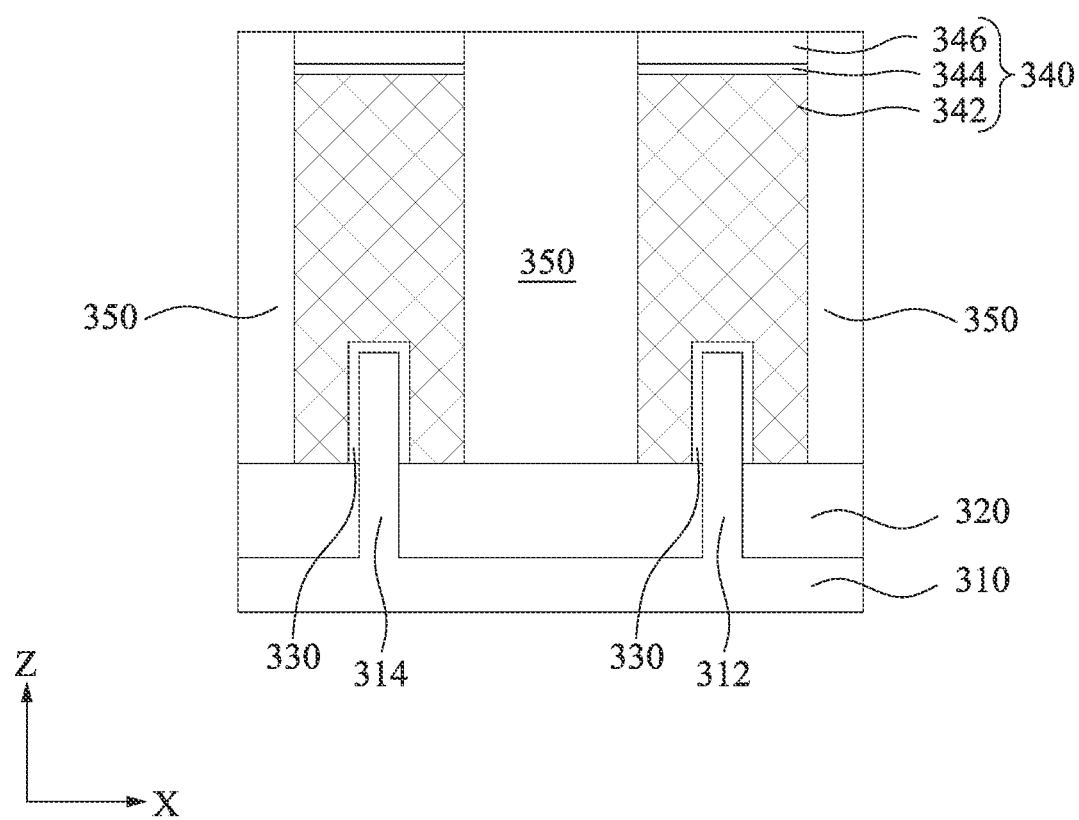
Figure 8D:
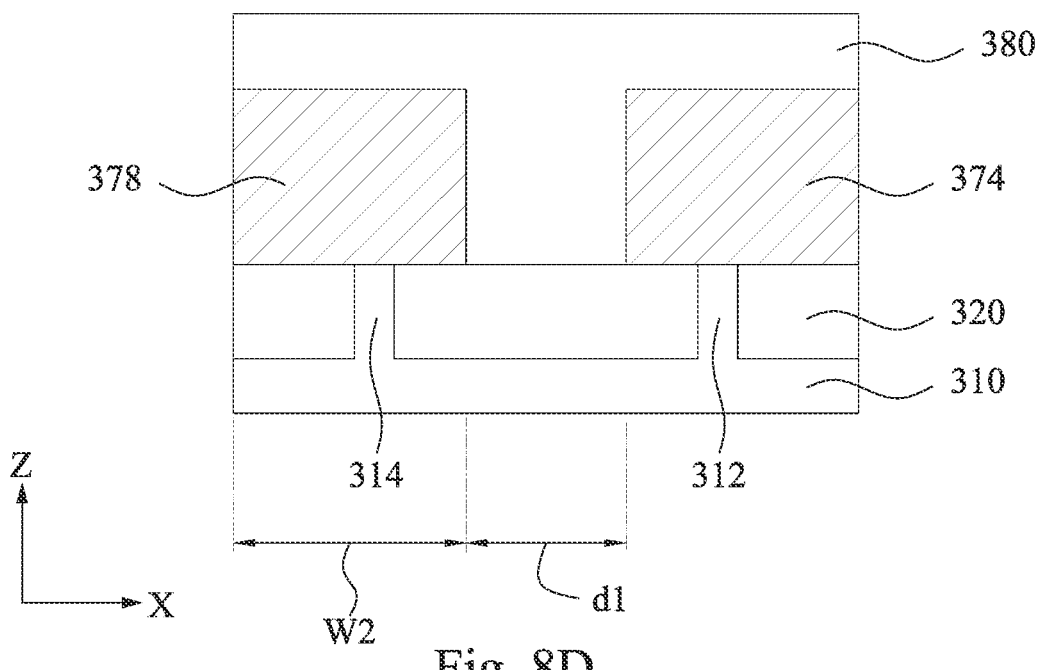

FIG. 8A is a top view of a memory cell at various stages in accordance with some embodiments of the present disclosure, FIG. 8B is a cross-sectional view taken along line B-B in FIG. 8A, FIG. 8C is a cross-sectional view taken along line C-C in FIG. 8A, and FIG. 8D is a cross-sectional view taken along line D-D in FIG. 8A. The epitaxial structures 370 are patterned to be source/drain features 372, 374, 376, and 378. The source/drain features 372 and 374 are on opposite sides of one of the dummy gate structures 340 above the recessed semiconductor fin 312, and the source/drain features 376 and 378 are on opposite sides of another of the dummy gate structures 340 above the recessed semiconductor fin 314.

In some embodiments, a height H1 of the semiconductor fins 312, 314 (i.e., a distance between the bottom surfaces of the source/drain features 372, 374, 376, and 378 and the top surfaces of the semiconductor fins 312 and 314) is in a range of about 10 nm to about 100 nm. If the height H1 is less than about 10 nm, the threshold voltage of the transistors (PU1 and PU2 as shown in FIGS. 19A-19D) may be positively shifted; if the height H1 is greater than about 100 nm, the size of the memory cell may be increased. In some embodiments, a height H2 of the source/drain features 372, 374, 376, and 378 may be in a range of about 20 nm to about 100 nm. In some embodiments, a width W2 of each of the source/drain features 372, 374, 376, and 378 is in a range of about 10 nm to about 100 nm. In some embodiments, a distance d1 between adjacent source/drain features 372 and 376 (374 and 378) is in a range of about 10 nm to about 100 nm.

Subsequently, an isolation layer 380 is formed above the source/drain features 372, 374, 376, and 378. For example, a dielectric material layer including one or more layers of insulating material is formed over the substrate 310 so that the source/drain features 372, 374, 376, and 378 are fully embedded in the dielectric material layer. The dielectric material for the dielectric material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. Subsequently, a planarization operation, such as a chemical mechanical polishing (CMP) method or an etch-back method, is performed such that the upper surface of the dummy gate structures 340 are exposed from the dielectric material layer. The dielectric material layer is then recessed or etched back to form the isolation layer 380 so that the upper portions of the dummy gate structures 340 and upper portions of the isolation blocks 350 are exposed. With this operation, the source/drain features 372, 374, 376, and 378 are electrically insulated from each other by the isolation layer 380.

Figure 9A:
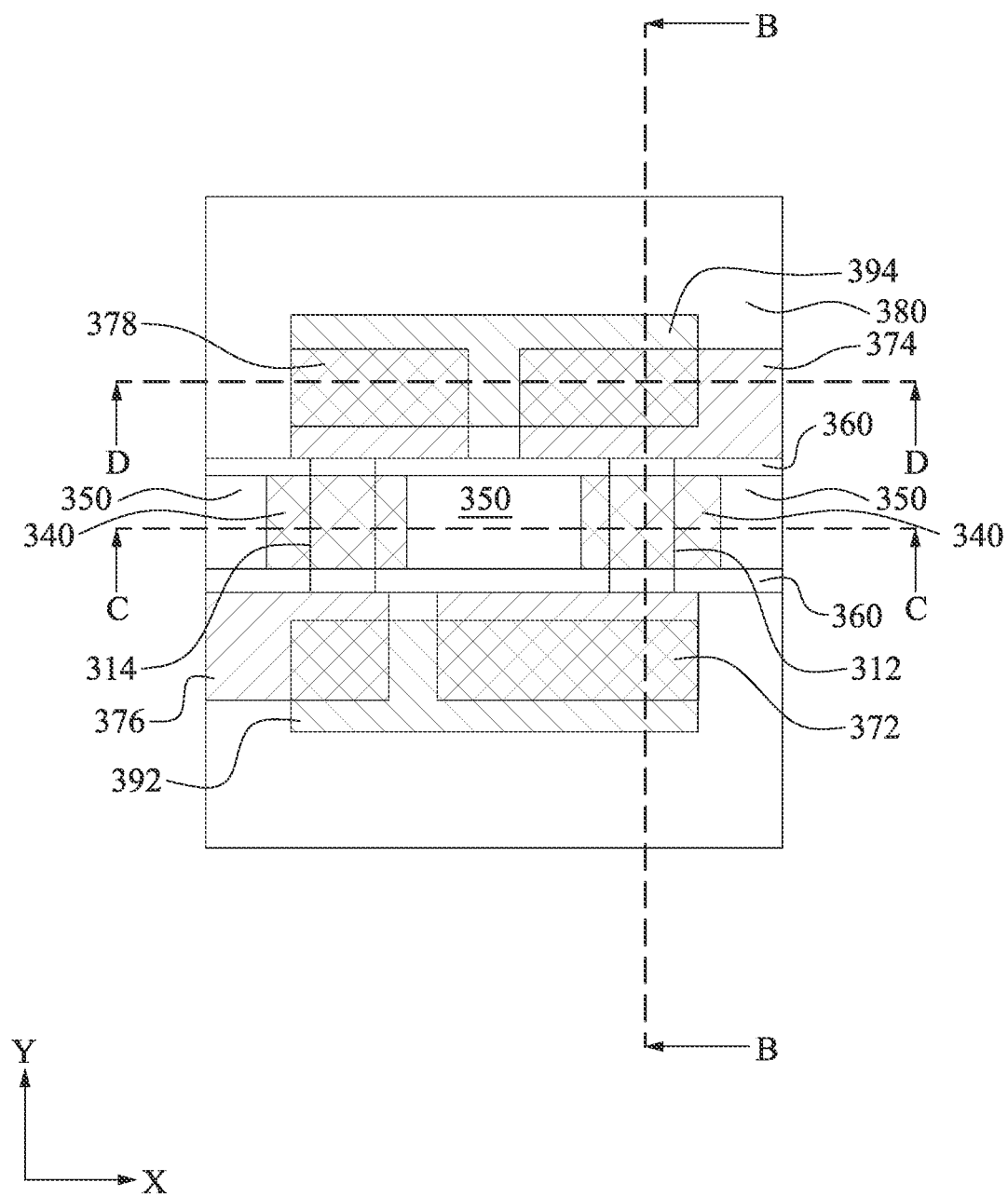
Figure 9B:
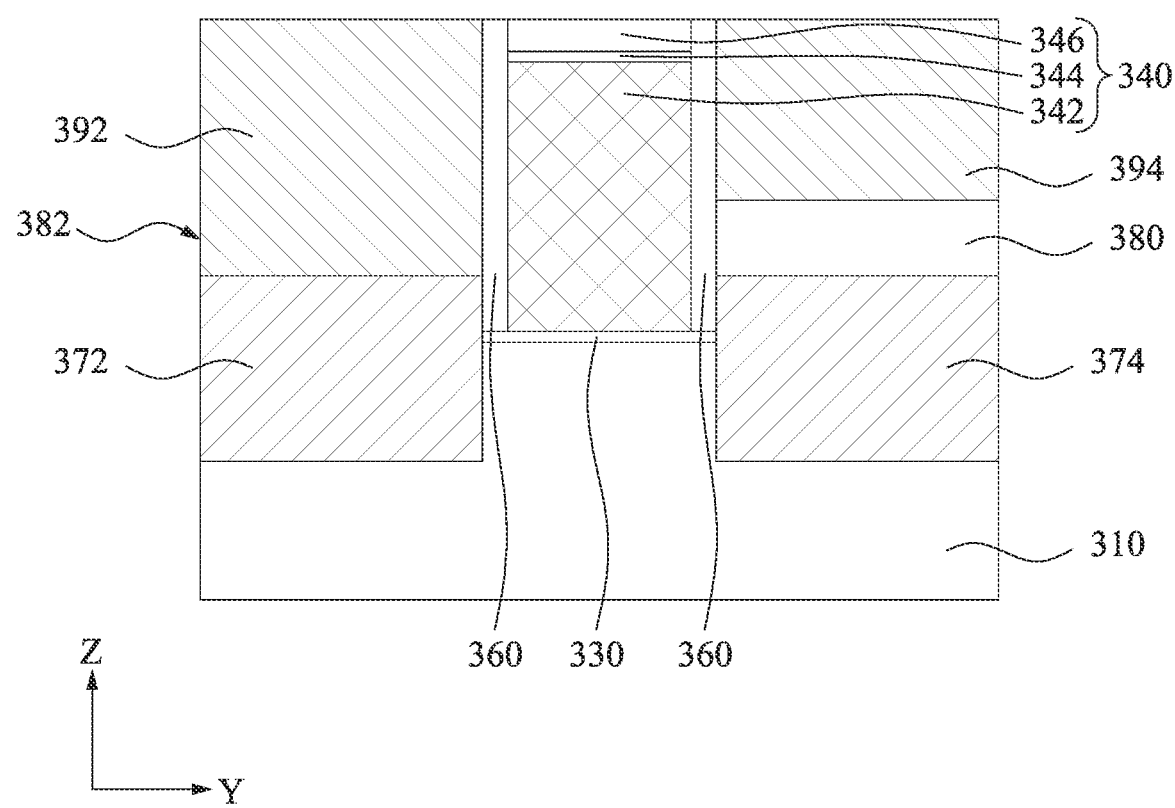
Figure 9C:
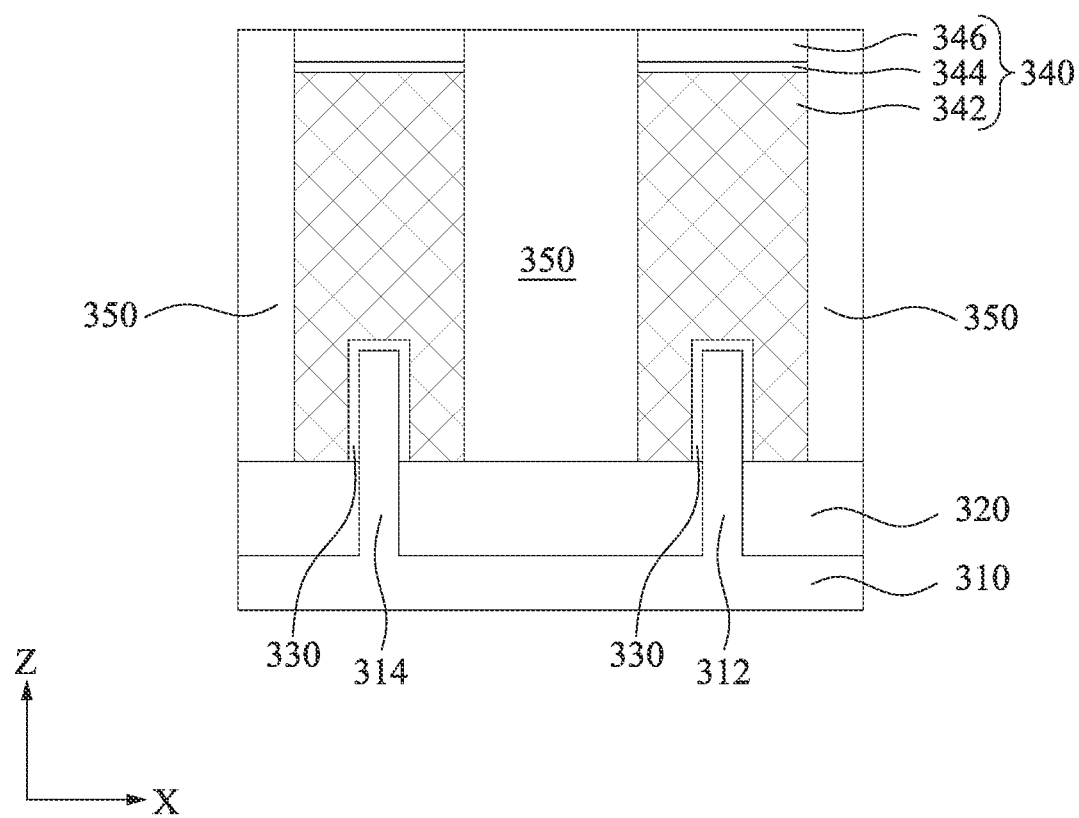
Figure 9D:
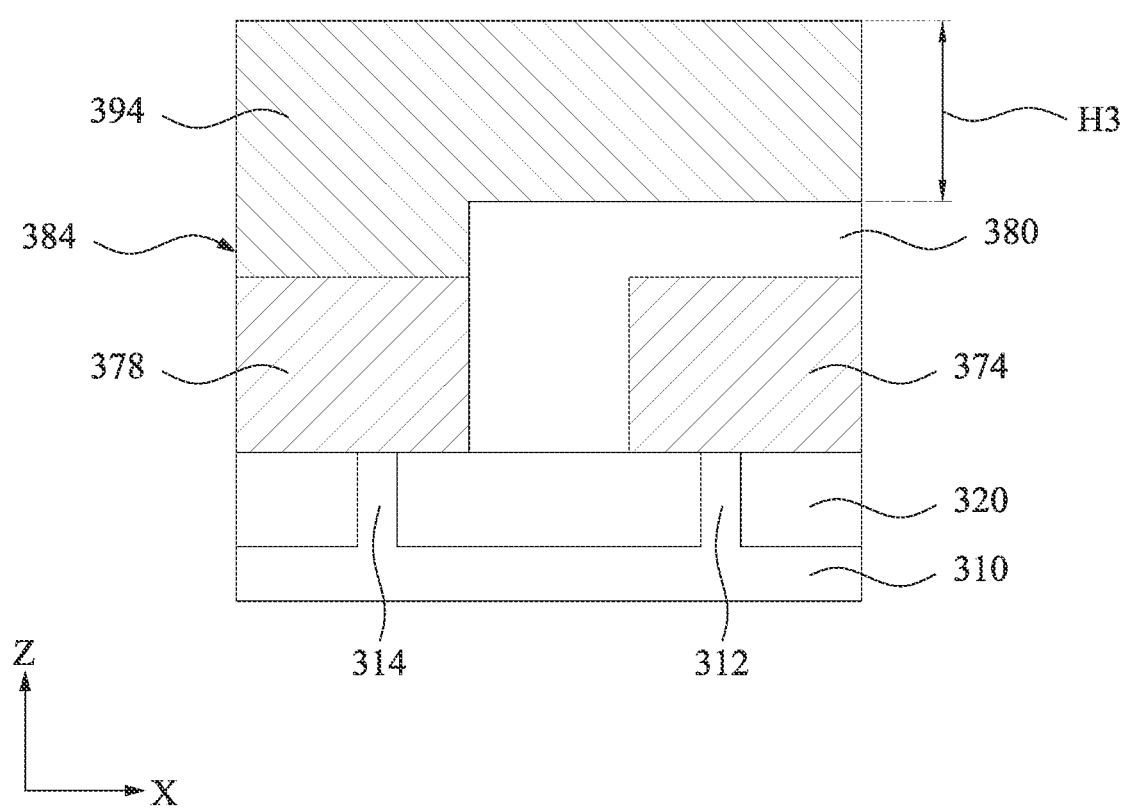

FIG. 9A is a top view of a memory cell at various stages in accordance with some embodiments of the present disclosure, FIG. 9B is a cross-sectional view taken along line B-B in FIG. 9A, FIG. 9C is a cross-sectional view taken along line C-C in FIG. 9A, and FIG. 9D is a cross-sectional view taken along line D-D in FIG. 9A. The isolation layer 380 is patterned to form openings 382 and 384 therein. The opening 382 exposes a portion of the source/drain feature 372, and the opening 384 exposes a portion of the source/drain feature 378.

Next, source/drain features 392 and 394 are respectively formed above the source/drain features 372 and 378. In some embodiments, the formation of the source/drain features 392 and 394 include overgrowth an epitaxial layer in the openings 382 and 384 and above the isolation layer 380, and a hydrogen reflow process is performed to reshape the profile of the epitaxial layer. The epitaxial layer is then patterned to be the source/drain features 392 and 394. In some embodiments, the source/drain features 392 and 394 have a conductivity type different from that of the source/drain features 372, 374, 376, and 378. For example, the source/drain features 392 and 394 are N-type, and the source/drain features 372, 374, 376, and 378 are P-type, or vise versa. The source/drain feature 392 is directly above the source/drain features 372 and 376. The source/drain feature 392, however, is in contact with the source/drain feature 372 but isolated from the source/drain feature 376 by the isolation layer 380. Similarly, the source/drain feature 394 is directly above the source/drain features 374 and 378. The source/drain feature 394, however, is in contact with the source/drain feature 378 but isolated from the source/drain feature 374 by the isolation layer 380. In some embodiments, a height H3 of the source/drain features 392 and 394 are in a range of about 20 nm to about 100 nm.

Figure 10A:
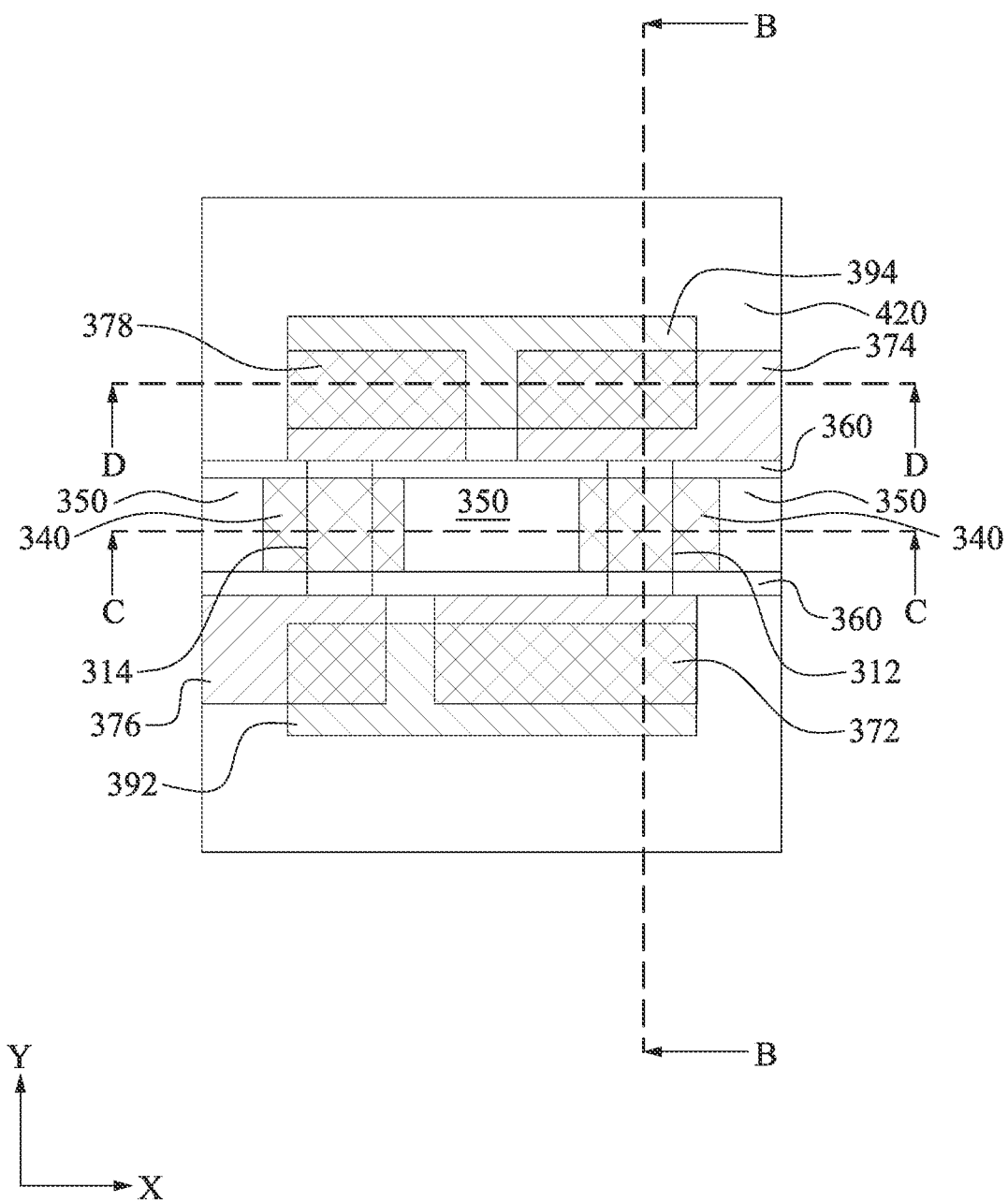
Figure 10B:
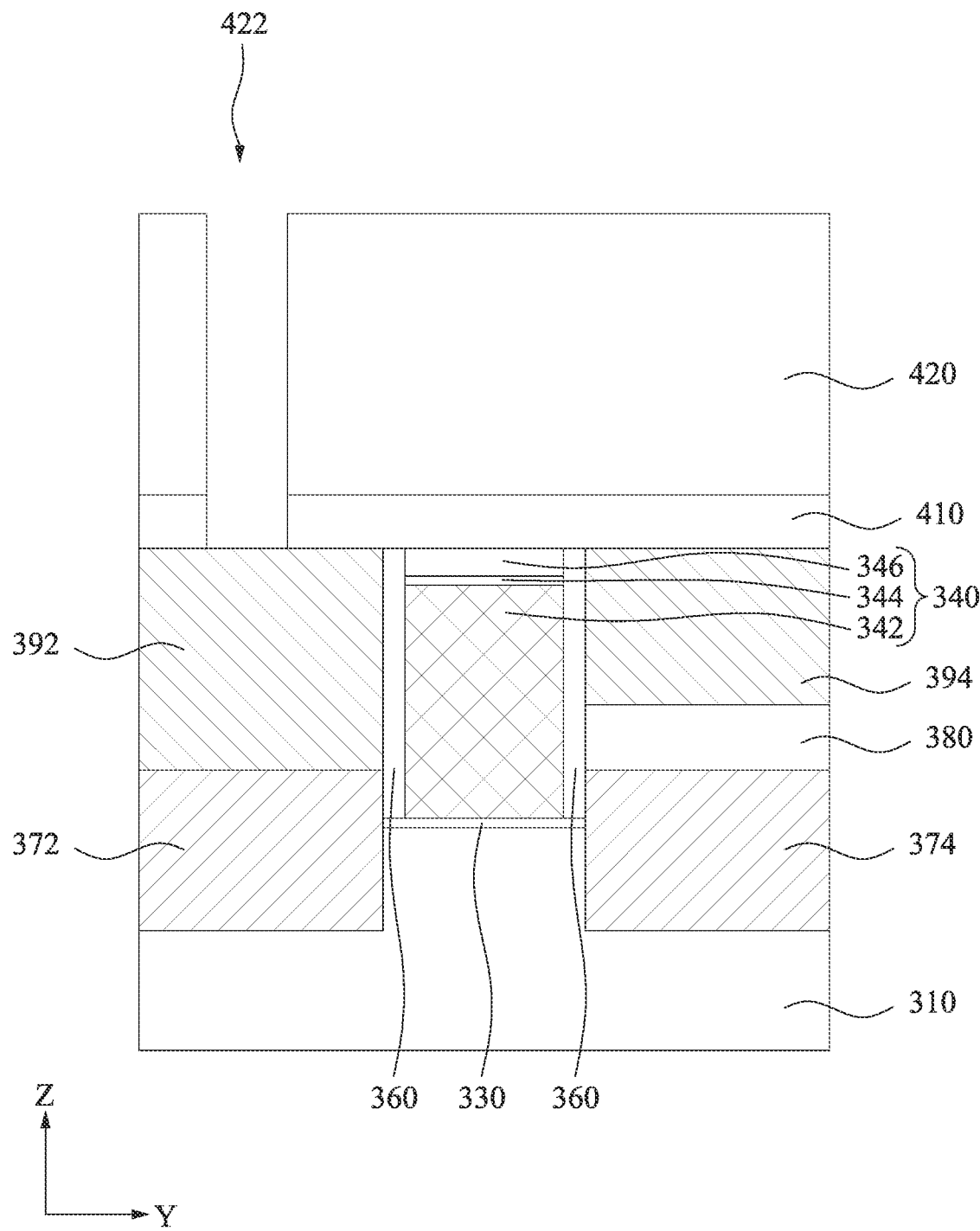
Figure 10C:
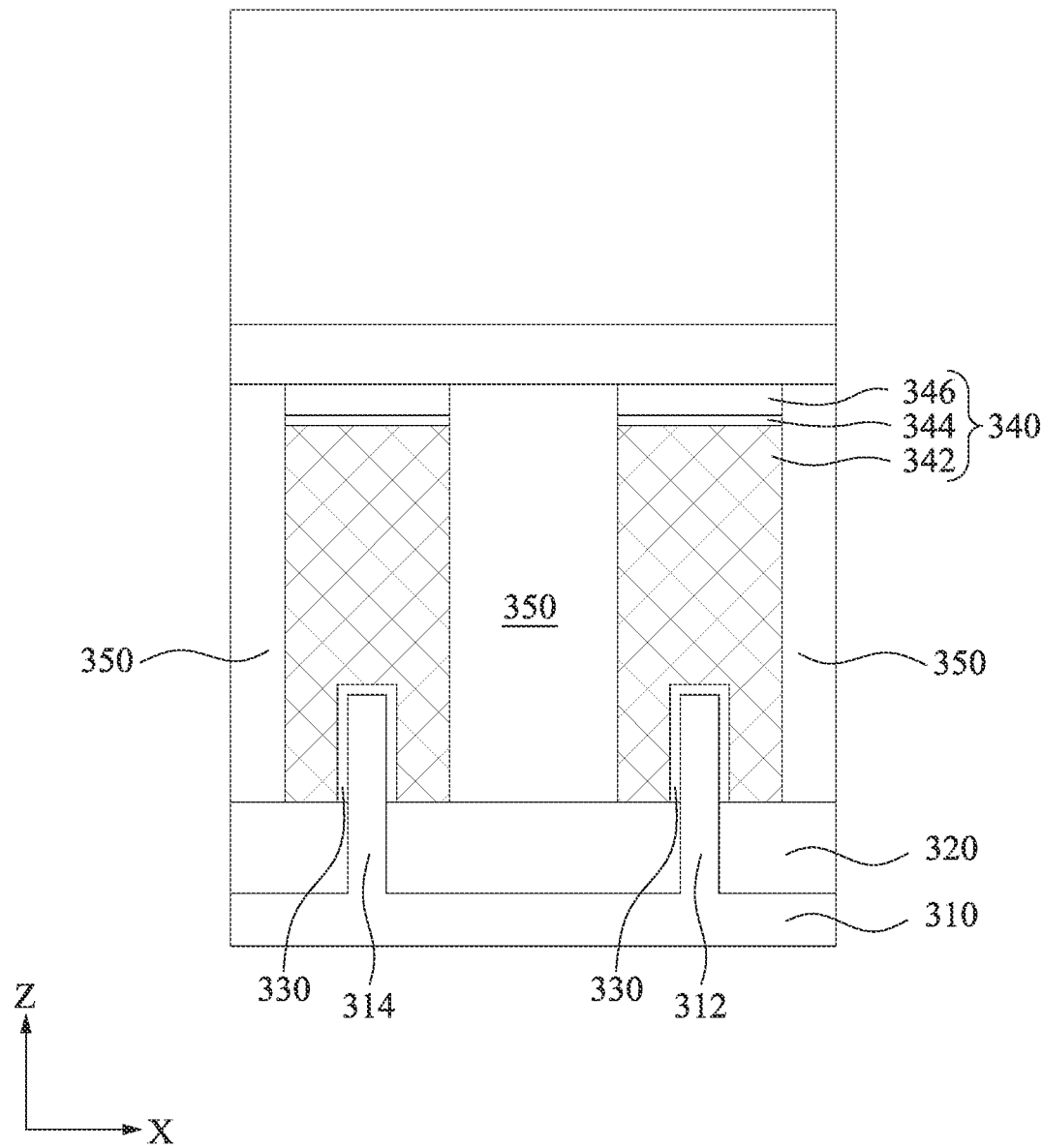
Figure 10D:
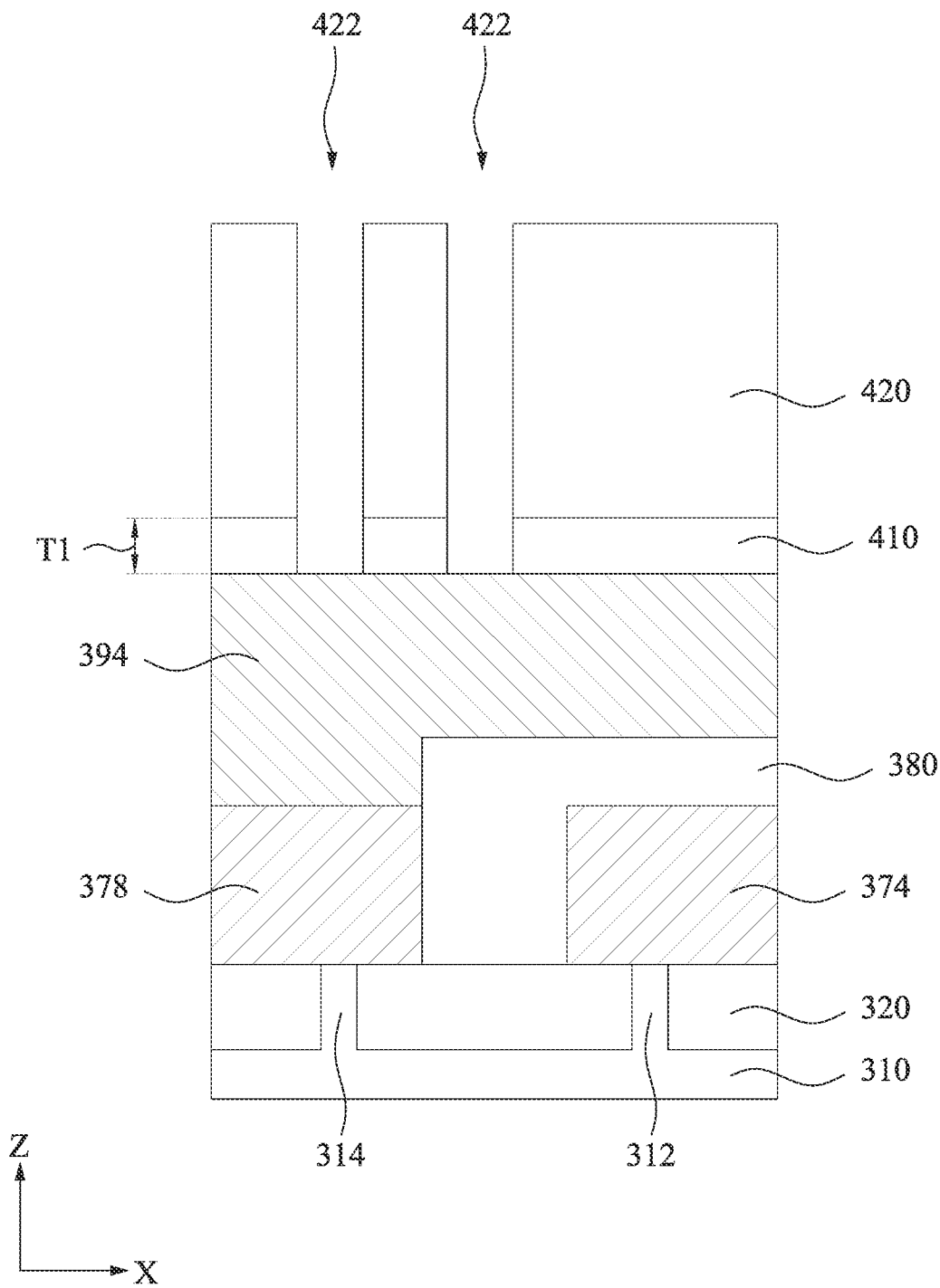

FIG. 10A is a top view of a memory cell at various stages in accordance with some embodiments of the present disclosure, FIG. 10B is a cross-sectional view taken along line B-B in FIG. 10A, FIG. 10C is a cross-sectional view taken along line C-C in FIG. 10A, and FIG. 10D is a cross-sectional view taken along line D-D in FIG. 10A. An etch stop layer (ESL) 410 and a first interlayer dielectric (ILD) 420 are sequentially formed over the structure of FIGS. 9A-9D. The ESL 410 may include SiN, SiON, SiOCN, SiCN, or combinations thereof. The ESL 410 is formed of a material that has a high etching selectivity with the first ILD 420, and hence the ESL 410 may be used to stop the etching of first ILD 420. The first ILD 420 may include, for example, silicon oxide, low-k silicon oxide such as a porous silicon oxide layer, other suitable dielectric material, combinations thereof, or the like. Next, a plurality of openings 422 are formed in the first ILD 420 and the ESL 410 to expose the source/drain features 392 and 394. For clarity, the openings 422 are shown in FIGS. 10B-10D and are omitted in FIG. 10A. In some embodiments, a thickness T1 of the ESL 410 is in a range of about 4 nm to about 50 nm. If the thickness T1 is less than about 4 nm, a short channel problem may occur; if the thickness T1 is greater than about 50 nm, the size of the memory cell may be increased.

Figure 11A:
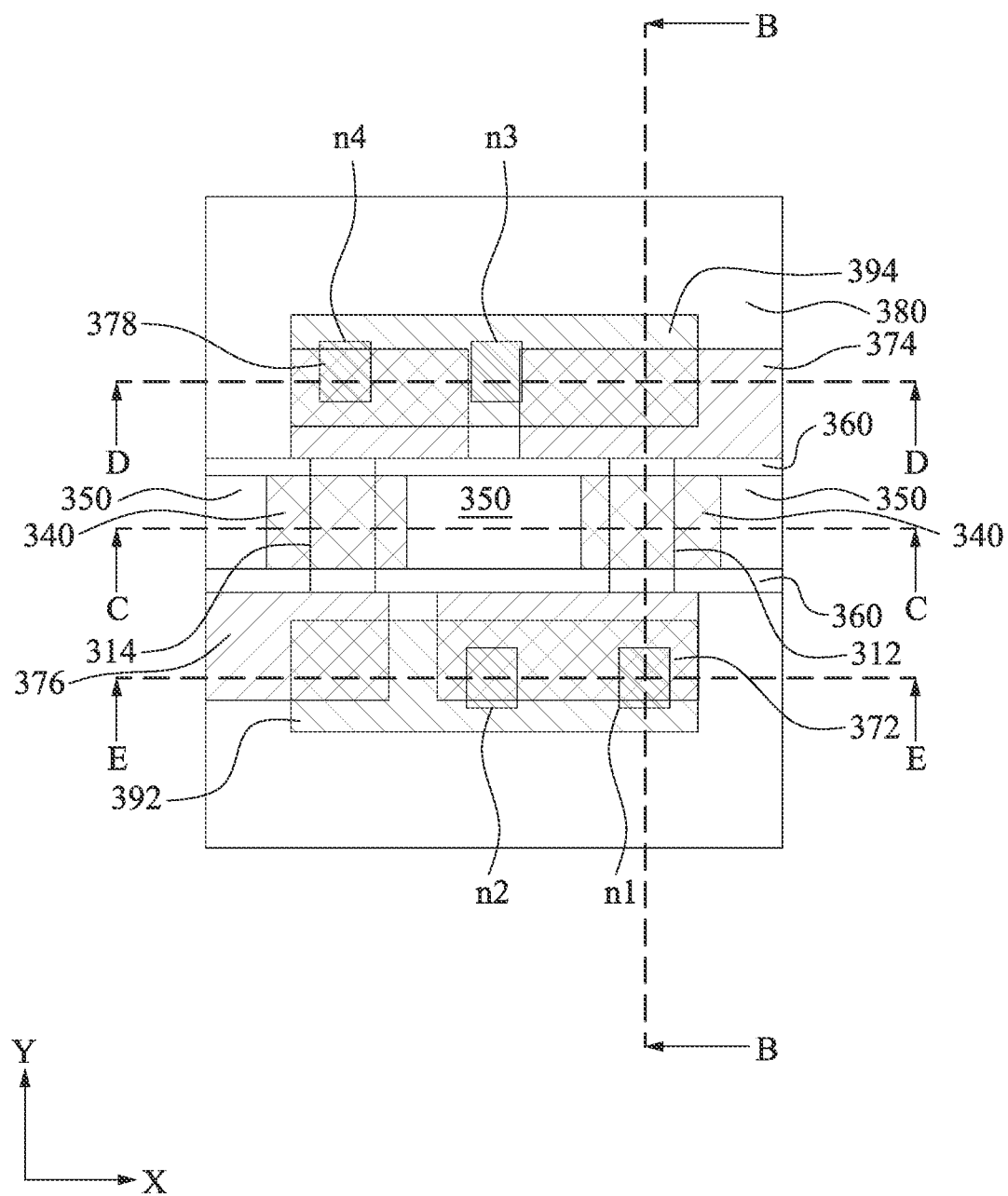
Figure 11B:
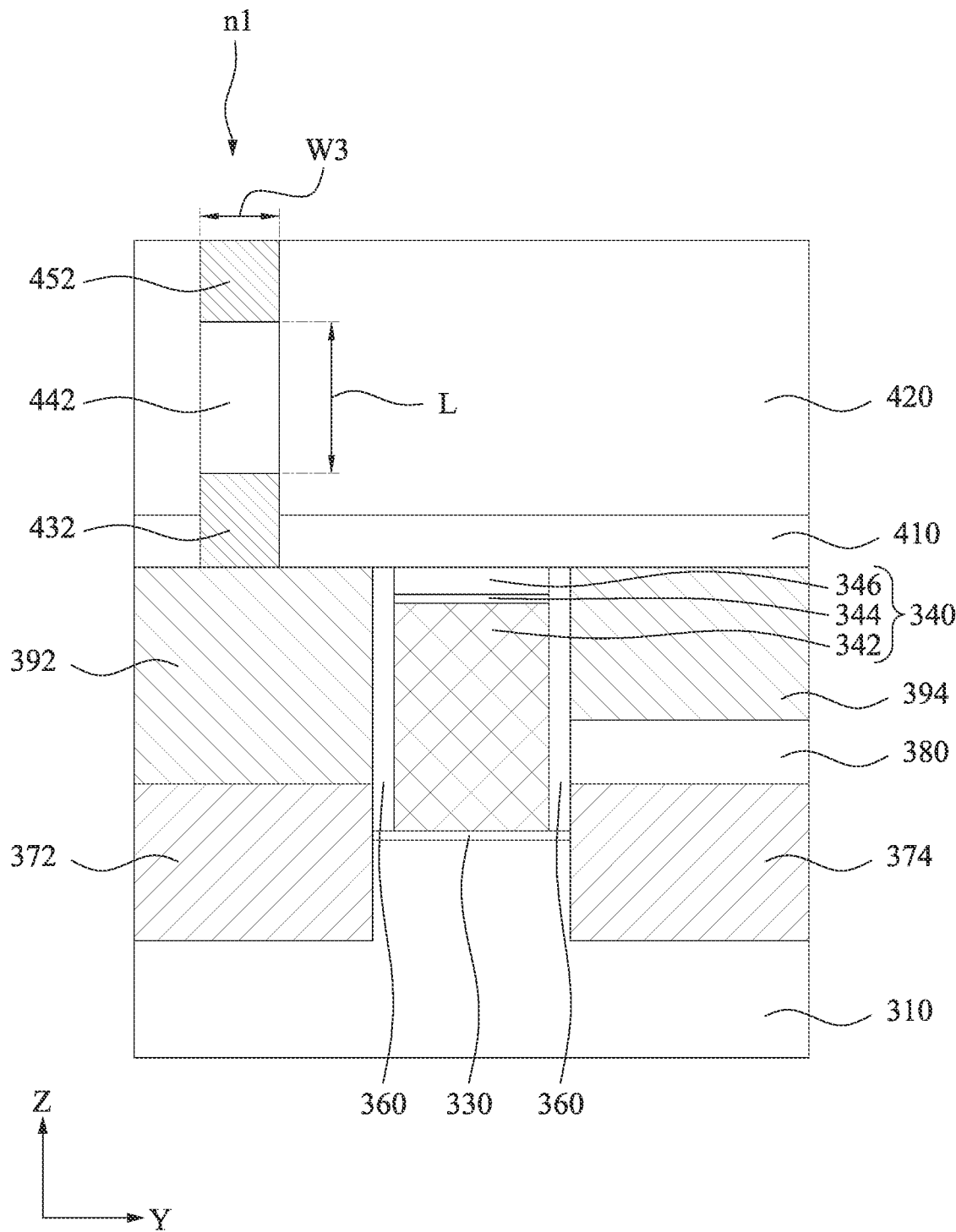
Figure 11C:
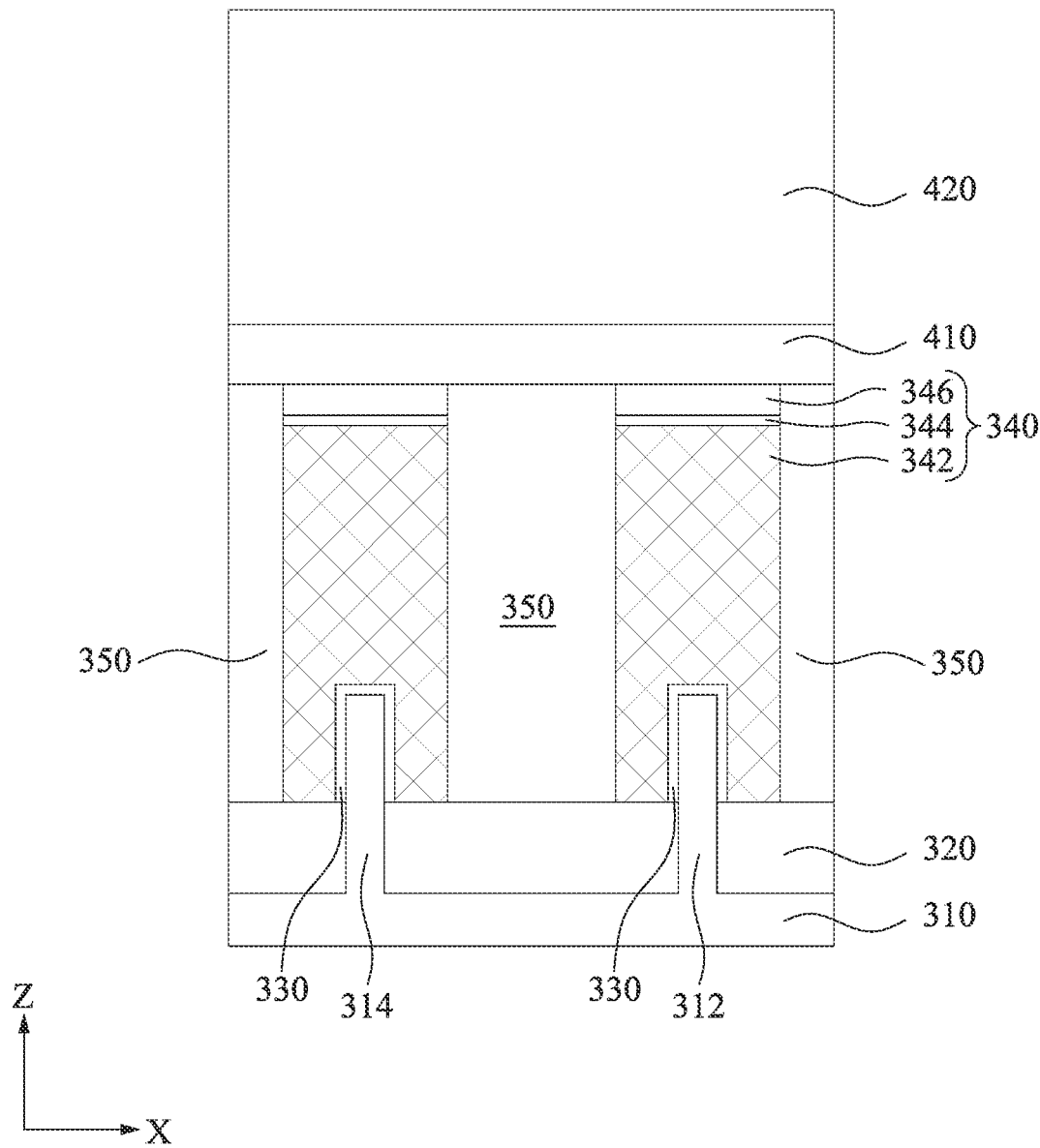
Figure 11D:
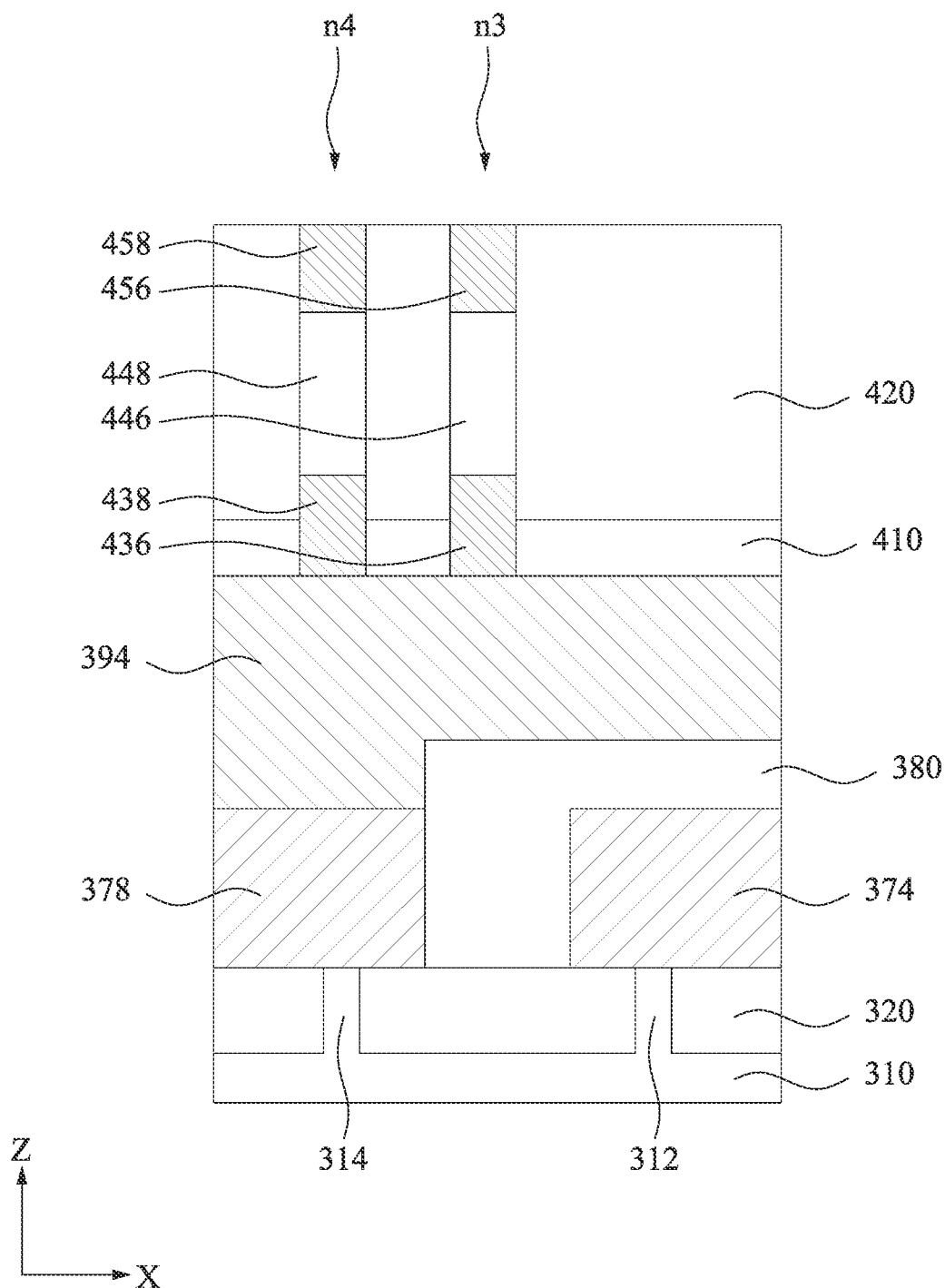
Figure 11E:
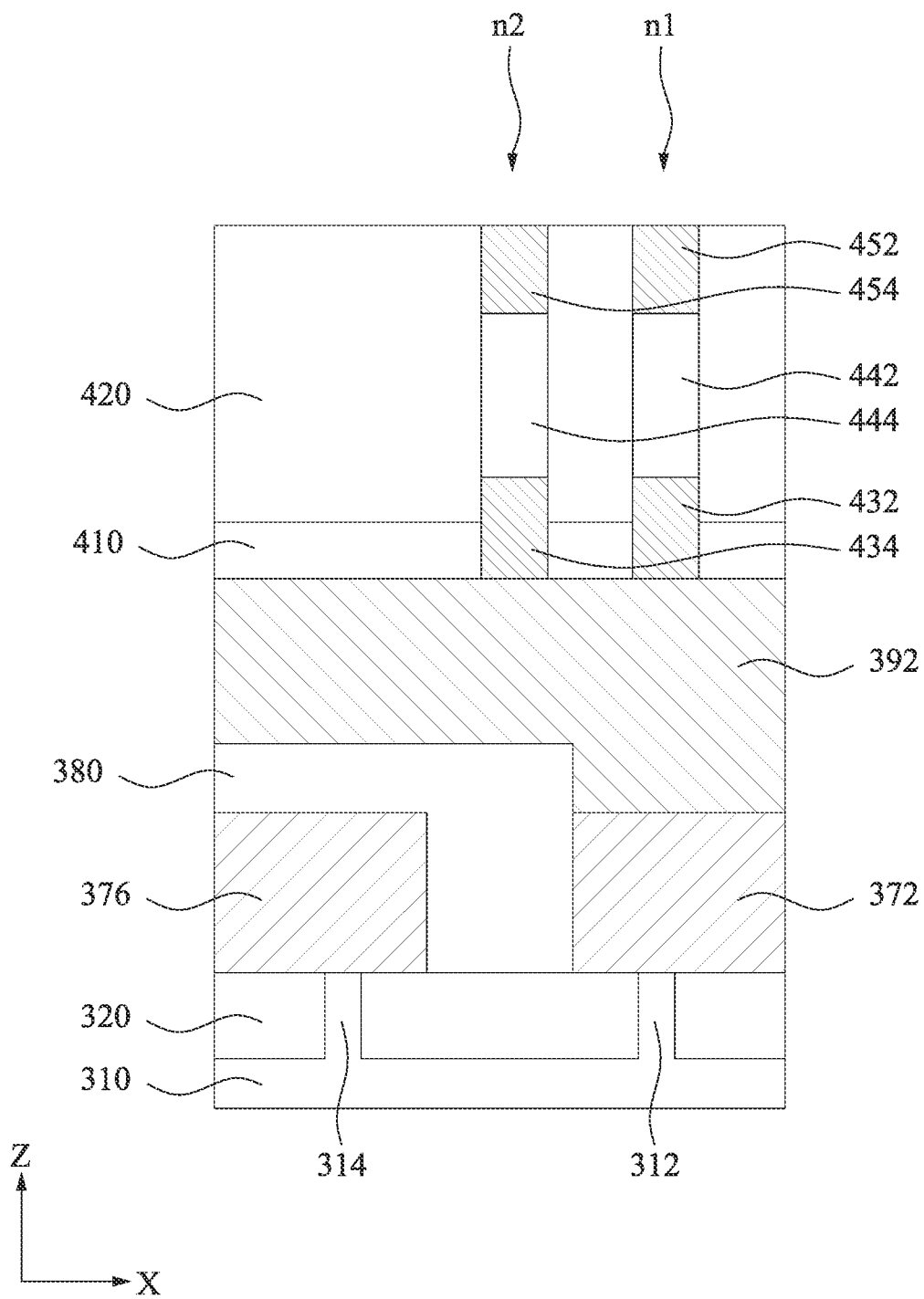

FIG. 11A is a top view of a memory cell at various stages in accordance with some embodiments of the present disclosure, FIG. 11B is a cross-sectional view taken along line B-B in FIG. 11A, FIG. 11C is a cross-sectional view taken along line C-C in FIG. 11A, FIG. 11D is a cross-sectional view taken along line D-D in FIG. 11A, and FIG. 11E is a cross-sectional view taken along line E-E in FIG. 11A. A plurality of bottom source/drain features 432, 434, 436, and 438 are formed above the source/drain features 392 and 394 and respectively in the openings 422 (see FIGS. 10B-10D). In some embodiments, the bottom source/drain features 432, 434, 436, and 438 are grown on the source/drain features 392 and 394 in a bottom-up manner. In some embodiments, the bottom source/drain features 432, 434, 436, and 438 have a conductivity type the same as that of the source/drain features 392 and 394. In some embodiments, the bottom source/drain features 432, 434, 436, and 438 have a material the same as that of the source/drain features 392 and 394. In some embodiments, the bottom source/drain features 432, 434, 436, and 438 have a doping concentration substantially the same as that of the source/drain features 392 and 394.

Subsequently, a plurality of channels 442, 444, 446, and 448 are respectively formed above the bottom source/drain features 432, 434, 436, and 438 and respectively in the openings 422. In some embodiments, the channels 442, 444, 446, and 448 are grown on the bottom source/drain features 432, 434, 436, and 438 in a bottom-up manner. In some embodiments, the channels 442, 444, 446, and 448 are undoped. In some embodiments, the channels 442, 444, 446, and 448 have a material the same as that of the bottom source/drain features 432, 434, 436, and 438. In some embodiments, a channel length L of each of the channels 442, 444, 446, and 448 is in a range of about 10 nm to about 100 nm. The channel length L of each of the channels 442, 444, 446, and 448 can be tuned to adjust the threshold voltage of the corresponding transistor (i.e., the transistors PD1, PD2, PG1, and PG2 shown in FIGS. 18A-18D).

Subsequently, a plurality of top source/drain features 452, 454, 456, and 458 are respectively formed above the channels 442, 444, 446, and 448 and respectively in the openings 422. In some embodiments, the top source/drain features 452, 454, 456, and 458 are grown on the channels 442, 444, 446, and 448 in a bottom-up manner. In some embodiments, the top source/drain features 452, 454, 456, and 458 have a conductivity type the same as that of the bottom source/drain features 432, 434, 436, and 438. In some embodiments, the top source/drain features 452, 454, 456, and 458 have a material the same as that of the bottom source/drain features 432, 434, 436, and 438. In some embodiments, the top source/drain features 452, 454, 456, and 458 have a doping concentration substantially the same as that of the bottom source/drain features 432, 434, 436, and 438.

As such, the bottom source/drain feature 432, the channel 442, and the top source/drain feature 452 form a nanowire n1, the bottom source/drain feature 434, the channel 444, and the top source/drain feature 454 form a nanowire n2, the bottom source/drain feature 436, the channel 446, and the top source/drain feature 456 form a nanowire n3, and the bottom source/drain feature 438, the channel 448, and the top source/drain feature 458 form a nanowire n4. In some embodiments, each of the nanowires n1-n4 have a width (or length or diameter) W3 in a range of about 4 nm to about 20 nm.

Figure 12A:
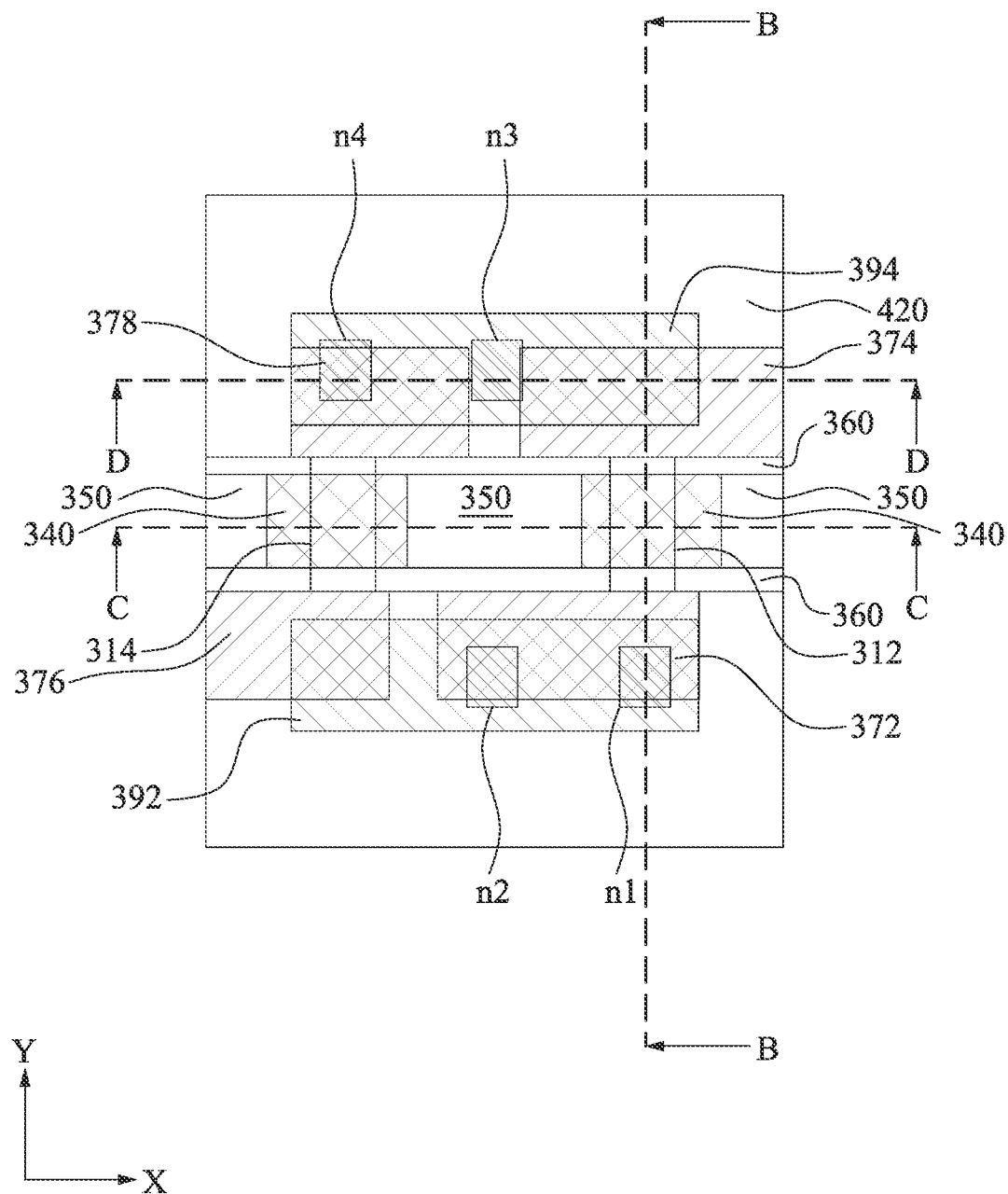
Figure 12B:
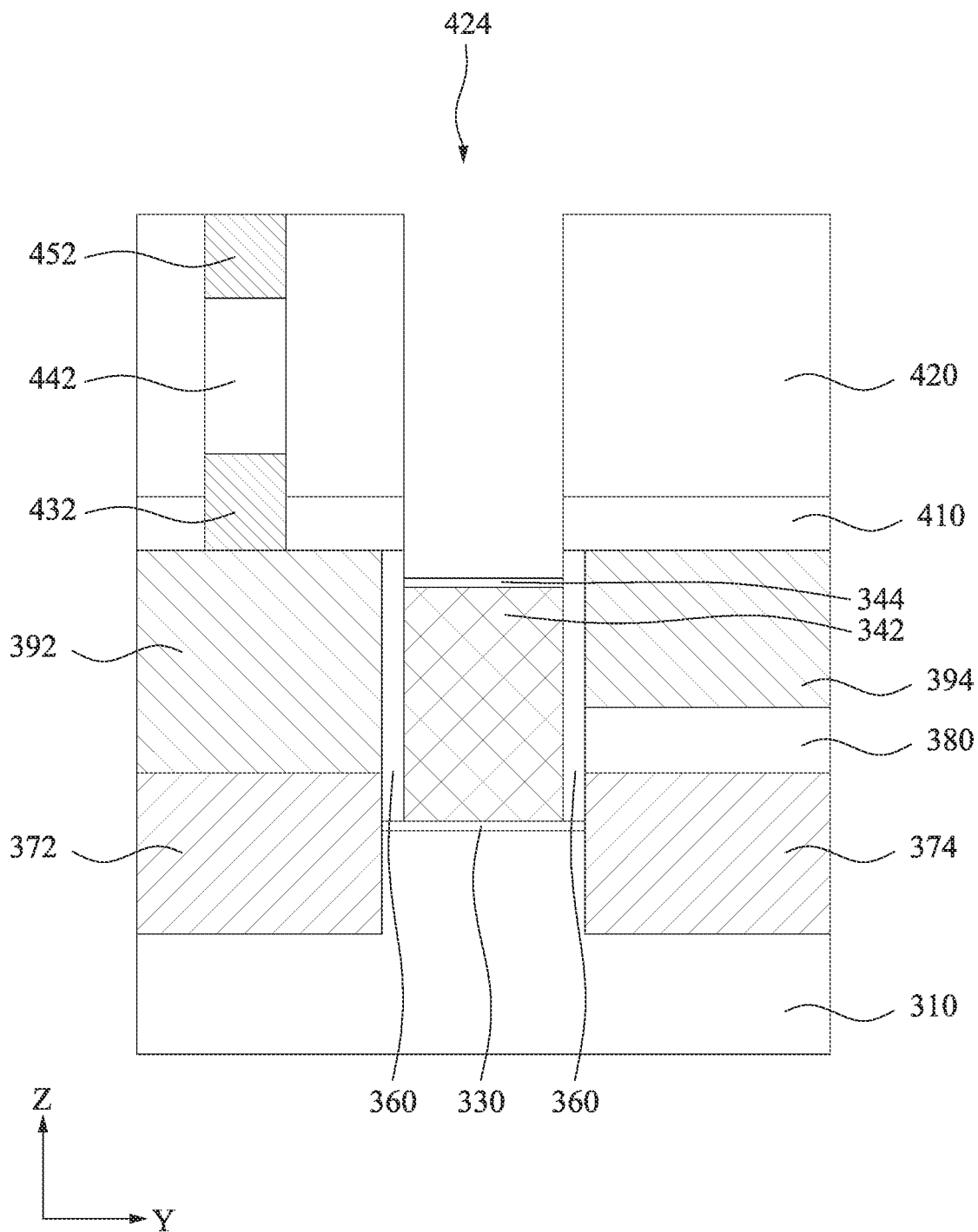
Figure 12C:
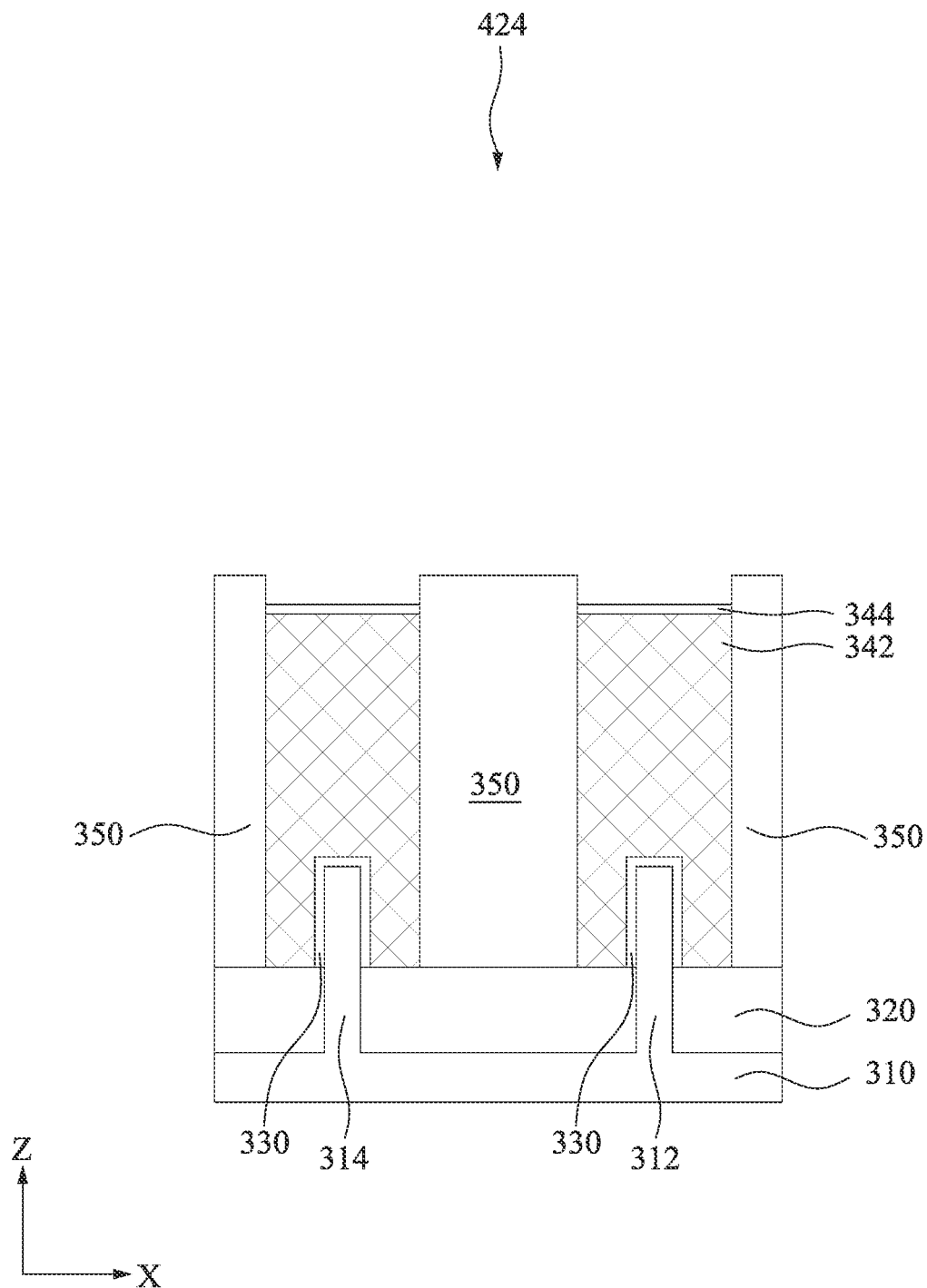
Figure 12D:
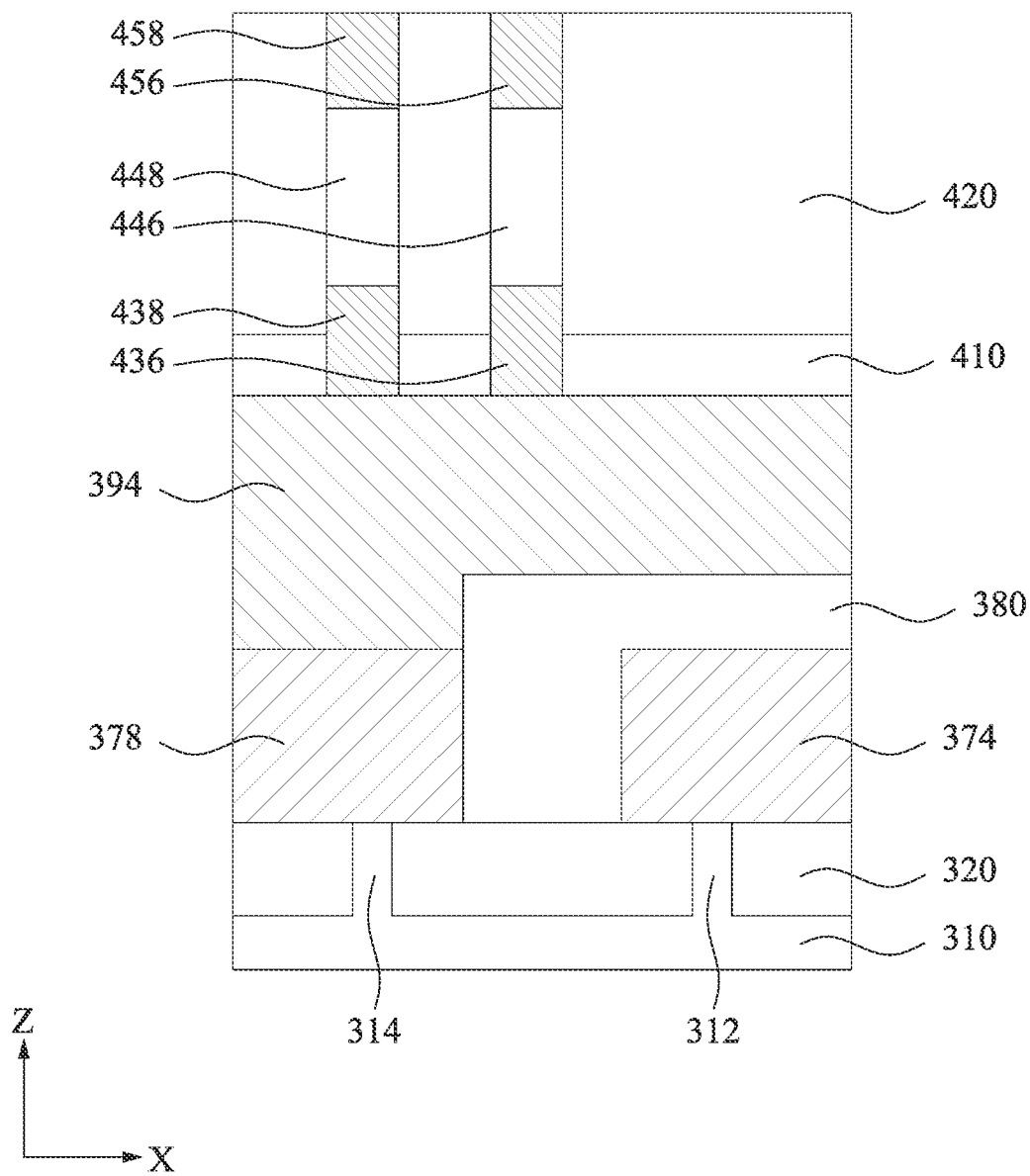

FIG. 12A is a top view of a memory cell at various stages in accordance with some embodiments of the present disclosure, FIG. 12B is a cross-sectional view taken along line B-B in FIG. 12A, FIG. 12C is a cross-sectional view taken along line C-C in FIG. 12A, and FIG. 12D is a cross-sectional view taken along line D-D in FIG. 12A. Another two openings 424 are formed in the first ILD 420 and respectively right above the dummy gate structures 340. For clarity, the openings 424 are shown in FIGS. 12B and 12C and are omitted in FIG. 12A. The openings 424 expose portions of the ESL 410, which are removed using the first ILD 420 as an etching mask. The mask layers 346 (see FIGS. 11B and 11C) are then exposed and be removed as well.

Figure 13A:
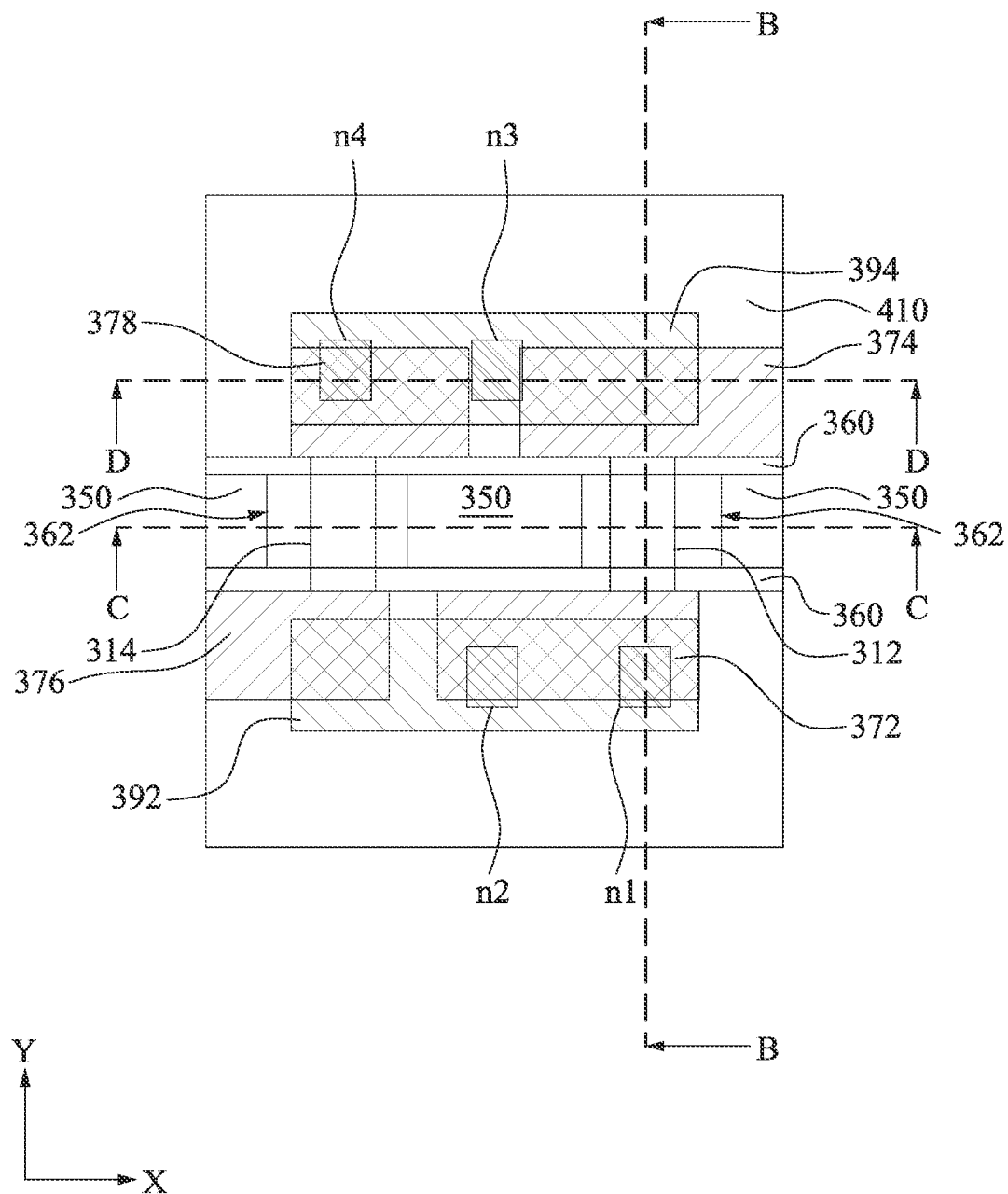
Figure 13B:
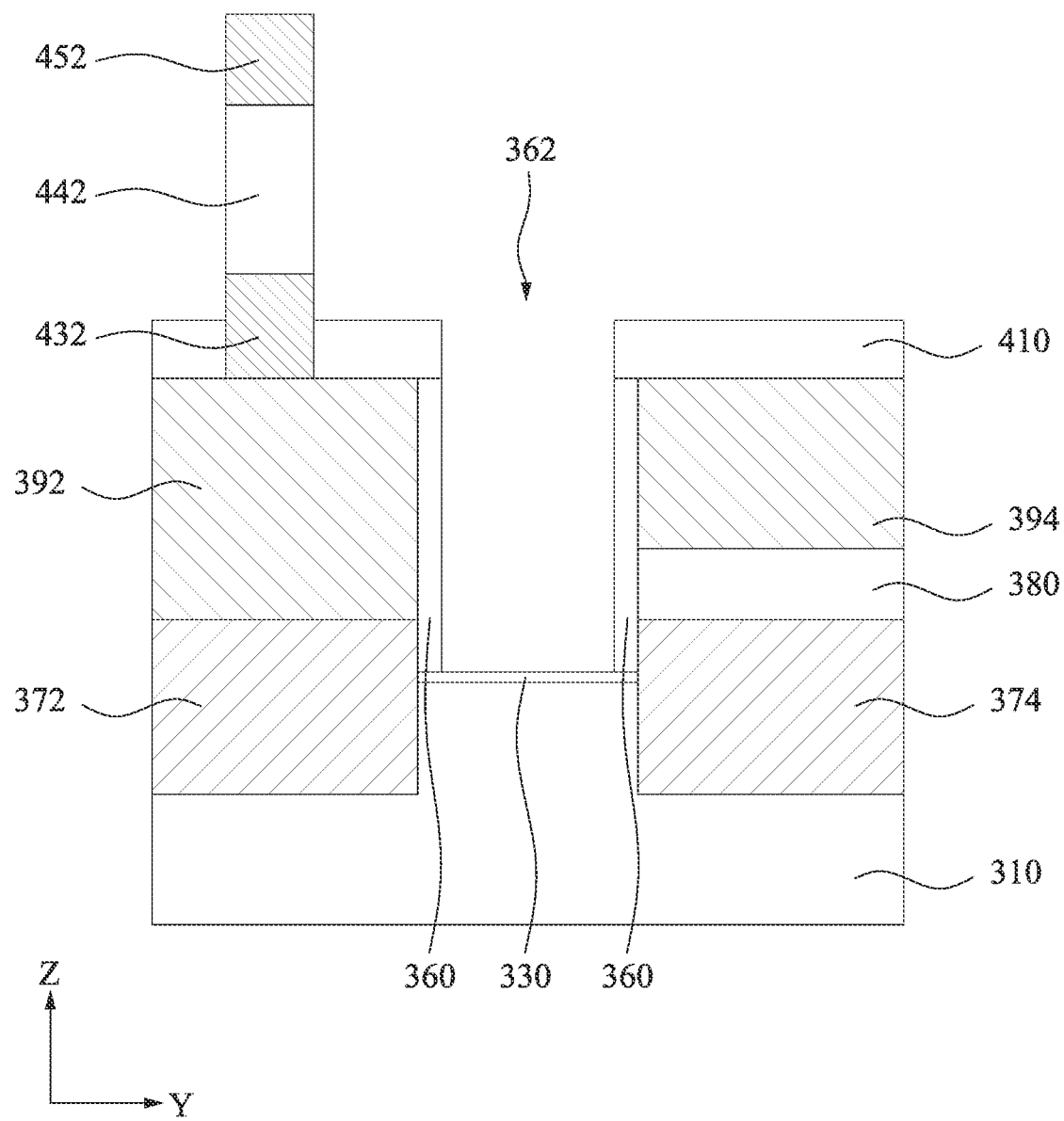
Figure 13C:
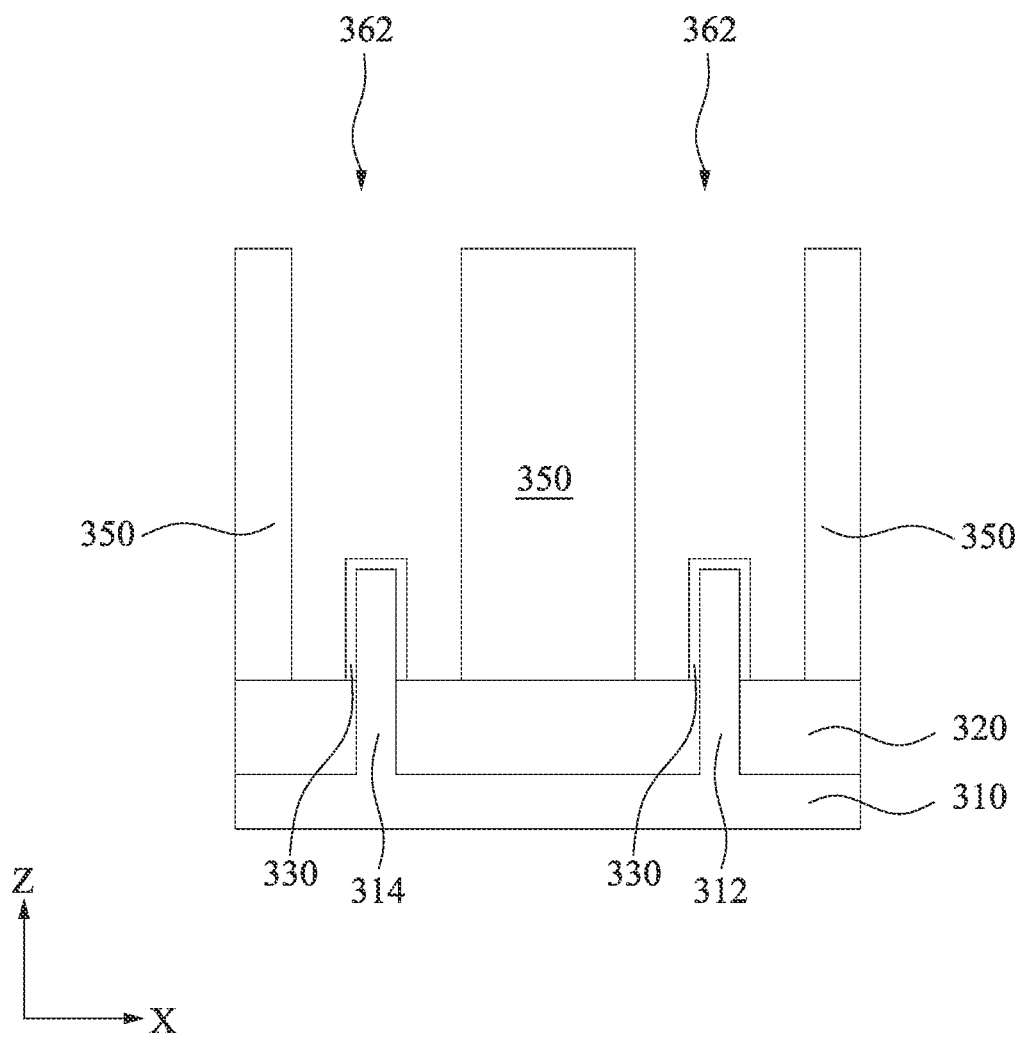
Figure 13D:
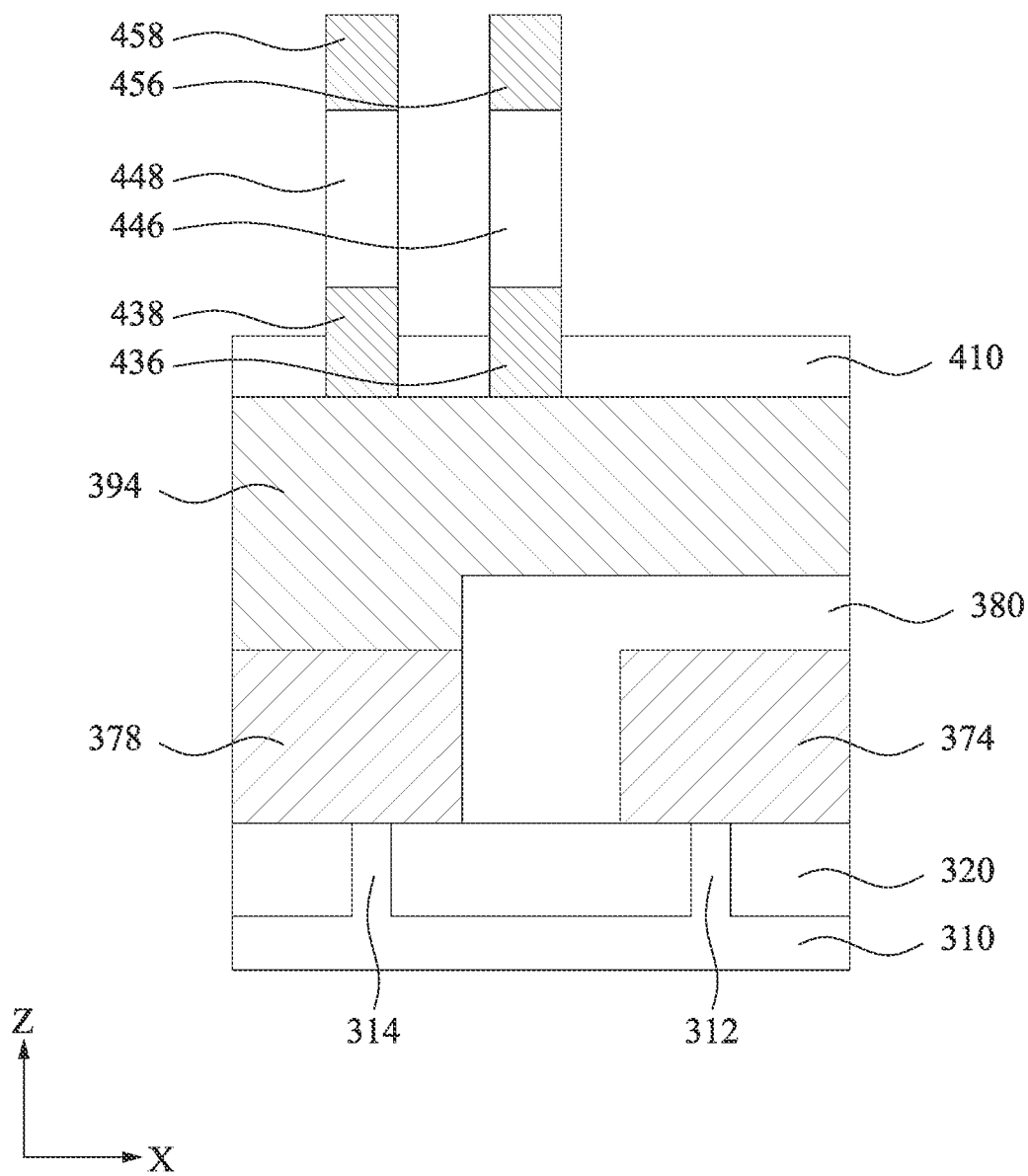

FIG. 13A is a top view of a memory cell at various stages in accordance with some embodiments of the present disclosure, FIG. 13B is a cross-sectional view taken along line B-B in FIG. 13A, FIG. 13C is a cross-sectional view taken along line C-C in FIG. 13A, and FIG. 13D is a cross-sectional view taken along line D-D in FIG. 13A. The ILD 420 (see FIGS. 12A-12D) as well as the pad layers 344 (see FIGS. 12A-12D) are removed, and the dummy gate layers 342 (see FIGS. 12A-12D) are exposed. Also, sidewalls of the nanowires n1-n4 are exposed. The dummy gate layers 342 are then removed to form gate trenches 362 with the gate spacers 360 as their sidewalls. In some embodiments, a trimming process is performed to the nanowires n1-n4 to tune a dimension (e.g., the width W3 in FIG. 11B) of the nanowires n1-n4. In some embodiments, the trimming process is a wet etching process to reduce the widths W3 of the nanowires n1-n4.

Figure 14A:
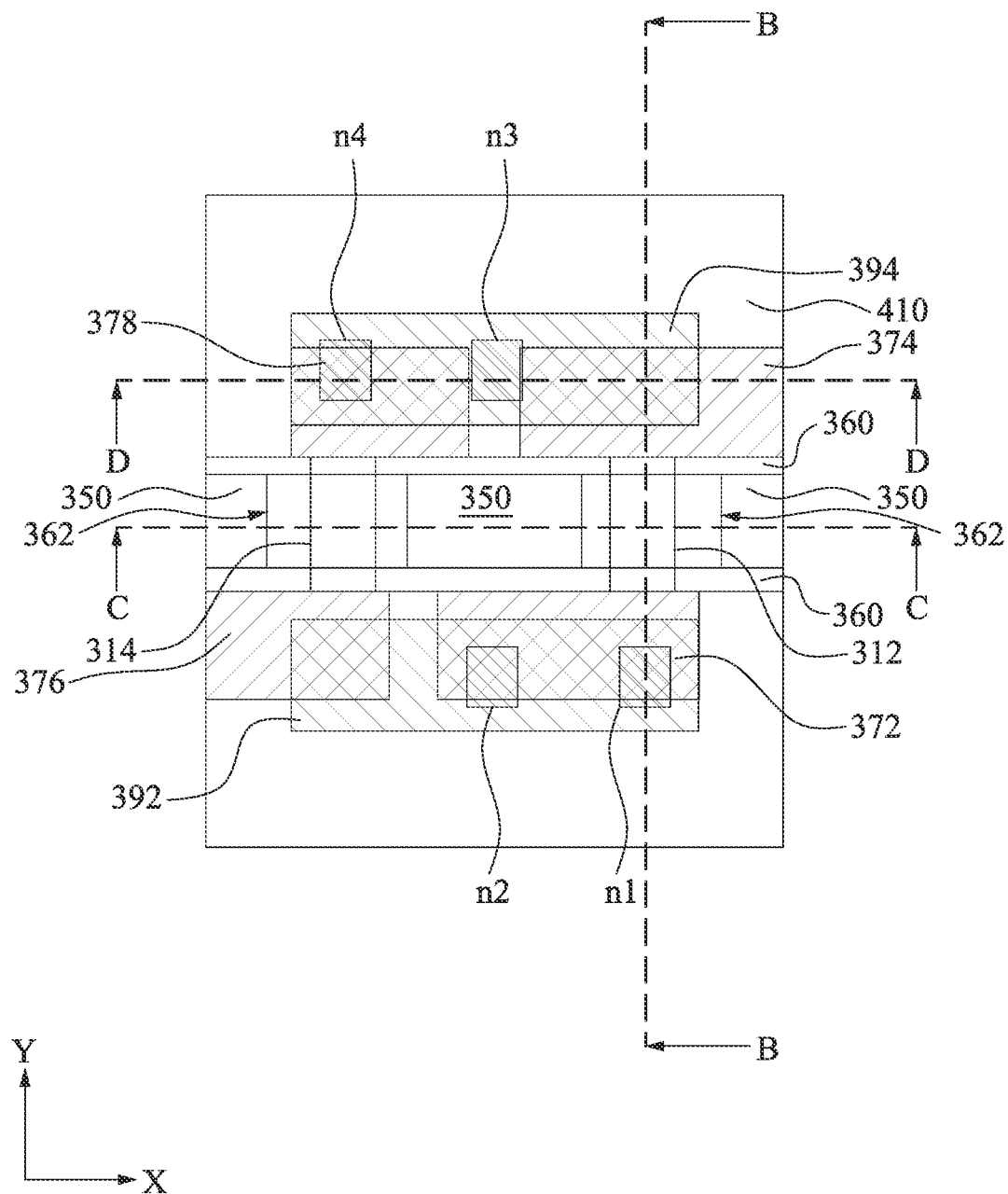
Figure 14B:
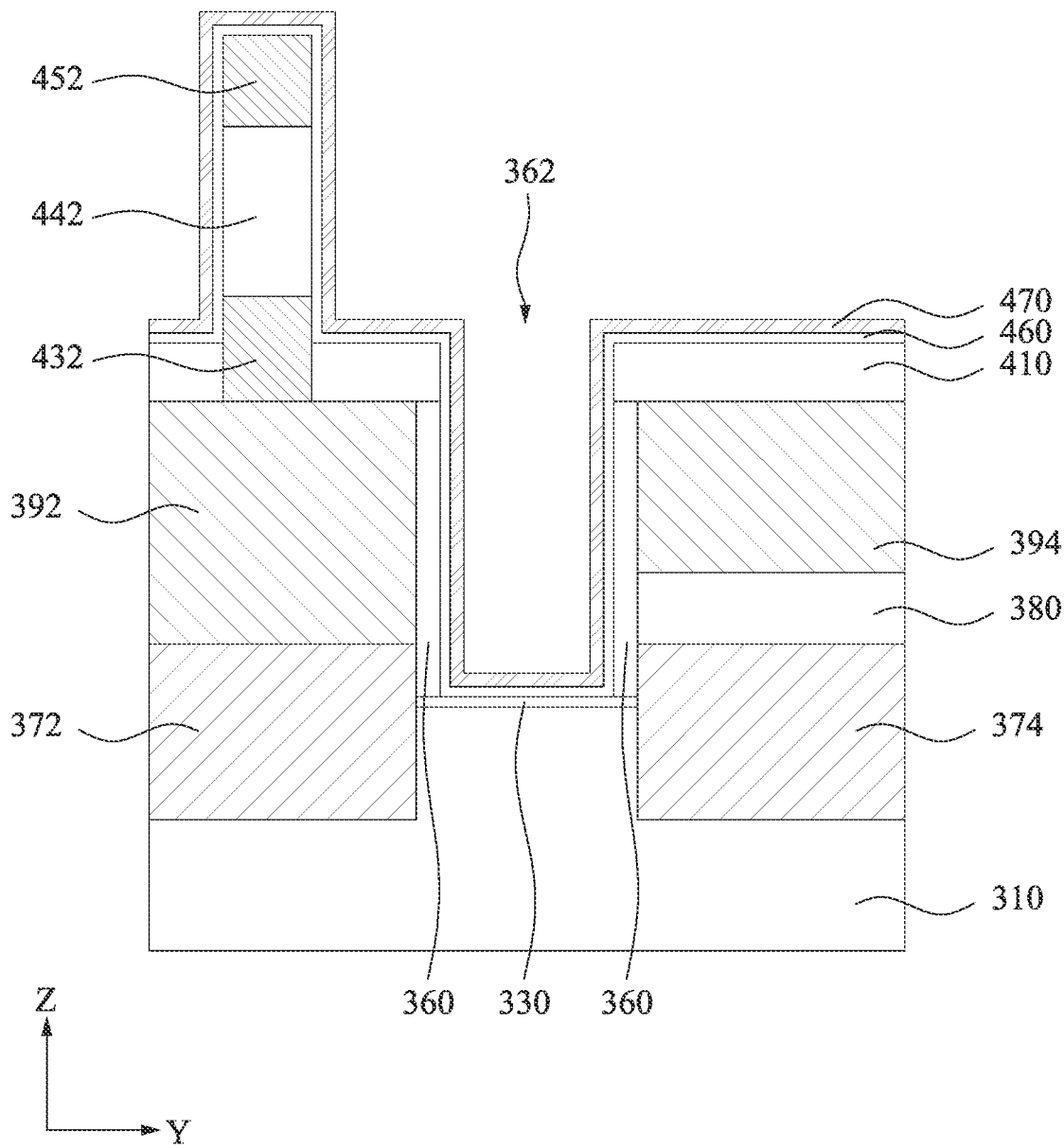
Figure 14C:
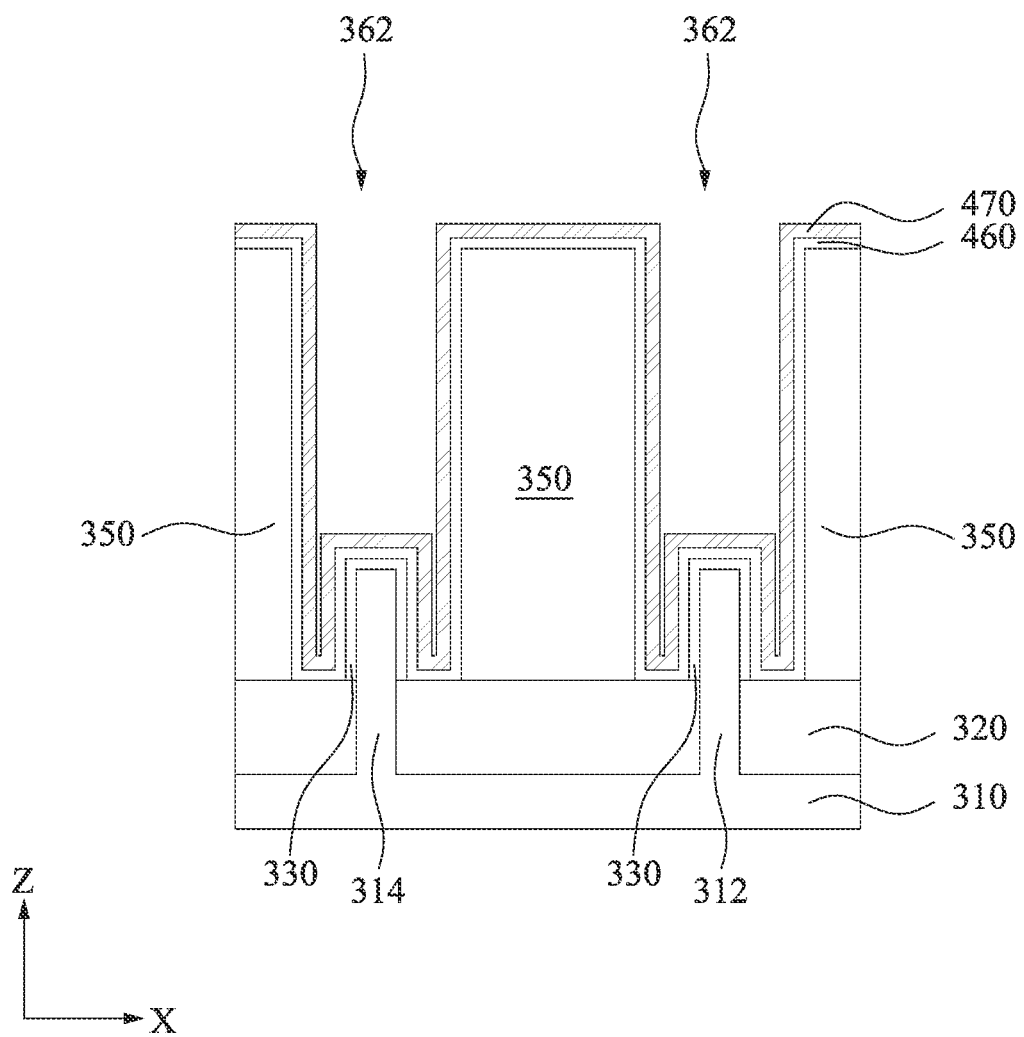
Figure 14D:
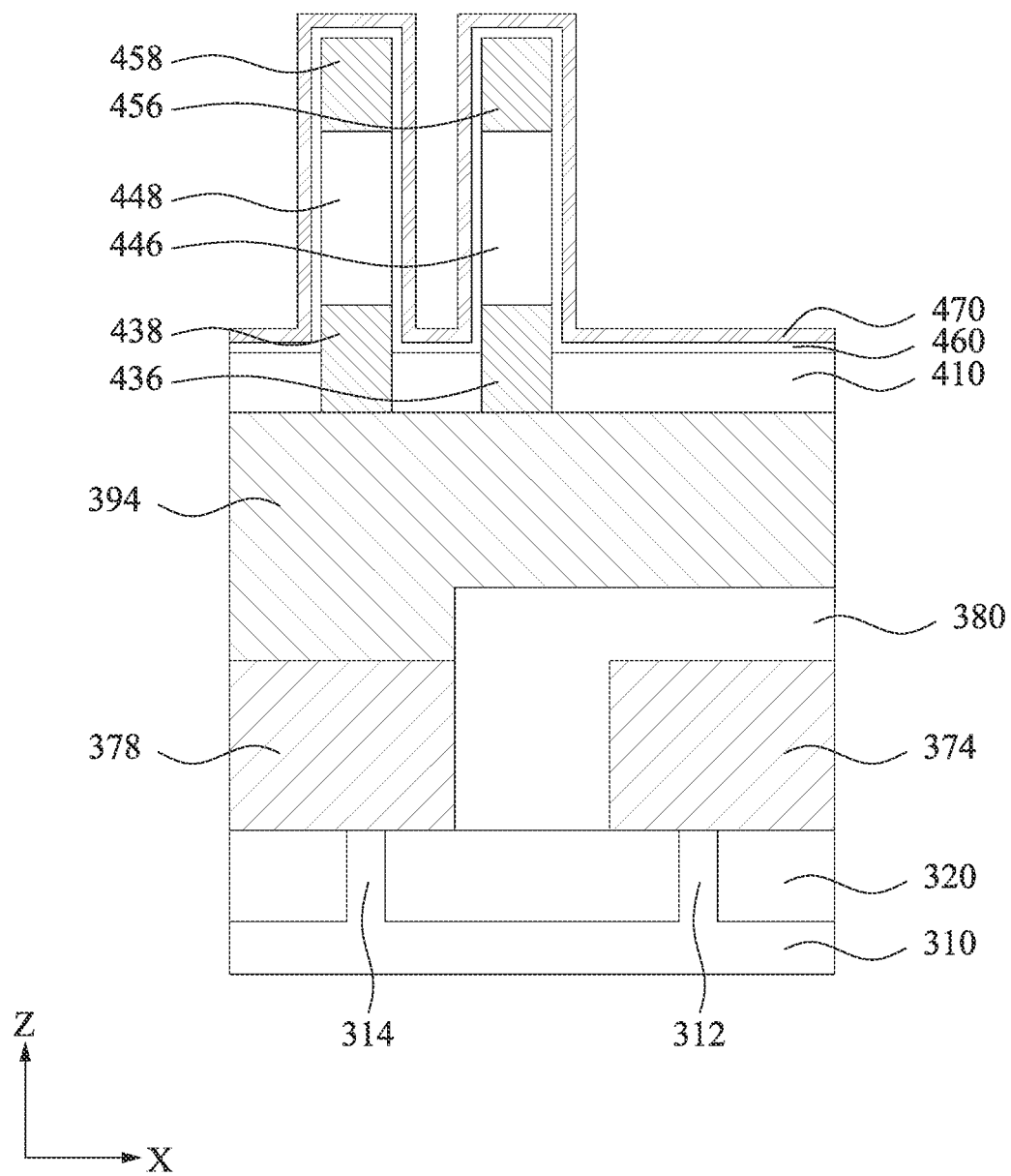

FIG. 14A is a top view of a memory cell at various stages in accordance with some embodiments of the present disclosure, FIG. 14B is a cross-sectional view taken along line B-B in FIG. 14A, FIG. 14C is a cross-sectional view taken along line C-C in FIG. 14A, and FIG. 14D is a cross-sectional view taken along line D-D in FIG. 14A. A gate dielectric layer 460 is conformally formed in the gate trenches 362 and lining top surfaces and sidewalls of the nanowire structures n1-n4. In some embodiments, the gate dielectric layer 460 may be a high dielectric constant (high-κ) dielectric layer having a dielectric constant (κ) higher than the dielectric constant of $SiO_2$, i.e. κ>3.9. The gate dielectric layer 460 may include $HfO_2$, lead zirconate titanate (PZT), LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The gate dielectric layer 460 is deposited by suitable techniques, such as thermal-ALD, PEALD, CVD, PVD, thermal oxidation, combinations thereof, or other suitable techniques.

Subsequently, a first work function metal layer 470 is conformally formed on the gate dielectric layer 460. In some embodiments, the first work function metal layer 470 may include a single layer or multi layers, such as a work function film, a liner film, a wetting film, and an adhesion film. The first work function metal layer 470 may include Ti, TiAl, TiAlN, TaC, TaCN, TaSiN, Mn, Zr, TiN, TaN, Ru, Mo, WN, Co, Al, or any suitable materials. The first work function metal layer 470 may be formed by ALD, PVD, CVD, or other suitable process. In some embodiments, the first work function metal layer 470 is a P-metal. The work function higher than a mid-gap work function (about 4.5 eV), that is in the middle of the valance band and the conduction band of silicon, is referred to as a p-work function, and the respective metal having the p-work function is referred to as a P-metal. For clarity, the gate dielectric layer 460 and the first work function metal layer 470 are shown in FIGS. 14B-14D and not shown in FIG. 14A.

Figure 15A:
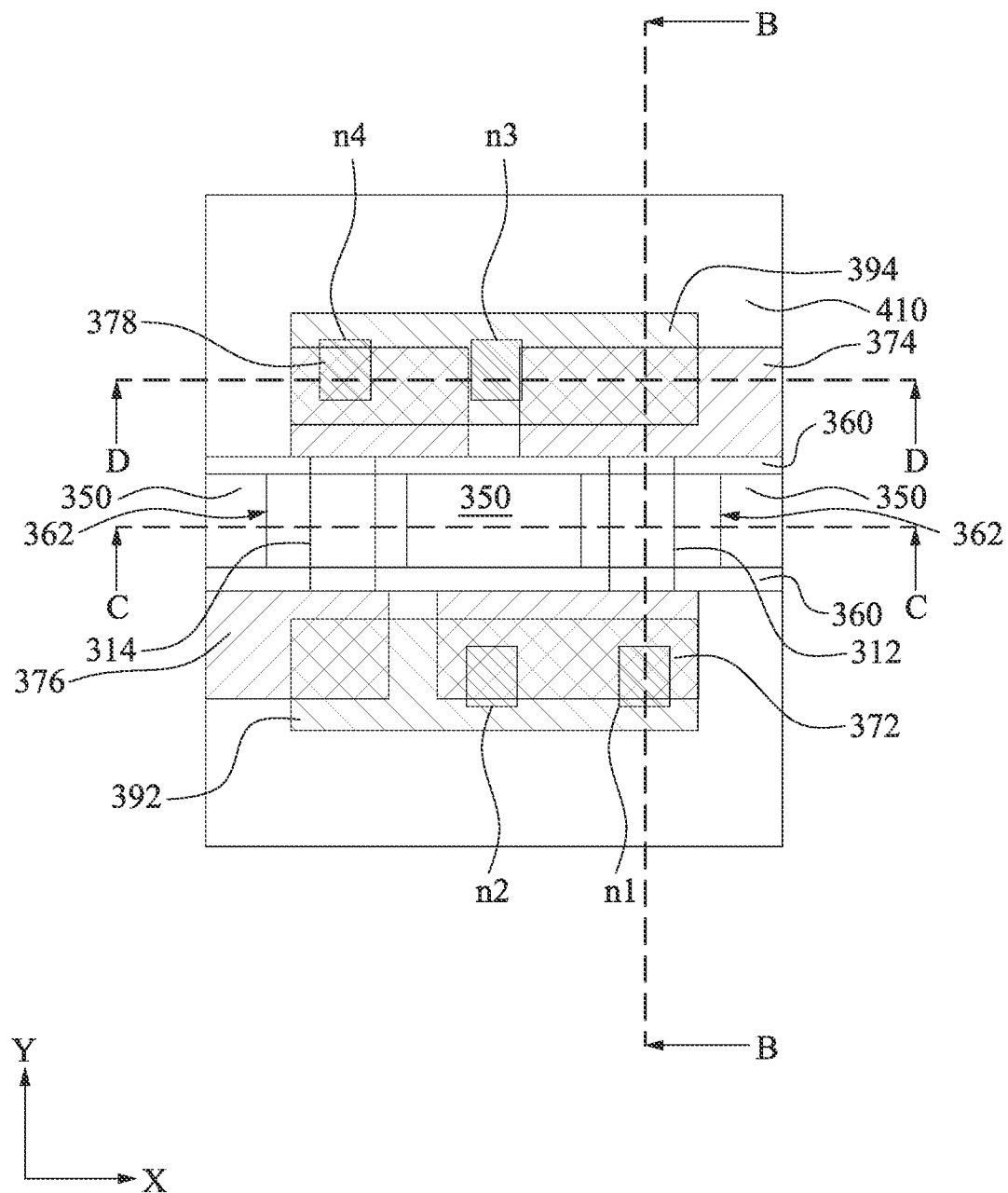
Figure 15B:
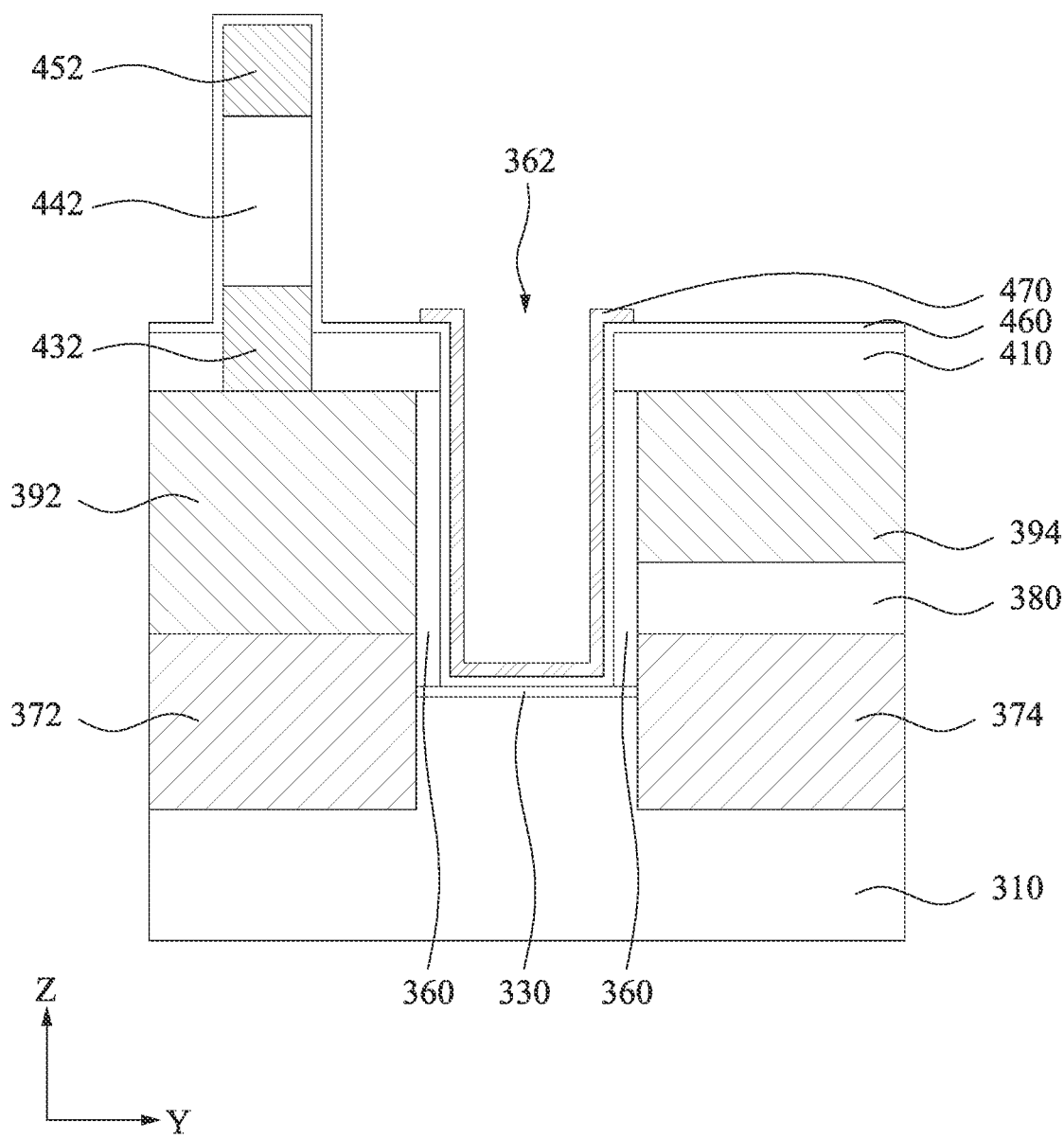
Figure 15C:
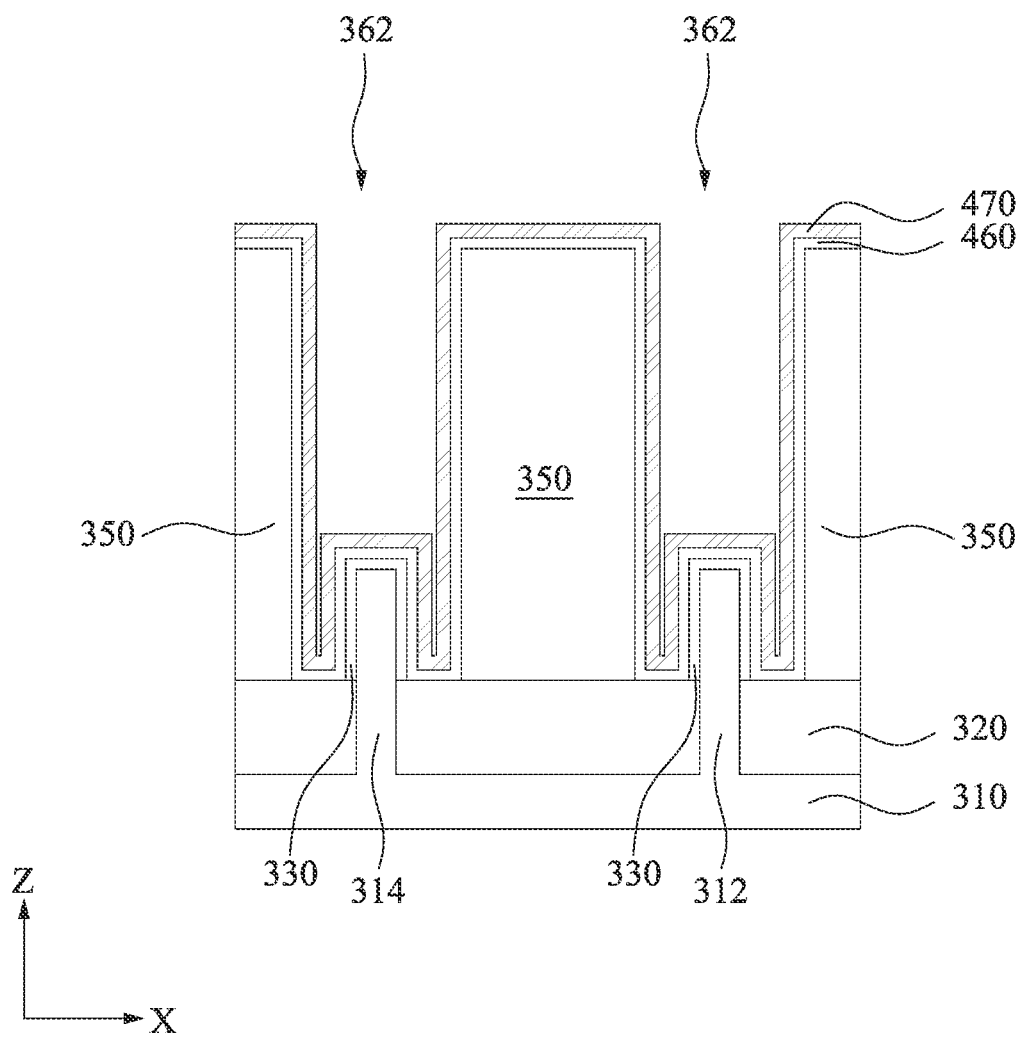
Figure 15D:
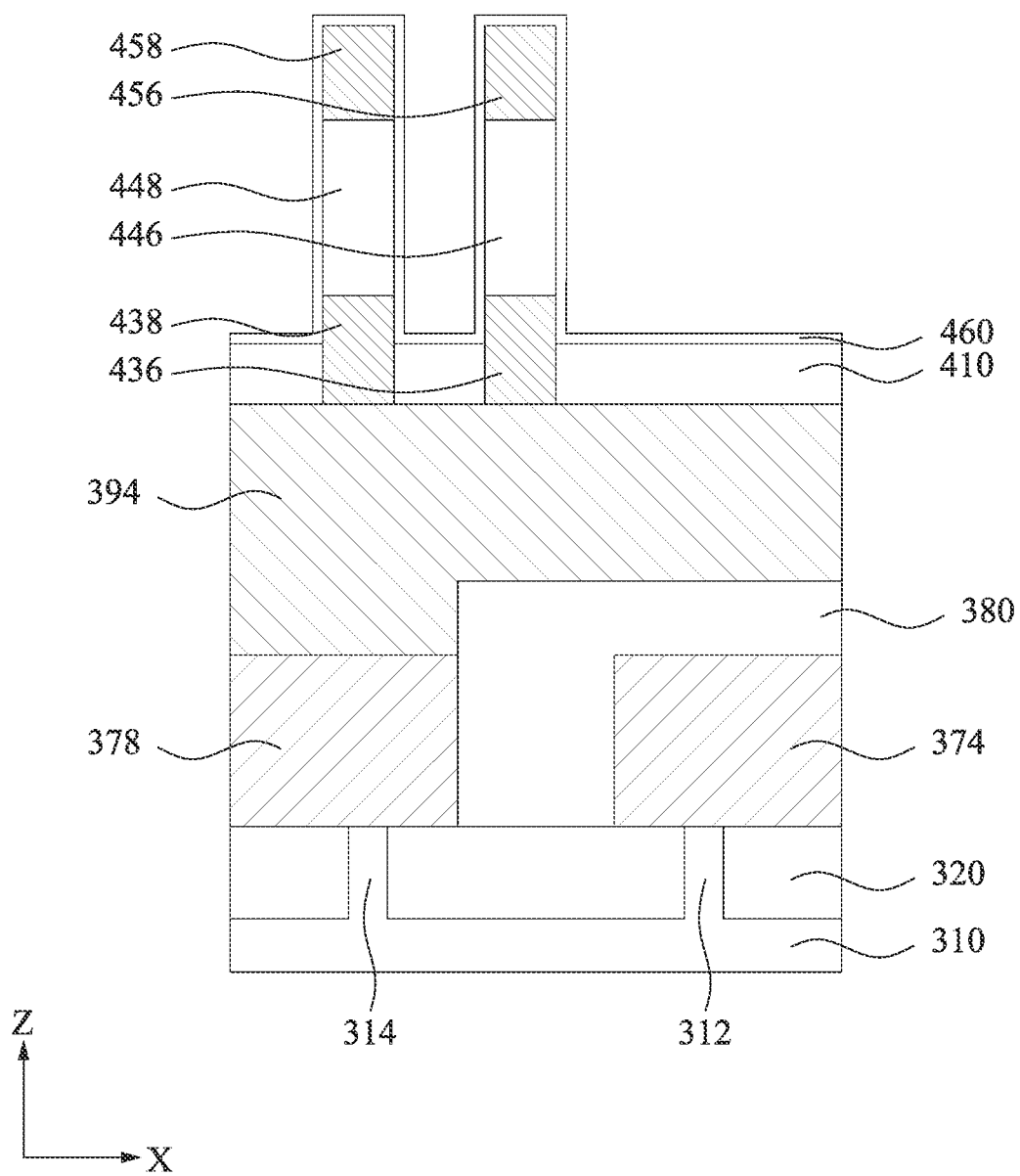

FIG. 15A is a top view of a memory cell at various stages in accordance with some embodiments of the present disclosure, FIG. 15B is a cross-sectional view taken along line B-B in FIG. 15A, FIG. 15C is a cross-sectional view taken along line C-C in FIG. 15A, and FIG. 15D is a cross-sectional view taken along line D-D in FIG. 15A. A patterning process is performed to the first work function metal layer 470. That is, the first work function metal layer 470 is partially removed. In some embodiments, at least a portion of the first work function metal layer 470 above the openings 362 is removed. As such, the first work function metal layer 470 is formed in the openings 362 and not surrounding the nanowires n1-n4. In some embodiments, a mask layer may cover portions of the first work function metal layer 470 in the openings 362 while expose another portions surrounding the nanowires n1-n4. The first work function metal layer 470 is then patterned using the mask layer as an etching mask. The mask layer is then removed after the patterning of the first work function metal layer 470. For clarity, the gate dielectric layer 460 and the first work function metal layer 470 are shown in FIGS. 15B-15D and not shown in FIG. 15A.

Figure 16A:
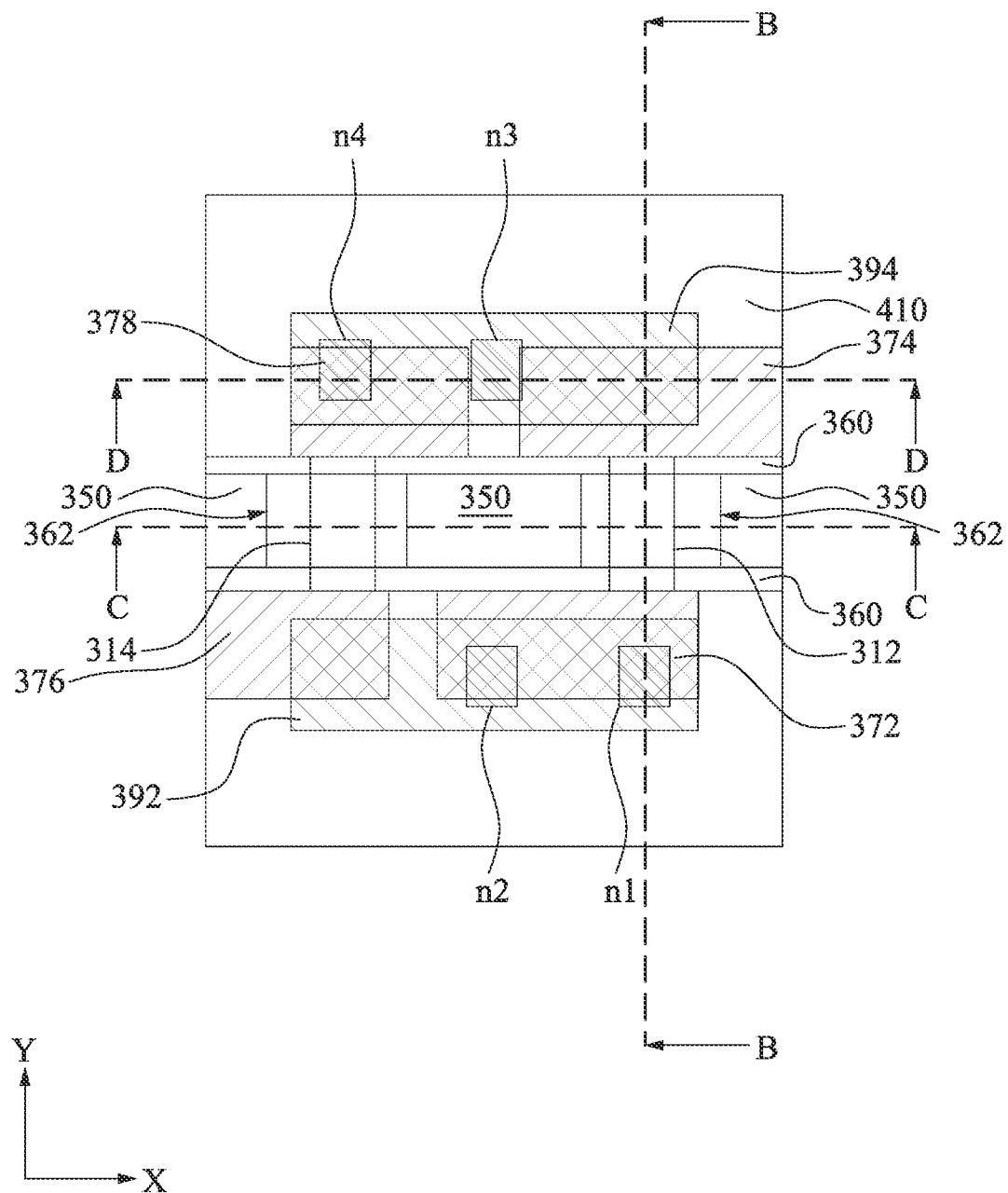
Figure 16B:
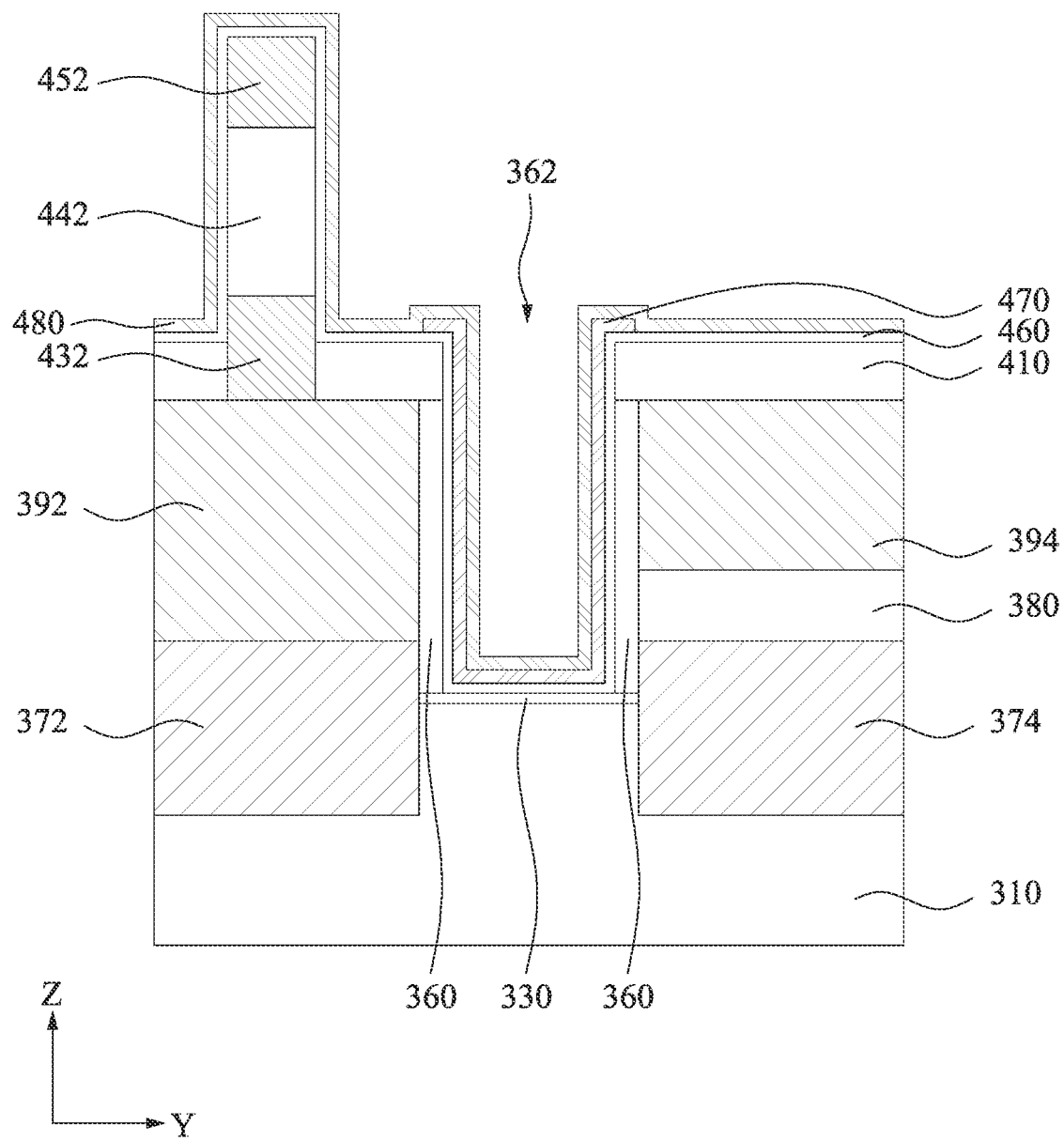
Figure 16C:
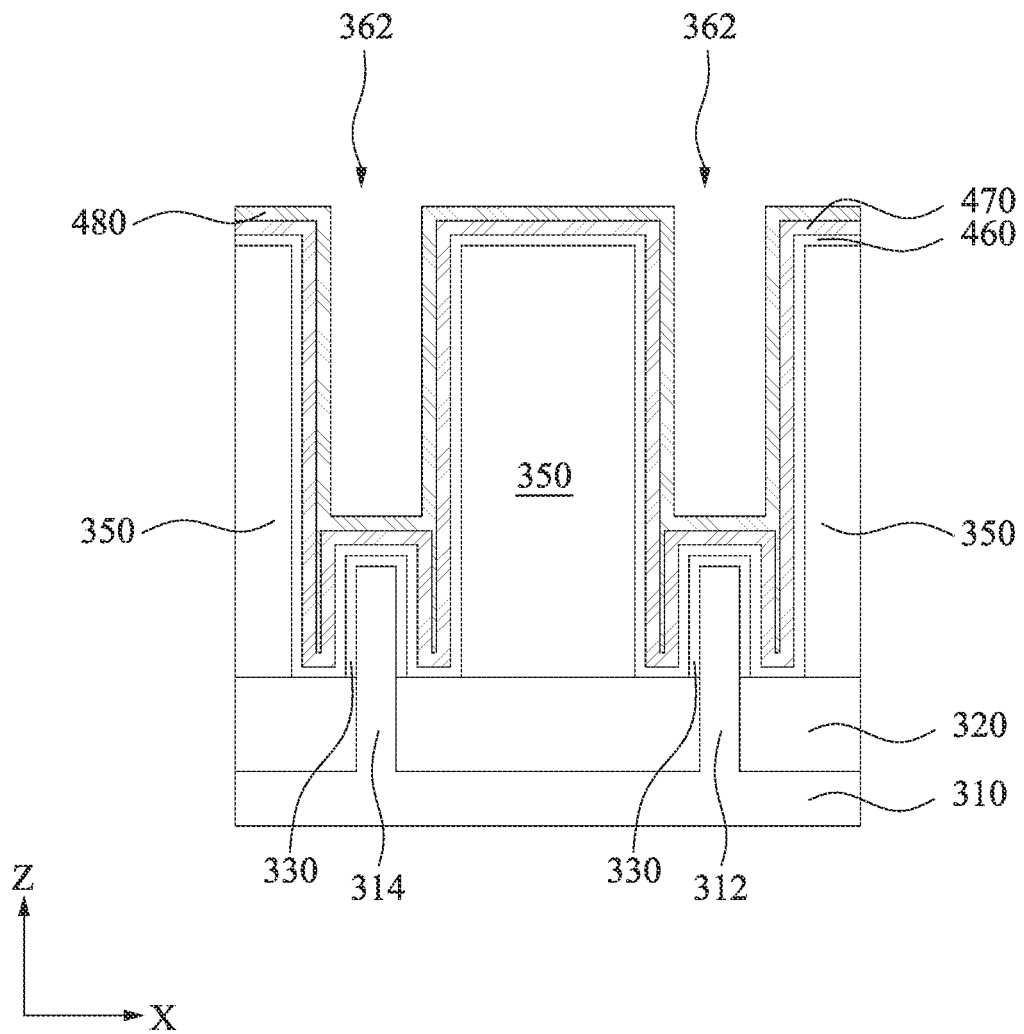
Figure 16D:
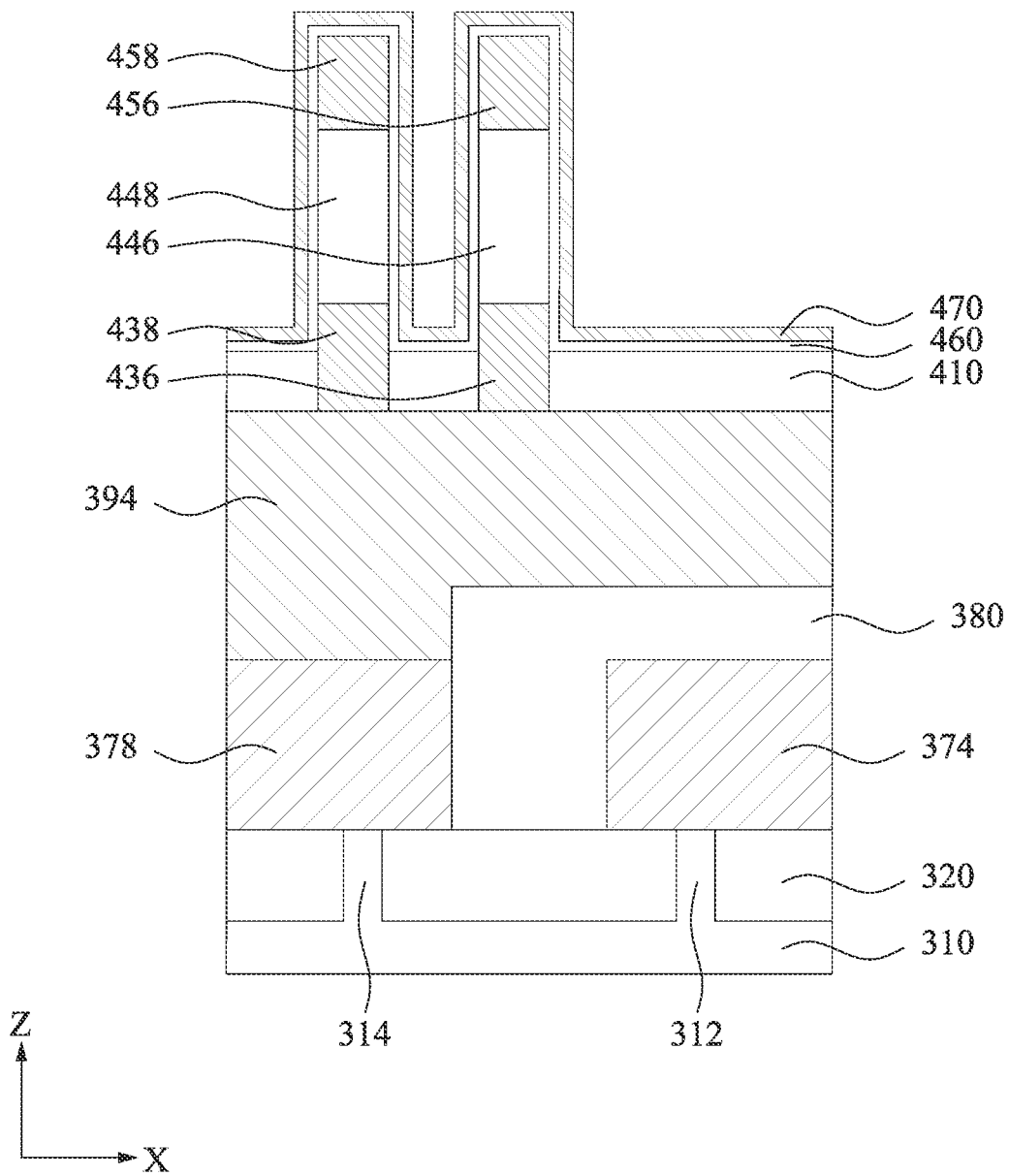

FIG. 16A is a top view of a memory cell at various stages in accordance with some embodiments of the present disclosure, FIG. 16B is a cross-sectional view taken along line B-B in FIG. 16A, FIG. 16C is a cross-sectional view taken along line C-C in FIG. 16A, and FIG. 16D is a cross-sectional view taken along line D-D in FIG. 16A. A second work function metal layer 480 is conformally formed on the structure of FIGS. 15A-15D. In some embodiments, the second work function metal layer 480 may include a single layer or multi layers, such as a work function film, a liner film, a wetting film, and an adhesion film. The second work function metal layer 480 may include Ti, TiAl, TiAlN, TaC, TaCN, TaSiN, Mn, Zr, TiN, TaN, Ru, Mo, WN, Co, Al, or any suitable materials. The second work function metal layer 480 may be formed by ALD, PVD, CVD, or other suitable process. The first and second work function metal layers 470 and 480 include different materials. For example, the first work function metal layer 470 is a P-metal, and the second work function metal layer 480 is an N-metal. The work function lower than the mid-gap work function (about 4.5 eV) is referred to as an n-work function, and the respective metal having the n-work function is referred to as an N-metal. For clarity, the gate dielectric layer 460, the first work function metal layer 470, and the second work function metal layer 480 are shown in FIGS. 16B-16D and not shown in FIG. 16A.

Figure 17A:
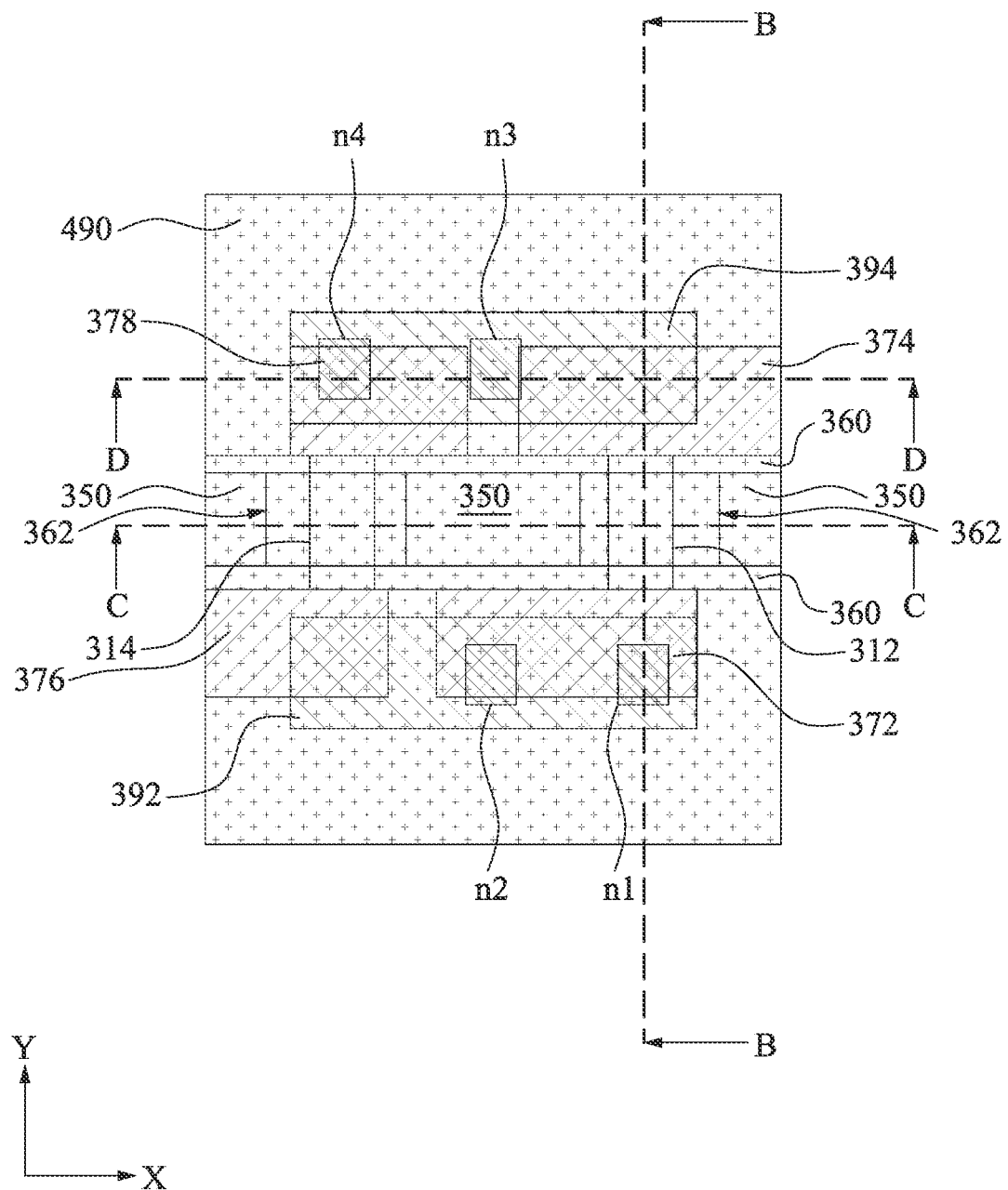
Figure 17B:
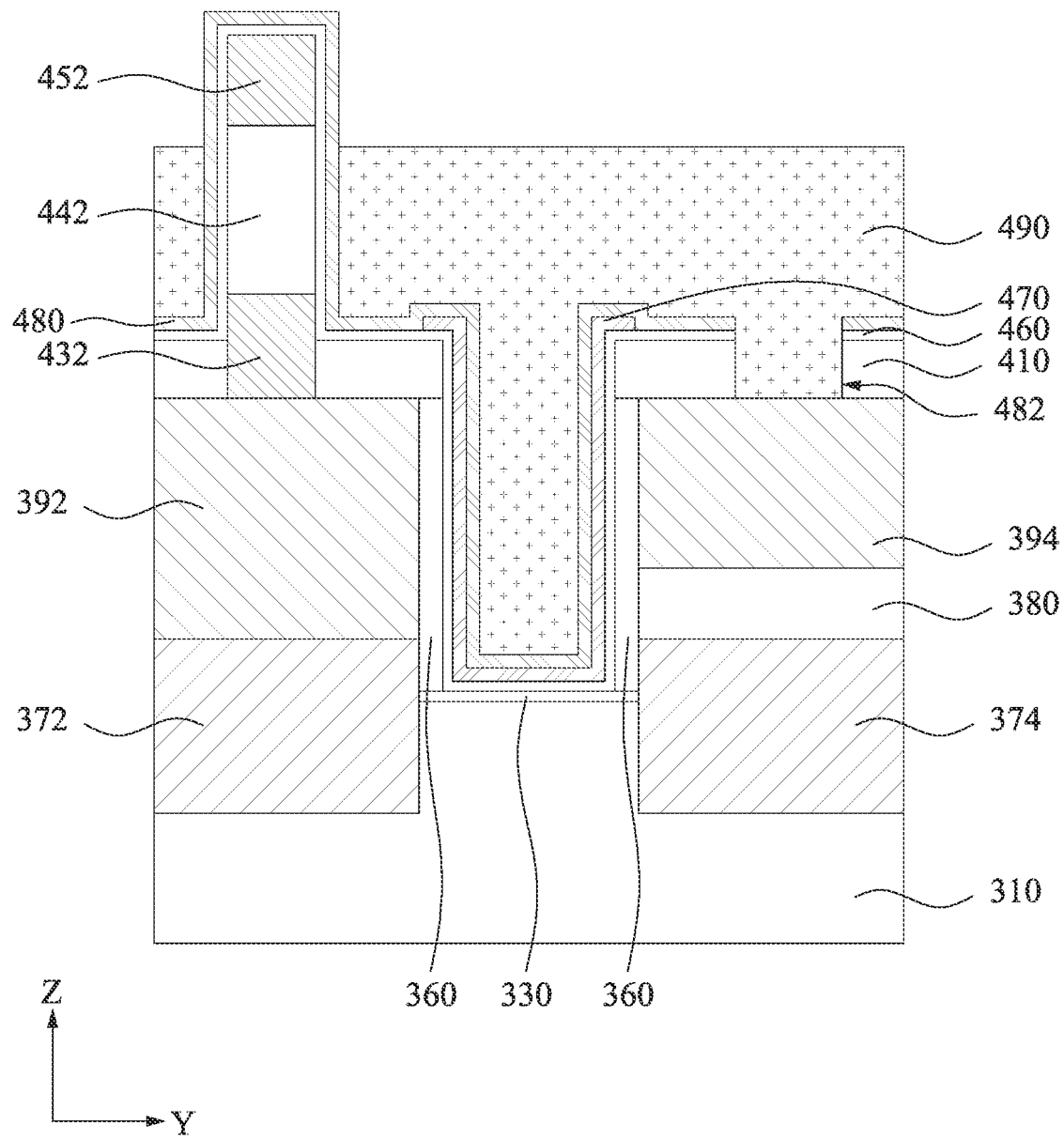
Figure 17C:
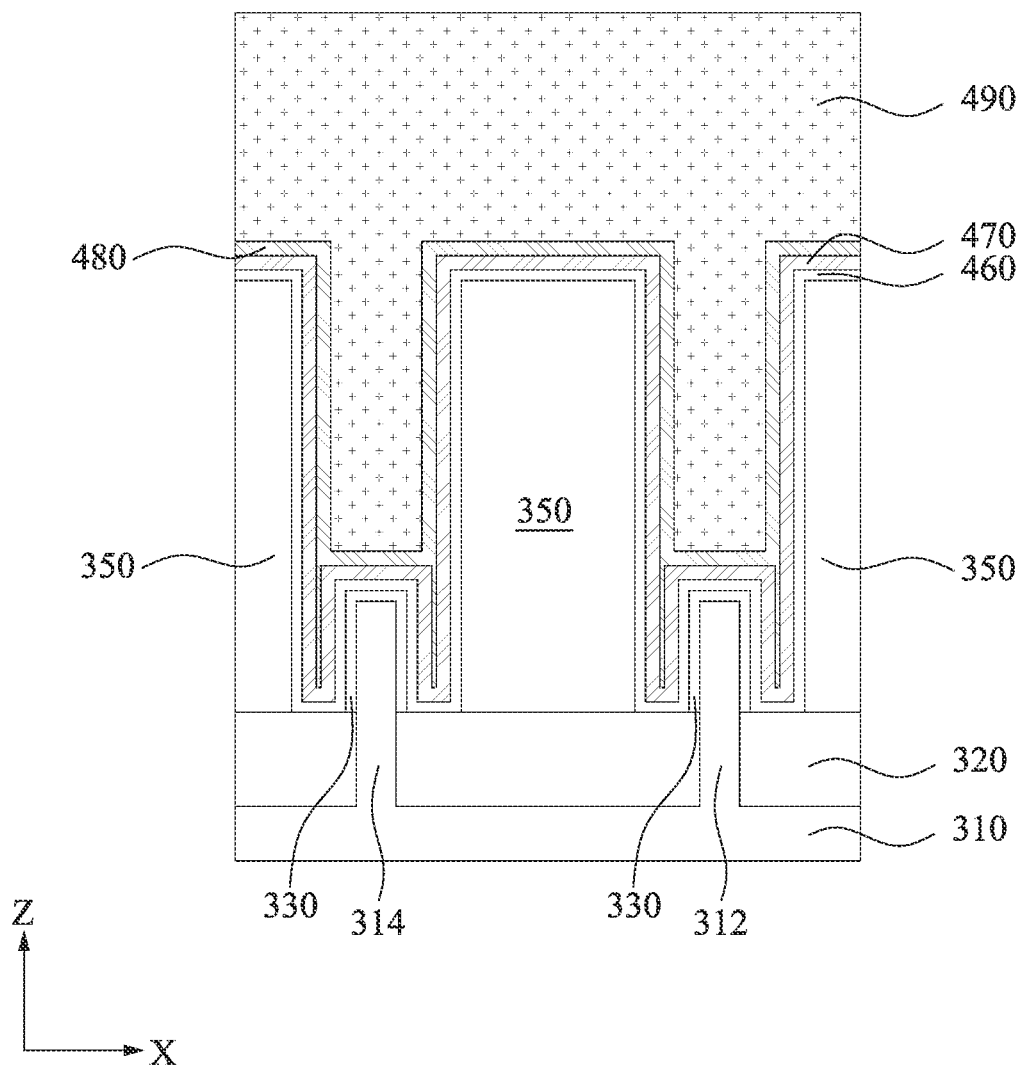
Figure 17D:
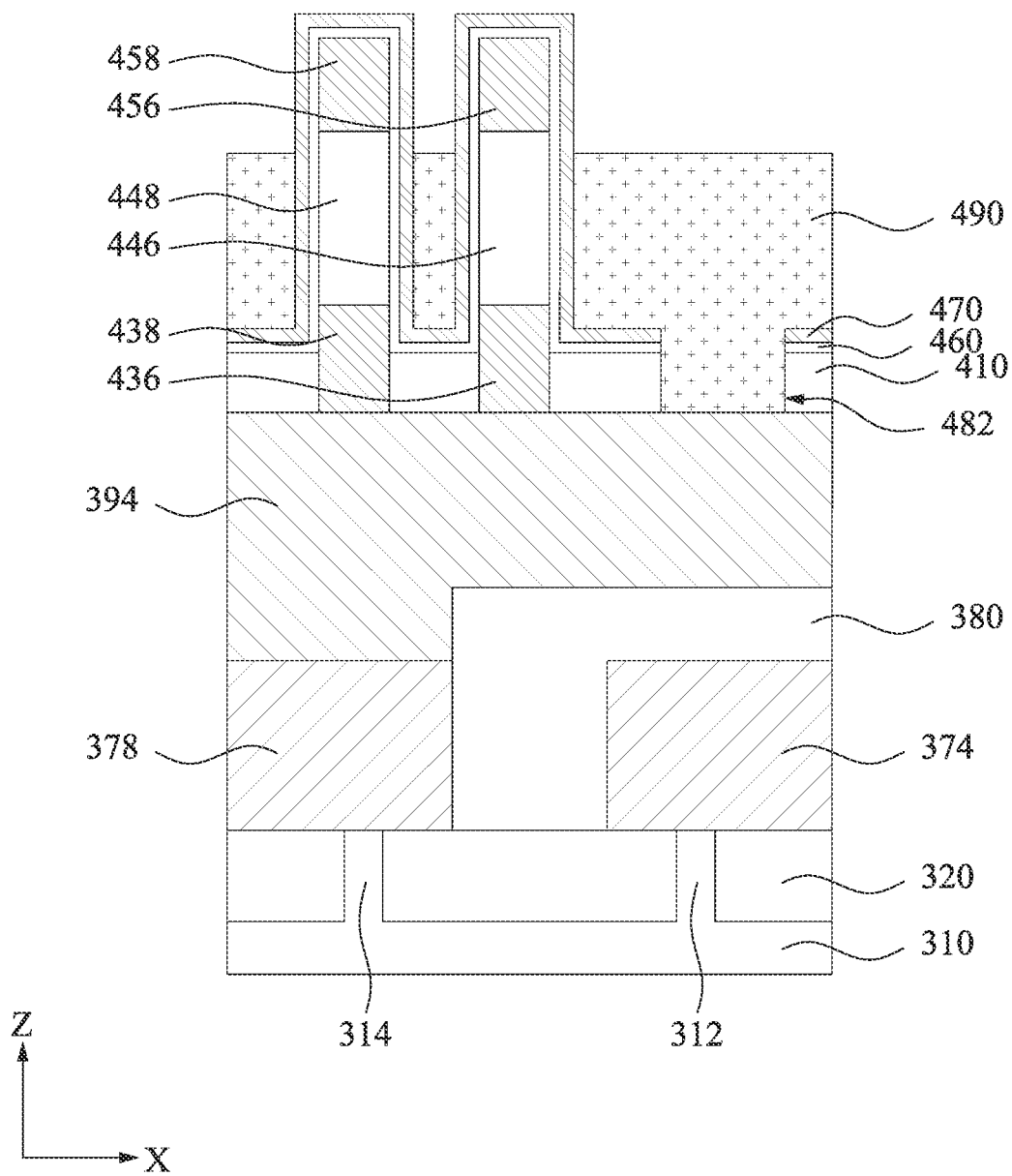

FIG. 17A is a top view of a memory cell at various stages in accordance with some embodiments of the present disclosure, FIG. 17B is a cross-sectional view taken along line B-B in FIG. 17A, FIG. 17C is a cross-sectional view taken along line C-C in FIG. 17A, and FIG. 17D is a cross-sectional view taken along line D-D in FIG. 17A. A plurality of openings 482 are formed in the second work function metal layer 480, the gate dielectric layer 460, and the ESL 410 to expose the source/drain features 392 and 394. Subsequently, filling metal 490 fills the remained space between the gate spacers 360 and surrounds the nanowires n1-n4. The filling metal 490 are made of metal, e.g., W, Ru, Cu, Al, or other suitable materials. After the deposition of the filling metal 490, an etching back process may be then performed to remove portions of the filling metal 490 such that top portions of the nanowires n1-n4 protrude from the filling metal 490.

Figure 18A:
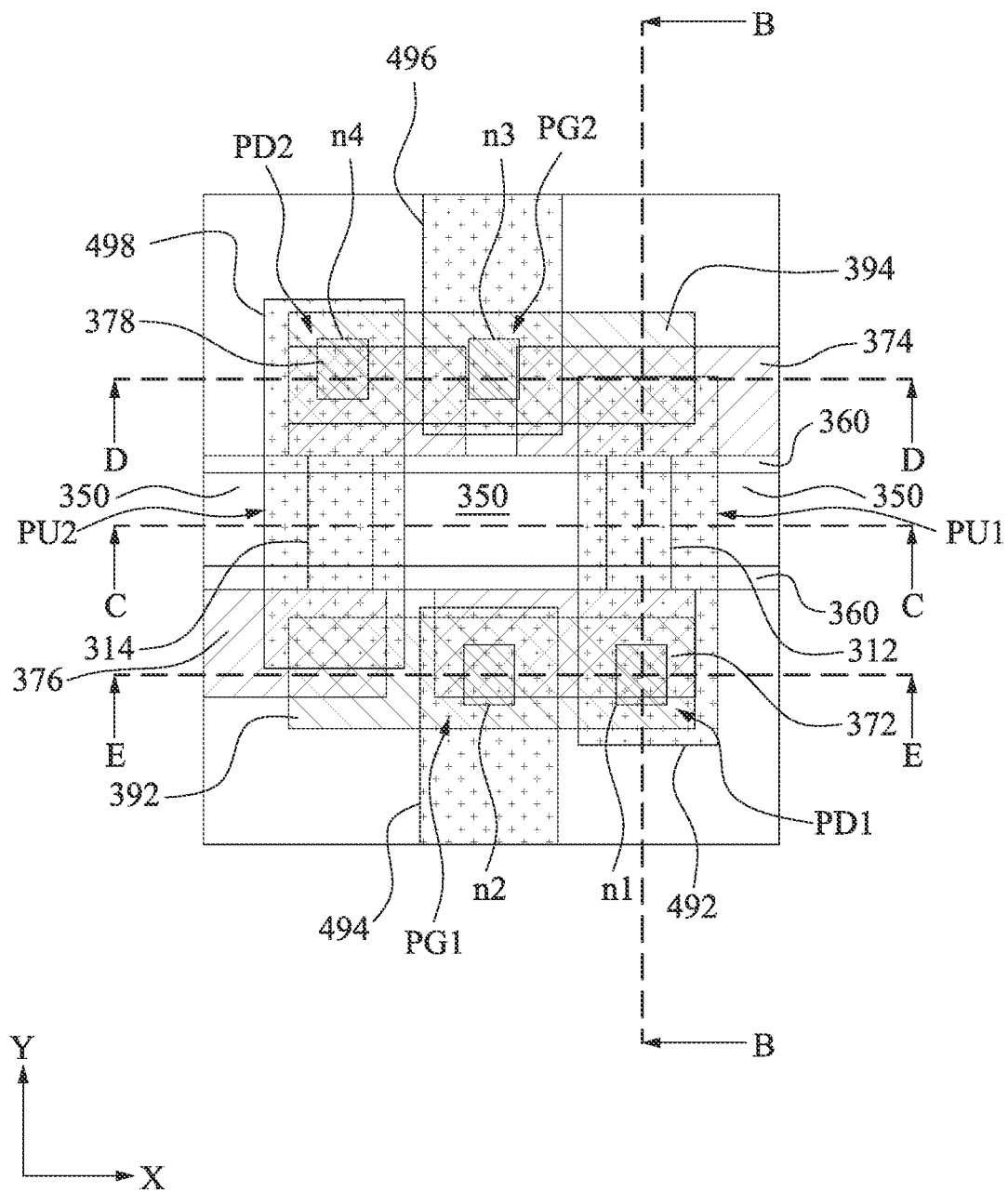
Figure 18B:
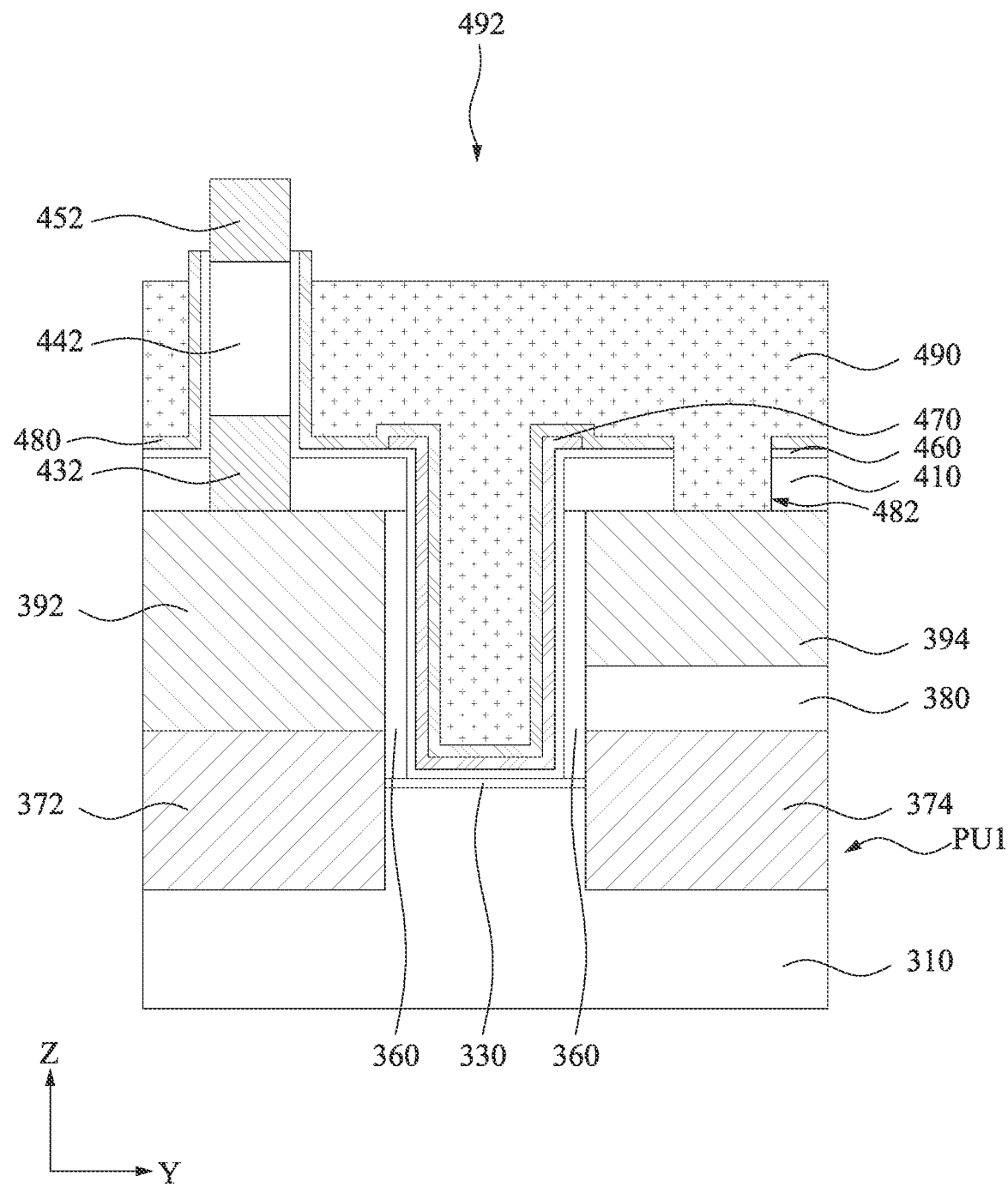
Figure 18C:
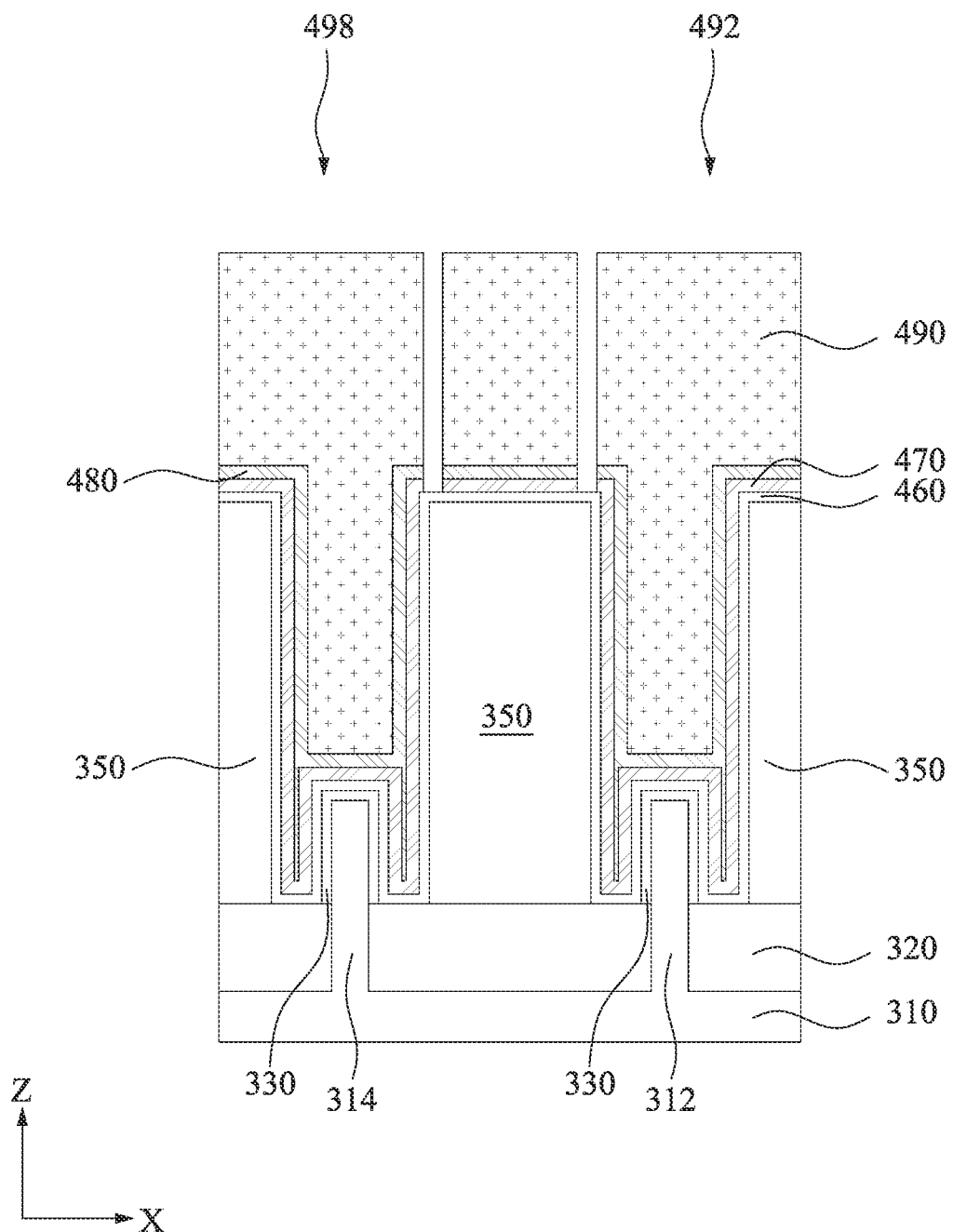
Figure 18D:
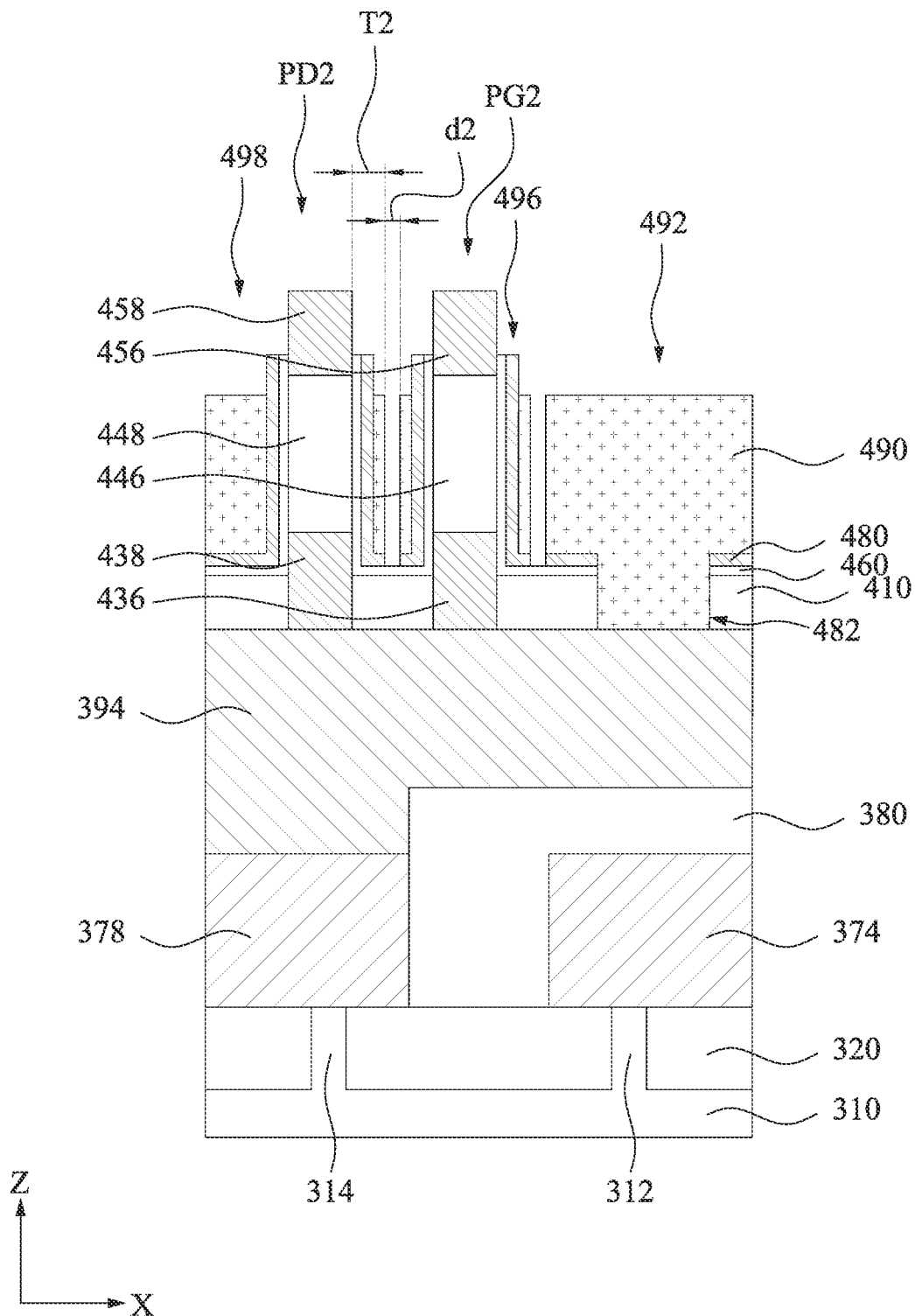
Figure 18E:
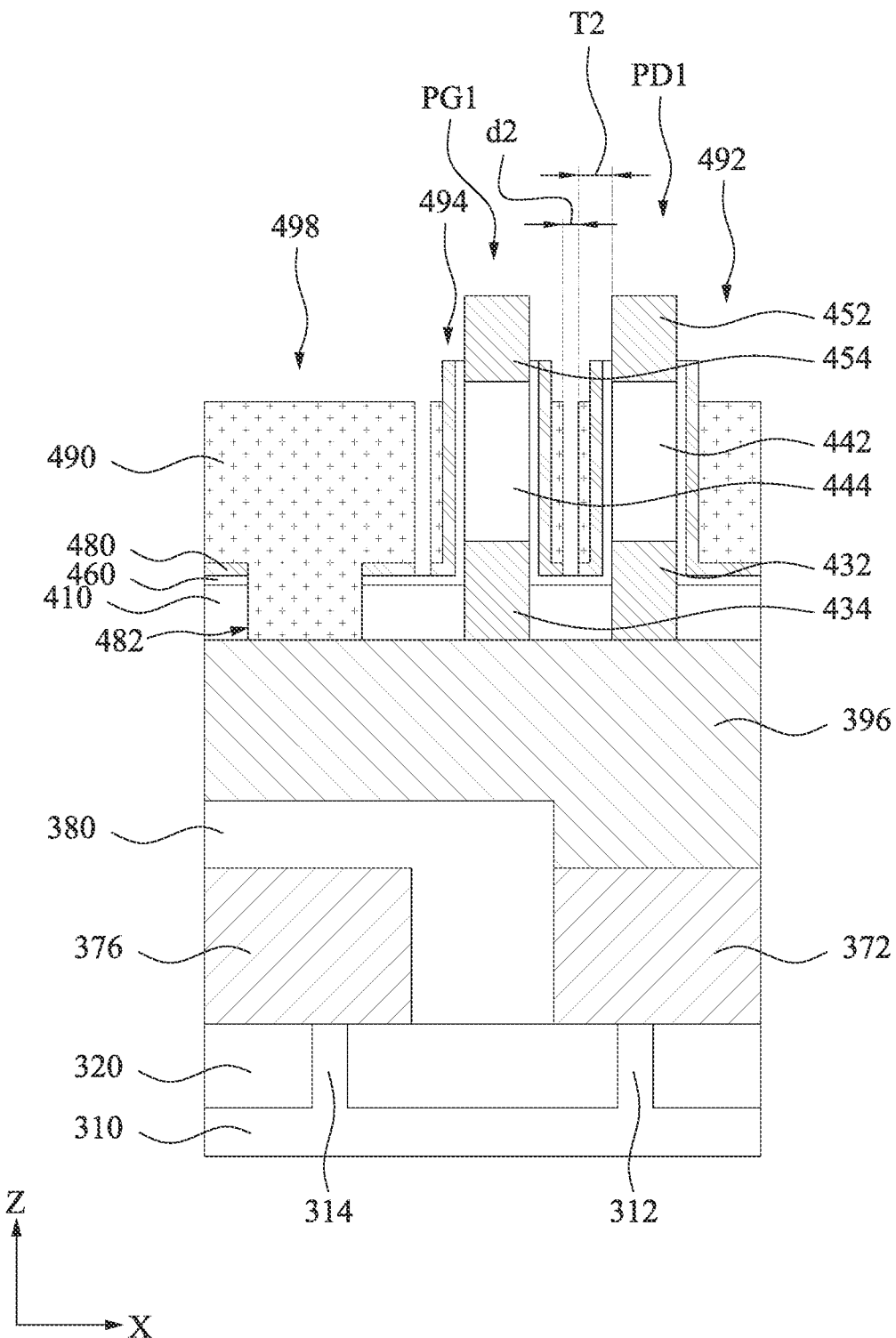

FIG. 18A is a top view of a memory cell at various stages in accordance with some embodiments of the present disclosure, FIG. 18B is a cross-sectional view taken along line B-B in FIG. 18A, FIG. 18C is a cross-sectional view taken along line C-C in FIG. 18A, FIG. 18D is a cross-sectional view taken along line D-D in FIG. 18A, and FIG. 18E is a cross-sectional view taken along line E-E in FIG. 18A. The filling metal 490, the first work function metal layer 470, and the second work function metal layer 480 are patterned. For example, a mask layer may be formed on the structure of FIGS. 17A-17D, and the filling metal 490, the first work function metal layer 470, and the second work function metal layer 480 are patterned using the mask layer as an etching mask. The mask layer is removed after the patterning process.

Subsequently, portions of the first work function metal layer 470, and the second work function metal layer 480 protruding from the filling metal 490 are removed or etched back to expose the top source/drain features 452, 454, 456, and 458. As such, gate structures 492, 494, 496, and 498 are formed. Specifically, the gate structure 492 is formed in one of the gate trenches 362 and surrounds the channel 442. Further, the gate structure 492 is connected to the source/drain feature 394 through one of the opening 482. The gate structure 494 surrounds the channel 444, and the gate structure 496 surrounds the channel 446. The gate structure 498 is formed in another of the gate trenches 362 and surrounds the channel 448. Further, the gate structure 498 is connected to the source/drain feature 392 through another of the opening 482.

Each of the gate structures 492, 494, 496 and 498 include a portion surrounding the corresponding nanowires n1-n4, and the portion has a minimum thickness T2 in a range of about 4 nm to about 20 nm. Further, a distance (space) d2 between adjacent gate structures 492 and 494 (496 and 498) is in a range of about 10 nm to about 100 nm.

As such, the gate structure 492, the semiconductor fin 312, and the source/drain features 372 and 374 form a first pull-up transistor PU1. The gate structure 498, the semiconductor fin 314, and the source/drain features 376 and 378 form a second pull-up transistor PU2. The gate structure 492, the channel 442, and the source/drain features 432 and 452 form a first pull-down transistor PD1. The gate structure 494, the channel 444, and the source/drain features 434 and 454 form a first pass gate transistor PG1. The gate structure 496, the channel 446, and the source/drain features 436 and 456 form a second pull-down transistor PD2. The gate structure 498, the channel 448, and the source/drain features 438 and 458 form a second pass gate transistor PG2.

Figure 19A:
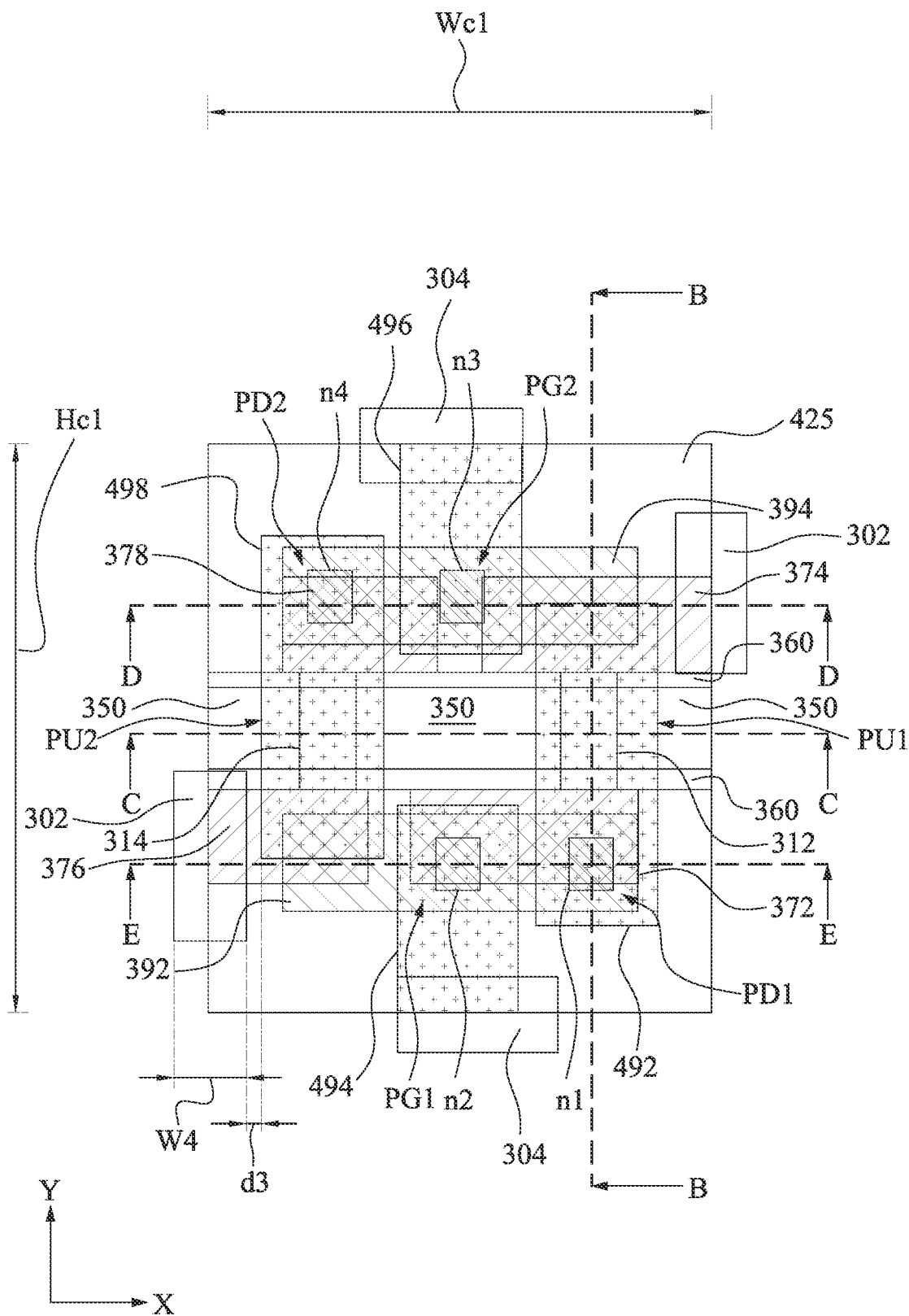
Figure 19B:
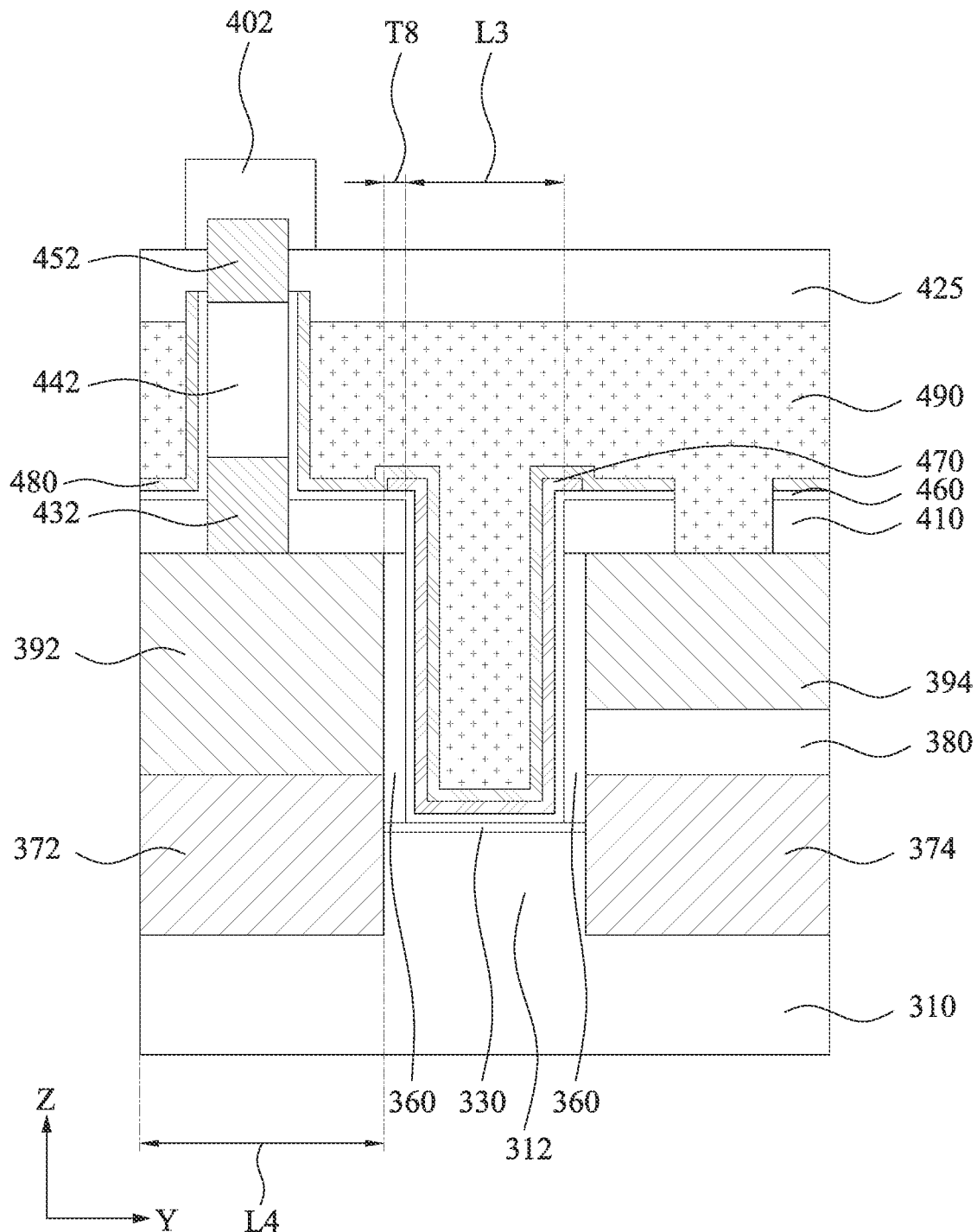
Figure 19C:
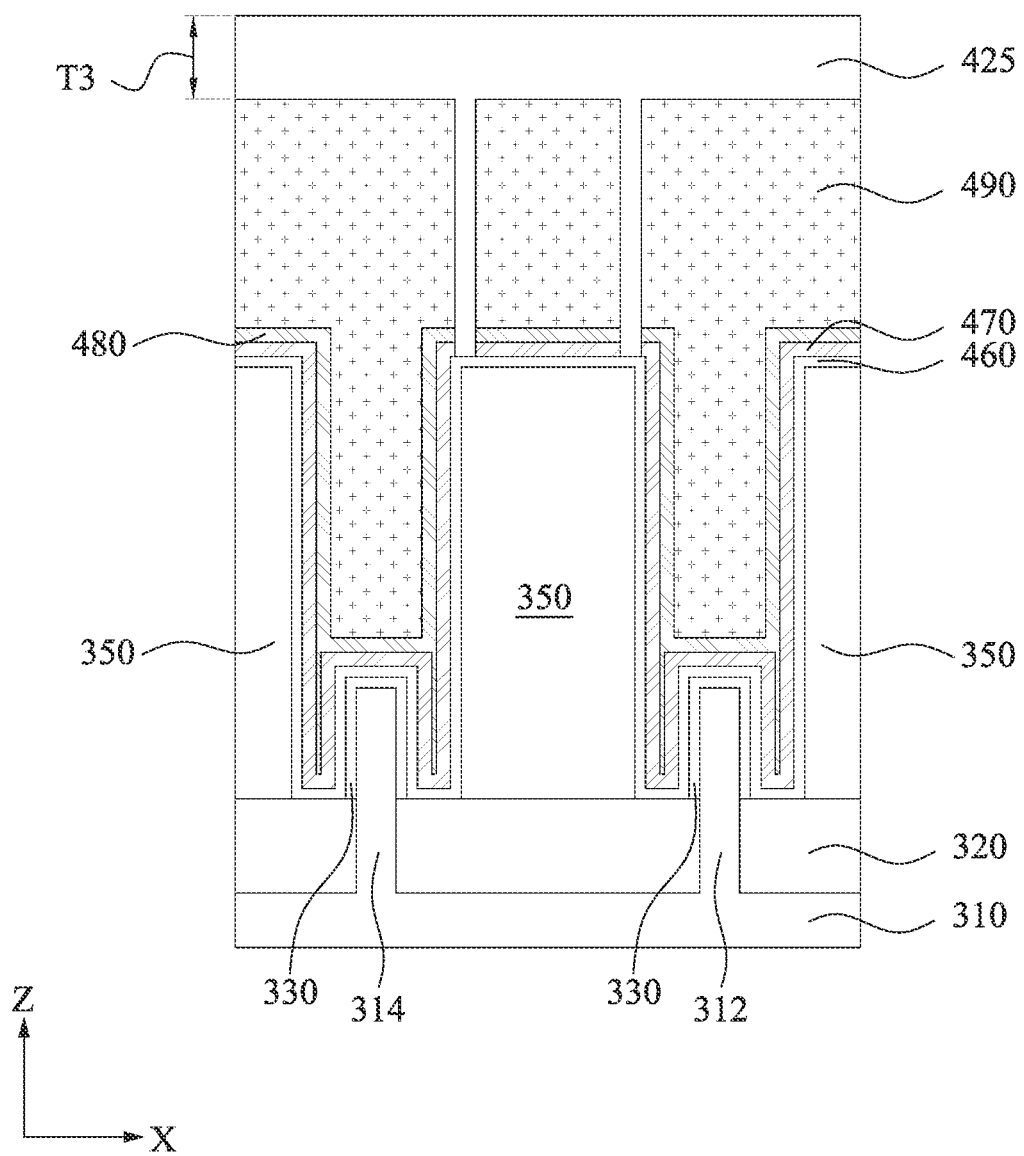
Figure 19D:
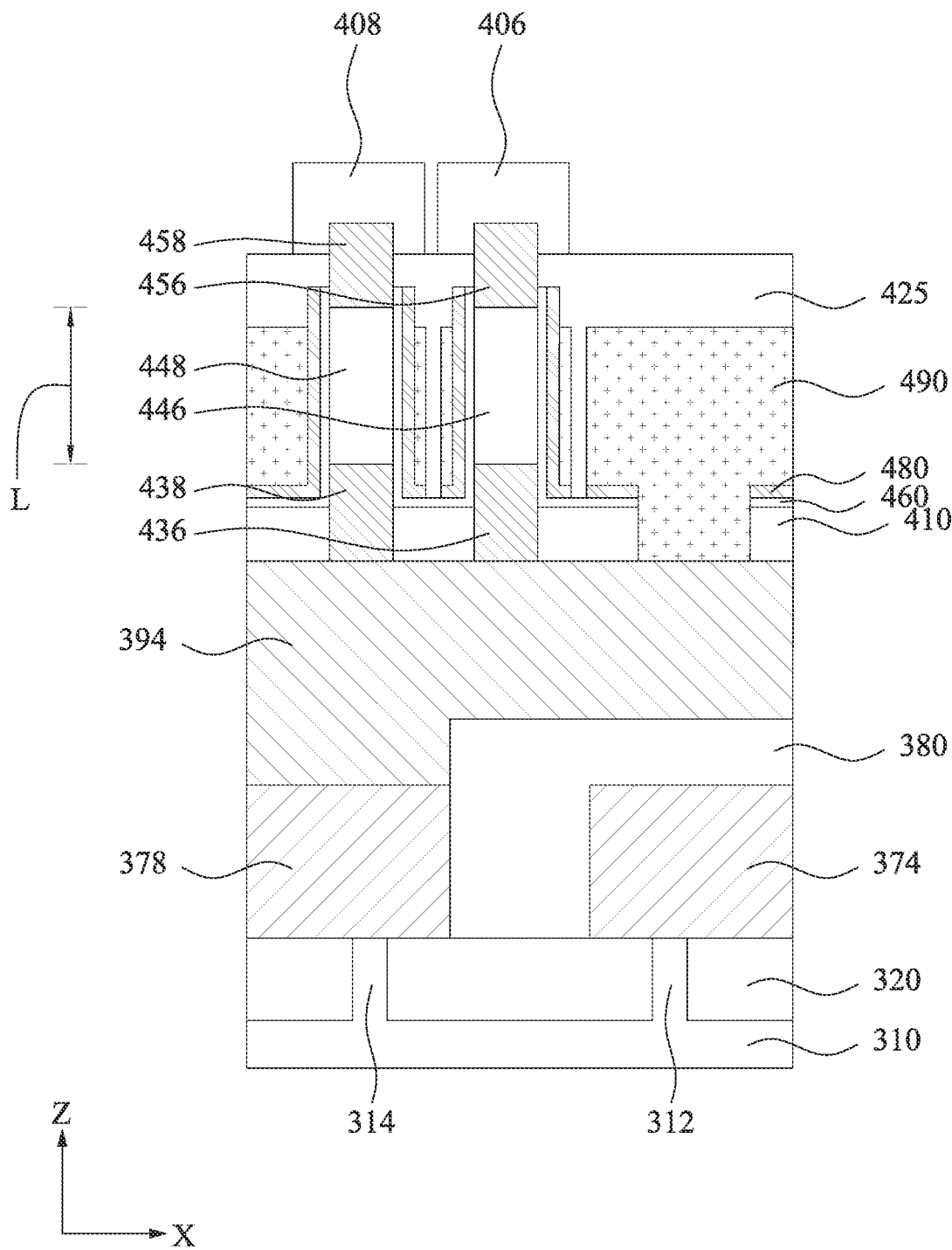
Figure 19E:
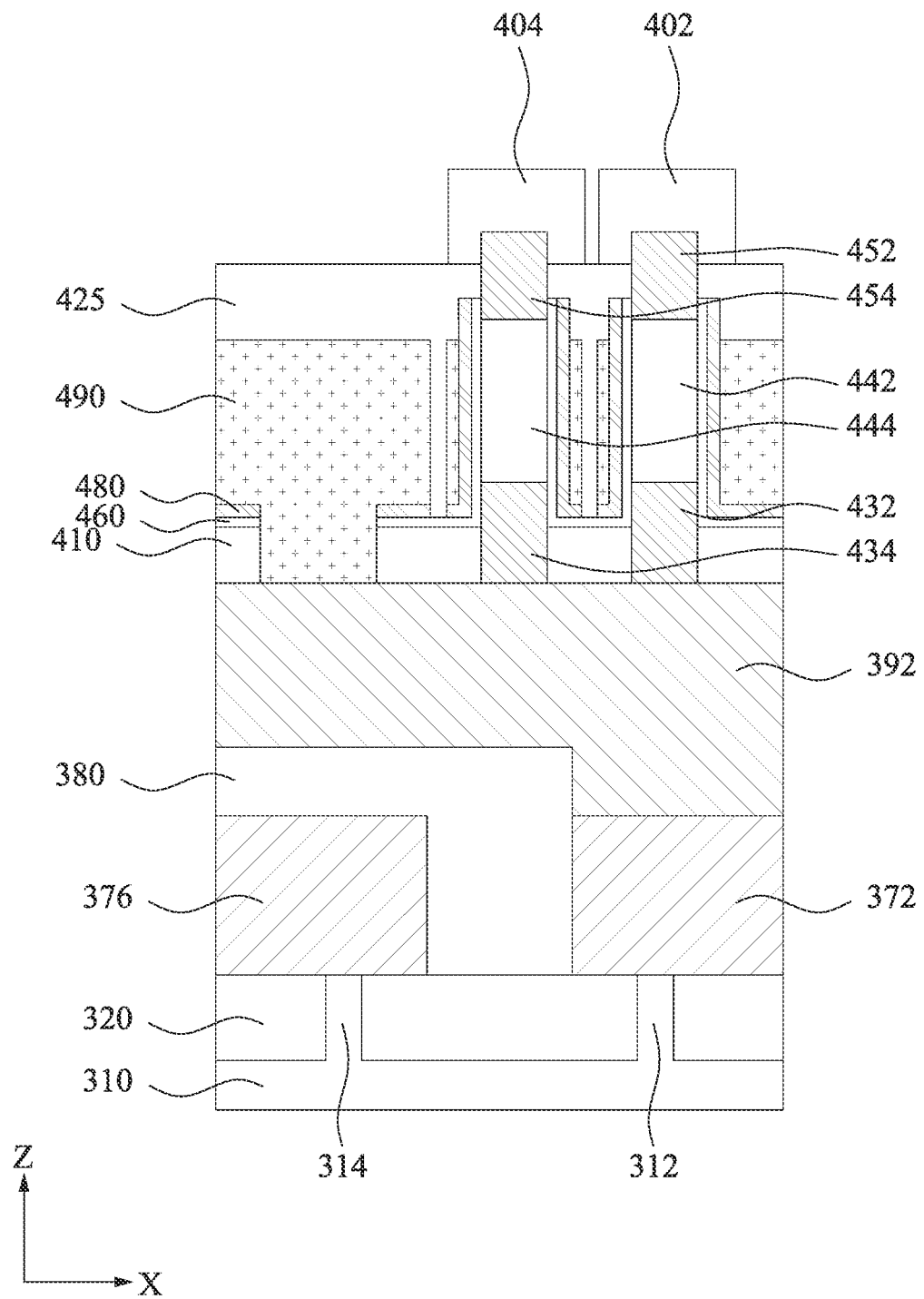

FIG. 19A is a top view of a memory cell at various stages in accordance with some embodiments of the present disclosure, FIG. 19B is a cross-sectional view taken along line B-B in FIG. 19A, FIG. 19C is a cross-sectional view taken along line C-C in FIG. 19A, FIG. 19D is a cross-sectional view taken along line D-D in FIG. 19A, and FIG. 19E is a cross-sectional view taken along line E-E in FIG. 19A. A second ILD 425 is formed above the structure of FIGS. 18A-18E. Portions of the second ILD 425 fill the spaces between gate structures 492, 494, 496, and 498 to isolate the gate structures 492, 494, 496, and 498 from each other. The second ILD 425 also covers portions of the first work function metal layer 470 and second work function metal layer 480 protruding from the filling metal 480, and the top source/drain features 452, 454, 456, and 458 protrude from the second ILD 425. The second ILD 425 may include, for example, silicon oxide, low-k silicon oxide such as a porous silicon oxide layer, other suitable dielectric material, combinations thereof, or the like. In some embodiments, a dielectric layer may be formed above the structure of FIGS. 18A-18E, and a CMP process is performed to expose top surfaces of the top source/drain features 452, 454, 456, and 458. The second ILD 425 is then etched back such that the top source/drain features 452, 454, 456, and 458 protrude from the second ILD 425. In some embodiments, a thickness T3 of the second ILD 425 is in a range of about 4 nm to about 50 nm. If the thickness T3 is less than about 4 nm, a short channel problem may occur; if the thickness T3 is greater than about 50 nm, the size of the memory cell may be increased.

Subsequently, contacts 402, 404, 406, and 408 are respectively formed above the top source/drain features 452, 454, 456, and 458. For example, a conductive layer is formed above the second ILD 425 and covers the top source/drain features 452, 454, 456, and 458. The conductive layer is then patterned to form the contacts 402, 404, 406, and 408. In some embodiments, the contacts 402, 404, 406, and 408 are metals such as tungsten, aluminum, copper, or other suitable materials. For clarity, the contacts 402, 404, 406, and 408 are shown in FIGS. 19B-19E and are omitted in FIG. 19A.

In some embodiments, other conductive features (e.g., vias, word lines, bit lines, power lines) are formed above the structure of FIGS. 19A-19E or in the second ILD 425 and connected to the gate structures 492, 494, 496, 498, and/or contacts 402, 404, 406, and 408. For example, as shown in FIG. 19A, conductive vias 302 are coupled to the source/drain features 374 and 376, and conductive vias 304 are coupled to the gate structures 494 and 496. For clarity, the conductive vias 302 and 304 are shown in FIG. 19A and omitted in FIGS. 19B-19E. In some embodiments, a distance d3 between the gate structure 492 (or 498) and the conductive via 302 is in a range of about 10 nm to about 100 nm. In some embodiments, a width W4 of each of the conductive vias 302 and 304 is in a range of about 10 nm to about 100 nm. In some embodiments, a portion of the gate structure 492 (498) directly above the semiconductor fin 312 (314) has a length L3 in a range of about 10 nm to about 100 nm. In some embodiments, each of the gate spacers 360 has a thickness T8 in a range of about 4 nm to about 50 nm. In some embodiments, each of the source/drain structures 372, 374, 376, and 378 has a length L4 in a range of about 10 nm to about 100 nm.

In some embodiments, a cell width Wc1 of the memory cell is:

$$Wc1 = 3(W3) + 6(T2) + 2(d2) + 2(d3) + W4,$$

where W3 (labeled in FIG. 11B) is a width of each of the nanowires n1-n4, T2 (labeled in FIG. 18D) is the minimum thickness of a portion of each of the gate structures 492, 494, 496, and 498 surrounding the corresponding the nanowires n1-n4, d2 (labeled in FIG. 18D) is a distance between adjacent gate structures 492 and 494 (496 and 498), d3 (labeled in FIG. 19A) is a distance between the gate structure 492 (or 498) and the conductive via 302, and W4 (labeled in FIG. 19A) is a width of each of the conductive vias 302. In some embodiments, the cell width Wc1 is in a range of about 50 nm to about 500 nm, e.g., about 187 nm.

In some embodiments, a cell height Hc1 of the memory cell is:

$$Hc1 = 2((L4) + (L3) + 2(T8)),$$

Where L4 (labeled in FIG. 19B) is a length of each of the source/drain structures 372, 374, 376, and 378, L3 (labeled in FIG. 19B) is a channel length of each of the semiconductor fin 312 (314), and T8 (labeled in FIG. 19B) is a thickness of each of the gate spacers 360. In some embodiments, the cell height Hct is in a range of about 50 nm to about 500 nm, e.g., about 100 nm.

In some embodiments, at least one of the first pull-down transistor PD1, the first pass gate transistor PG1, the second pull down transistor PD2, and the second pass gate transistor PG2 are junctionless transistors. Take the nanowire n1 as an example. The bottom source/drain feature 432, the channel 442, and the top source/drain feature 452 are made of the same material and have substantially the same doping concentration (or all are undoped). Similarly, the bottom source/drain feature 434, the channel 444, and the top source/drain feature 454 are made of the same material and have substantially the same doping concentration (or all are undoped). The bottom source/drain feature 436, the channel 446, and the top source/drain feature 456 are made of the same material and have substantially the same doping concentration (or all are undoped). The bottom source/drain feature 438, the channel 448, and the top source/drain feature 458 are made of the same material and have substantially the same doping concentration (or all are undoped).

FIGS. 20A and 20B are cross-sectional views of a memory cell, in accordance with some embodiments of the present disclosure. The difference between the memory cells of FIGS. 20A-20B and FIGS. 19D-19E pertains to the profiles of the source/drain features 372, 374, 376, 378, 392, and 394. As mentioned above, after the overgrowth of the epitaxial structures 370 (see FIGS. 7A-7D), a hydrogen reflow process can be performed to tune the profiles of the source/drain features 372, 374, 376, 378. In some embodiments, the top surfaces of the source/drain features 372, 374, 376, 378 is substantially flat as shown in FIGS. 19D-19E. In some other embodiments, the top surfaces of the source/drain features 372, 374, 376, 378 are wavy (or curved) as shown in FIGS. 20A-20B. The profiles of the top surfaces of the source/drain features 372, 374, 376, 378 can be adjusted by tuning parameters (e.g., temperature, reflow period, or other parameters) of the hydrogen reflow process. Similarly, an overgrowth process and a hydrogen reflow process can be performed for forming the source/drain features 392 and 394. As such, the top surfaces of the source/drain features 392 and 394 may be substantially flat as shown in FIGS. 19D-19E or wavy as shown in FIGS. 20A-20B. Other relevant structural and manufacturing details of the memory cell of FIGS. 20A-20B are all substantially the same as or similar to the memory cell of FIGS. 19A-19E, and, therefore, a description in this regard will not be repeated hereinafter.

Figure 21A:
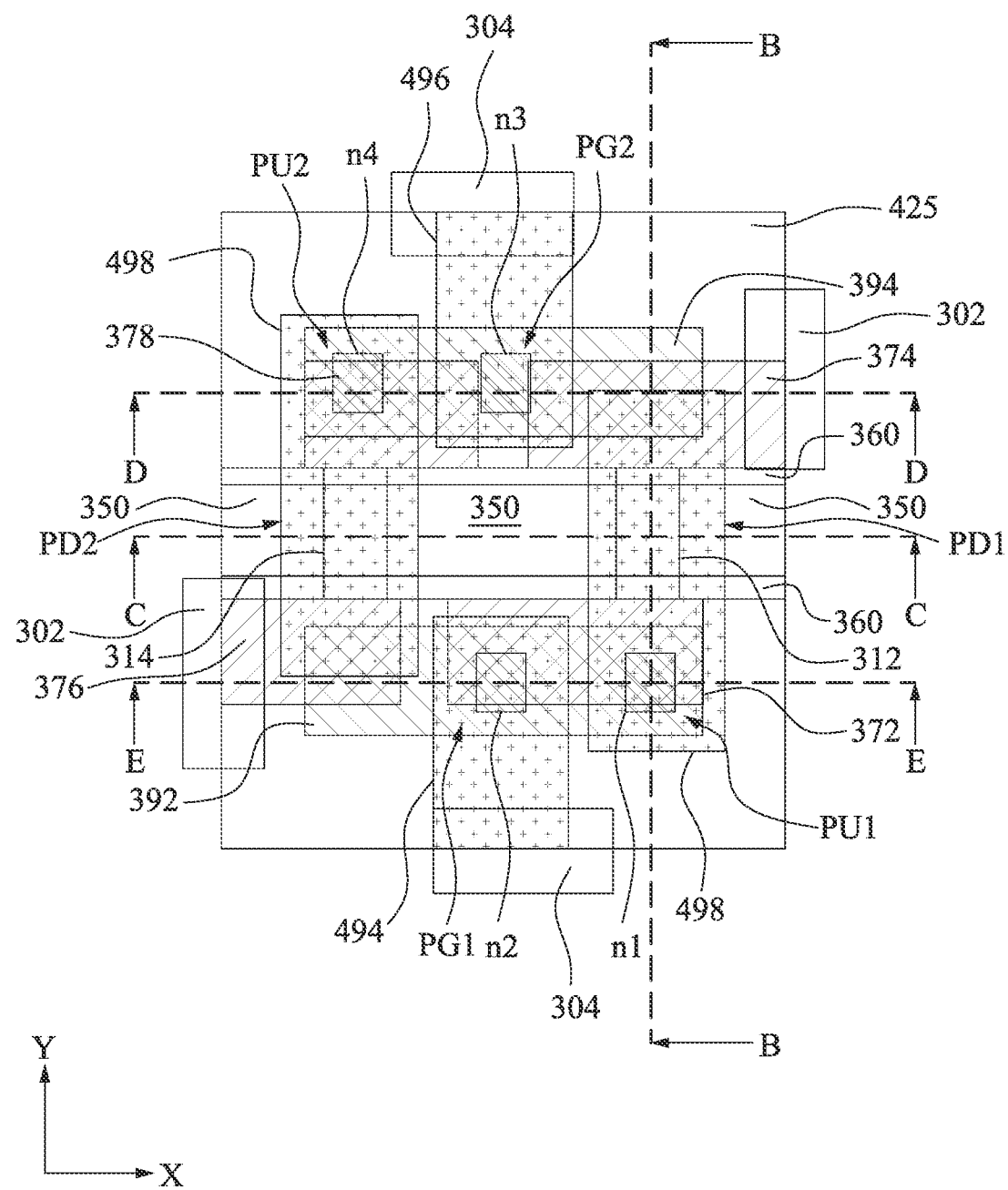
FIG. 21A is a top view of a memory cell in accordance with some embodiments of the present disclosure.
Figure 21B:
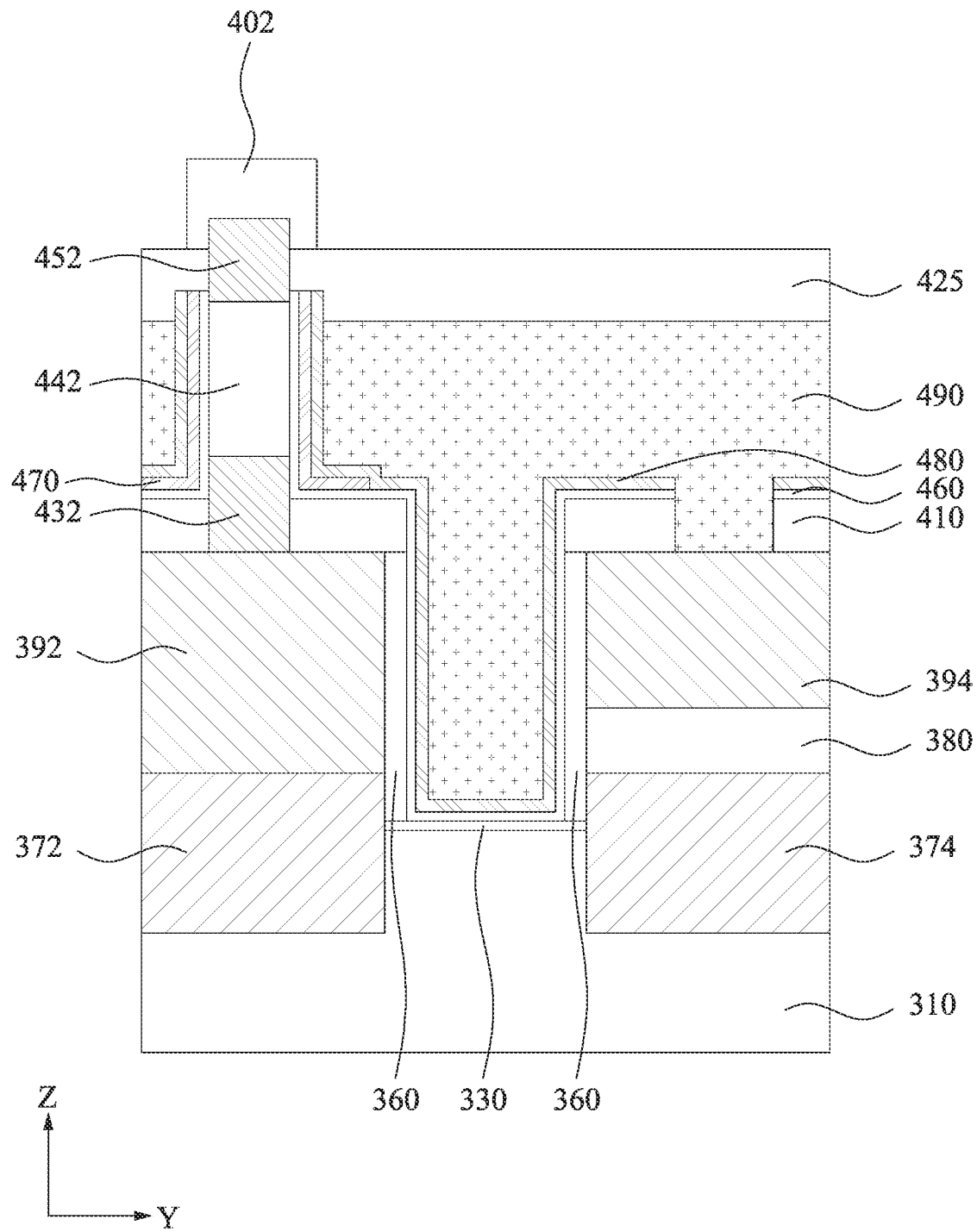
FIG. 21B is a cross-sectional view taken along line B-B in FIG. 21A.
Figure 21C:
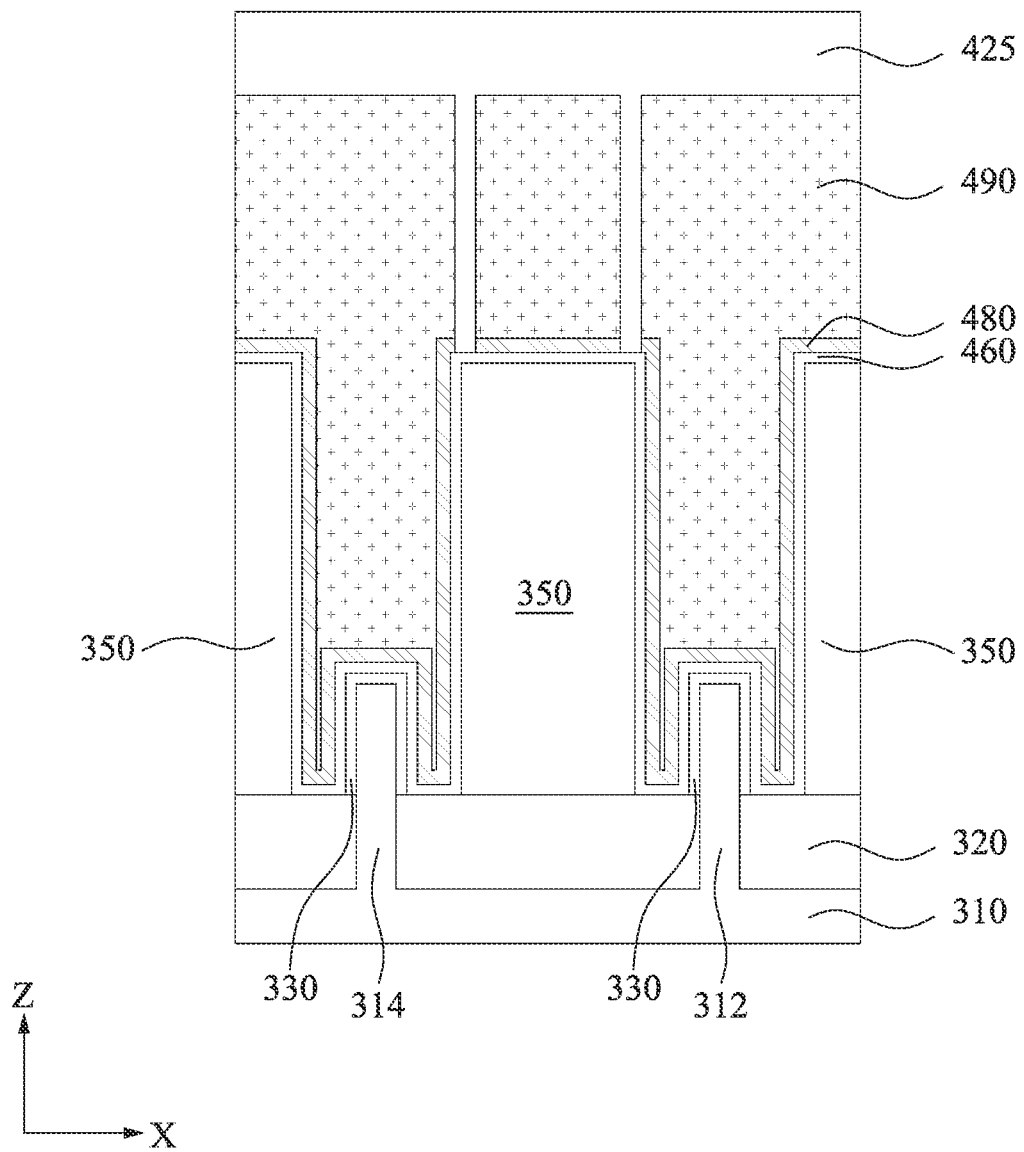
FIG. 21C is a cross-sectional view taken along line C-C in FIG. 21A.
Figure 21D:
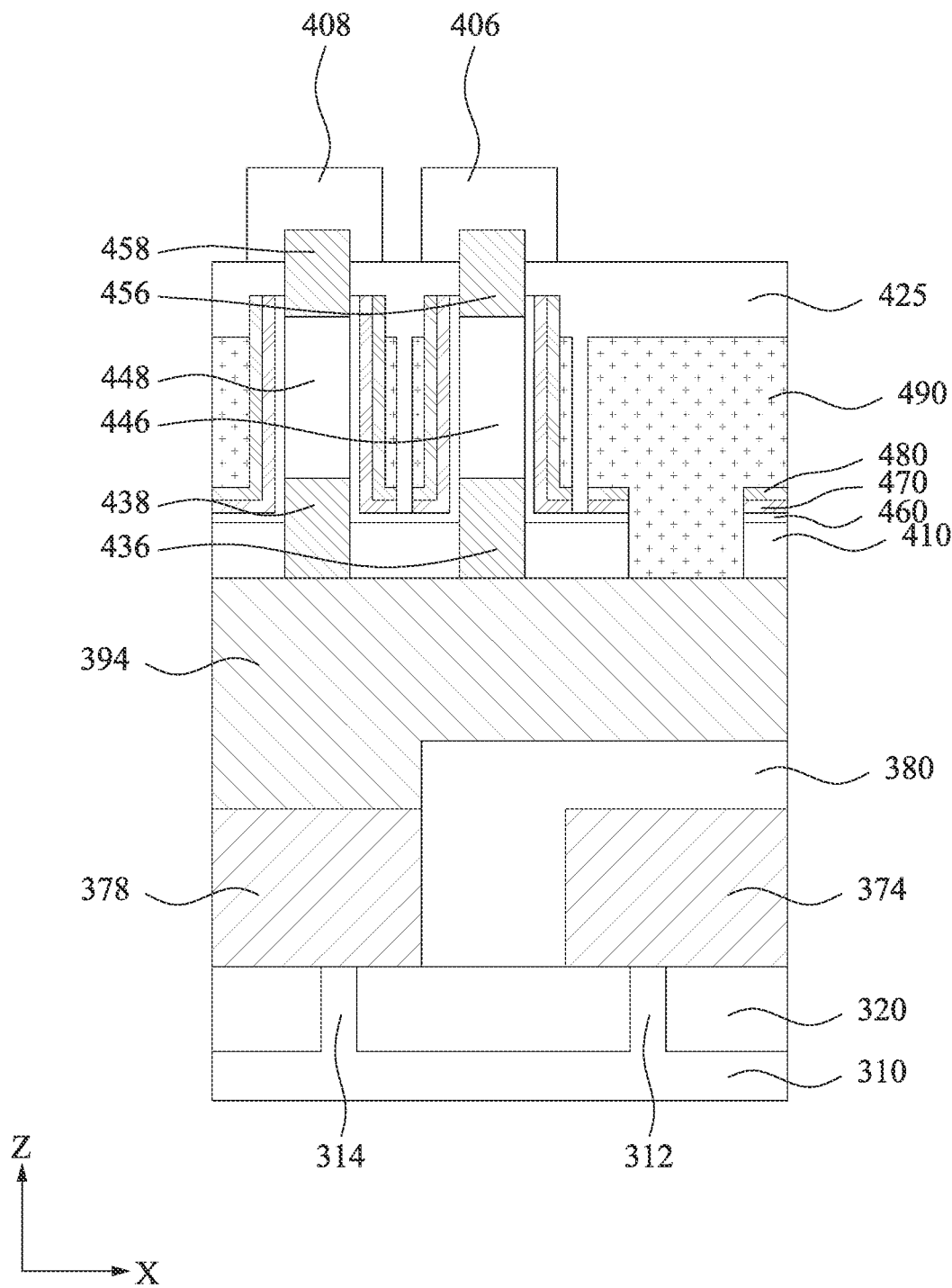
FIG. 21D is a cross-sectional view taken along line D-D in FIG. 21A.
Figure 21E:
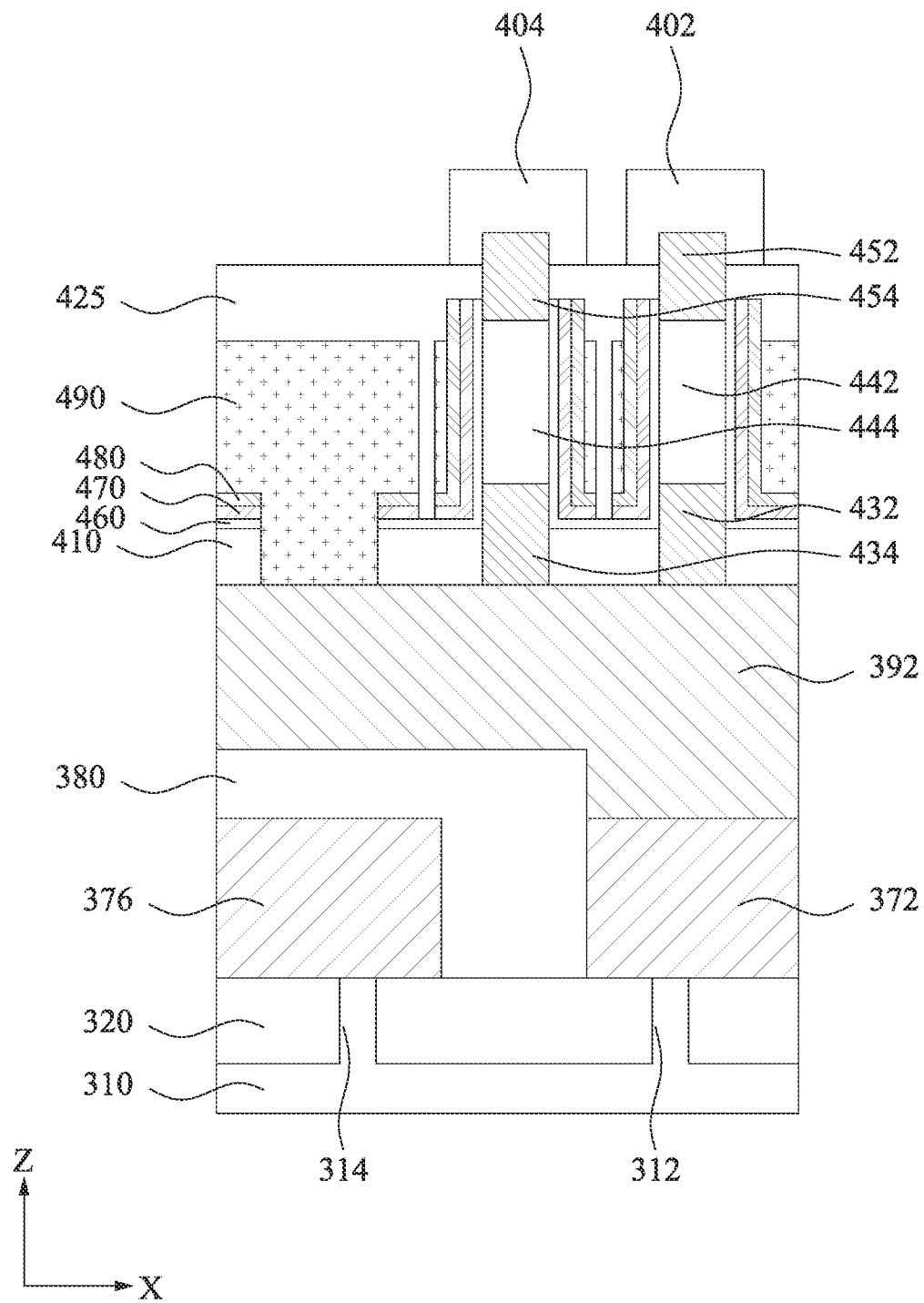
FIG. 21E is a cross-sectional view taken along line E-E in FIG. 21A.

FIG. 21A is a top view of a memory cell in accordance with some embodiments of the present disclosure, FIG. 21B is a cross-sectional view taken along line B-B in FIG. 21A, FIG. 21C is a cross-sectional view taken along line C-C in FIG. 21A, FIG. 21D is a cross-sectional view taken along line D-D in FIG. 21A, and FIG. 21E is a cross-sectional view taken along line E-E in FIG. 21A. The difference between the memory cells of FIGS. 20A-20B and FIGS. 19D-19E pertains to the conductivity types of the transistors. In FIGS. 21A-21E, the gate structure 492, the semiconductor fin 312, and the source/drain features 372 and 374 form a first pull-down transistor PD1. The gate structure 498, the semiconductor fin 314, and the source/drain features 376 and 378 form a second pull-down transistor PD2. The gate structure 492, the channel 442, and the source/drain features 432 and 452 form a first pull-up transistor PU1. The gate structure 494, the channel 444, and the source/drain features 434 and 454 form a first pass gate transistor PG1. The gate structure 496, the channel 446, and the source/drain features 436 and 456 form a second pull-up transistor PU2. The gate structure 498, the channel 448, and the source/drain features 438 and 458 form a second pass gate transistor PG2. The first pull-down transistor PD1 and the second pull-down transistor PD2 are N-type transistors, and the first pull-up transistor PU1, the first pass gate transistor PG1, the second pass gate transistor PG2, and the second pull-up transistor PU2 are P-type transistors. As such, the first work function metal layer 470 surrounds the nanowires n1-n4 and does not cover the semiconductor fins 312 and 314. Other relevant structural and manufacturing details of the memory cell of FIGS. 21A-21E are all substantially the same as or similar to the memory cell of FIGS. 19A-19E, and, therefore, a description in this regard will not be repeated hereinafter.

Figure 22:
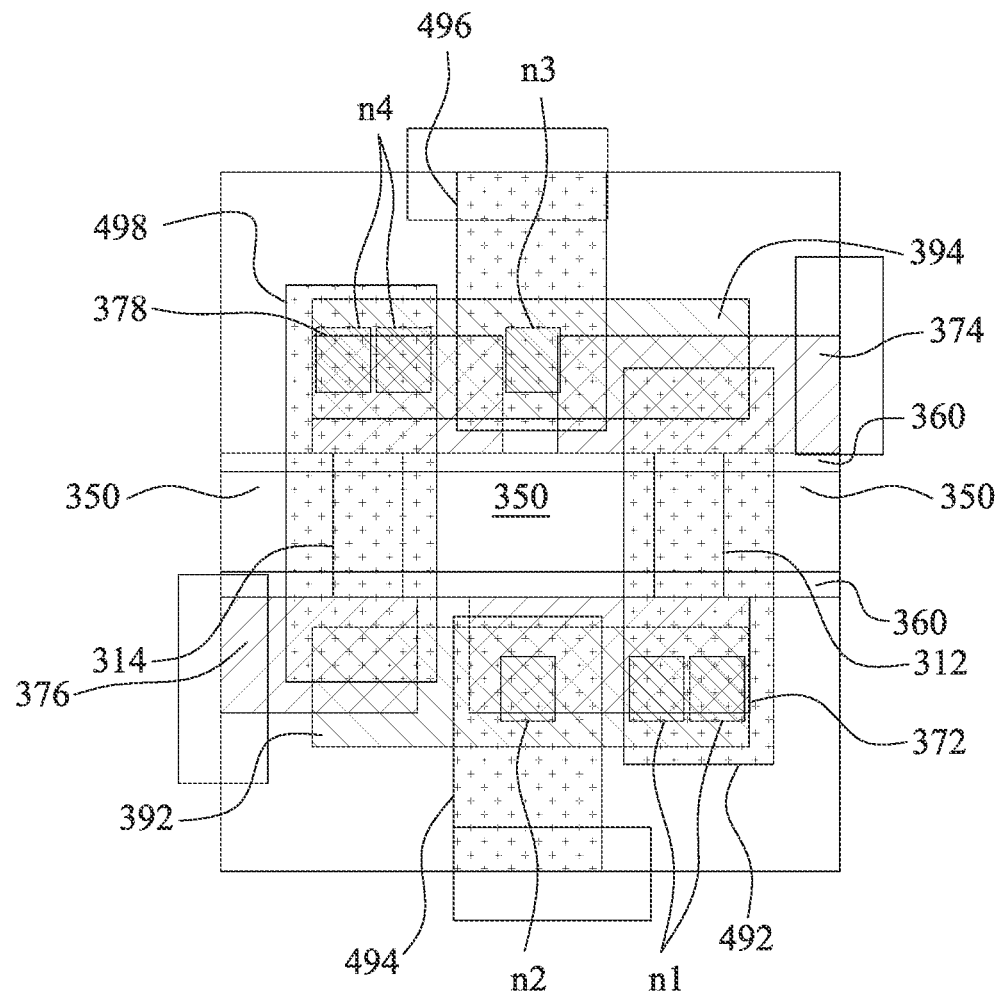
FIG. 22 is a top view of a memory cell in accordance with some embodiments of the present disclosure.

FIG. 22 is a top view of a memory cell in accordance with some embodiments of the present disclosure. The difference between the memory cells of FIG. 22 and FIG. 19A pertains to the number of the first and second pull-down transistors PD1 and PD2. In FIG. 22, each of the first and second pull-down transistors PD1 and PD2 includes two channels (nanowires n1 and n4). With such configuration, the current of the each of the first and second pull-down transistors PD1 and PD2 of FIG. 22 is substantially twice each of the first and second pull-down transistors PD1 and PD2 of FIG. 19A. Further, in some embodiments, the current ratio of transistors PU1:PG1:PD1 (PU2:PG2:PD2) in FIG. 22 is about 1:1:2. Other relevant structural and manufacturing details of the memory cell of FIG. 22 are all substantially the same as or similar to the memory cell of FIGS. 19A-19E, and, therefore, a description in this regard will not be repeated hereinafter.

Figure 23A:
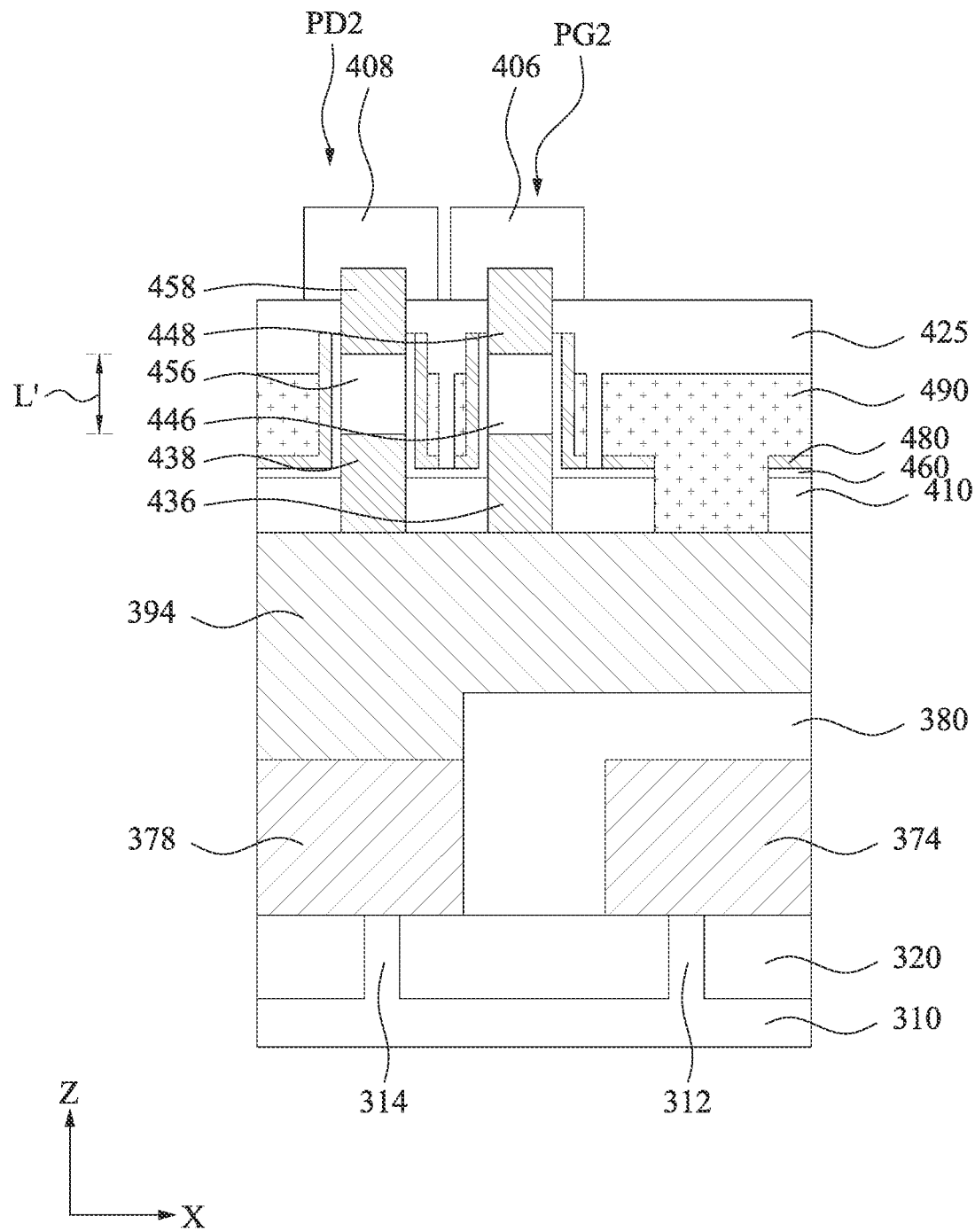
FIGS. 23A and 23B are cross-sectional views of a memory cell in accordance with some embodiments of the present disclosure.
Figure 23B:
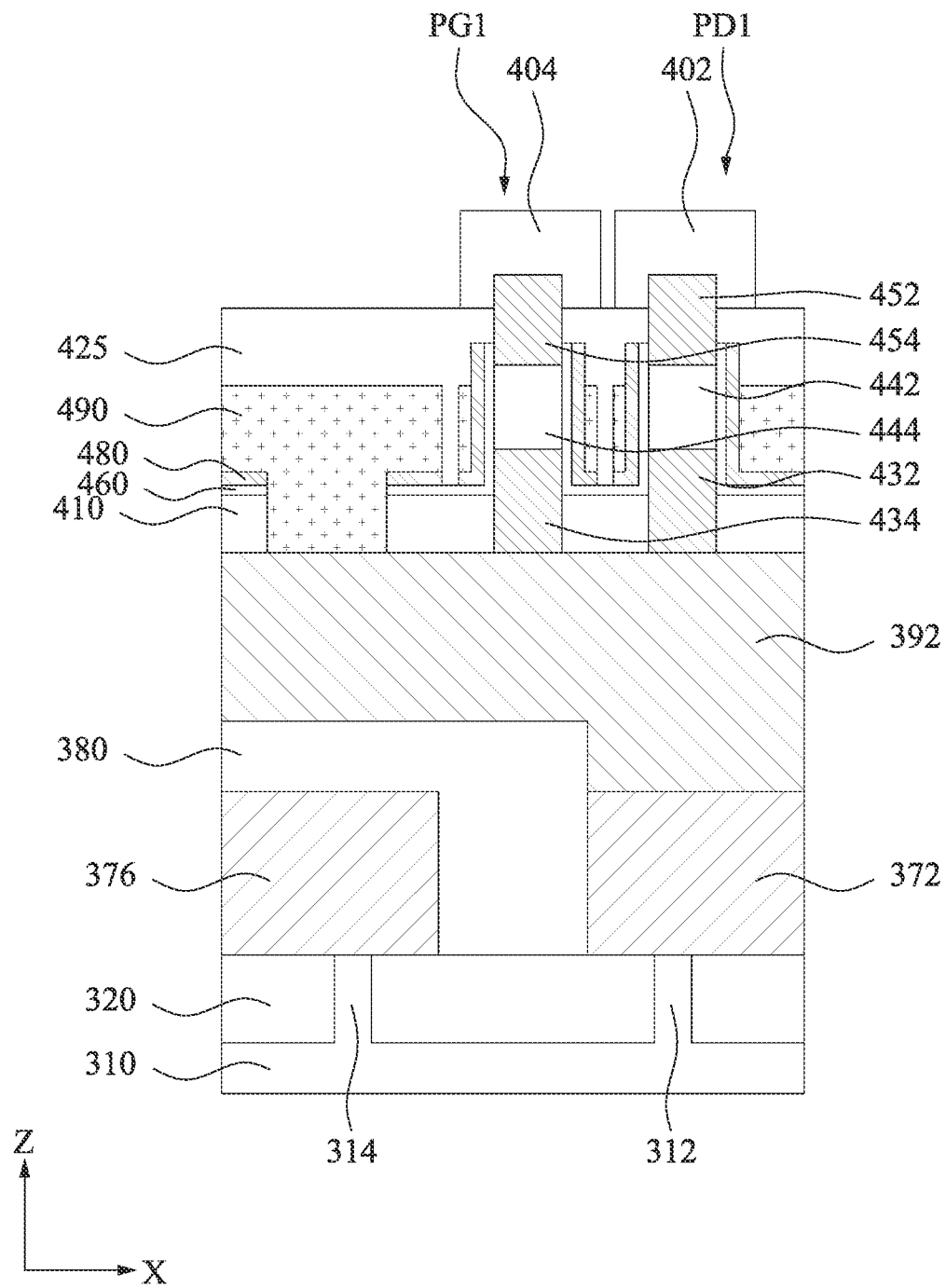

FIGS. 23A and 23B are cross-sectional views of a memory cell in accordance with some embodiments of the present disclosure. The difference between the memory cells of FIGS. 23A-23B and FIGS. 19D-19E pertains to the channel lengths of the transistors PD1, PD2, PG1, and PG2. In FIGS. 23A-23B, each of the transistors PD1, PD2, PG1, and PG2 has a channel length L' shorter than the channel length L shown in FIGS. 19D-19E. With such configuration, the current of each of the transistors PD1, PD2, PG1, and PG2 of FIGS. 23A-23B is greater than that of each of the transistors PD1, PD2, PG1, and PG2 of FIGS. 19D-19E. Further, in some embodiments, the current ratio of transistors PU1:PG1:PD1 (PU2:PG2:PD2) in FIGS. 23A-23B is about 1:2:2. Other relevant structural and manufacturing details of the memory cell of FIGS. 23A-23B are all substantially the same as or similar to the memory cell of FIGS. 19A-19E, and, therefore, a description in this regard will not be repeated hereinafter.

Figure 23C:
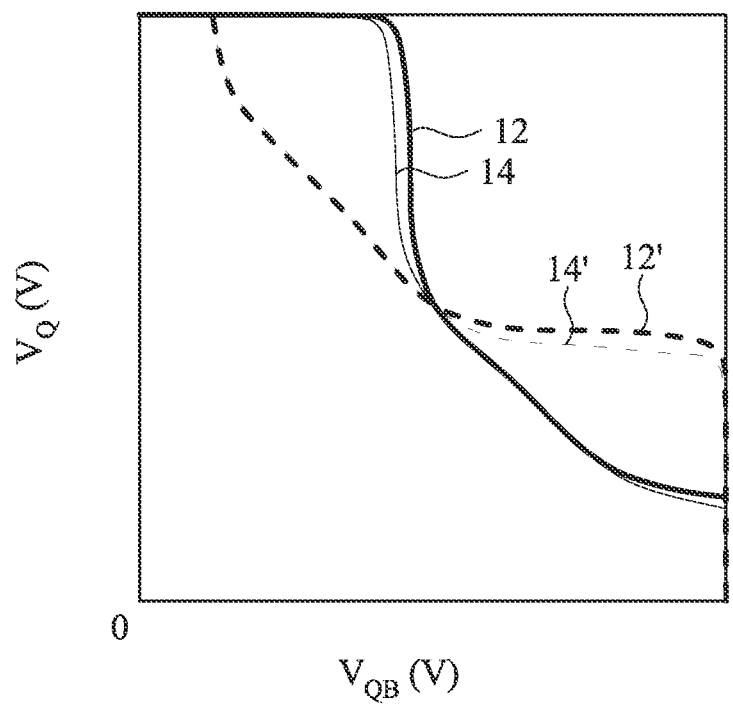
FIG. 23C illustrates simulated read static noise margin (RSNM) of the memory cells with different channel lengths.

FIG. 23C illustrates simulated read static noise margin (RSNM) of the memory cells with different channel lengths. In FIG. 23C, $V_{QB}$ and $V_B$ represent bit line voltages. Lines 12 and 12' represent bit-line voltage curves of a first memory cell, which includes PG and PD transistors having channel lengths with about 15 nm. Lines 14 and 14' represent bit-line voltage curves of a second memory cell, which includes PG and PD transistors having channel lengths with about 10 nm. The first and second memory cells have the same cell area.

Figure 24A:
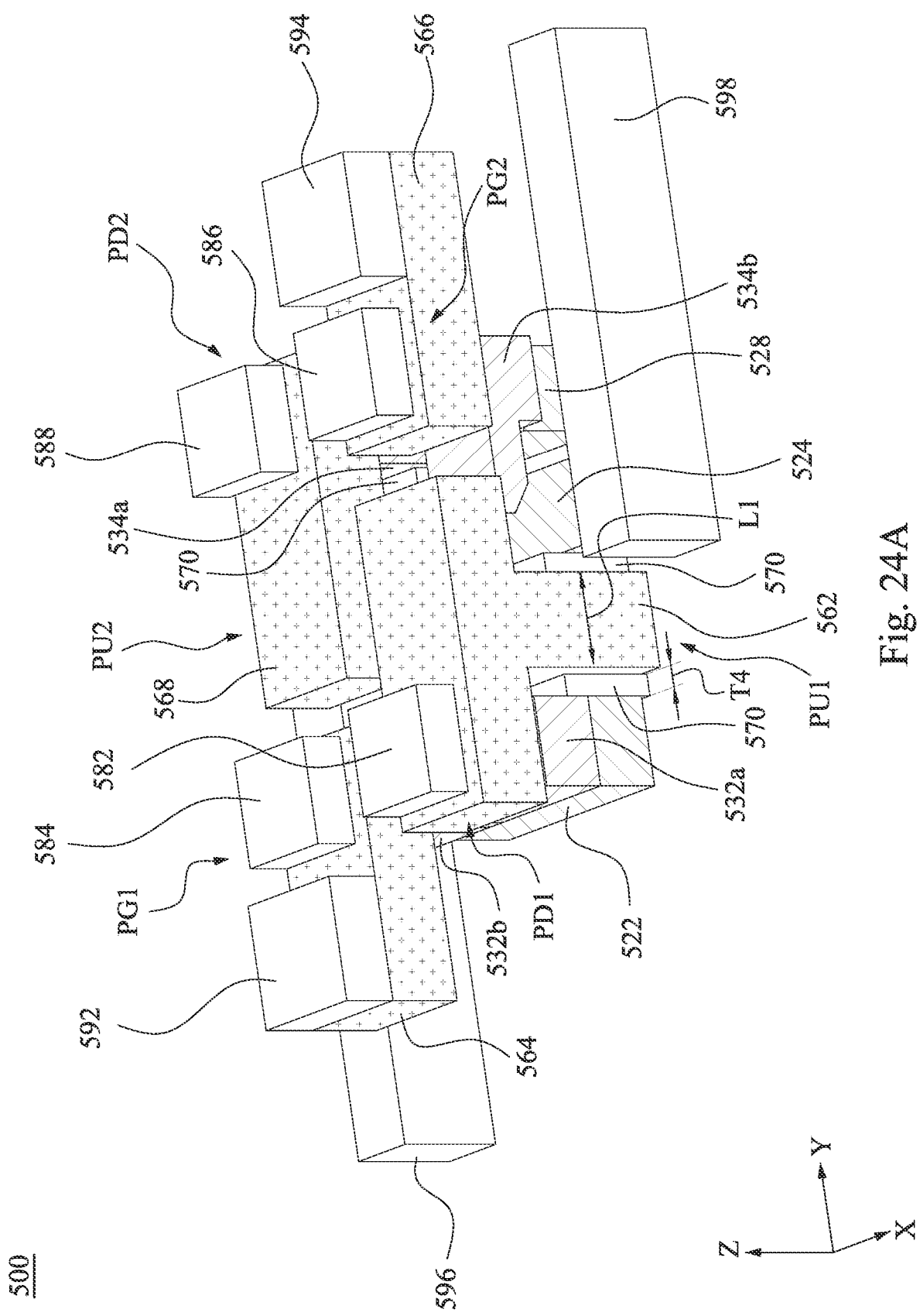
FIG. 24A is a schematic diagram of a perspective view of a layout structure corresponding to a memory cell, in accordance with some embodiments of the present disclosure.
Figure 24B:
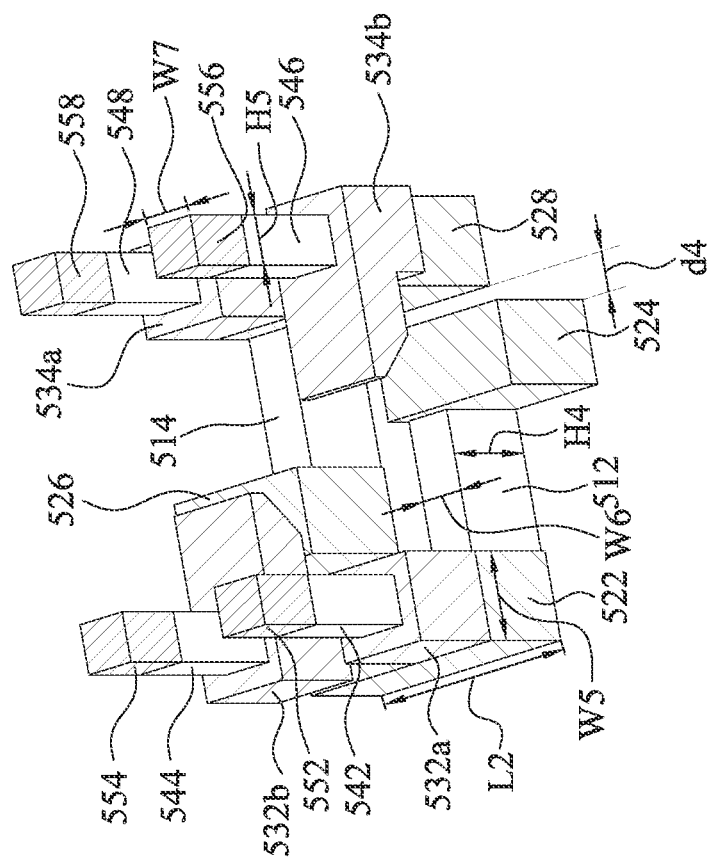
FIG. 24B is a schematic diagram of a perspective view of a layout structure of the memory cell without gate structures and conductive features, in accordance with some embodiments of the present disclosure.
Figure 24C:
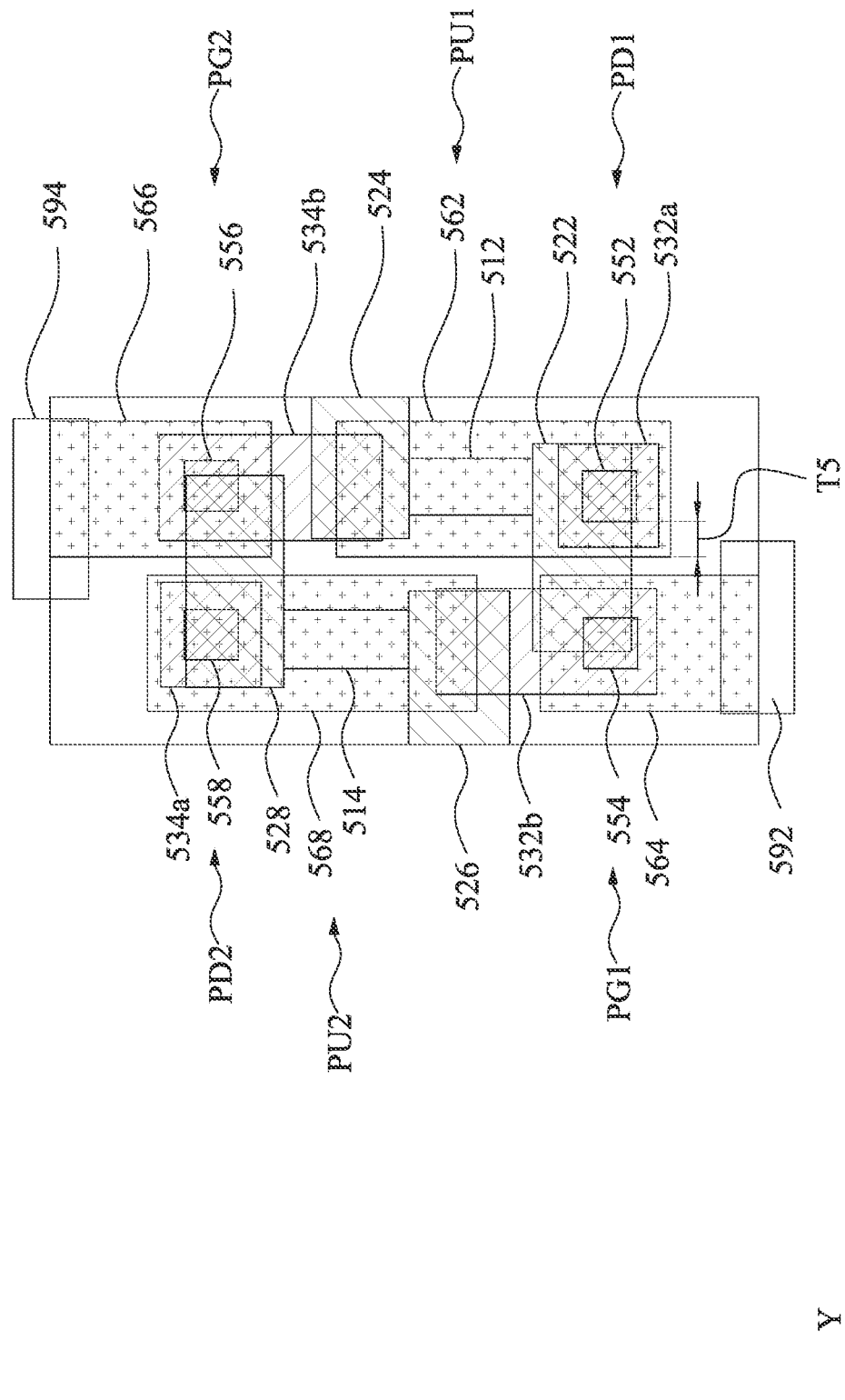
FIG. 24C is a top view of the memory cell in FIG. 24A.

FIG. 24A is a schematic diagram of a perspective view of a layout structure corresponding to a memory cell 500, in accordance with some embodiments of the present disclosure, FIG. 24B is a schematic diagram of a perspective view of a layout structure of the memory cell 500 without gate structures and conductive features, in accordance with some embodiments of the present disclosure, and FIG. 24C is a top view of the memory cell 500 in FIG. 24A. In addition to the memory cell 500, FIGS. 24A and 24B depict X-axis, Y-axis, and Z-axis directions. FIGS. 24A-24C depict a simplified version of the memory cell 500 for the purpose of illustrating the general spatial relationships between the various features.

The memory cell 500 may be an SRAM device. As illustratively shown in FIGS. 24A-24C, the memory cell 500 includes a first horizontal channel 512 and a second horizontal channel 514 extending in the Y direction. The first horizontal channel 512 and the second horizontal channel 514 are spaced apart from each other, and the first horizontal channel 512 is offset from the second horizontal channel 514. That is, the ends of the first horizontal channel 512 and the second horizontal channel 514 are misaligned in the X direction. In some embodiments, the first horizontal channel 512 and the second horizontal channel 514 are fin structures. In some other embodiments, the first horizontal channel 512 and the second horizontal channel 514 are nanosheets, nanowires, or combinations thereof.

The memory cell 500 further includes a first source/drain feature 522, a second source/drain feature 524, a third source/drain feature 526, and a fourth source/drain feature 528. The first source/drain feature 522 and the second source/drain feature 524 are on opposite sides of the first horizontal channel 512, and the third source/drain feature 526 and the fourth source/drain feature 528 are on opposite sides of the second horizontal channel 514. The first source/drain feature 522 and the third source/drain feature 526 are spaced apart from each other, and the second source/drain feature 524 and the fourth source/drain feature 528 are spaced apart from each other. The first source/drain feature 522, the second source/drain feature 524, the third source/drain feature 526, and the fourth source/drain feature 528 form a staggered pattern. For example, the second source/drain feature 524 is aligned with the second horizontal channel 514 in the X direction, and the third source/drain feature 526 is aligned with the first horizontal channel 512 in the X direction. In some embodiments, the first source/drain feature 522, the second source/drain feature 524, the third source/drain feature 526, and the fourth source/drain feature 528 are epitaxial structures or doped fin structures.

The memory cell 500 further includes fifth source/drain features 532a, 532b and sixth source/drain features 534a, 534b. In some embodiments, the fifth source/drain feature 532a, 532b are separated from each other as shown in FIGS. 24B and 24C. In some other embodiments, the fifth source/drain feature 532a, 532b are merged together. Similarly, the sixth source/drain features 534a, 534b may be separated from each other or merged together. The fifth source/drain features 532a, 532b are above and in contact with the first source/drain feature 522, and the sixth source/drain features 534a, 534b are above and in contact with the fourth source/drain feature 528. In some embodiments, a portion of the fifth source/drain feature 532b is suspended above the third source/drain feature 526, and a portion of the sixth source/drain feature 534b is suspended above the second source/drain feature 524. In some embodiments, the fifth source/drain features 532a, 532b and the sixth source/drain features 534a, 534b are epitaxial structures.

In some embodiments, the first source/drain feature 522, the second source/drain feature 524, the third source/drain feature 526, and the fourth source/drain feature 528 have a first conductivity type while the fifth source/drain features 532a, 532b and the sixth source/drain features 534a, 534b have a second conductivity type different from the first conductivity type. For example, the first conductivity type is P-type, and the second conductivity type is N-type, or vise versa.

The memory cell 500 further includes a first vertical channel 542, a second vertical channel 544, a third vertical channel 546, and a fourth vertical channel 548 extending in the Z direction. The first vertical channel 542 and the second vertical channel 544 are above and in contact with the fifth source/drain features 532a and 532b, respectively, and the third vertical channel 546 and the fourth vertical channel 548 are above and in contact with the sixth source/drain features 534b and 534a, respectively. In some embodiments, the first vertical channel 542, the second vertical channel 544, the third vertical channel 546, and the fourth vertical channel 548 are nanowires, nano-columns, nanotubes, or combinations thereof.

The memory cell 500 further includes a seventh source/drain feature 552, an eighth source/drain feature 554, a ninth source/drain feature 556, and a tenth source/drain feature 558 respectively above the first vertical channel 542, the second vertical channel 544, the third vertical channel 546, and the fourth vertical channel 548. In some embodiments, the seventh source/drain feature 552, the eighth source/drain feature 554, the ninth source/drain feature 556, and the tenth source/drain feature 558 are epitaxial structures, and have the second conductivity type.

The memory cell 500 further includes a first gate structure 562, a second gate structure 564, a third gate structure 566, and a fourth gate structure 568. The first gate structure 562 crosses over the first horizontal channel 512, wraps around the first vertical channel 542, is in contact with the sixth source/drain feature 534b, and is spaced apart from the fifth source/drain feature 532a. The second gate structure 564 wraps around the second vertical channel 544. The third gate structure 566 wraps around the third vertical channel 546. The fourth gate structure 568 crosses over the second horizontal channel 514, wraps around the fourth vertical channel 548, is in contact with the fifth source/drain feature 532b, and is spaced apart from the sixth source/drain feature 534a. In some embodiments, the first gate structure 562, the second gate structure 564, the third gate structure 566, and the fourth gate structure 568 may be polysilicon gates or metal gate structures.

As such, the first horizontal channel 512, the first source/drain feature 522, the second source/drain feature 524, and the first gate structure 562 form a first pull-up transistor PU1, the second horizontal channel 514, the third source/drain feature 526, the fourth source/drain feature 528, and the fourth gate structure 568 form a second pull-up transistor PU2, the first vertical channel 542, the fifth source/drain feature 532a, the seventh source/drain feature 552, and the first gate structure 562 form a first pull-down transistor PD1, the second vertical channel 544, the fifth source/drain feature 532b, the eighth source/drain feature 554, and the second gate structure 564 form a first pass gate transistor PG1, the third vertical channel 546, the sixth source/drain feature 534b, the ninth source/drain feature 556, and the third gate structure 566 form a second pass gate transistor PG2, and the fourth vertical channel 548, the sixth source/drain feature 534a, the tenth source/drain feature 558, and the fourth gate structure 568 form a second pull down transistor PD2.

The first pull-up transistor PU1 and the second pull-up transistor PU2 are horizontal FETs, and the first pull-down transistor PD1, the first pass gate transistor PG1, the second pass gate transistor PG2, and the second pull down transistor PD2 are vertical FETs. In some embodiments, the first pull-up transistor PU1 and the second pull-up transistor PU2 are P-type transistors, and the first pull-down transistor PD1, the first pass gate transistor PG1, the second pass gate transistor PG2, and the second pull down transistor PD2 are N-type transistors, or vise versa.

In some embodiments, the memory cell 500 further includes isolation structures 570 for isolating gate structures (e.g., the first gate structure 562 and the fourth gate structure 568) from source/drain features (e.g., the first to sixth source/drain features 522, 524, 526, 528, 532a, 532b, 534a, and 534b).

In some embodiments, the memory cell 500 further includes conductive features 582, 584, 586, 588, 592, 594, 596, and 598. For clarity, the conductive features 582, 584, 586, 588, 596, and 598 are omitted in FIG. 24C and are shown in FIG. 24A. The conductive features 582, 584, 586, 588 are couple to the seventh to tenth source/drain features 552, 554, 556, and 558, respectively. The conductive features 592 and 594 are couple to the second and third gate structures 564 and 566, respectively. The conductive feature 596 is couple to the second source/drain feature 526, and the conductive feature 598 is couple to the third source/drain feature 524. The conductive features 582, 584, 586, 588, 592, 594, 596, and 598 are configured to interconnect the corresponding element to other circuits or interconnect structure. For example, the conductive feature 582 can be coupled to a VSS line, the conductive feature 584 can be coupled to a bit line, the conductive feature 586 can be coupled to another bit line, the conductive feature 588 can be coupled to the VSS line, the conductive feature 592 and 594 can be coupled to a word line, and the conductive features 596 and 598 can be coupled to a VDD line.

The first gate structure 562 has a portion crossing the first horizontal channel 512, and the portion has a length L1 in a range of about 10 nm to about 15 nm. Similarly, the fourth gate structure 568 has a portion crossing the second horizontal channel 514, and the portion of the fourth gate structure 568 has a length in a range of about 10 nm to about 15 nm. Each of the first to fourth source/drain features 522, 524, 526, and 528 has a length L2 in a range of about 25 nm to about 35 nm and a width W5 in a range of about 15 nm to about 25 nm. In some embodiments, each of the isolation structures 570 has a thickness T4 in a range of about 5 nm to about 10 nm. The gate structure 562 (564, 566, 568) has a portion surrounding the vertical channel 542 (544, 546, 548), and the portion has a thickness T5 in a range of about 1 nm to about 3 nm. Moreover, the effective oxide thickness (EOT) of the portion of the gate structure 562 (564, 566, 568) is in a range of about 0.5 nm to about 1.5 nm. Each of the first horizontal channels 512 and 514 has a height H4 in a range of about 5 nm to about 15 nm and has a width W6 in a range of about 5 nm to about 15 nm. Each of the first to fourth vertical channels 542, 544, 546, and 548 has a height H5 in a range of about 5 nm to about 15 nm and has a width W7 in a range of about 5 nm to about 15 nm. A distance d4 between the second and fourth source/drain features 524 and 528 (or between the first and third source/drain features 522 and 526) is in a range of about 2 nm to about 8 nm.

Figure 25A:
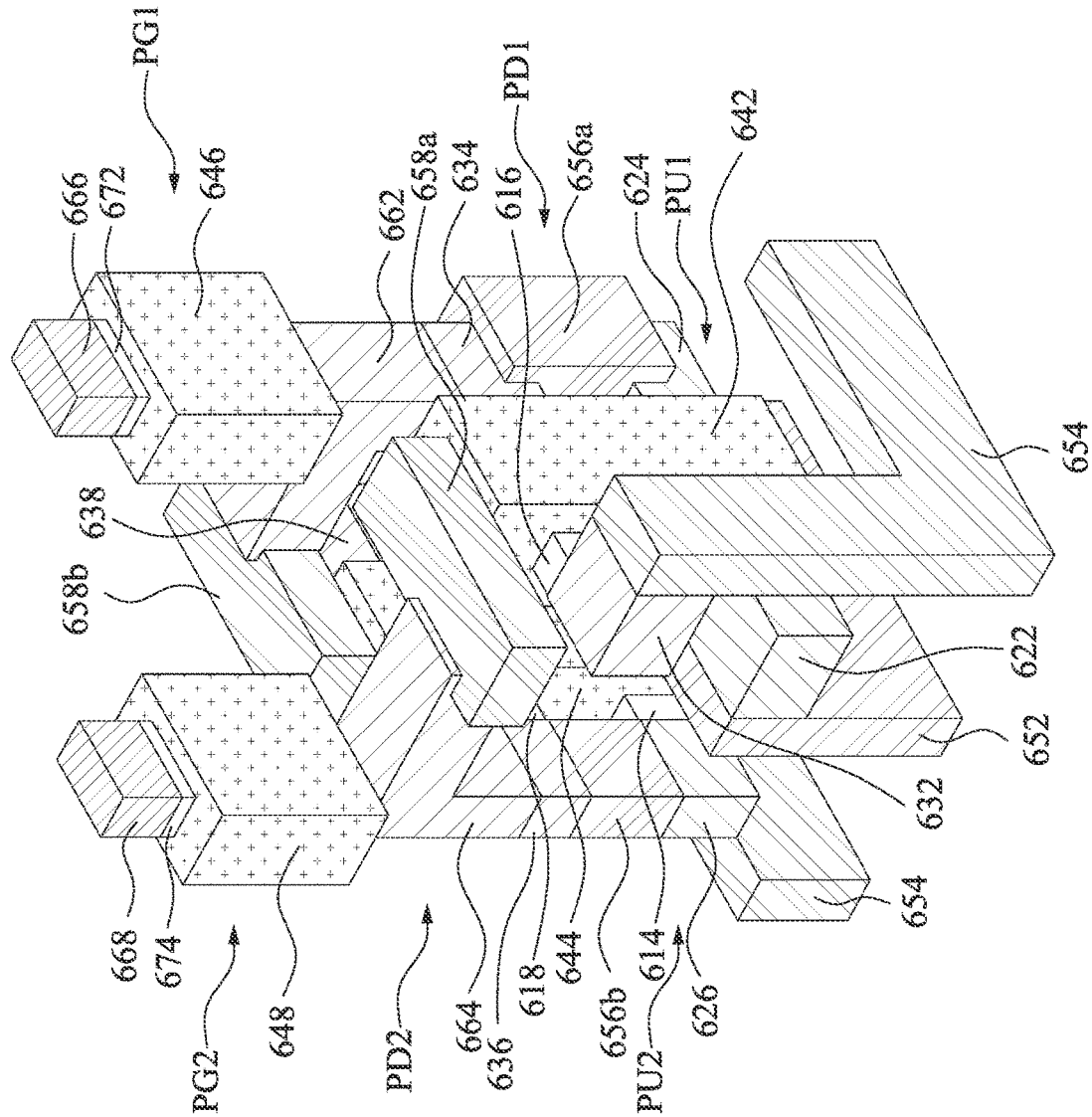
FIG. 25A is a schematic diagram of a perspective view of a layout structure corresponding to a memory cell, in accordance with some embodiments of the present disclosure.

FIG. 25A is a schematic diagram of a perspective view of a layout structure corresponding to a memory cell 600, in accordance with some embodiments of the present disclosure, and FIG. 25B is a schematic diagram of a perspective view of a layout structure of the memory cell 600 without gate structures and conductive features, in accordance with some embodiments of the present disclosure. In addition to the memory cell 600, FIGS. 25A and 25B depict X-axis, Y-axis, and Z-axis directions. FIGS. 25A and 25B depict a simplified version of the memory cell 600 for the purpose of illustrating the general spatial relationships between the various features; the specific spatial relationships of the various embodiments are discussed below with respect to FIGS. 44A-44E.

The memory cell 600 may be an SRAM device. As illustratively shown in FIGS. 25A and 25B, the memory cell 600 includes a first horizontal channel 612, a second horizontal channel 614, a third horizontal channel 616, and a fourth horizontal channel 618 extending in the Y direction.

The first horizontal channel 612, the second horizontal channel 614, the third horizontal channel 616, and the fourth horizontal channel 618 are spaced apart from each other. The third horizontal channel 616 is directly above the first horizontal channel 612, and the fourth horizontal channel 618 is directly above the second horizontal channel 614. In some embodiments, the first horizontal channel 612, the second horizontal channel 614, the third horizontal channel 616, and the fourth horizontal channel 618 are fin structures. In some other embodiments, the first horizontal channel 612, the second horizontal channel 614, the third horizontal channel 616, and the fourth horizontal channel 618 are nanosheets, nanowires, or combinations thereof. For example, the first horizontal channel 612 and the second horizontal channel 614 are fin structures, and the third horizontal channel 616 and the fourth horizontal channel 618 are nanosheets, nanowires, or combinations thereof.

The memory cell 600 further includes a first source/drain feature 622, a second source/drain feature 624, a third source/drain feature 626, a fourth source/drain feature 628, a fifth source/drain feature 632, a sixth source/drain feature 634, a seventh source/drain feature 636, and an eighth source/drain feature 638. The first source/drain feature 622 and the second source/drain feature 624 are on opposite sides of the first horizontal channel 612, the third source/drain feature 626 and the fourth source/drain feature 628 are on opposite sides of the second horizontal channel 614, the fifth source/drain feature 632 and the sixth source/drain feature 634 are on opposite sides of the third horizontal channel 616, and the seventh source/drain feature 636 and the eighth source/drain feature 638 are on opposite sides of the fourth horizontal channel 618. The first source/drain feature 622, the second source/drain feature 624, the third source/drain feature 626, the fourth source/drain feature 628, the fifth source/drain feature 632, the sixth source/drain feature 634, the seventh source/drain feature 636, and the eighth source/drain feature 638 are spaced apart from each other. In some embodiments, the first source/drain feature 622, the second source/drain feature 624, the third source/drain feature 626, the fourth source/drain feature 628, the fifth source/drain feature 632, the sixth source/drain feature 634, the seventh source/drain feature 636, and the eighth source/drain feature 638 are epitaxial structures or doped fin structures.

In some embodiments, the first to fourth source/drain features 622, 624, 626, and 628 have a first conductivity type while the fifth to eighth source/drain features 632, 634, 636, and 638 have a second conductivity type different from the first conductivity type. For example, the first conductivity type is P-type, and the second conductivity type is N-type, or vise versa.

The memory cell 600 further includes a first gate structure 642 and a second gate structure 644. The first gate structure 642 surrounds the first and third horizontal channels 612 and 616, and the second gate structure 644 surrounds the second and fourth horizontal channels 614 and 618. As such, the first horizontal channel 612, the first and second source/drain features 622 and 624, and the first gate structure 642 form a first pull-up transistor PU1, the second horizontal channel 614, the third and fourth source/drain features 626 and 628, and the second gate structure 644 form a second pull-up transistor PU2, the third horizontal channel 616, the fifth and sixth source/drain features 632 and 634, and the first gate structure 642 form a first pull-down transistor PD1, and the fourth horizontal channel 618, the seventh and eighth source/drain features 636 and 638, and the second gate structure 644 form a second pull-down transistor PD2.

The first pull-down transistor PD1, the first pull-down transistor PD1, the first pull-up transistor PU1, and the second pull-up transistor PU2 are horizontal FETs. In some embodiments, the first pull-up transistor PU1 and the second pull-up transistor PU2 are P-type transistors, and the first pull-down transistor PD1 and the second pull-down transistor PD2 are N-type transistors, or vise versa.

The memory cell 600 further includes conductive features 652, 654, 656a, and 656b. The conductive feature 652 is coupled to the first source/drain feature 622 and the fourth source/drain feature 628 and may be referred to as VDD power lines. The conductive features 654 are respectively coupled to the fifth source/drain feature 632 and the eighth source/drain feature 638 and may be referred to as VSS power lines. The conductive feature 656a is coupled to the second and sixth source/drain features 624 and 634, and the conductive feature 656b is coupled to the third and seventh source/drain features 626 and 636.

The memory cell 600 further includes a ninth source/drain feature 662 and a tenth source/drain feature 664 coupled to the sixth source/drain feature 634 and the seventh source/drain feature 636, respectively. The memory cell 600 further includes a first vertical channel 672 and a second vertical channel 674 coupled to the ninth source/drain feature 662 and the tenth source/drain feature 664, respectively. The memory cell 600 further includes an eleventh source/drain feature 666 and a twelfth source/drain feature 668 coupled to the first vertical channel 672 and the second vertical channel 674, respectively. In some embodiments, the ninth source/drain feature 662, the tenth source/drain feature 664, the eleventh source/drain feature 666, and the twelfth source/drain feature 668 are epitaxial structures with the second conductivity type.

The memory cell 600 further includes a third gate structure 646 surrounds the first vertical channel 672 and a fourth gate structure 648 surrounds the second vertical channel 674. As such, the first vertical channel 672, the ninth and eleventh source/drain features 662 and 666, and the third gate structure 646 form a first pass gate transistor PG1, and the second vertical channel 674, the tenth and twelfth source/drain features 664 and 668, and the fourth gate structure 648 form a second pass gate transistor PG2. The first pass gate transistor PG1 and the second pass gate transistor PG2 are vertical FETs. In some embodiments, the first pass gate transistor PG1 and the second pass gate transistor PG2 are N-type transistors. In some other embodiments, the first pass gate transistor PG1 and the second pass gate transistor PG2 are P-type transistors.

The memory cell 600 further includes conductive features 658a and 658b. The conductive feature 658a is coupled to the first gate structure 642 and the tenth source/drain feature 664, such that the first gate structure 642 is electrically connected to the third, seventh, and tenth source/drain features 626, 636, and 664. The conductive feature 658b is coupled to the second gate structure 644 and the ninth source/drain feature 662, such that the second gate structure 644 is electrically connected to the second, sixth, and ninth source/drain features 624, 634, and 662.

Figure 26:
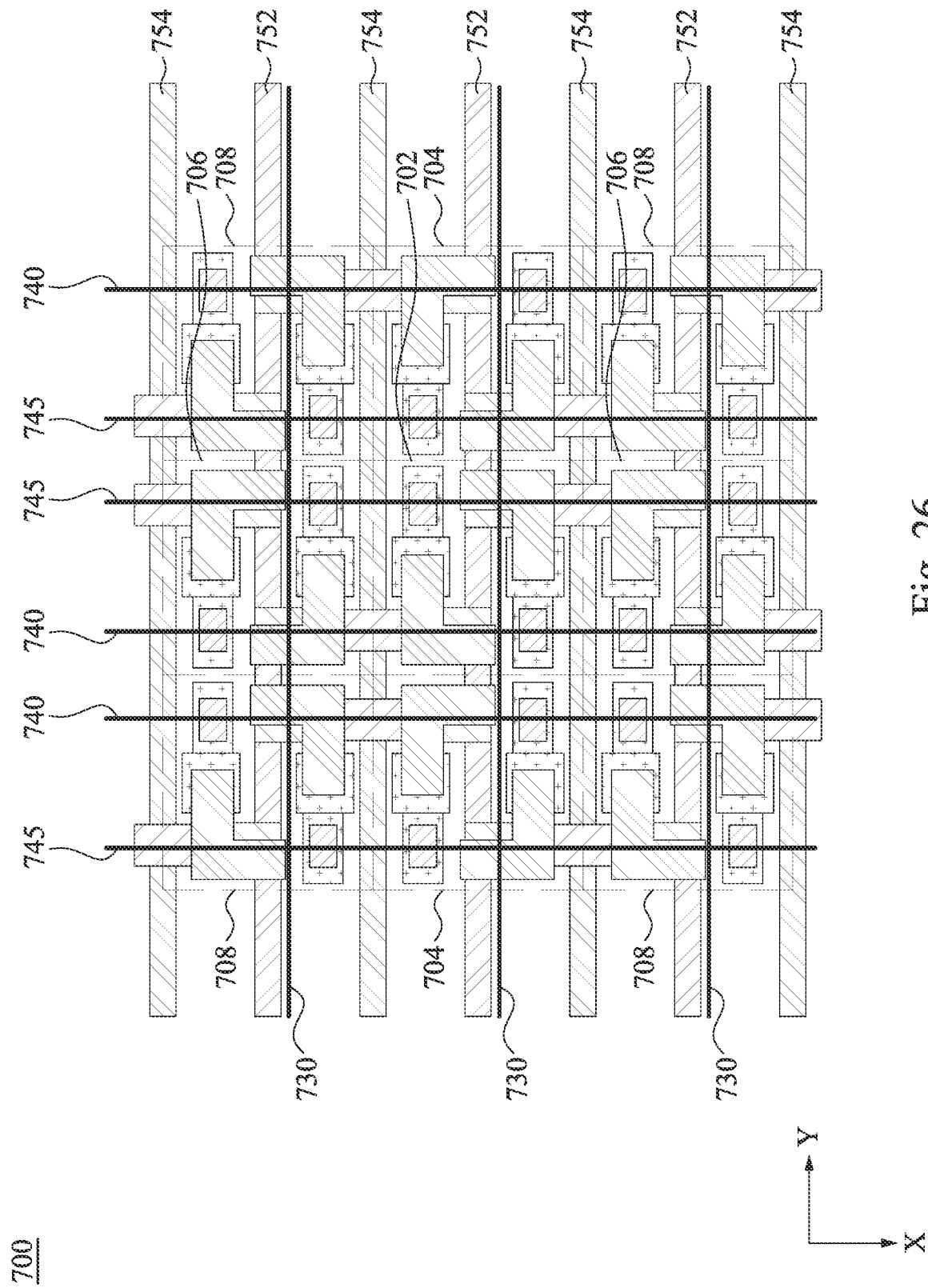
FIG. 26 is a schematic diagram of a top view of a memory device, in accordance with some embodiments of the present disclosure.

FIG. 26 is a schematic diagram of a top view of a memory device 700, in accordance with some embodiments of the present disclosure. As shown in FIG. 26, the memory device 700 includes an array of memory cells 702, 704, 706, and 708. All of the memory cells 702, 704, 706, and 708 have an identical structure as the memory cell 600 of FIG. 25A but different orientations. In greater detail, the memory cells 702 and 704 are symmetric with relative to the illustrated X axis, and the memory cells 706 and 708 are symmetric with relative to the illustrated X axis. The memory cells 702 and 706 are symmetric with relative to the illustrated Y axis, and the memory cells 704 and 708 are symmetric with relative to the illustrated Y axis. The memory cells 702, 704, 706, and 708 as a group may be reproduced and allocated as a plurality of rows and columns to form a memory cell array.

In FIG. 26, the fifth source/drain features 632 (see FIG. 25A) in adjacent memory cells 702, 704, 706, and 708 can be integrally formed. The eighth source/drain features 638 (see FIG. 25A) in adjacent memory cells 702, 704, 706, and 708 can be integrally formed.

The memory device 700 further includes conductive lines. For example, the conductive lines include VDD power lines 752, VSS power lines 754, word lines 730, and bit lines 740 and 745 above the array of memory cells. The VDD power lines 752, the VSS power lines 754, and the word lines 730 extend in the Y direction, and the bit lines 740 and 745 extend in the X direction. The VDD power lines 752 are connected to the conductive features 652 (see FIG. 25A), respectively, such that the first and fourth source/drain features 622 and 628 (see FIG. 25A) can be connected to the VDD power lines 752 through the conductive features 652. The VSS power lines 754 are respectively connected to the fifth and eighth source/drain features 632 and 638 (see FIG. 25B) respectively through the conductive features 654 (see FIG. 25A). The word lines 730 are connected to the third and fourth gate structures 646 and 648 (see FIG. 25A). The bit lines 740 are connected to the eleventh source/drain features 666 (see FIG. 25A), and the bit lines 745 are connected to the twelfth source/drain feature 668 (see FIG. 25A).

Figure 27A:
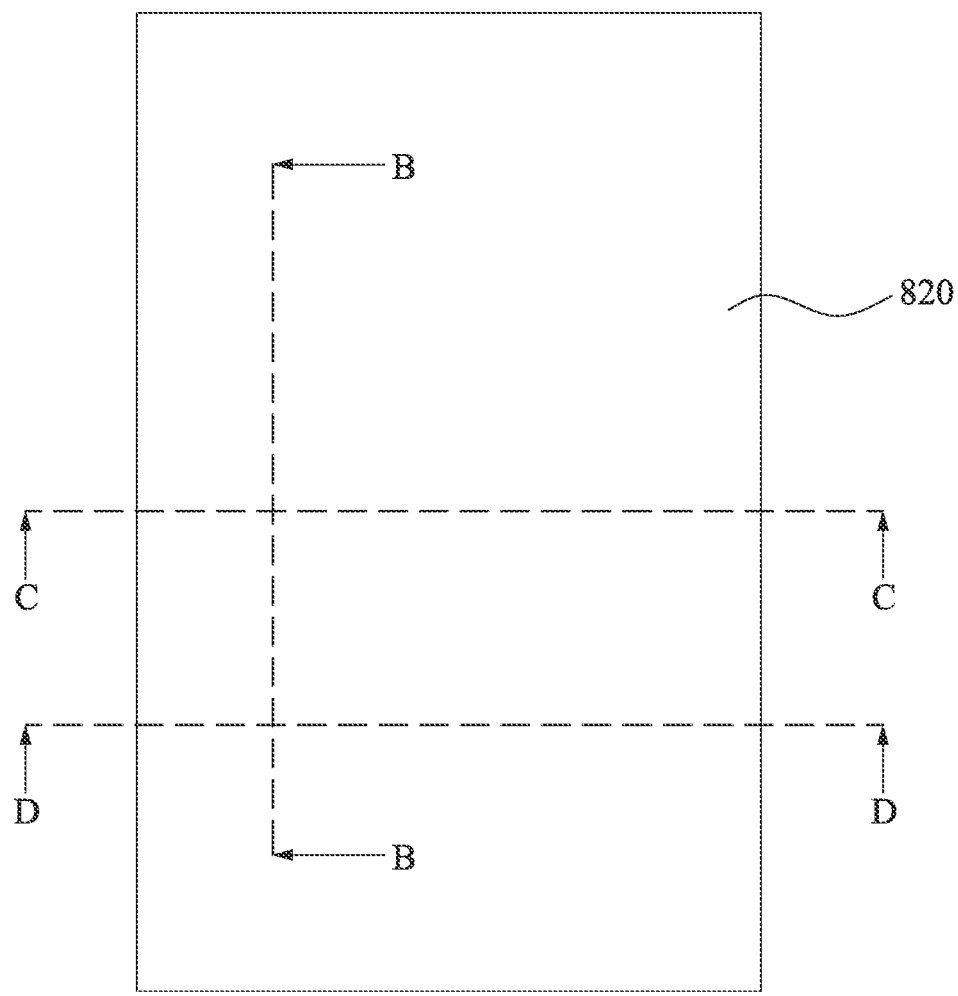
FIG. 27A-44E illustrate a method for manufacturing a memory cell at various stages in accordance with some embodiments of the present disclosure.
Figure 27A:
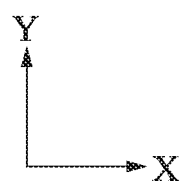
Figure 27B:
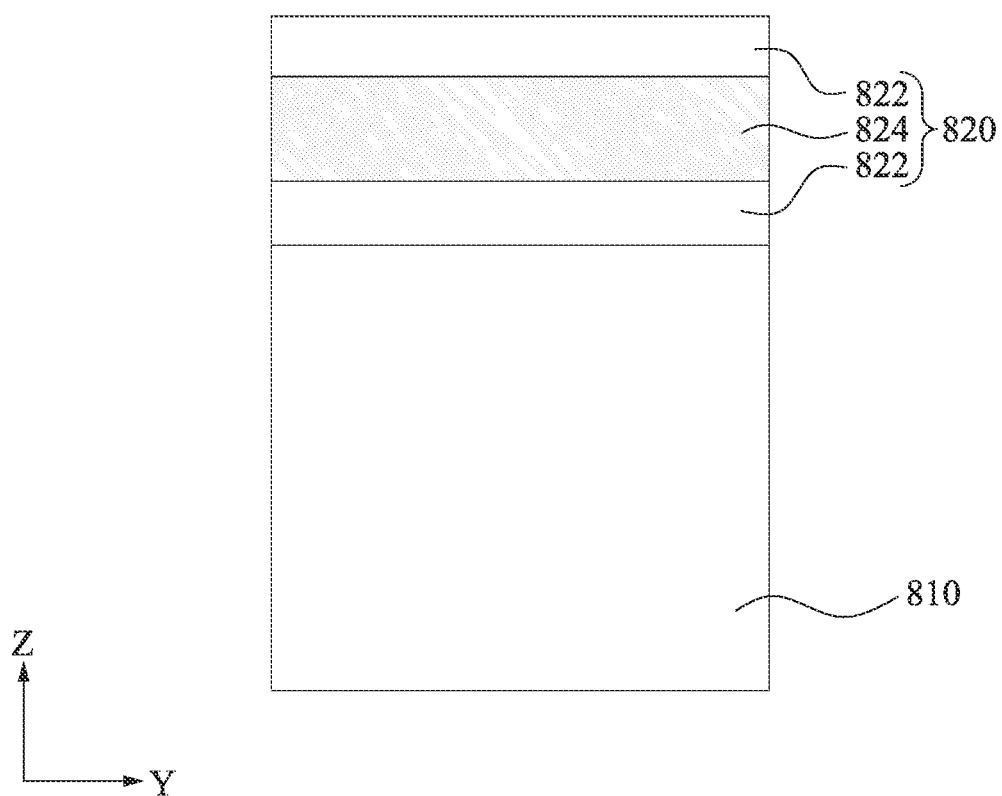
Figure 27C:
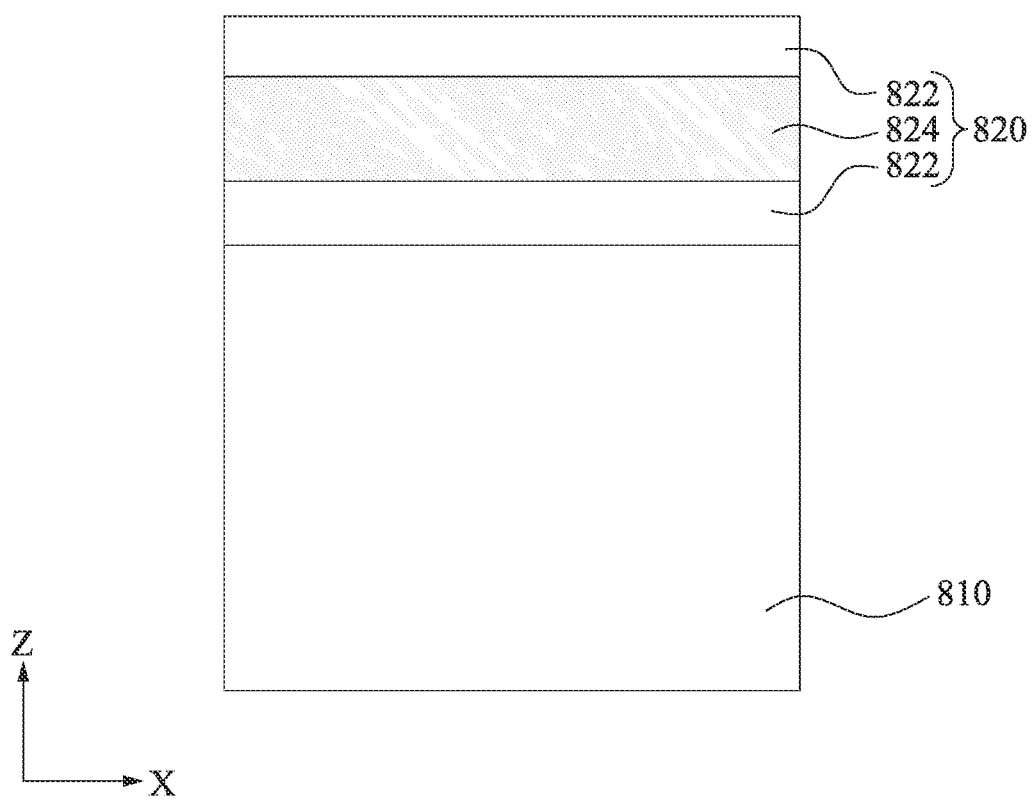
Figure 27D:
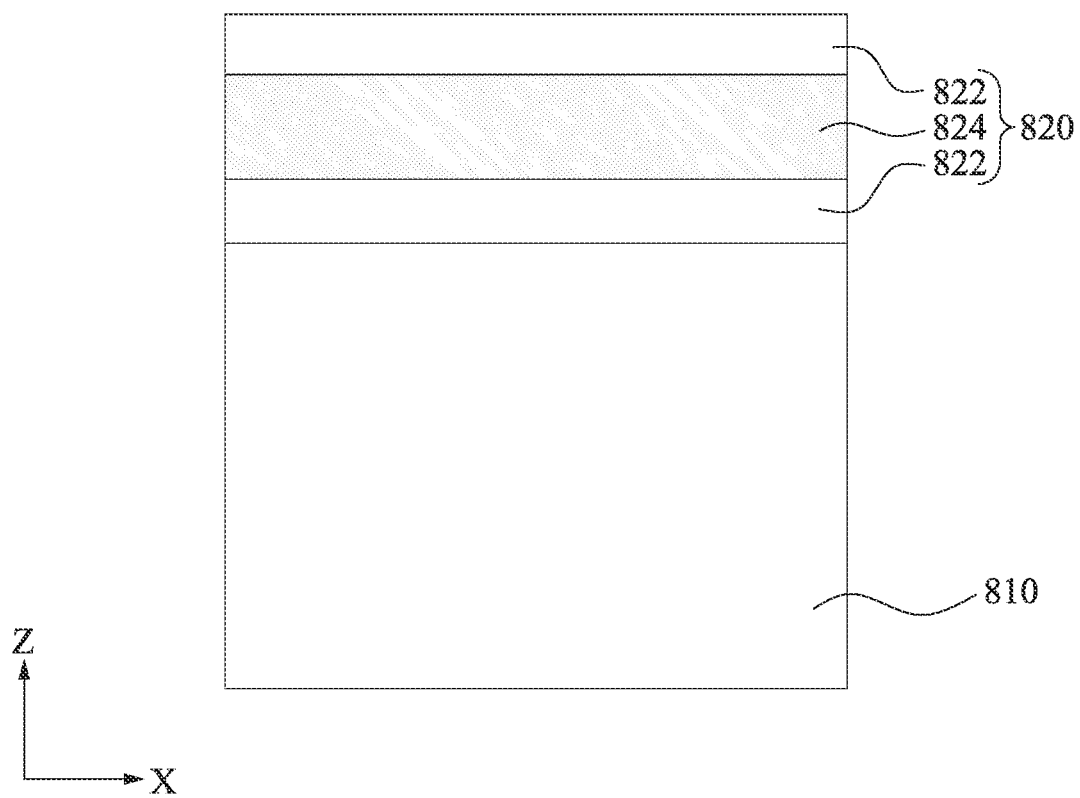

FIG. 27A-44E illustrate a method for manufacturing a memory cell at various stages in accordance with some embodiments of the present disclosure. FIG. 27A is a top view of a memory cell at various stages in accordance with some embodiments of the present disclosure, FIG. 27B is a cross-sectional view taken along line B-B in FIG. 27A, FIG. 27C is a cross-sectional view taken along line C-C in FIG. 27A, and FIG. 27D is a cross-sectional view taken along line D-D in FIG. 27A. A substrate 810 is provided. In some embodiments, the substrate 810 may include silicon (Si). Alternatively, the substrate 810 may include germanium (Ge), silicon germanium (SiGe), gallium arsenide (GaAs) or other appropriate semiconductor materials. In some embodiments, the substrate 810 may include a semiconductor-on-insulator (SOI) structure such as a buried dielectric layer. Also alternatively, the substrate 810 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 810 may include any of a variety of substrate structures and materials.

A stacked structure 820 is formed on the substrate 810 through epitaxy, such that the stacked structure 820 forms crystalline layers. The stacked structure 820 includes at least one first semiconductor layer 822 and at least one second semiconductor layer 824 stacked alternately. The first semiconductor layer 822 and the second semiconductor layer 824 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layer 822 and the second semiconductor layer 824 are made of Si, a Si compound, SiGe, Ge or a Ge compound. In FIGS. 27B-27D, two layers of the first semiconductor layers 822 and a single layer of the second semiconductor layer 824 are disposed. However, the numbers of the layers are not limited to one or two, and may be 2-10 layers of each of the first and second semiconductor layers are formed. By adjusting the numbers of the stacked layers, a driving current of the GAA FET device can be adjusted.

In some embodiments, the first semiconductor layers 822 can be SiGe layers having a germanium atomic percentage greater than zero. In some embodiments, the germanium percentage of the first semiconductor layers 822 is in the range between about 1 percent and about 99 percent. In some embodiments, the thickness of the first semiconductor layers 822 is in the range between about 5 nm and about 200 nm.

In some embodiments, the second semiconductor layer 824 may be pure silicon layers that are free from germanium. The second semiconductor layer 824 may also be substantially pure silicon layers, for example, with a germanium atomic percentage lower than about 1 percent. Furthermore, the second semiconductor layer 824 may be intrinsic, which are not doped with p-type and n-type impurities. In some embodiments, the thickness of the second semiconductor layer 824 is in the range between about 1 nm and about 100 nm.

Figure 28A:
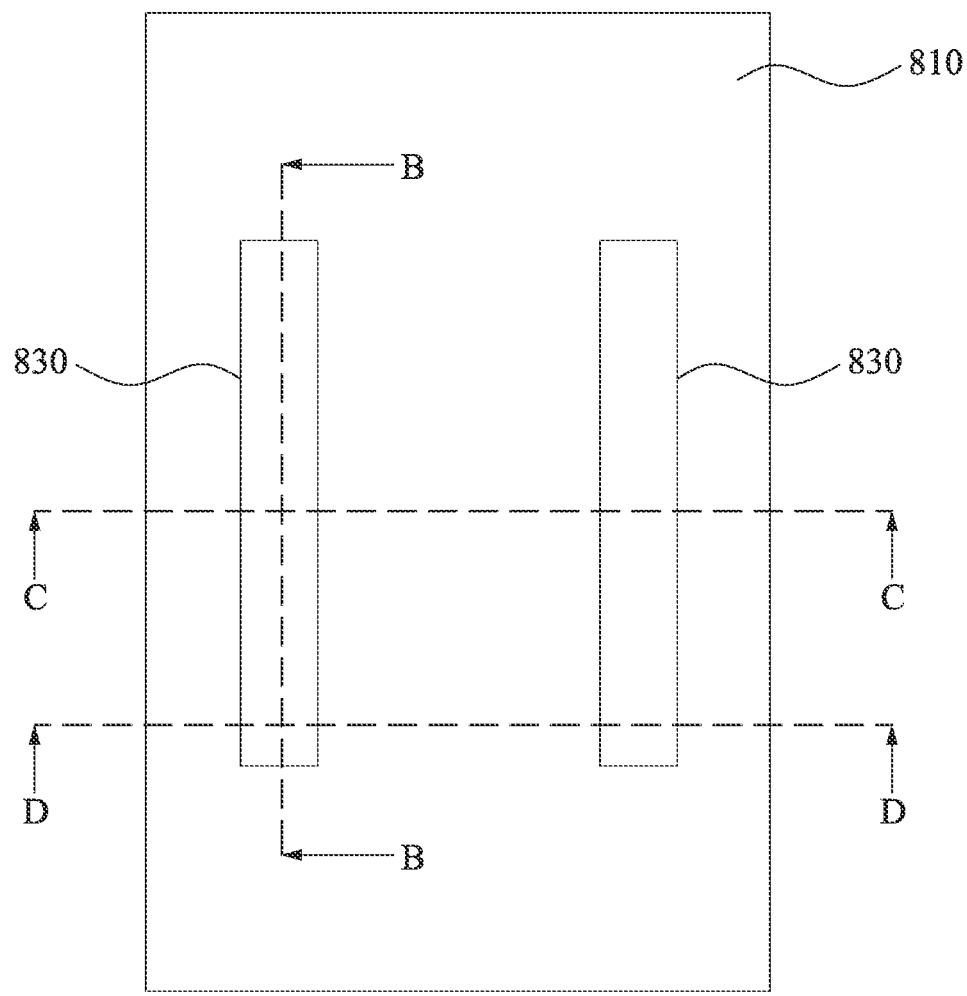
Figure 28B:
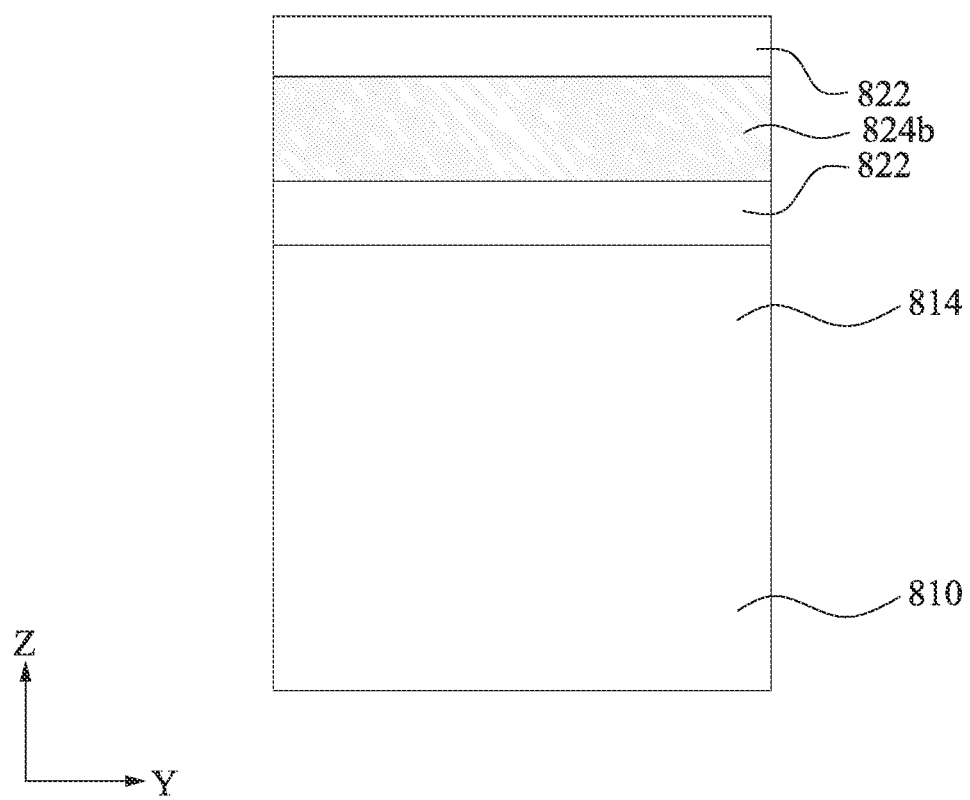
Figure 28C:
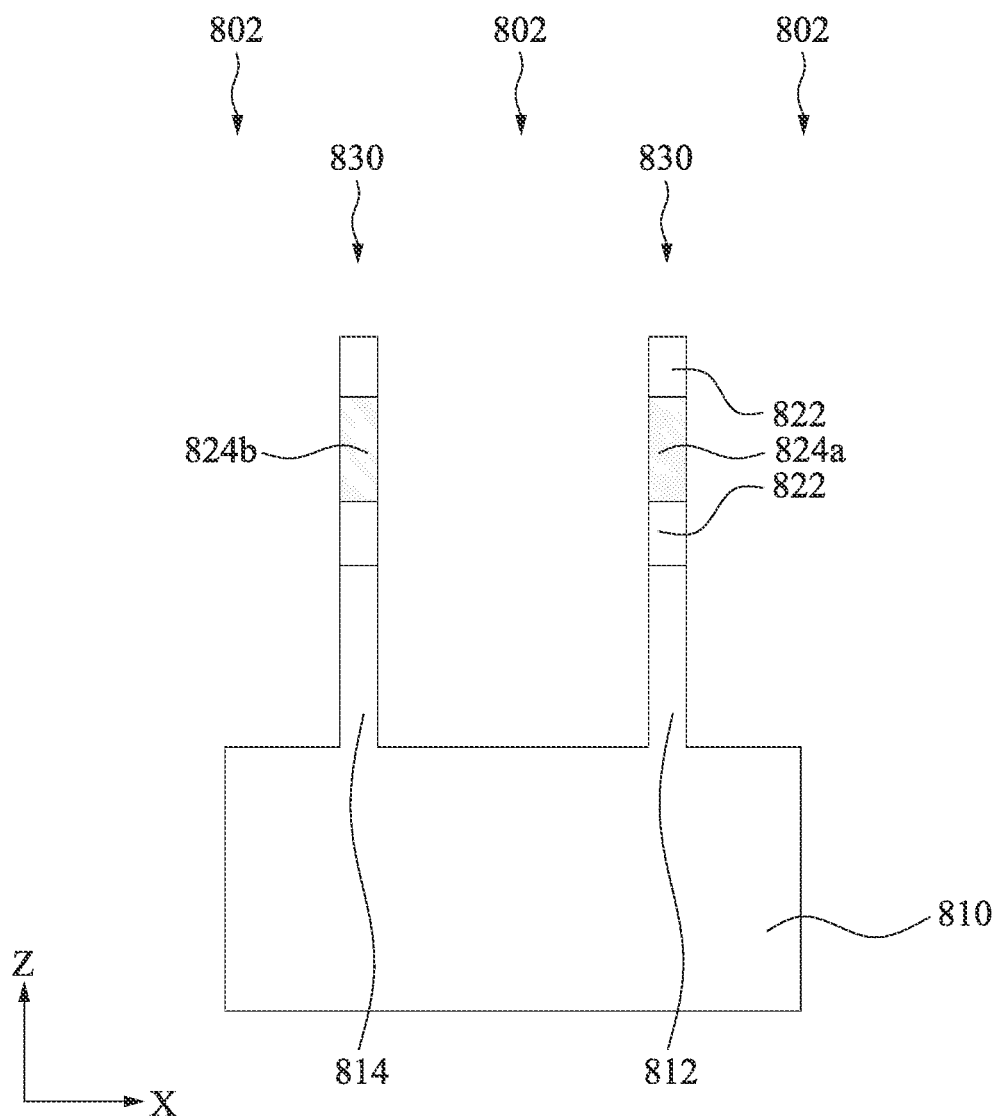
Figure 28D:
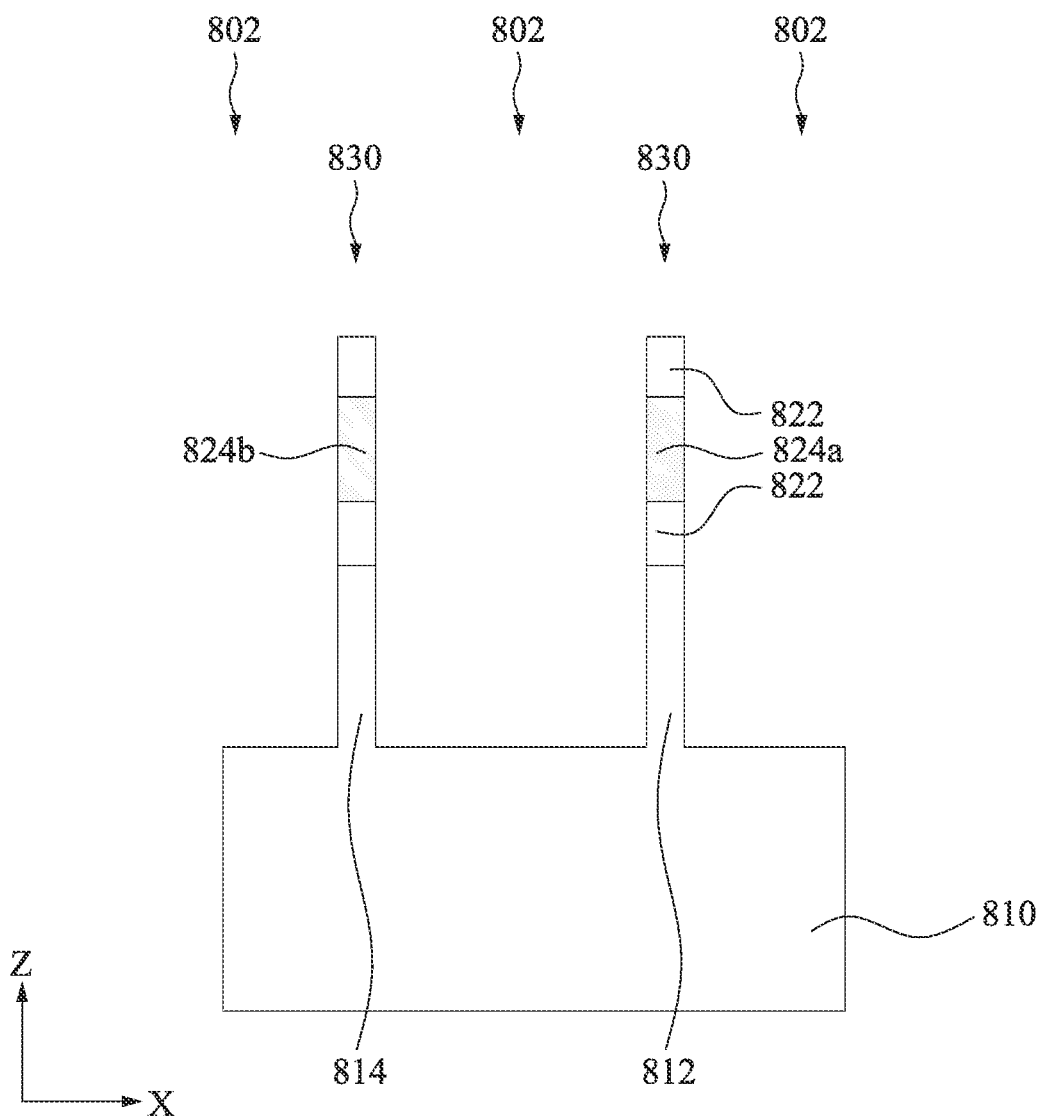

FIG. 28A is a top view of a memory cell at various stages in accordance with some embodiments of the present disclosure, FIG. 28B is a cross-sectional view taken along line B-B in FIG. 28A, FIG. 28C is a cross-sectional view taken along line C-C in FIG. 28A, and FIG. 28D is a cross-sectional view taken along line D-D in FIG. 28A. The stacked structure 820 (see FIGS. 27A-27D) is patterned by using a mask layer as an etch mask, such that the stacked structure 820 is patterned into fin structures 830 and first trenches 802 extending in the Y direction. In FIGS. 28A-28D, two fin structures 830 are arranged in the X direction. But the number of the fin structures is not limited to, and may be three or more. In some embodiments, one or more dummy fin structures are formed on both sides of the fin structures 830 to improve pattern fidelity in the patterning operations.

The trenches 802 extend into the substrate 810, and have lengthwise directions substantially parallel to each other. The trenches 802 form semiconductor fins 812 and 814 in the substrate 810, where the semiconductor fins 812 and 814 protrude from the substrate 810, and the fin structures 830 are respectively formed above the semiconductor fins 812 and 814 of the substrate 810. The remaining portions of the stacked structure 820 are accordingly referred to as the fin structures 830 alternatively. A portion of the semiconductor layer 824 right above the semiconductor fin 812 is labeled as 824a, and another portion of the semiconductor layer 824 right above the semiconductor fin 814 is labeled as 824b.

Figure 29A:
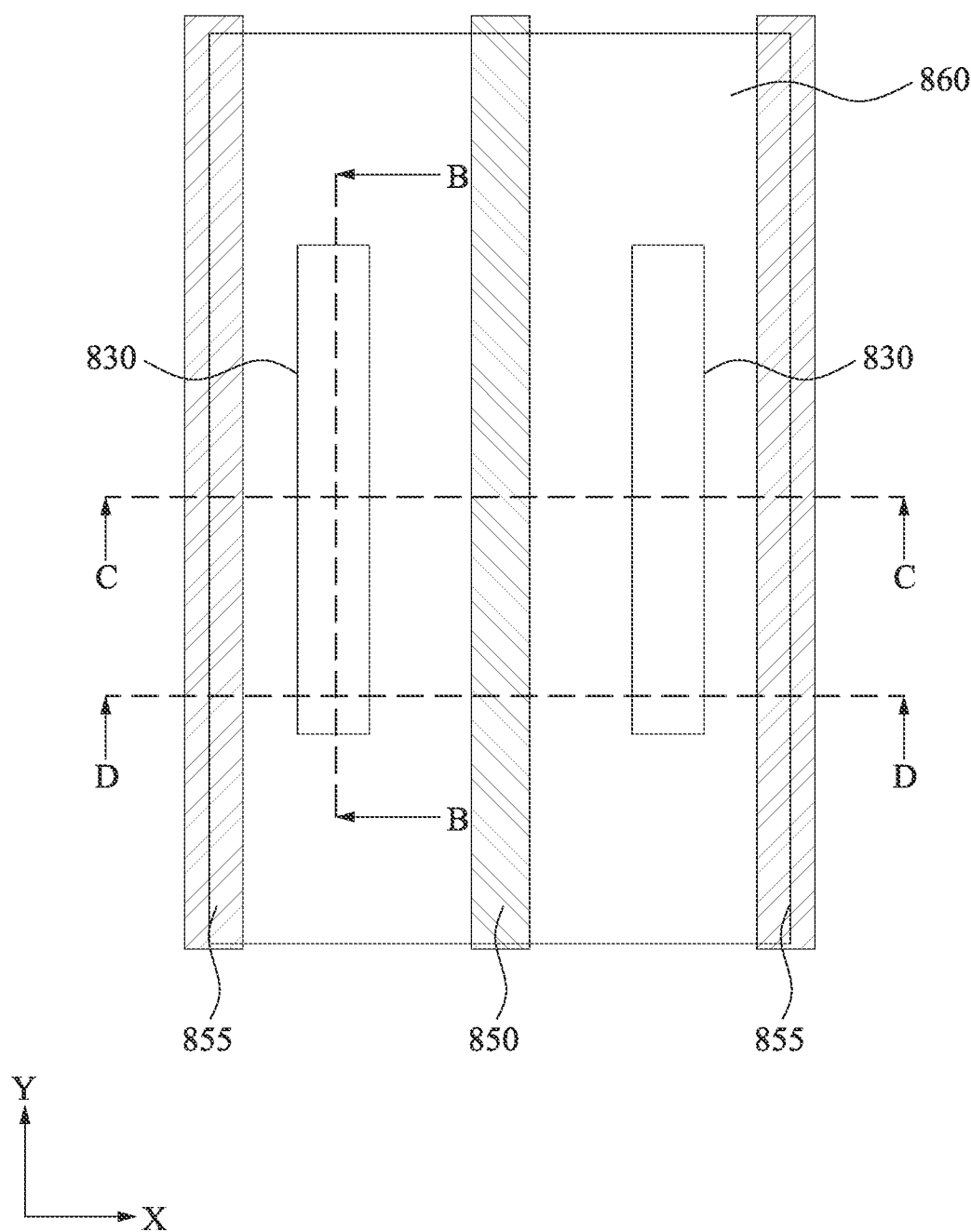
Figure 29B:
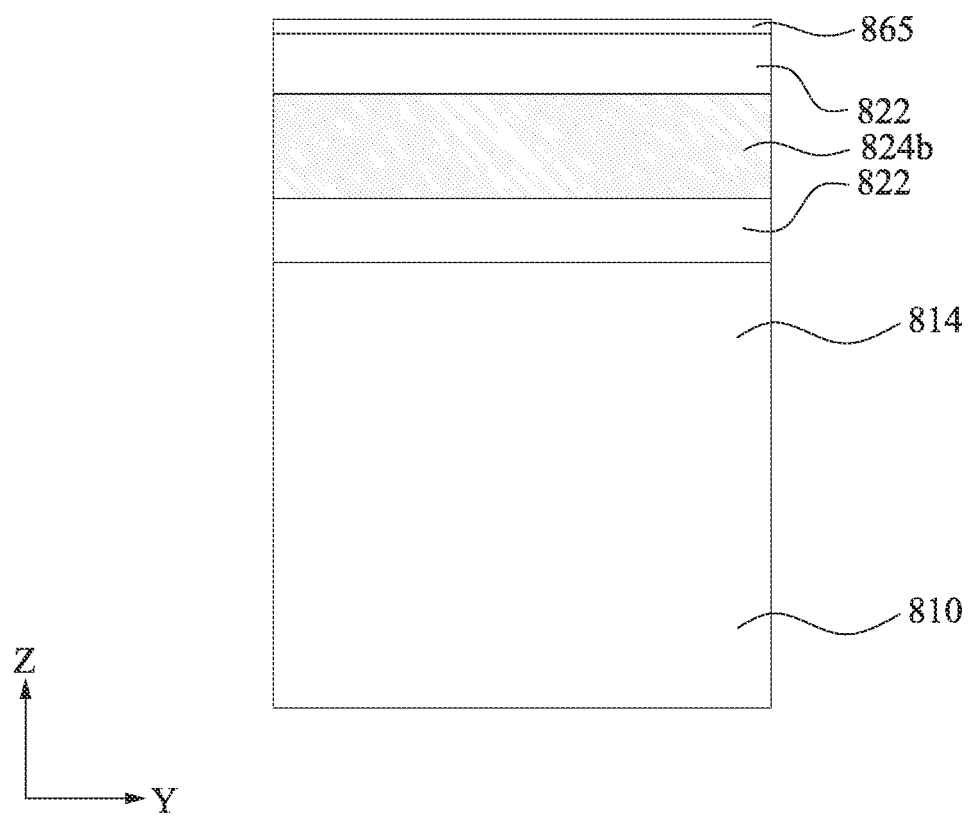
Figure 29C:
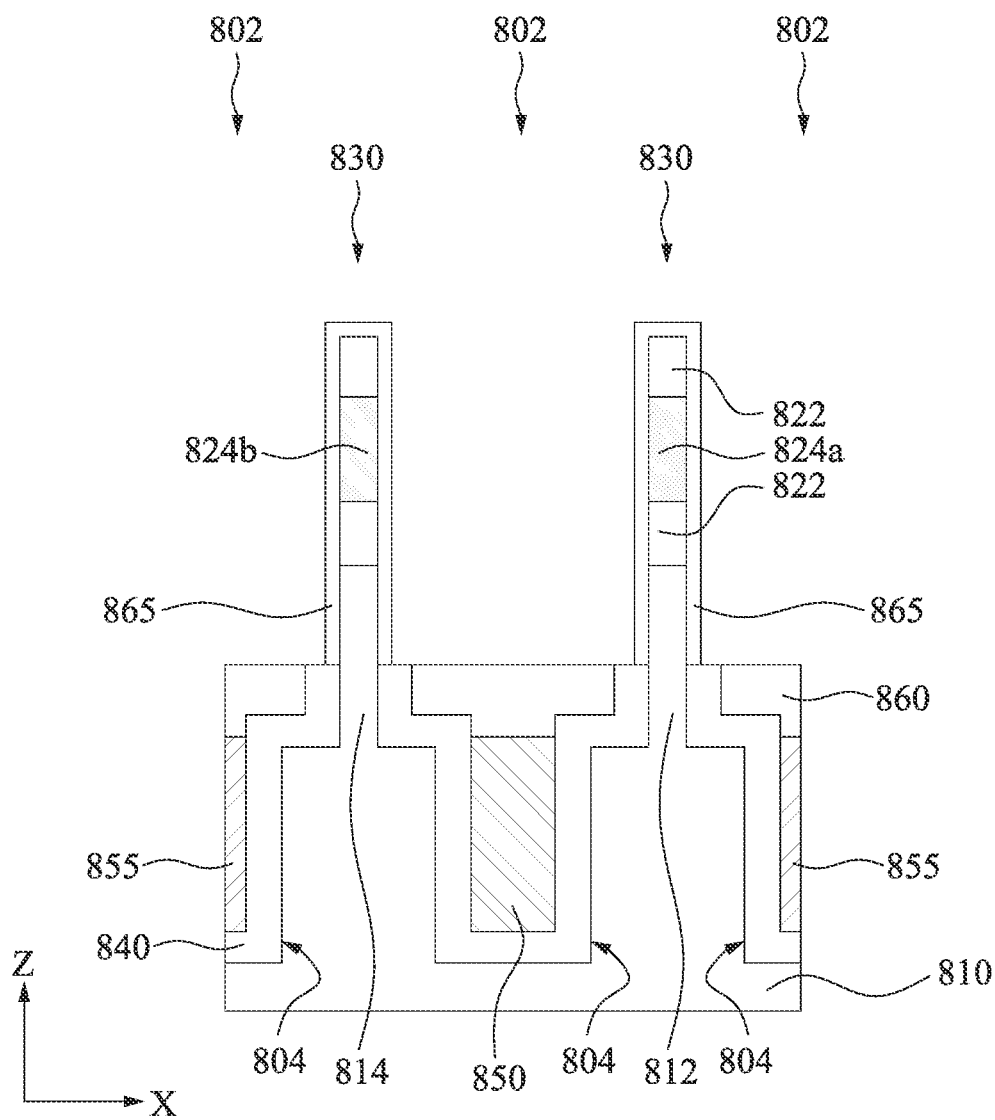
Figure 29D:
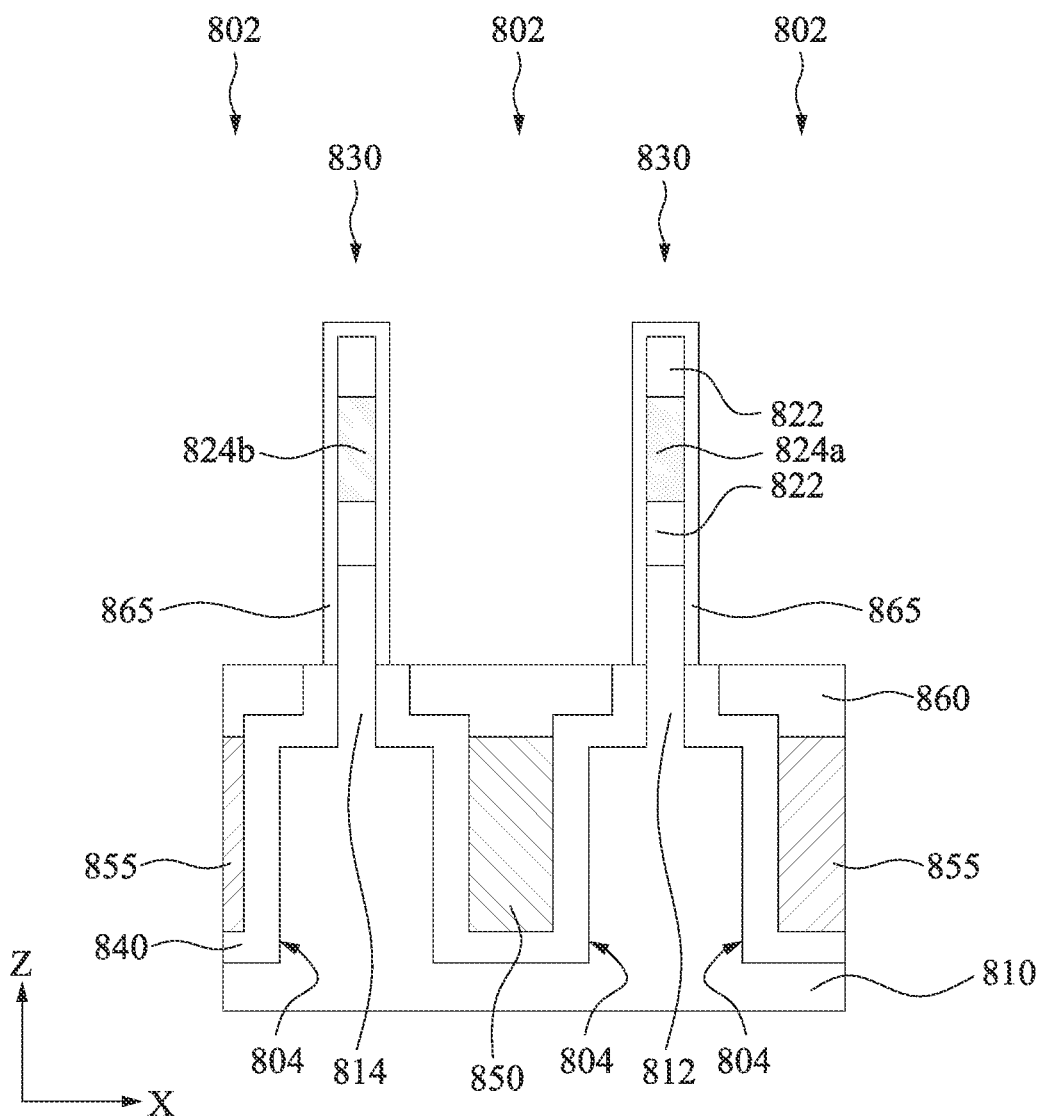

FIG. 29A is a top view of a memory cell at various stages in accordance with some embodiments of the present disclosure, FIG. 29B is a cross-sectional view taken along line B-B in FIG. 29A, FIG. 29C is a cross-sectional view taken along line C-C in FIG. 29A, and FIG. 29D is a cross-sectional view taken along line D-D in FIG. 29A. A plurality of second trenches 804 are formed in the substrate 810. Subsequently, liner layers 840 are formed in the second trenches 804 and are conformal to the substrate 810 at sidewalls and bottom surfaces of the second trenches 804. In some embodiments, the liner layers 840 are dielectric layers, e.g., silicon oxide, silicon nitride, silicon oxynitride (SiON), or other suitable materials. For clarity, the liner layers 840 are shown in FIGS. 29B-29D and are omitted in FIG. 29A.

Next, conductive lines 850 and 855 are respectively formed in the second trenches 804 and above the liner layers 840. In some embodiments, conductive materials are filled in the remaining second trenches 804, and the conductive materials are etched back to form the conductive lines 850 and 855. In some embodiments, the conductive lines 850 and 855 are made of metal, e.g., Ru, W, or other suitable materials. In some embodiments, the conductive line 850 may be a VDD power line, and the conductive lines 855 may be VSS power lines, or vise versa.

After the conductive lines 850 and 855 are formed, an insulating material layer including one or more layers of insulating material is formed over the substrate 810 so that the conductive lines 850 and 855 are fully embedded in the insulating material layer. The insulating material for the insulating material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating material layer, especially when the insulating material layer is formed using flowable CVD. Then, a planarization operation, such as a chemical mechanical polishing (CMP) method or an etch-back method, is performed such that the upper surface of the uppermost first semiconductor layer 822 is exposed from the insulating material layer.

The insulating material layer is then recessed or etched back to form an isolation insulating layer 860 so that the upper portions of the fin structures 830 are exposed. In some embodiments, the liner layers 840 are etched back with the insulating material layer. With this operation, the fin structures 830 are electrically insulated from each other by the isolation insulating layer 860, which is also referred to as an STI structure. In some embodiments, the insulating material layer is recessed until the semiconductor fins 812 and 814 are exposed. The first semiconductor layers 822 are sacrificial layers which are subsequently partially removed, and the second semiconductor layers 824a and 824b will serve as channel regions of a GAA FET.

Sacrificial gate dielectric layers 865 are conformally formed above the semiconductor fins 812 and 814, the fin structures 830, and the isolation structures 860. For clarity, the sacrificial gate dielectric layers 865 are shown in FIGS. 29B-29D and are omitted in FIG. 29A. In some embodiments, the sacrificial gate dielectric layers 865 may include silicon dioxide, silicon nitride, a high-κ dielectric material or other suitable material. In various examples, the sacrificial gate dielectric layers 330 may be deposited by a thermal process, an ALD process, a CVD process, a subatmospheric CVD (SACVD) process, a flowable CVD process, a PVD process, or other suitable process. By way of example, the sacrificial gate dielectric layers 865 may be used to prevent damage to the semiconductor fins 812, 814 and the fin structures 830 by subsequent processing (e.g., subsequent formation of the dummy gate structure).

Figure 30A:
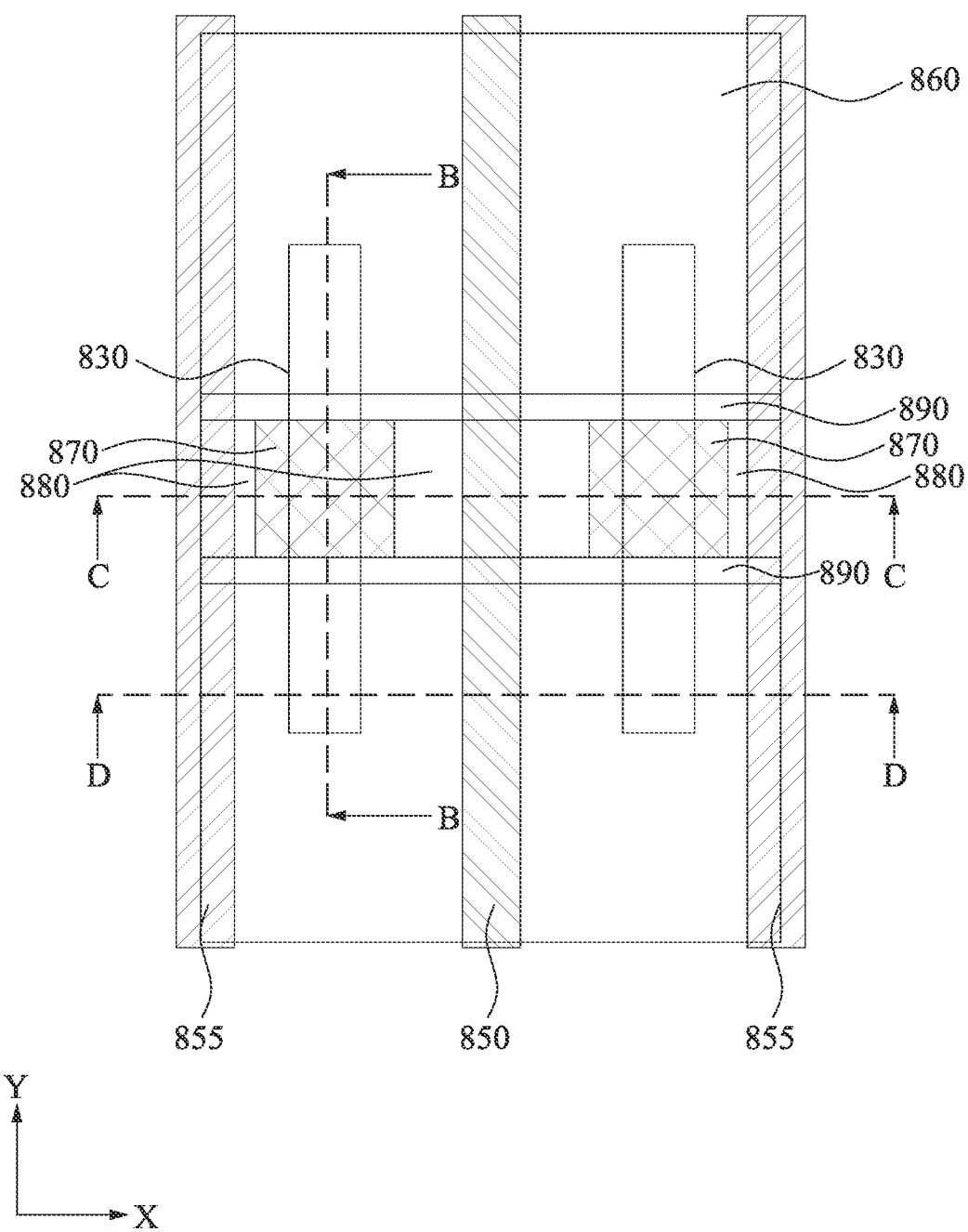
Figure 30B:
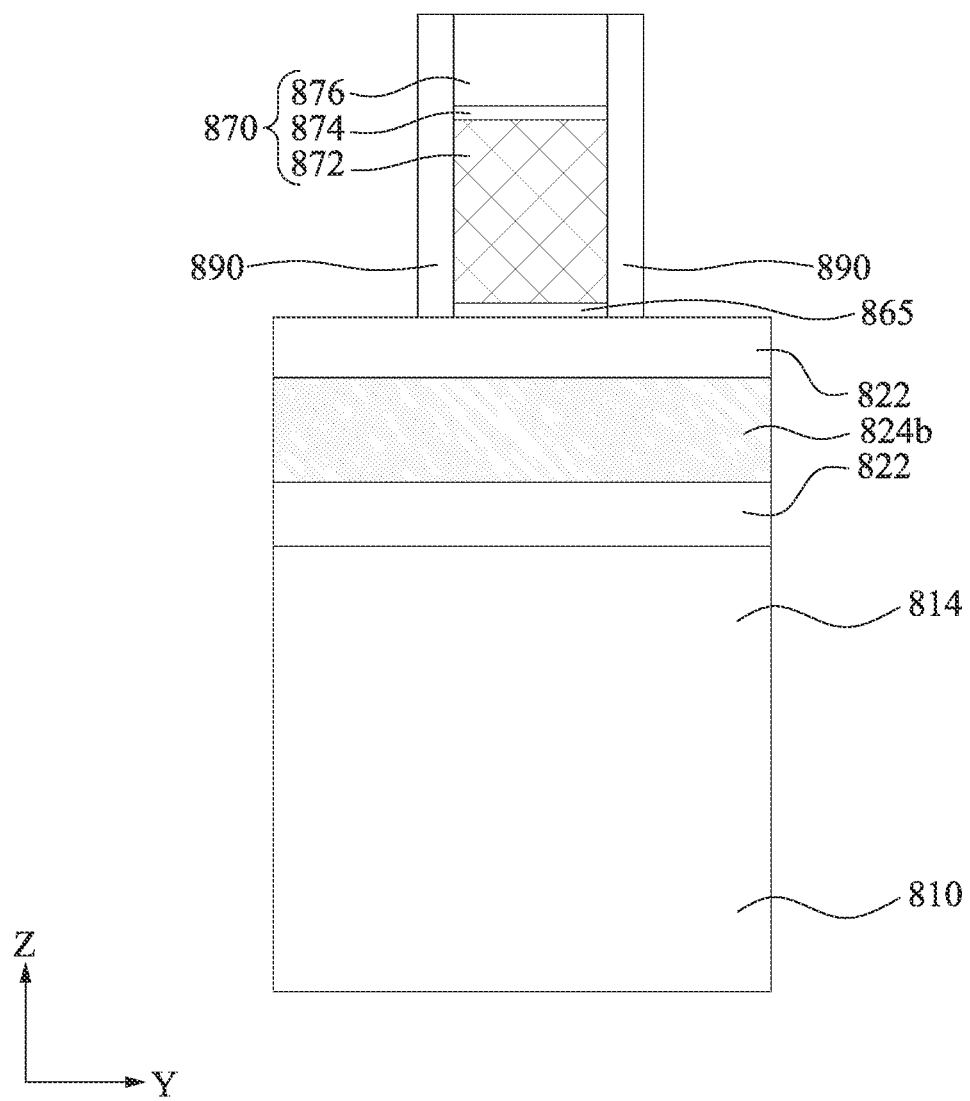
Figure 30C:
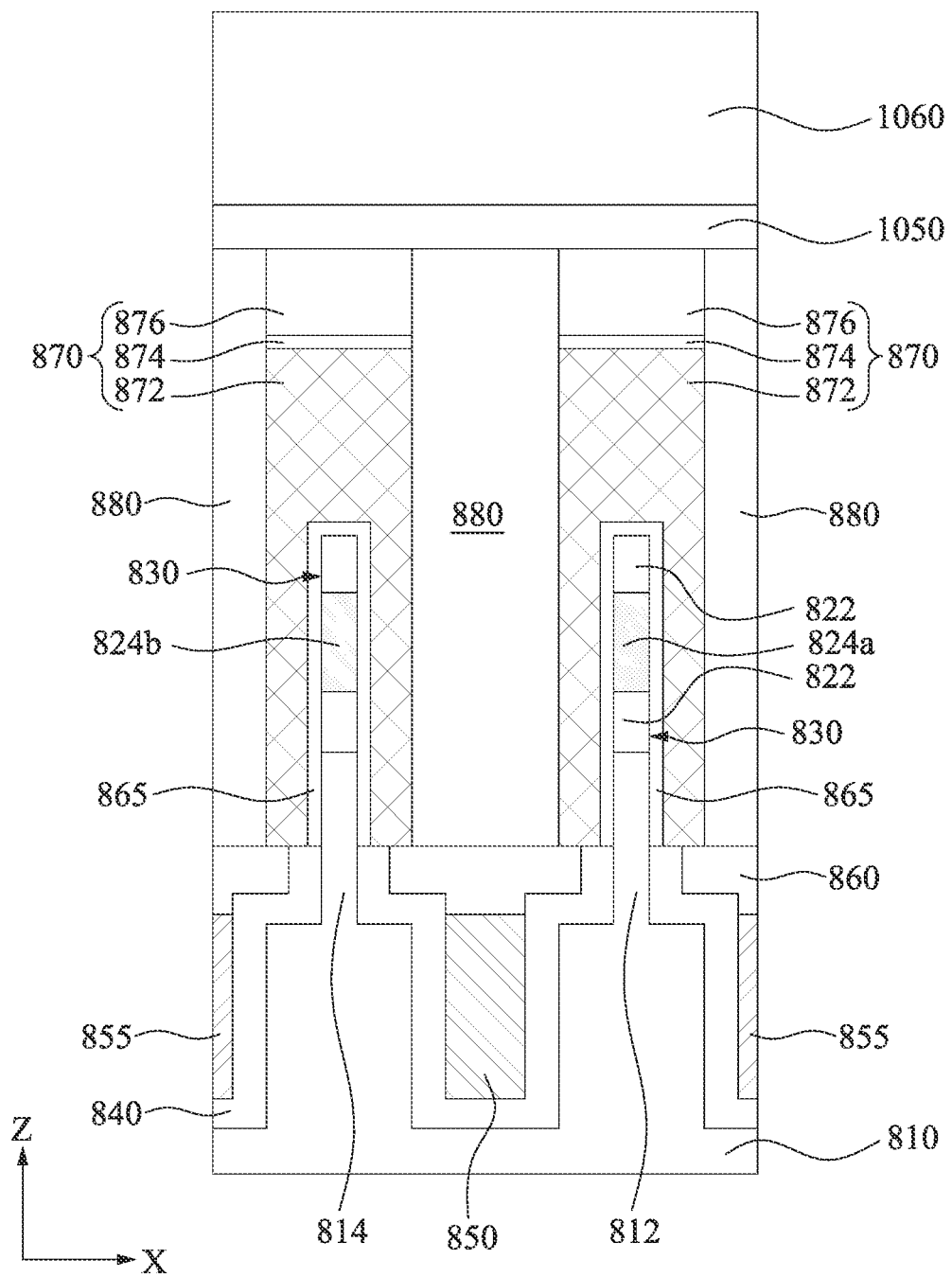
Figure 30D:
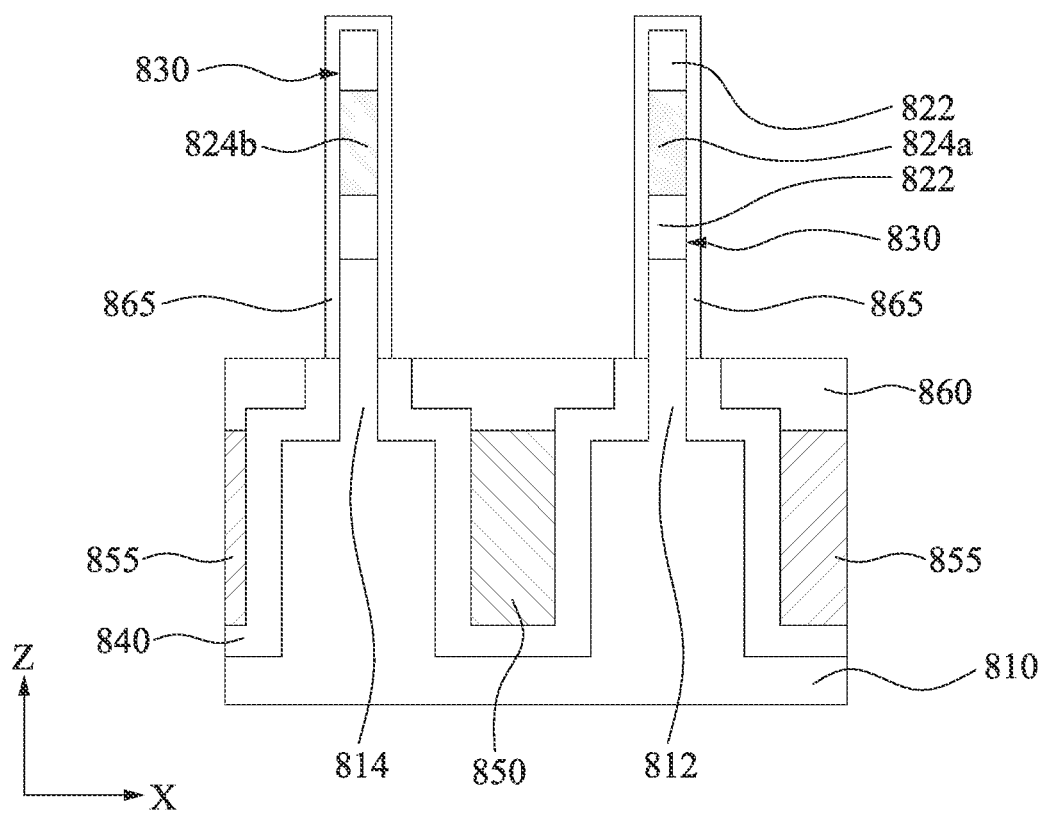

FIG. 30A is a top view of a memory cell at various stages in accordance with some embodiments of the present disclosure, FIG. 30B is a cross-sectional view taken along line B-B in FIG. 30A, FIG. 30C is a cross-sectional view taken along line C-C in FIG. 30A, and FIG. 30D is a cross-sectional view taken along line D-D in FIG. 30A. Dummy gate structures 870 and isolation blocks 880 are formed above the structure of FIGS. 29A-29D. The structural and manufacturing details of the dummy gate structures 870 and the isolation blocks 880 are similar to the dummy gate structures 340 and the isolation blocks 350 shown in FIGS. 5A-5D. For example, each of the dummy gate structures 870 includes a dummy gate layer 872, a pad layer 874 formed over the dummy gate layer 872, and a mask layer 876 formed over the pad layer 874. The dummy gate structures 870 are respectively above the fin structures 830, and one of the isolation blocks 880 is between the dummy gate structures 870.

In some embodiments, the dummy gate layer 872 may be made of polycrystalline-silicon (poly-Si), poly-crystalline silicon-germanium (poly-SiGe), or other suitable materials. The pad layer 874 may be made of silicon nitride or other suitable materials, and the mask layer 876 may be made of silicon dioxide or other suitable materials. In some embodiments, the isolation blocks 880 are dielectric materials, such as SiN, SiON, SiOCN, SiCN, or combinations thereof.

Gate spacers 890 are then formed on opposite sidewalls of the dummy gate structures 870 and opposite sidewalls of the isolation blocks 880. For example, a blanket layer of an insulating material for sidewall spacers is conformally formed to cover the dummy gate structures 870 and the isolation blocks 880 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 870. In some embodiments, the insulating material of the blanket layer is a silicon nitride-based material, such as SiN, SiON, SiOCN, SiCN, or combinations thereof. The blanket layer is then etched using an anisotropic process to form the gate spacers 890 on opposite sidewalls of the dummy gate structures 870 and the isolation blocks 880. In some embodiments, the gate spacers 890 and the isolation blocks 880 are made of the same material, such that there is no or unapparent interface between the gate spacers 890 and the isolation blocks 880. In some other embodiments, the gate spacers 890 and the isolation blocks 880 are made of different materials, such that an apparent interface is between the gate spacers 890 and the isolation blocks 880.

Figure 31A:
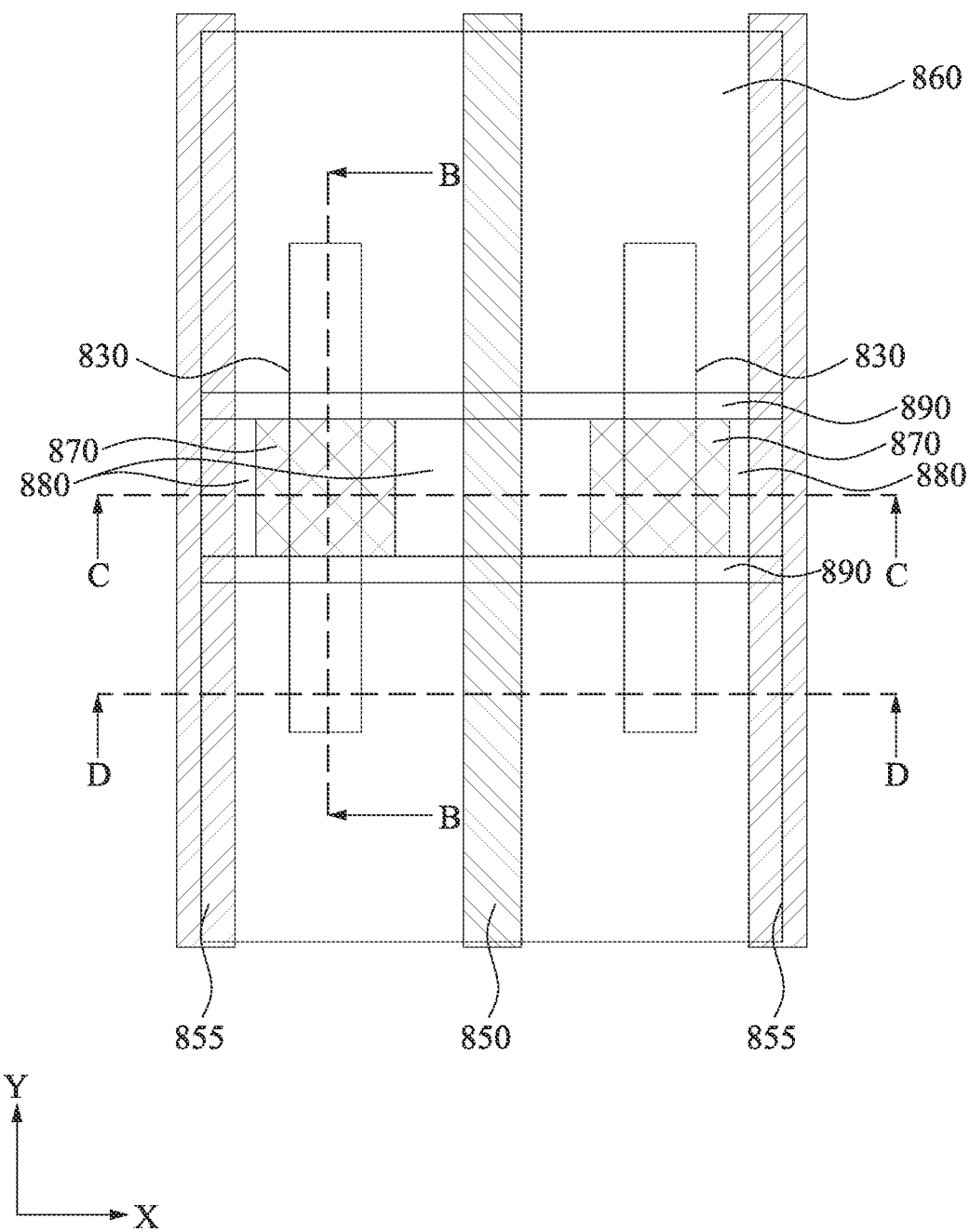
Figure 31B:
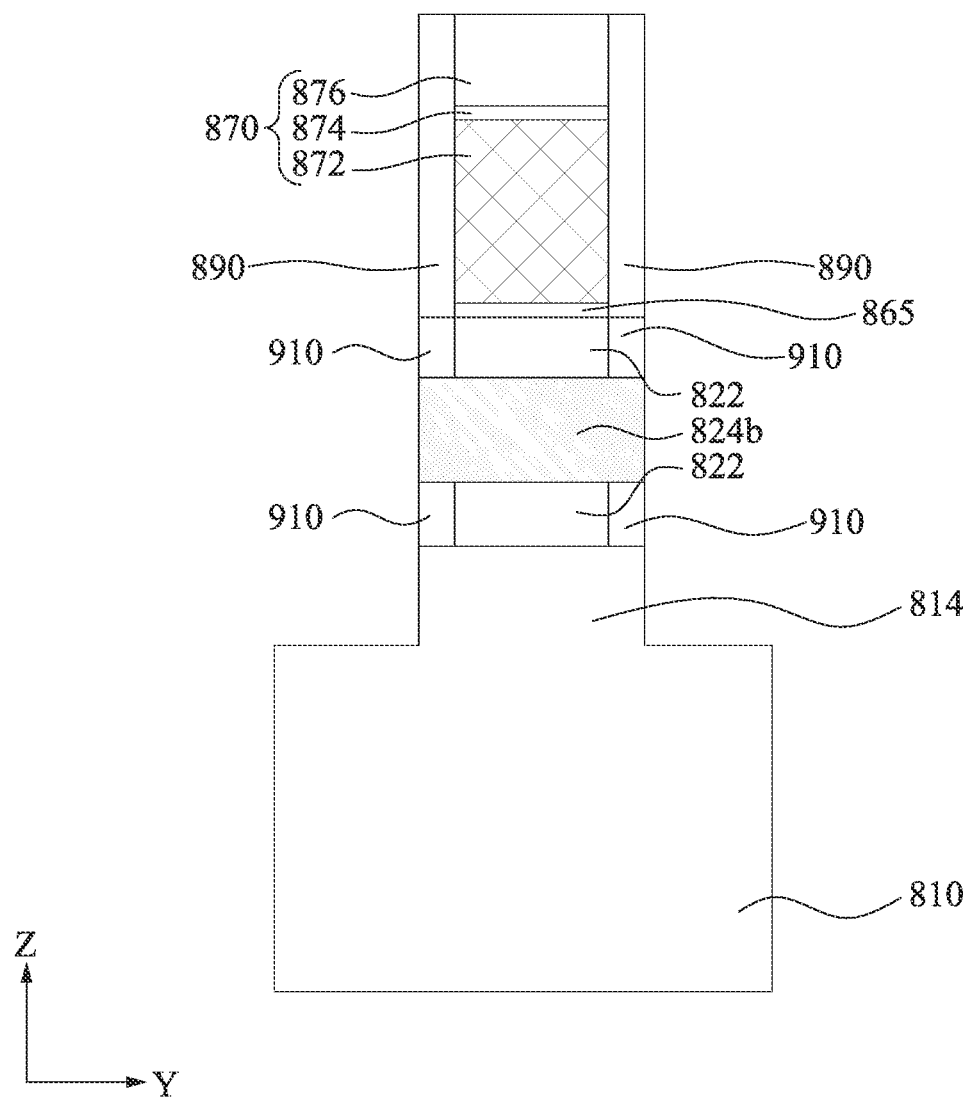
Figure 31C:
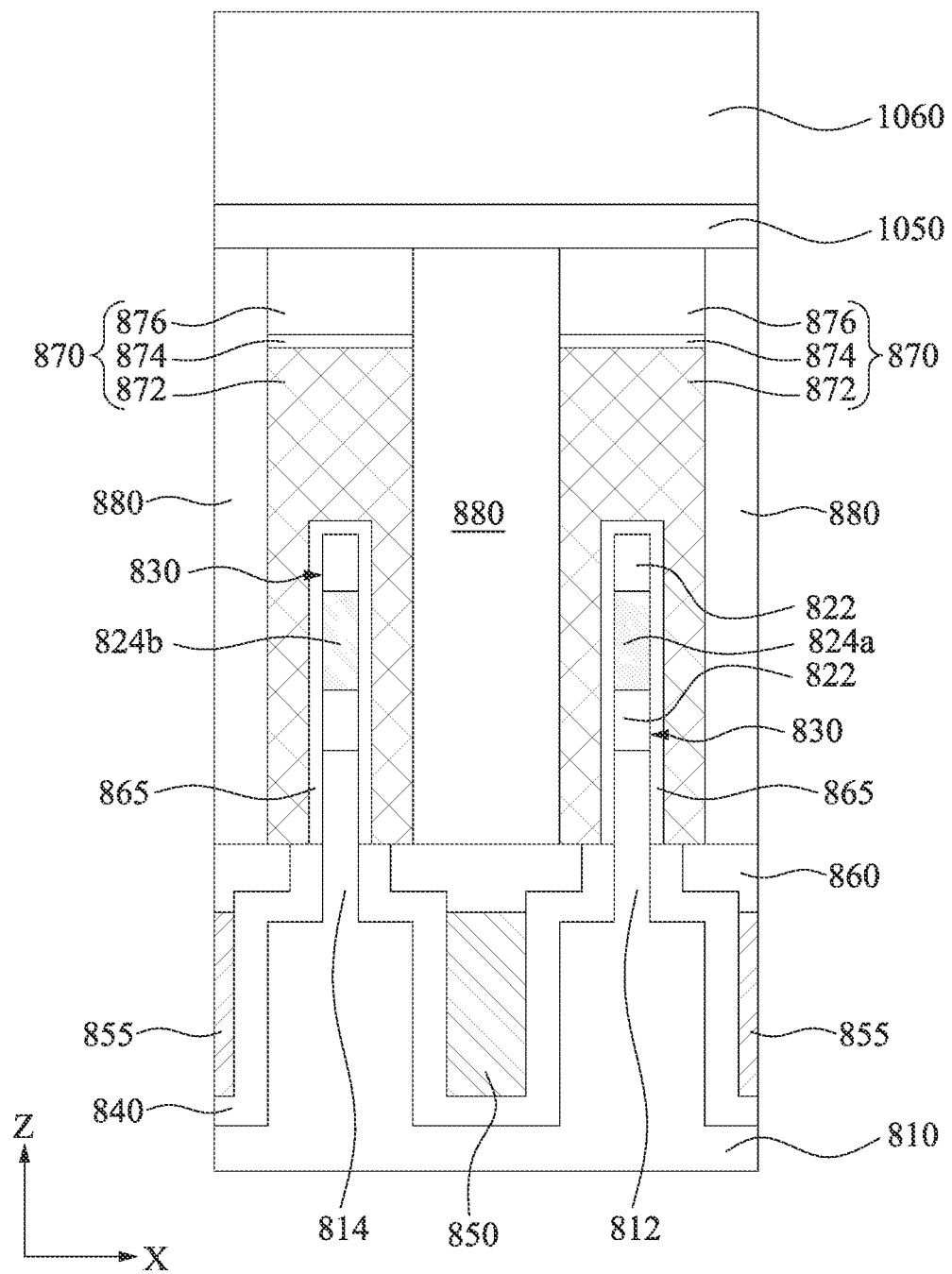
Figure 31D:
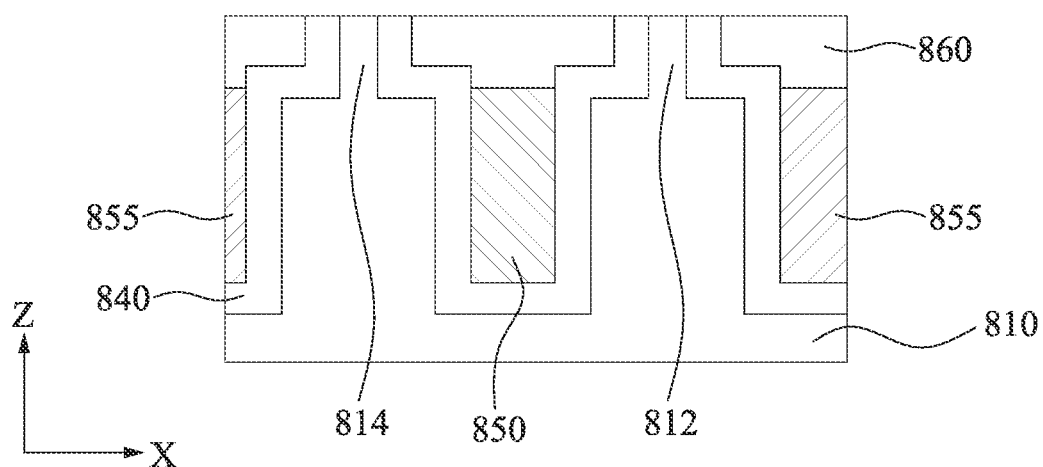

FIG. 31A is a top view of a memory cell at various stages in accordance with some embodiments of the present disclosure, FIG. 31B is a cross-sectional view taken along line B-B in FIG. 31A, FIG. 31C is a cross-sectional view taken along line C-C in FIG. 31A, and FIG. 31D is a cross-sectional view taken along line D-D in FIG. 31A. Exposed portions of the fin structures 830 and the semiconductor fins 812 and 814 are removed by using a strained source/drain (SSD) etching process. Subsequently, the first semiconductor layers 822 are horizontally recessed (etched) so that the second semiconductor layers 824a and 824b laterally extends past opposite end surfaces of the first semiconductor layers 822. In some embodiments, end surfaces of the first semiconductor layers 822 may be substantially vertically aligned with the side surfaces of the gate spacers 890.

After the first semiconductor layers 822 are horizontally recessed, inner spacers 910 are formed on the recessed surfaces of the first semiconductor layers 822, as shown in FIG. 31B. Formation of the inner spacer 910 includes depositing an inner spacer material layer (e.g., silicon nitride), followed by etching back the inner spacer material layer by an anisotropic etching process, to remove the inner spacer material layer from the substrate 810. In some embodiments, the inner spacers 910 include insulating material such as silicon oxide, silicon nitride, or the like.

Figure 32A:
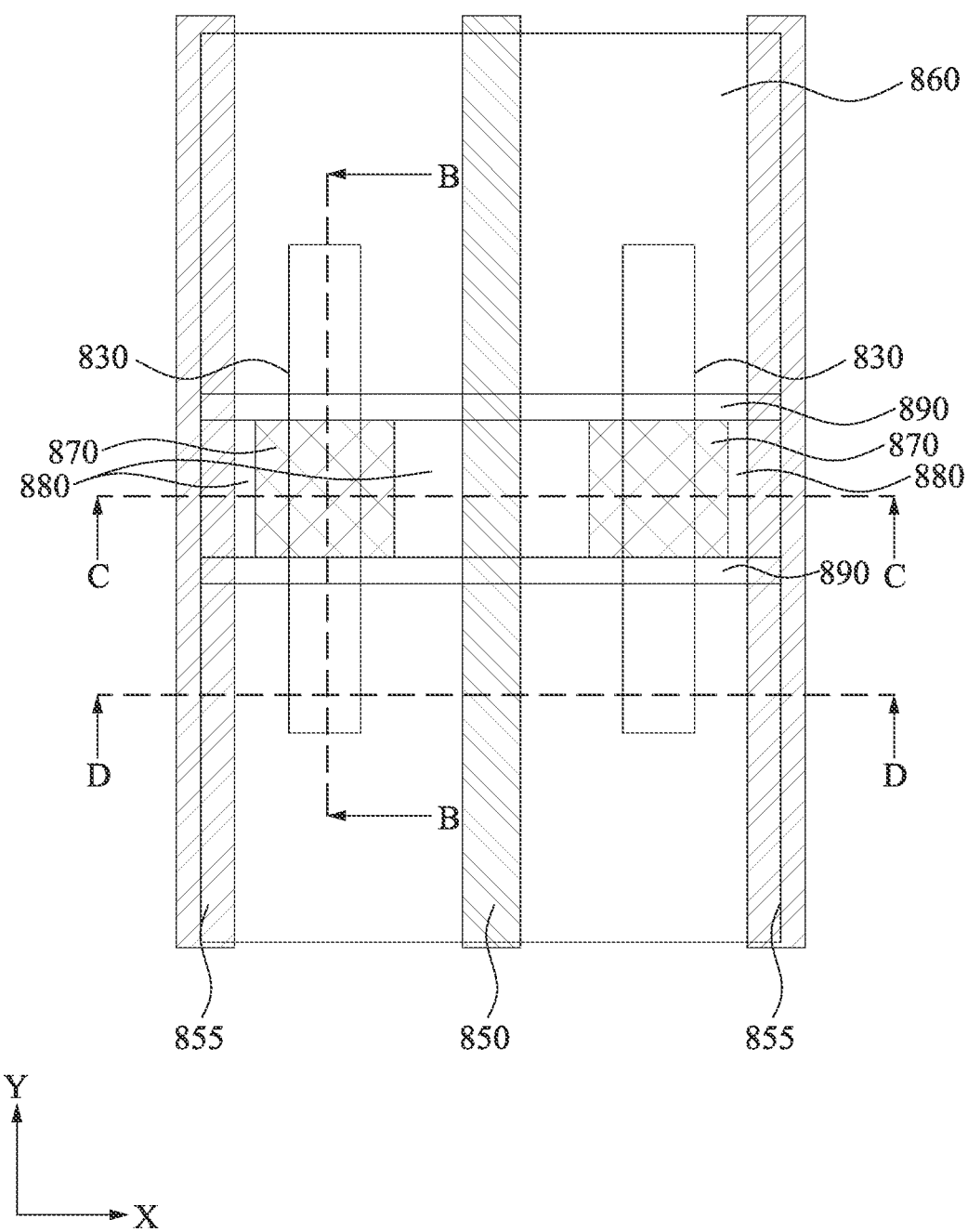
Figure 32B:
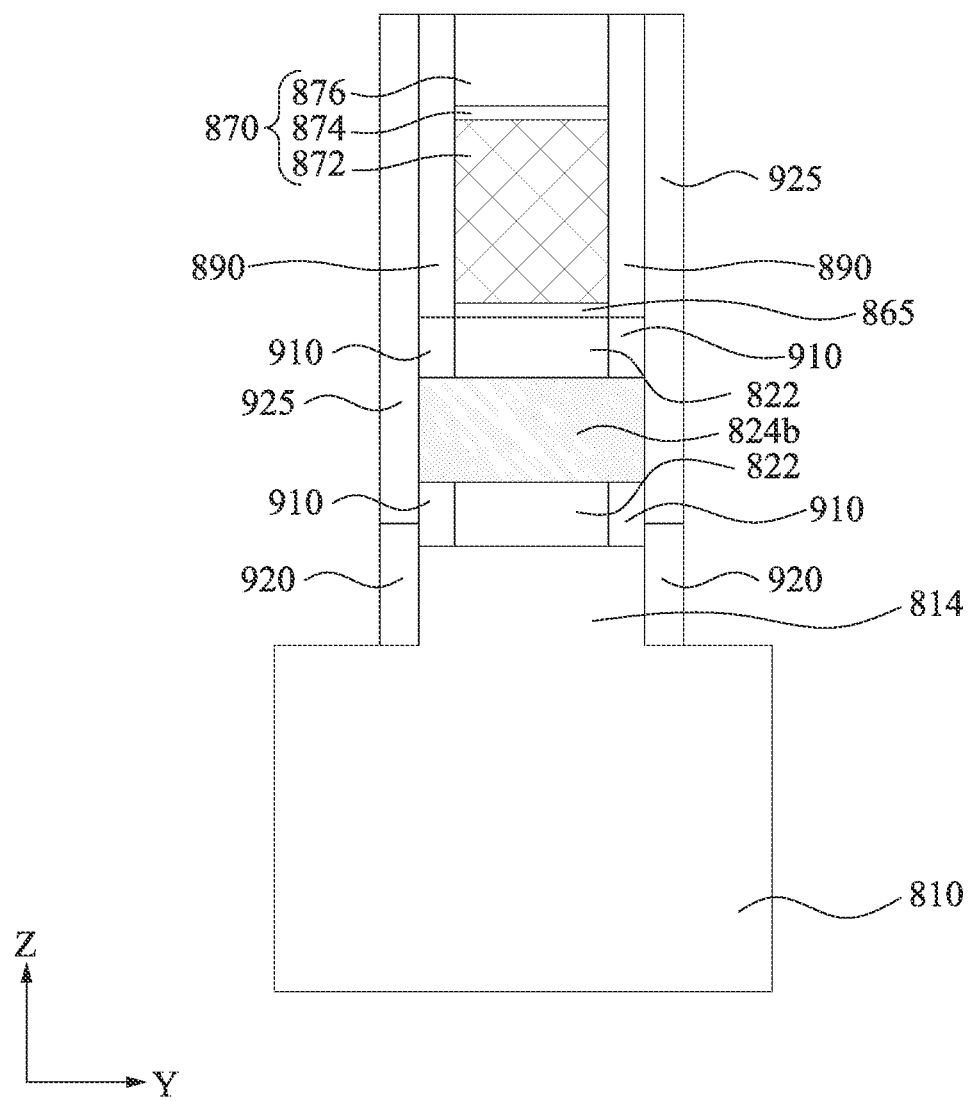
Figure 32C:
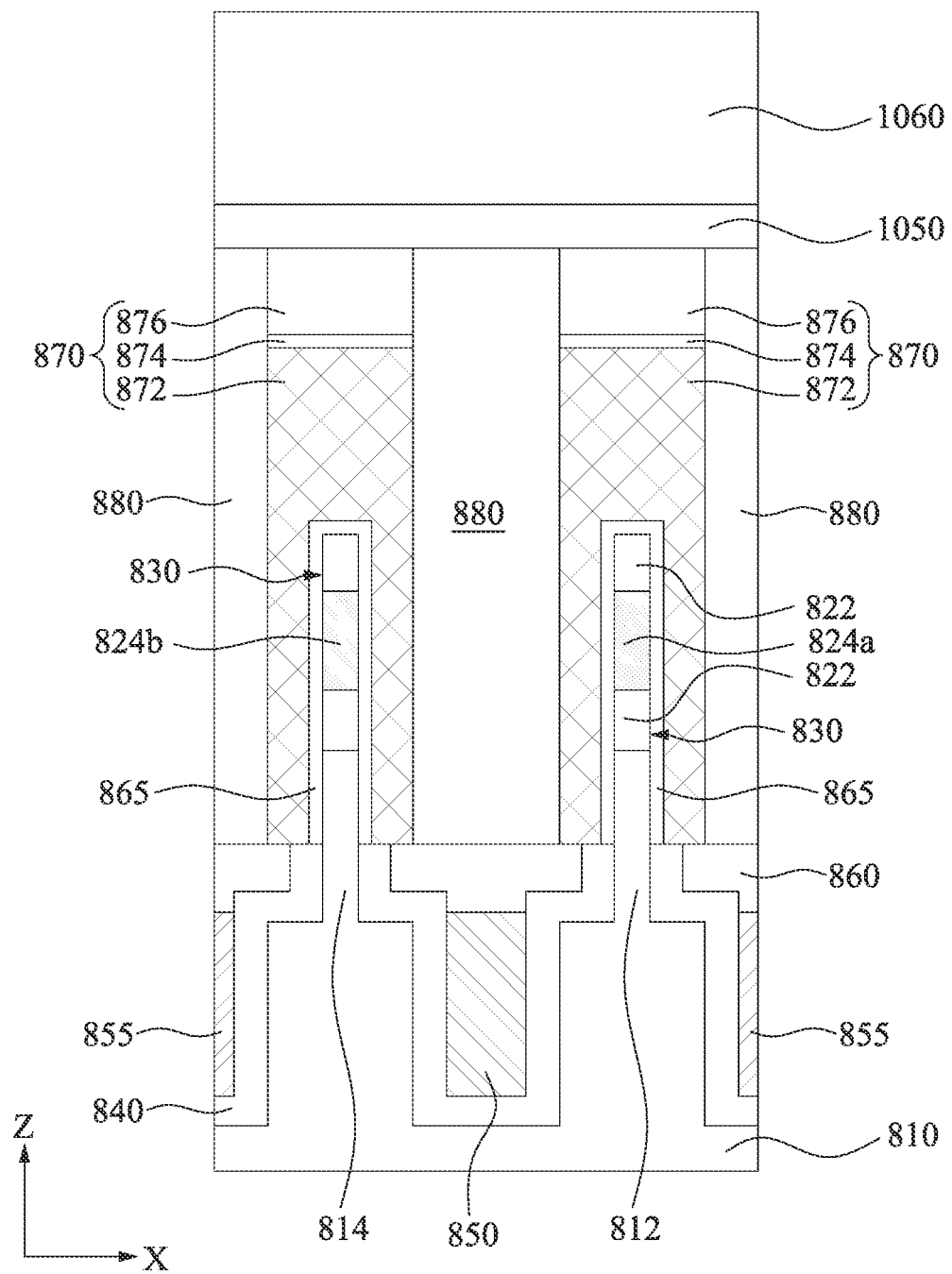
Figure 32D:
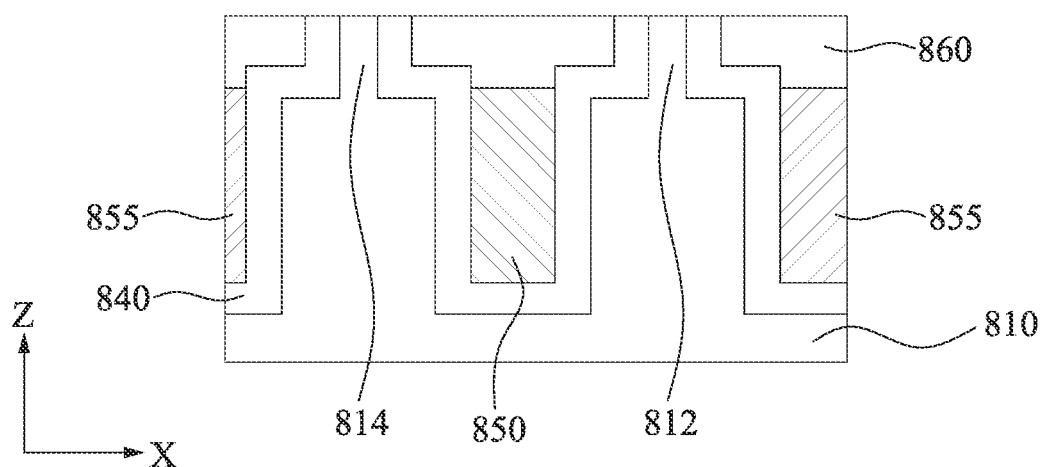

FIG. 32A is a top view of a memory cell at various stages in accordance with some embodiments of the present disclosure, FIG. 32B is a cross-sectional view taken along line B-B in FIG. 32A, FIG. 32C is a cross-sectional view taken along line C-C in FIG. 32A, and FIG. 32D is a cross-sectional view taken along line D-D in FIG. 32A. First sidewall spacers 920 are formed on opposite sides of the semiconductor fins 812 and 814. The first sidewall spacers 920 are further in contact with portions of the bottommost inner spacers 910. For example, a blanket layer of an insulating material for sidewall spacers is conformally formed to cover the fin structures 830 and the semiconductor fins 812 and 814 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the fin structures 830. In some embodiments, the insulating material for forming the first sidewall spacers 920 is silicon oxide. The blanket layer is then etched using an anisotropic process to form the first sidewall spacers 920 on opposite sidewalls of the semiconductor fins 812 and 814.

Subsequently, second sidewall spacers 925 are formed on opposite sides of the fin structures 830. For clarity, the first and second sidewall spacers 920 and 925 are shown in FIG. 32B and are omitted in FIG. 32A. For example, another blanket layer of an insulating material for sidewall spacers is conformally formed to cover the fin structures 830 and the first sidewall spacers 920 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the fin structures 830. In some embodiments, the insulating material for forming the second sidewall spacers 925 is silicon oxynitride. The blanket layer is then etched using an anisotropic process to form the second sidewall spacers 925 on opposite sidewalls of the fin structures 830 and above the first sidewall spacers 920. The first and second sidewall spacers 920 and 925 are made of different materials. For example, the second sidewall spacer 925 is made of a material that has etching selectivity to that of the first sidewall spacer 920.

Figure 33A:
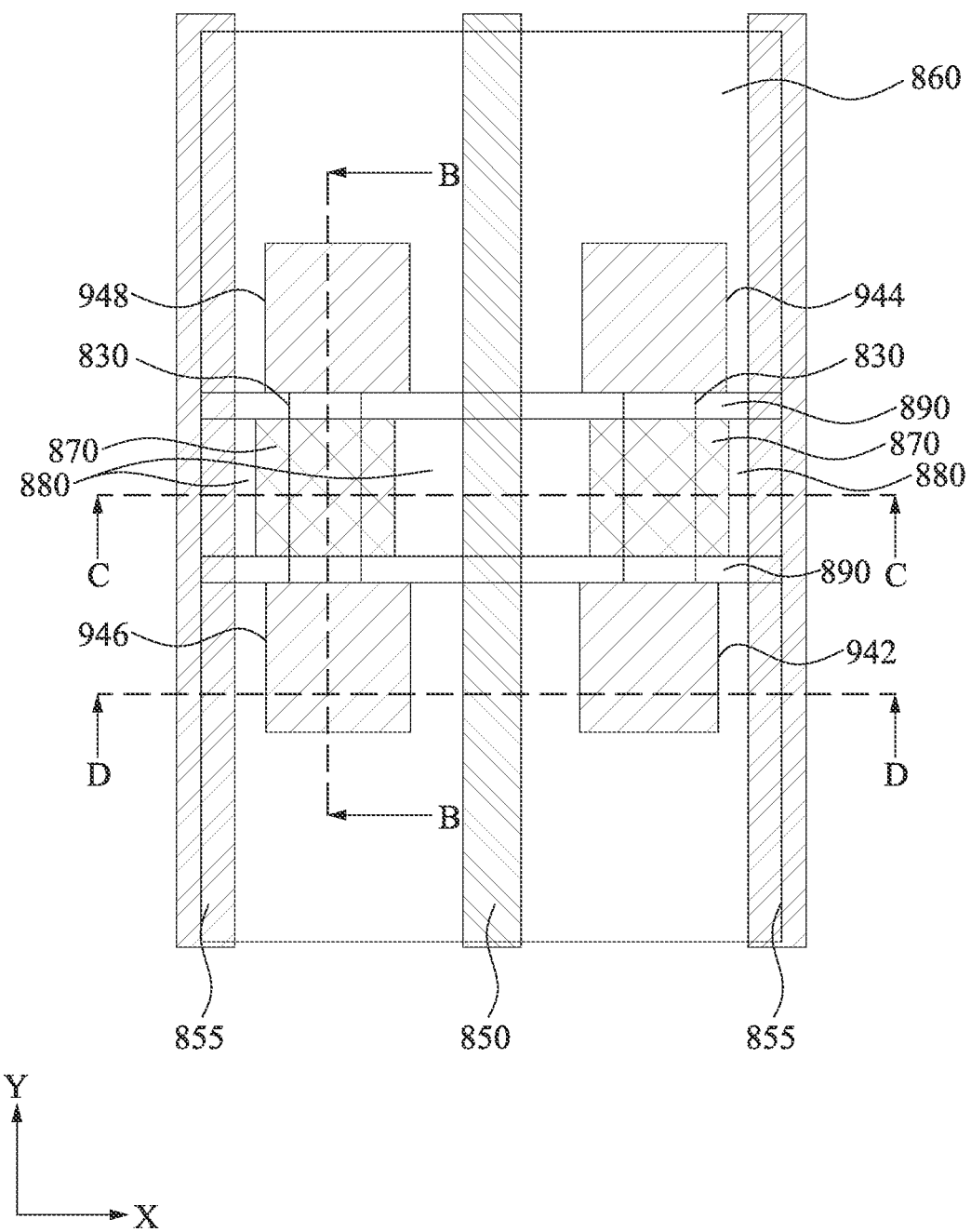
Figure 33B:
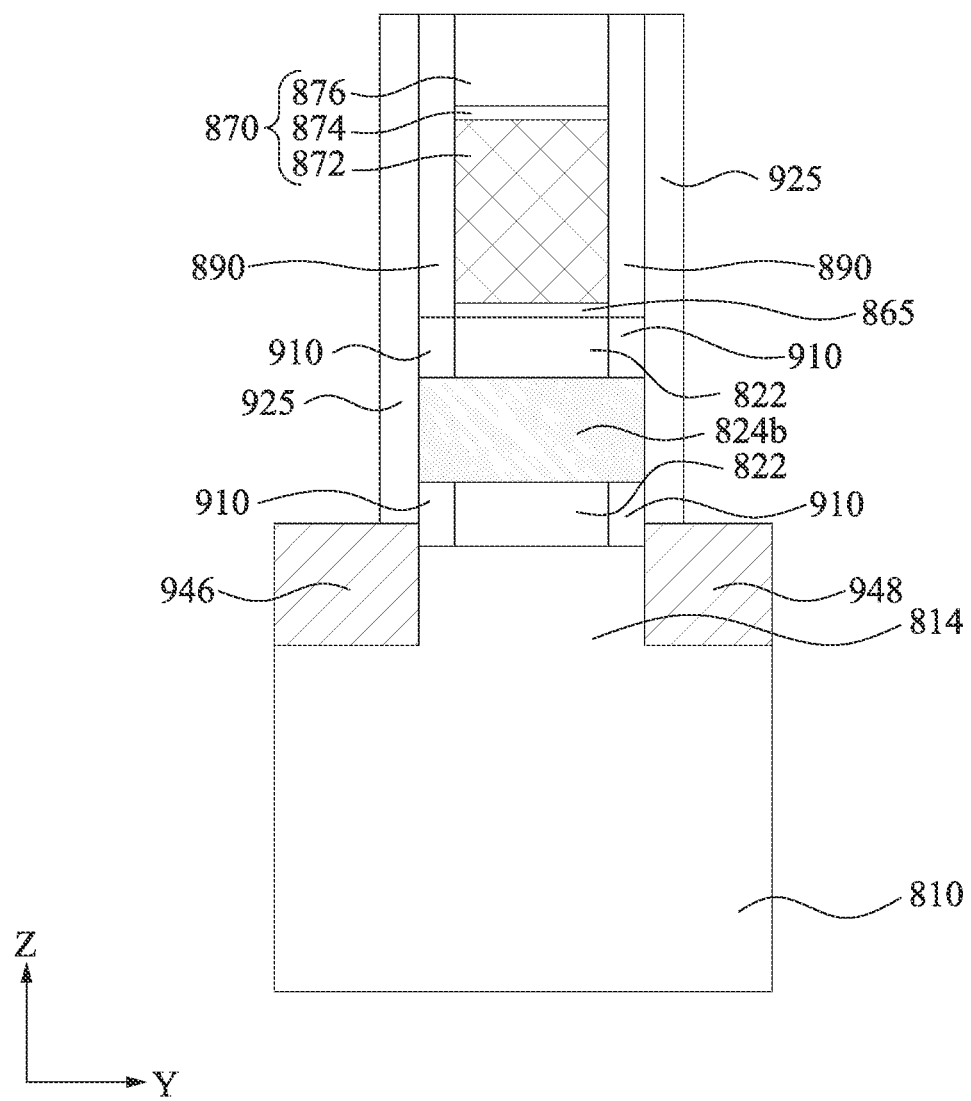
Figure 33C:
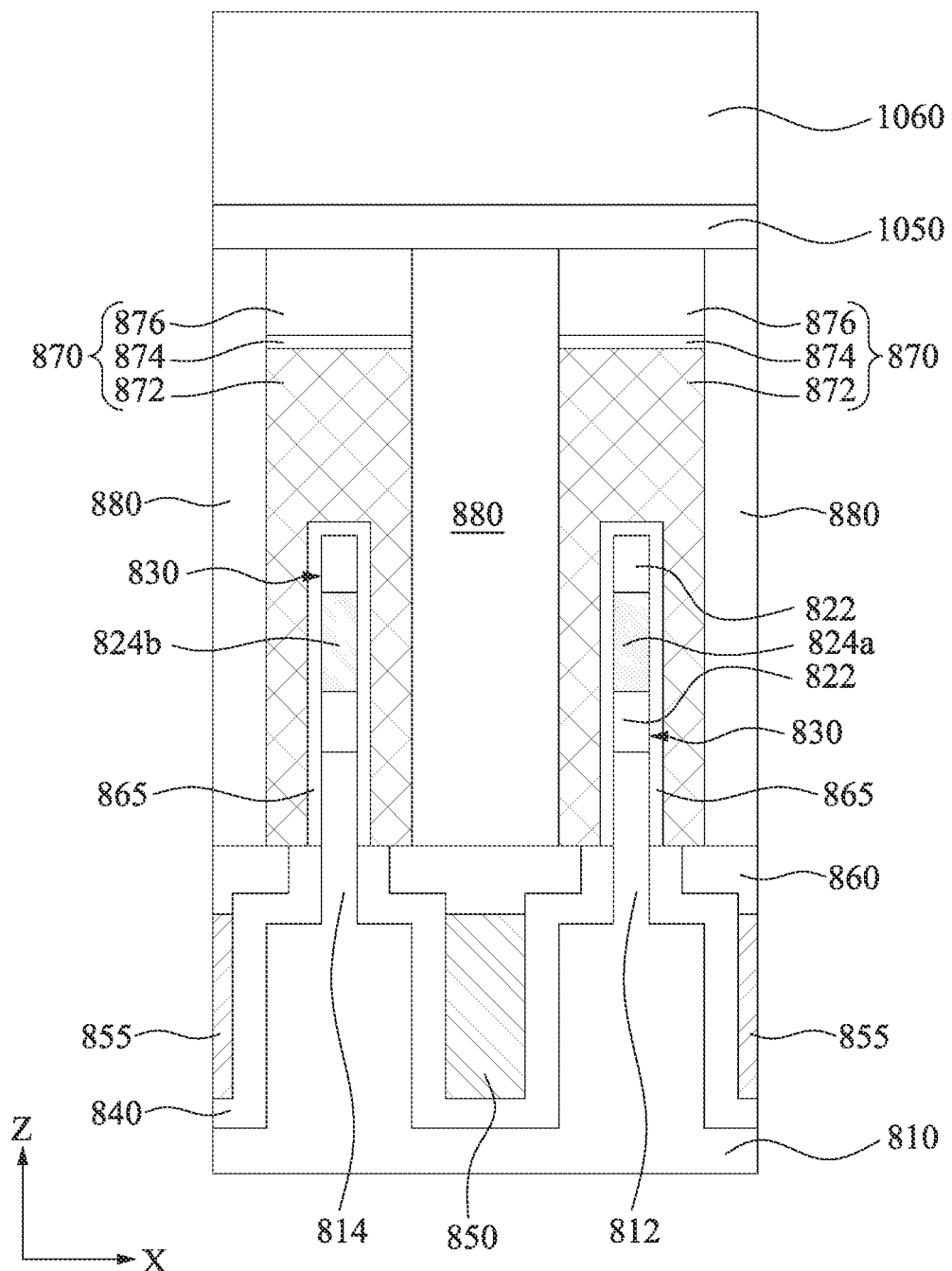
Figure 33D:
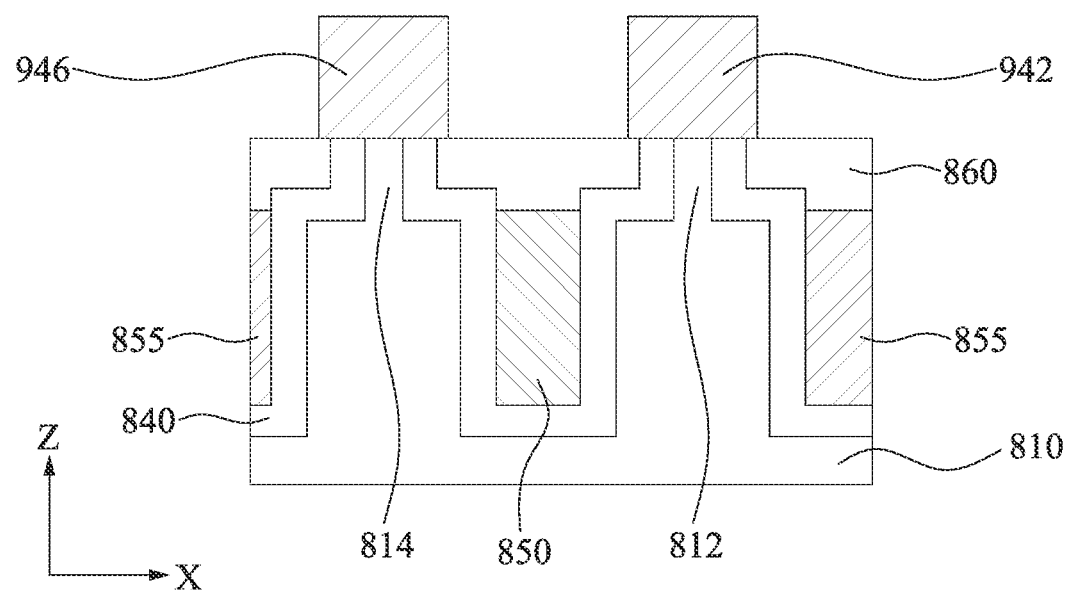

FIG. 33A is a top view of a memory cell at various stages in accordance with some embodiments of the present disclosure, FIG. 33B is a cross-sectional view taken along line B-B in FIG. 33A, FIG. 33C is a cross-sectional view taken along line C-C in FIG. 33A, and FIG. 33D is a cross-sectional view taken along line D-D in FIG. 33A. The first sidewall spacers 920 are removed while the second sidewall spacers 925 remain. As mentioned above, the first sidewall spacers 920 and the second sidewall spacers 925 are made of different materials, such that the first sidewall spacers 920 can be selectively etched by using suitable etchants. In some embodiments, etchants for removing the first sidewall spacers 920 are RIE using fluorocarbon gases ($CHF_3$, $CF_4$, combinations thereof, or other suitable materials).

Subsequently, source/drain features 942, 944, 946, and 948 are formed. For example, the source/drain features 942 and 944 are formed on opposite sides of the semiconductor fin 812, and the source/drain features 946 and 948 are formed on opposite sides of the semiconductor fin 814. The source/drain features 942, 944, 946, and 948 includes one or more layers of Si, SiP, SiC and SiCP for an n-channel FET or Si, SiGe, Ge for a p-channel FET. The source/drain features 942, 944, 946, and 948 are formed by an epitaxial growth method using CVD, ALD or molecular beam epitaxy (MBE). The source/drain features 942, 944, 946, and 948 have the same conductivity type (e.g., P-type in this case).

Figure 34A:
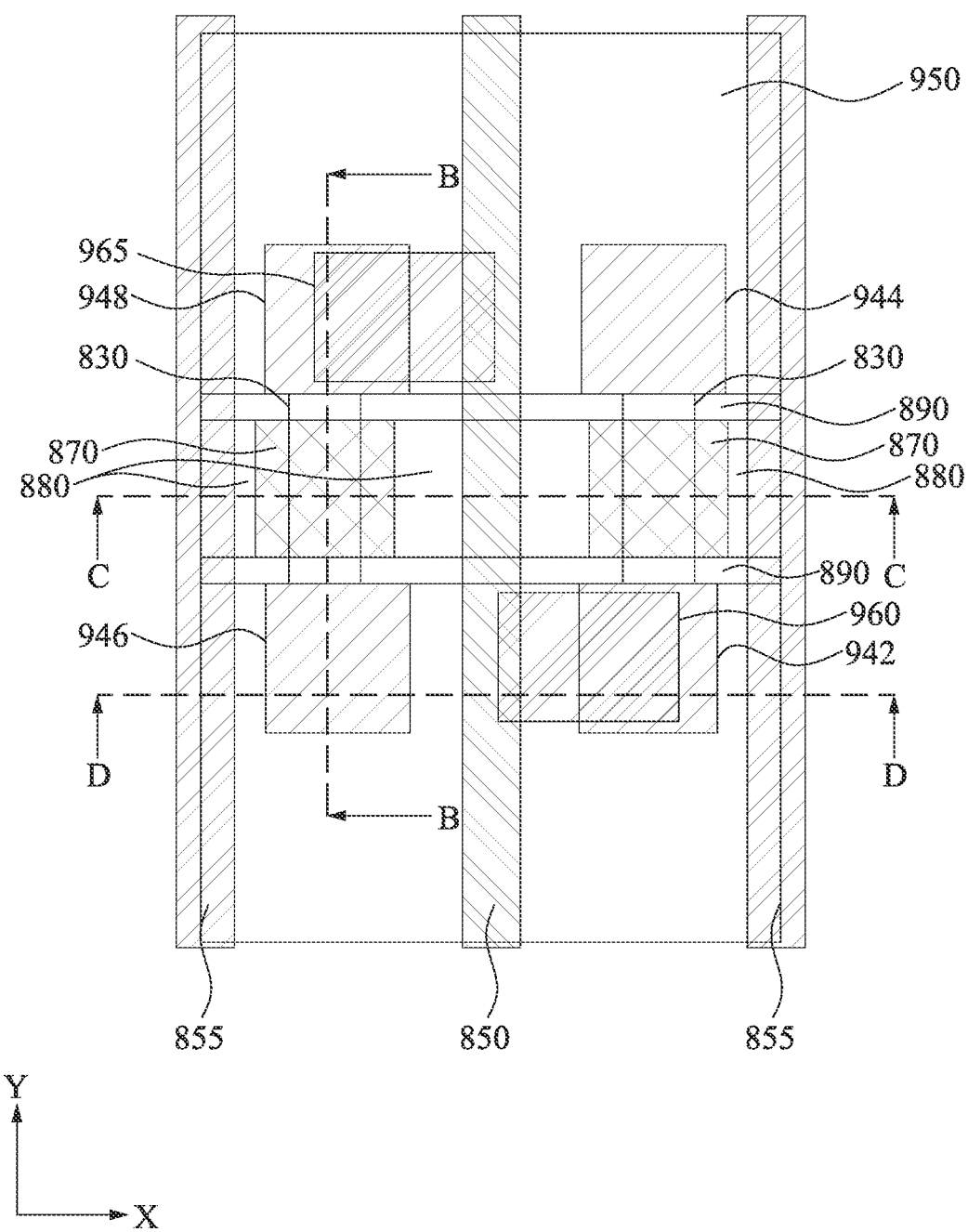
Figure 34B:
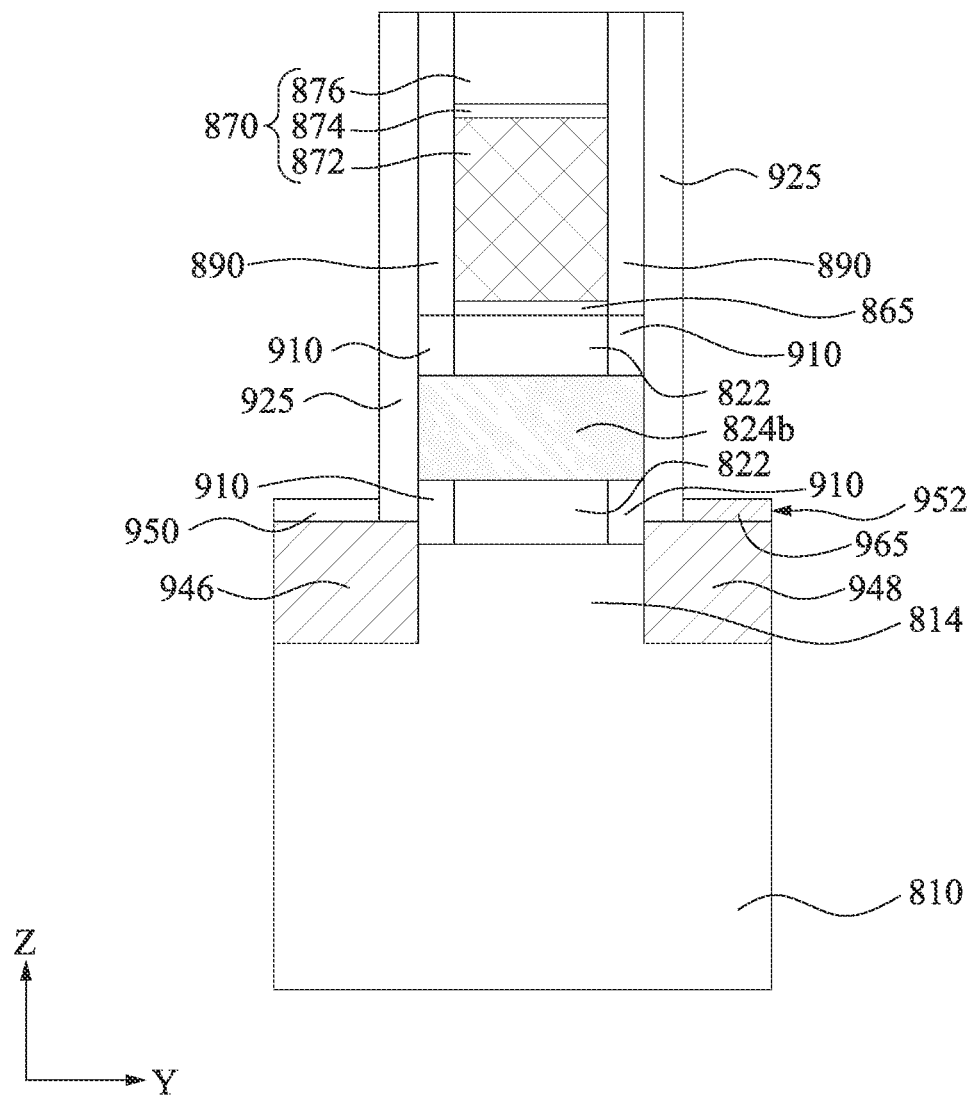
Figure 34C:
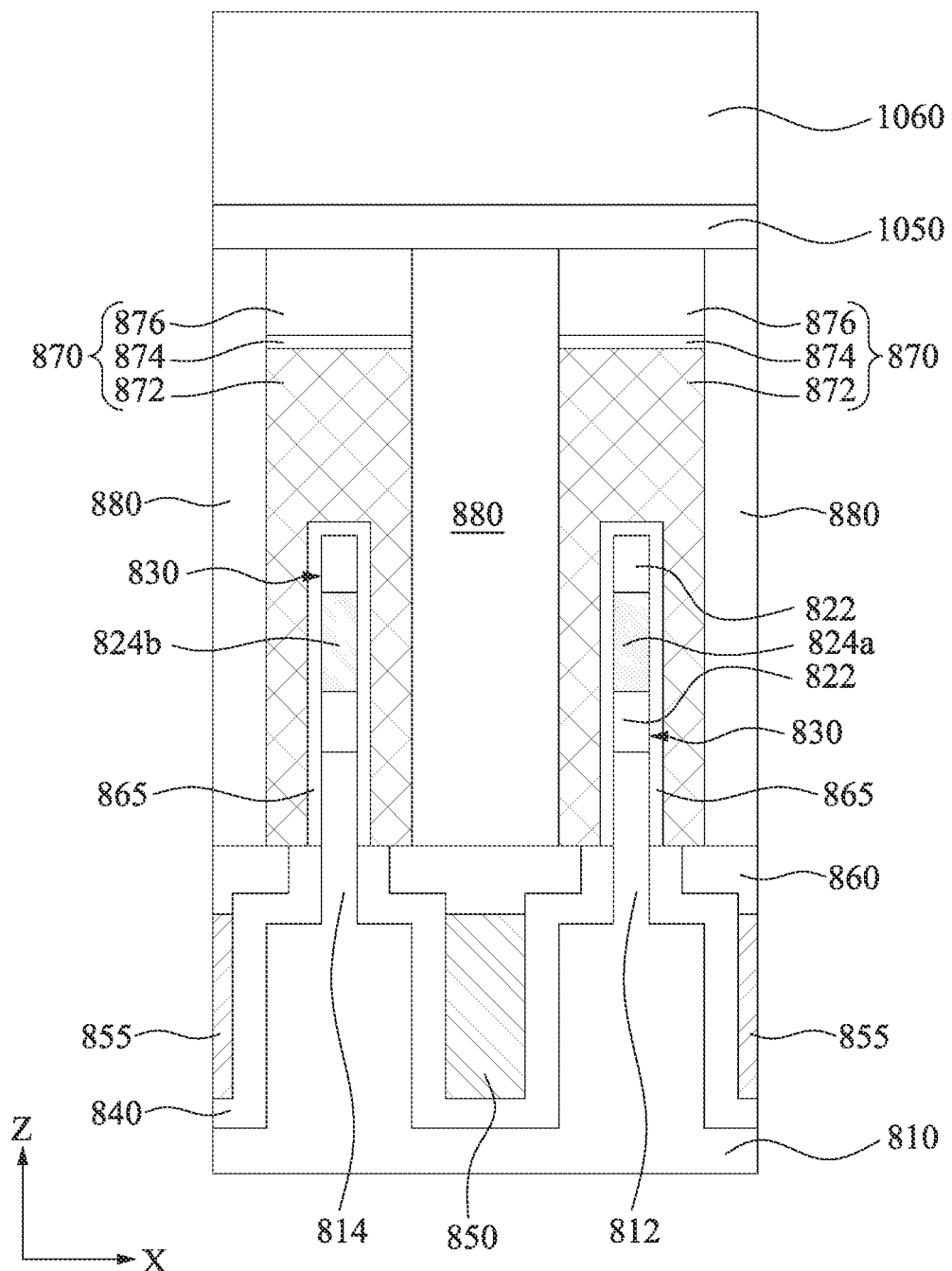
Figure 34D:
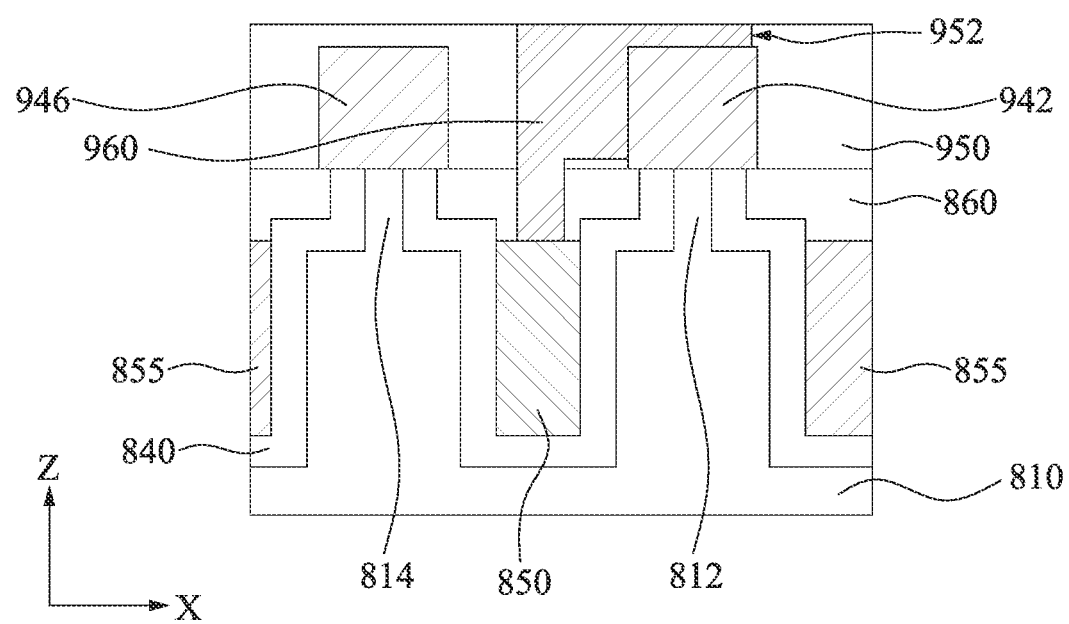

FIG. 34A is a top view of a memory cell at various stages in accordance with some embodiments of the present disclosure, FIG. 34B is a cross-sectional view taken along line B-B in FIG. 34A, FIG. 34C is a cross-sectional view taken along line C-C in FIG. 34A, and FIG. 34D is a cross-sectional view taken along line D-D in FIG. 34A. A first isolation layer 950 is formed above the source/drain features 942, 944, 946, and 948. For example, a dielectric material layer including one or more layers of insulating material is formed over the substrate 810 so that the source/drain features 942, 944, 946, and 948 are fully embedded in the dielectric material layer. The dielectric material for the dielectric material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. Subsequently, a planarization operation, such as a chemical mechanical polishing (CMP) method or an etch-back method, is performed such that the upper surface of the dummy gate structures 870 are exposed from the dielectric material layer. The dielectric material layer is then recessed or etched back to form the first isolation layer 950 so that the upper portions of the dummy gate structures 870 and upper portions of the isolation blocks 880 are exposed. With this operation, the source/drain features 942, 944, 946, and 948 are electrically insulated from each other by the first isolation layer 950.

Next, openings 952 are formed in the first isolation layer 950. The openings 952 exposes the source/drain features 942 and 948 and the conductive line 850. Conductive features 960 and 965 are respectively formed in the openings 952. As such, the conductive feature 960 interconnects the source/drain feature 942 and the conductive line 850, and the conductive feature 965 interconnects the source/drain feature 948 and the conductive line 850. In some embodiments, the conductive features 960 and 965 are made of metal, e.g., Ru, W, or other suitable materials.

Figure 35A:
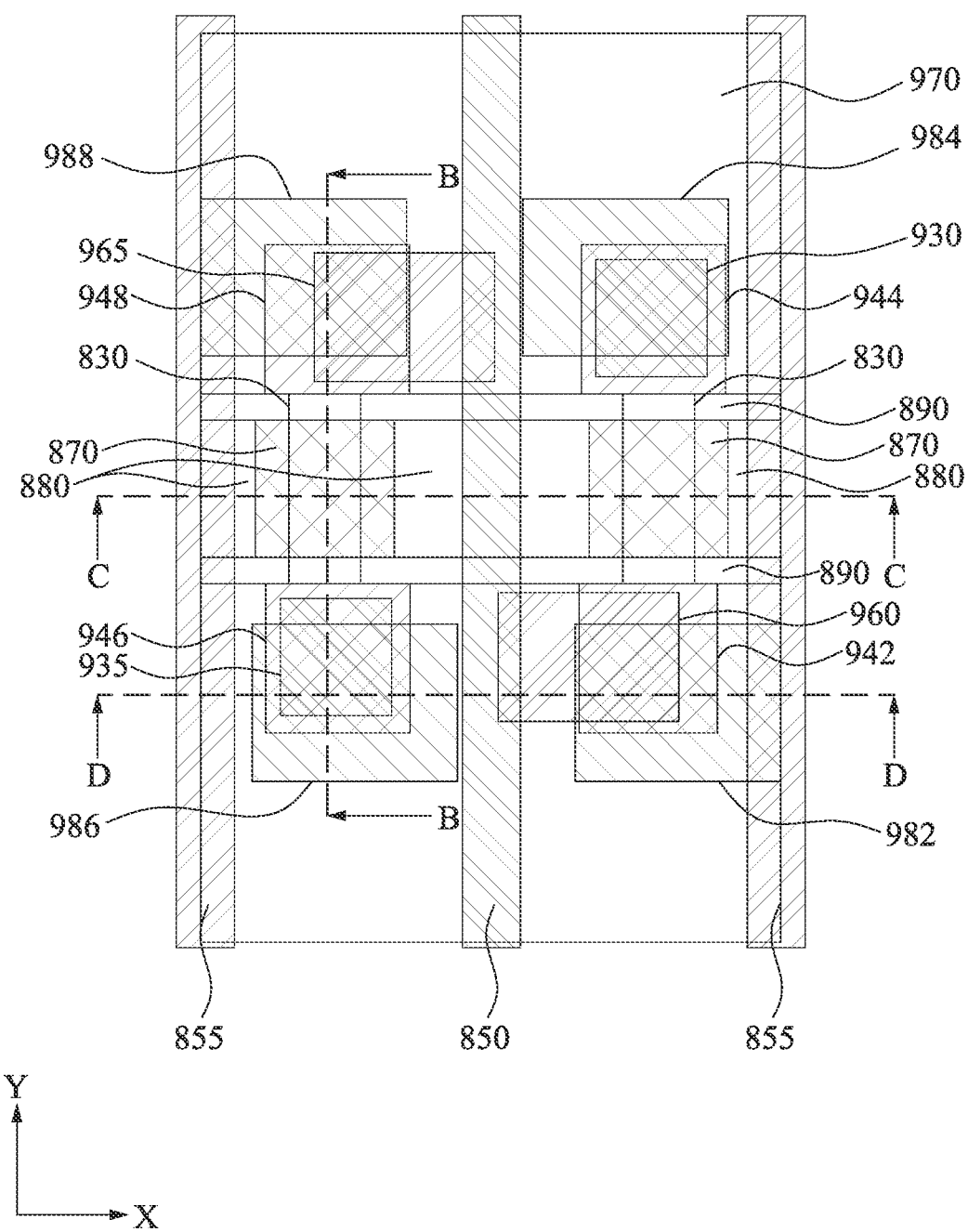
Figure 35B:
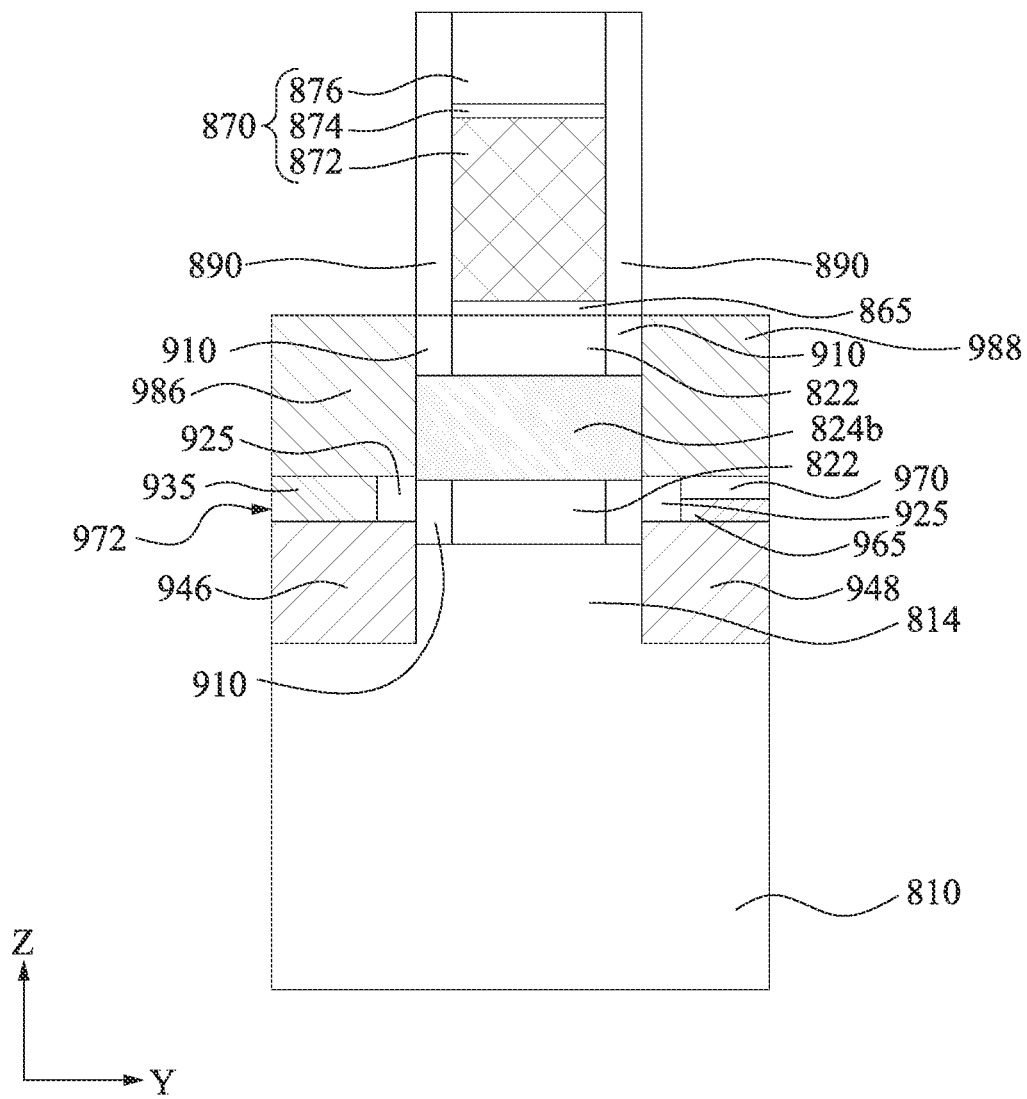
Figure 35C:
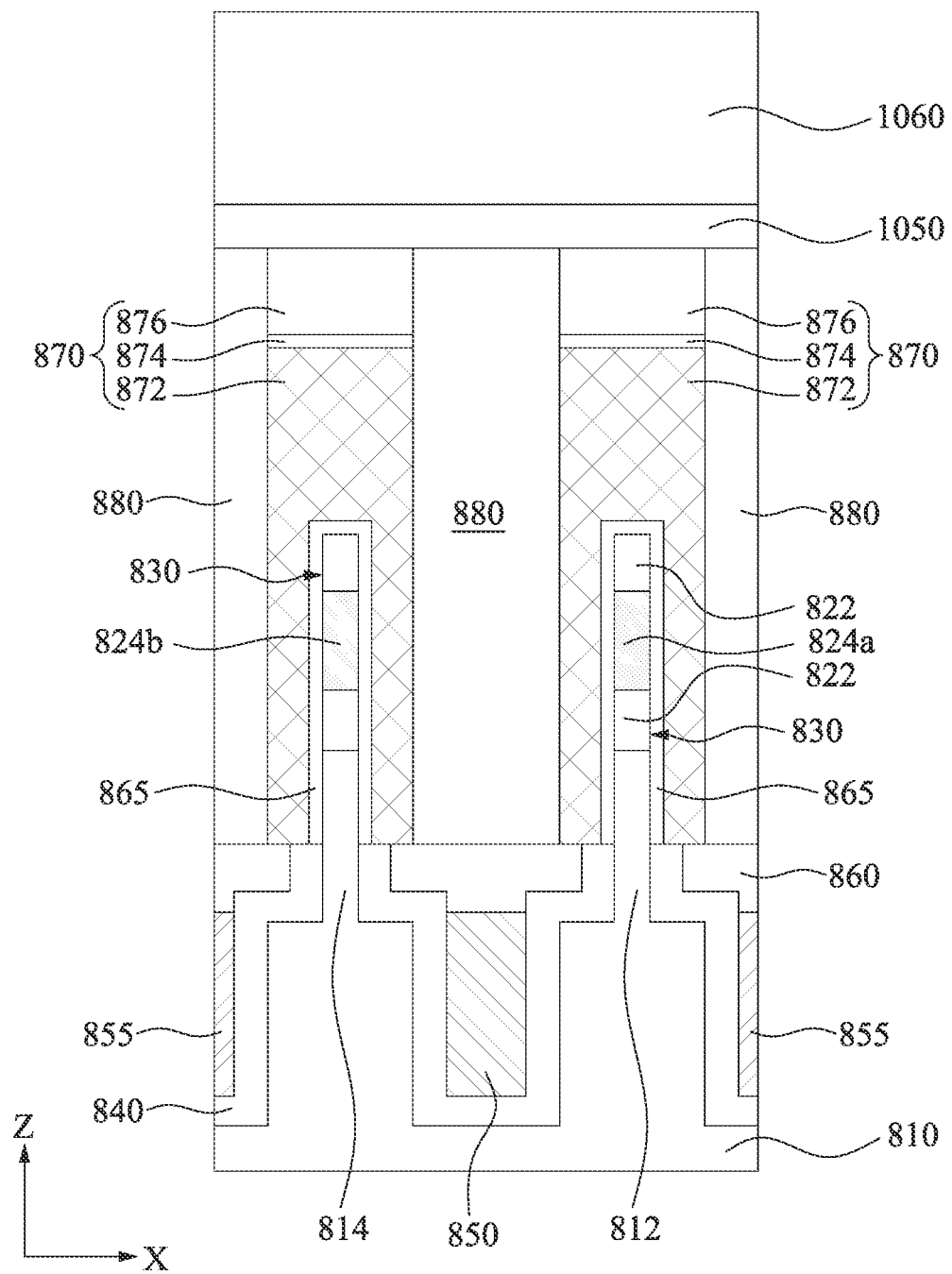
Figure 35D:
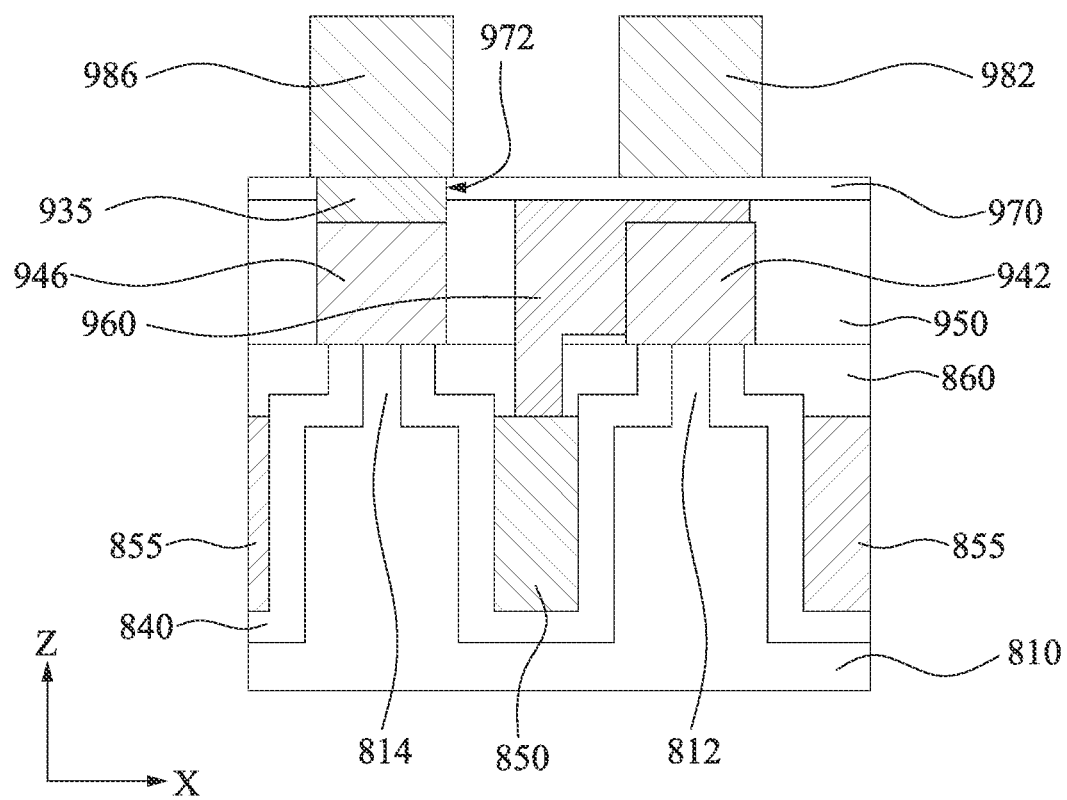

FIG. 35A is a top view of a memory cell at various stages in accordance with some embodiments of the present disclosure, FIG. 35B is a cross-sectional view taken along line B-B in FIG. 35A, FIG. 35C is a cross-sectional view taken along line C-C in FIG. 35A, and FIG. 35D is a cross-sectional view taken along line D-D in FIG. 35A. A second isolation layer 970 is formed above the first isolation layer 950 and the conductive features 960 and 965. The materials and manufacturing details of the second isolation layer 970 is the same or similar to that of the first isolation layer 950, and, therefore, a description in this regard will not be repeated hereinafter.

Subsequently, the second sidewall spacers 925 are etched back, such that the top surfaces of the second sidewall spacers 925 are substantially aligned with the top surface of the second isolation layer 970. After the second sidewall spacers 925 are etched back, openings 972 are formed in the second isolation layer 970 to respectively expose the source/drain features 944 and 946. Conductive features 930 and 935 are then respectively formed in the openings 972. As such, the conductive feature 930 is coupled to the source/drain feature 944, and the conductive feature 935 is coupled to the source/drain feature 946. In some embodiments, the conductive features 930 and 935 are made of metal, e.g., W, Ru, Cu, or other suitable materials.

After the conductive features 930 are formed, source/drain features 982, 984, 986, and 988 are then formed on the second isolation layer 970. Specifically, the source/drain features 982 and 984 are formed on opposite sides of the second semiconductor layer 824a, and the source/drain features 986 and 988 are formed on opposite sides of the second semiconductor layer 824b. Further, the source/drain feature 984 is coupled to the conductive feature 930, and the source/drain feature 986 is coupled to the conductive feature 935. The source/drain features 982, 984, 986, and 988 includes one or more layers of Si, SiP, SiC and SiCP for an n-channel FET or Si, SiGe, Ge for a p-channel FET. The source/drain features 982, 984, 986, and 988 are formed by an epitaxial growth method using CVD, ALD or molecular beam epitaxy (MBE). The source/drain features 982, 984, 986, and 988 have the same conductivity type (e.g., N-type in this case). The source/drain features 982, 984, 986, and 988 have the second conductivity type different from the first conductivity type of the source/drain features 942, 944, 946, and 948.

Figure 36A:
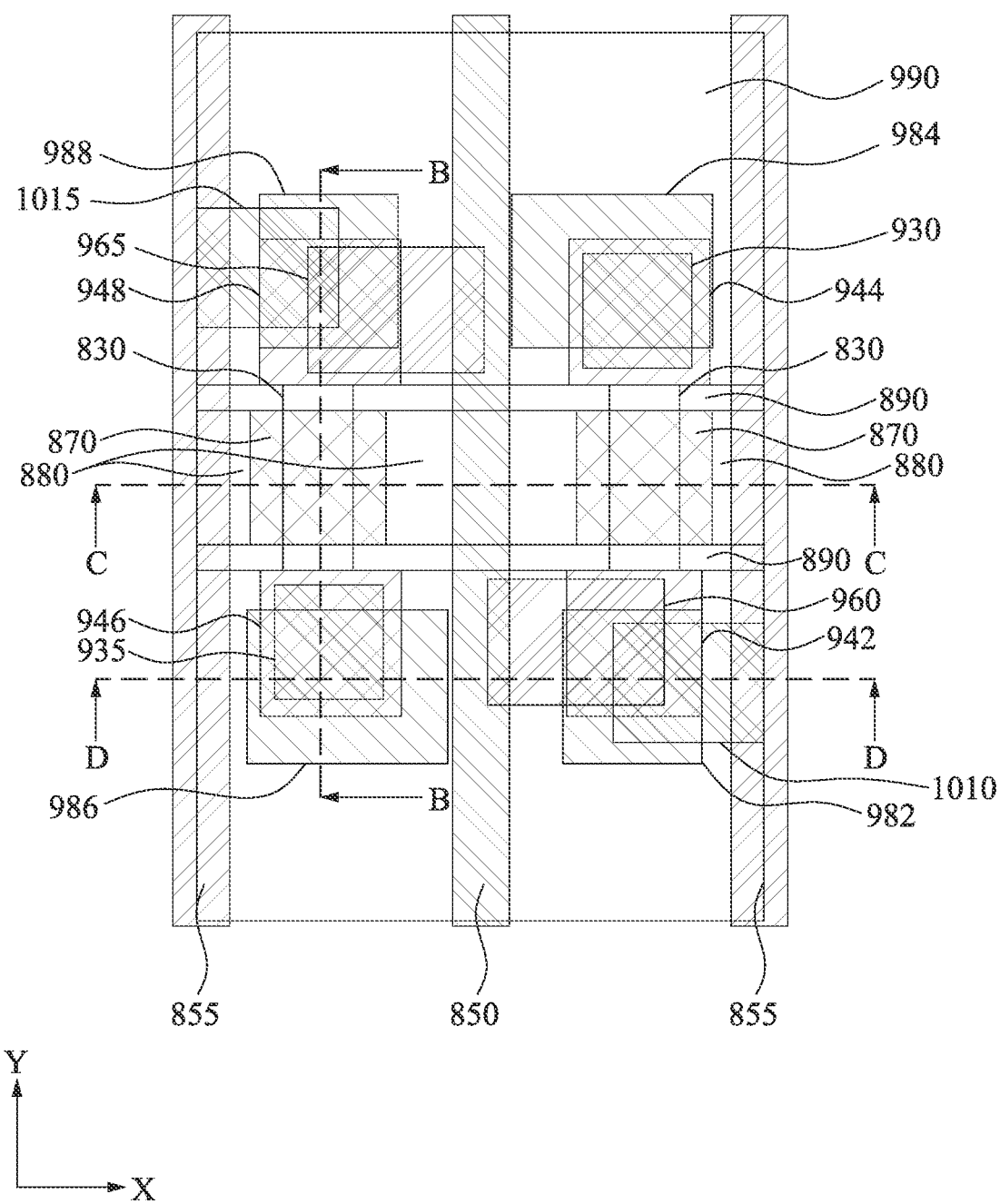
Figure 36B:
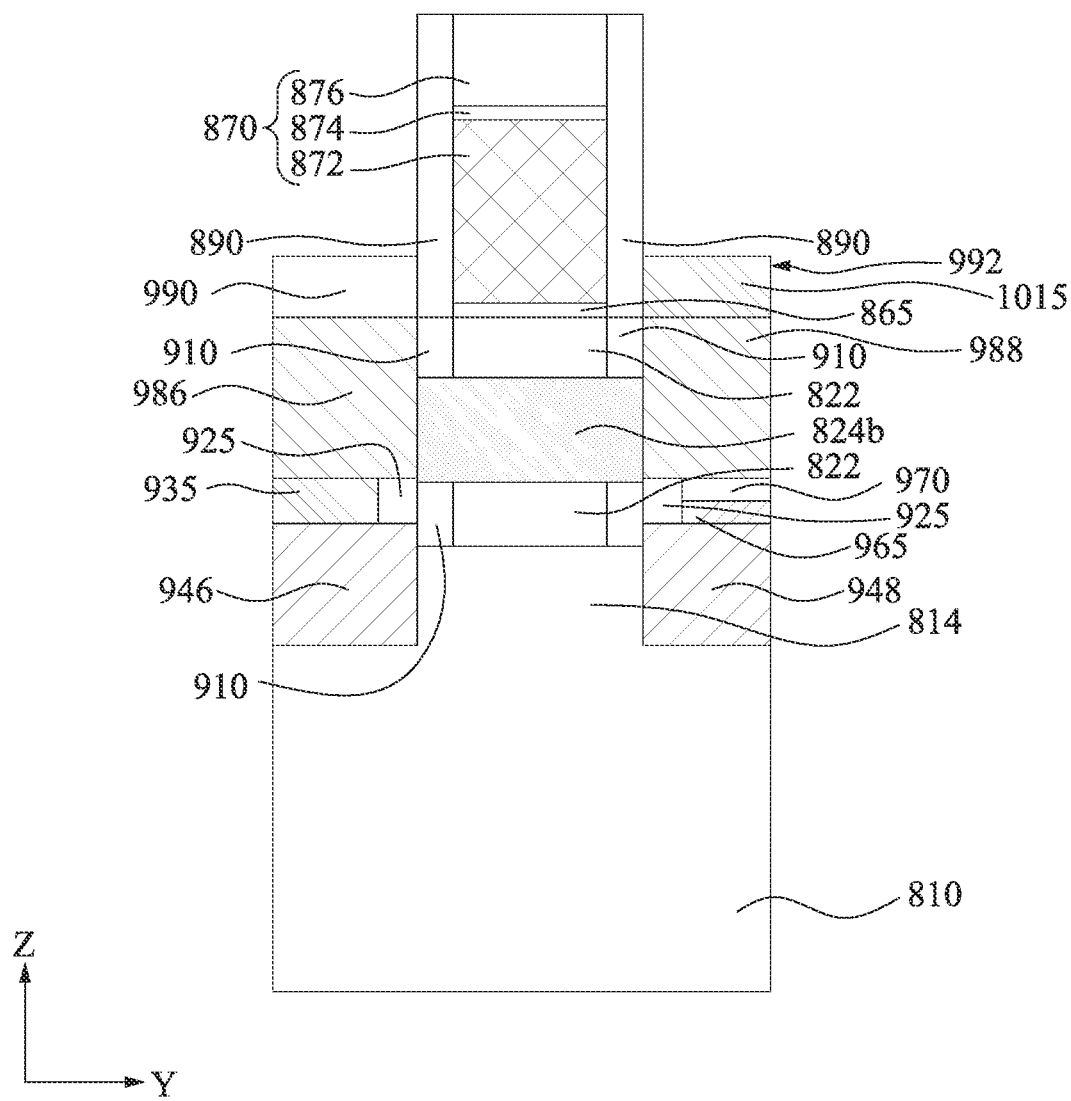
Figure 36C:
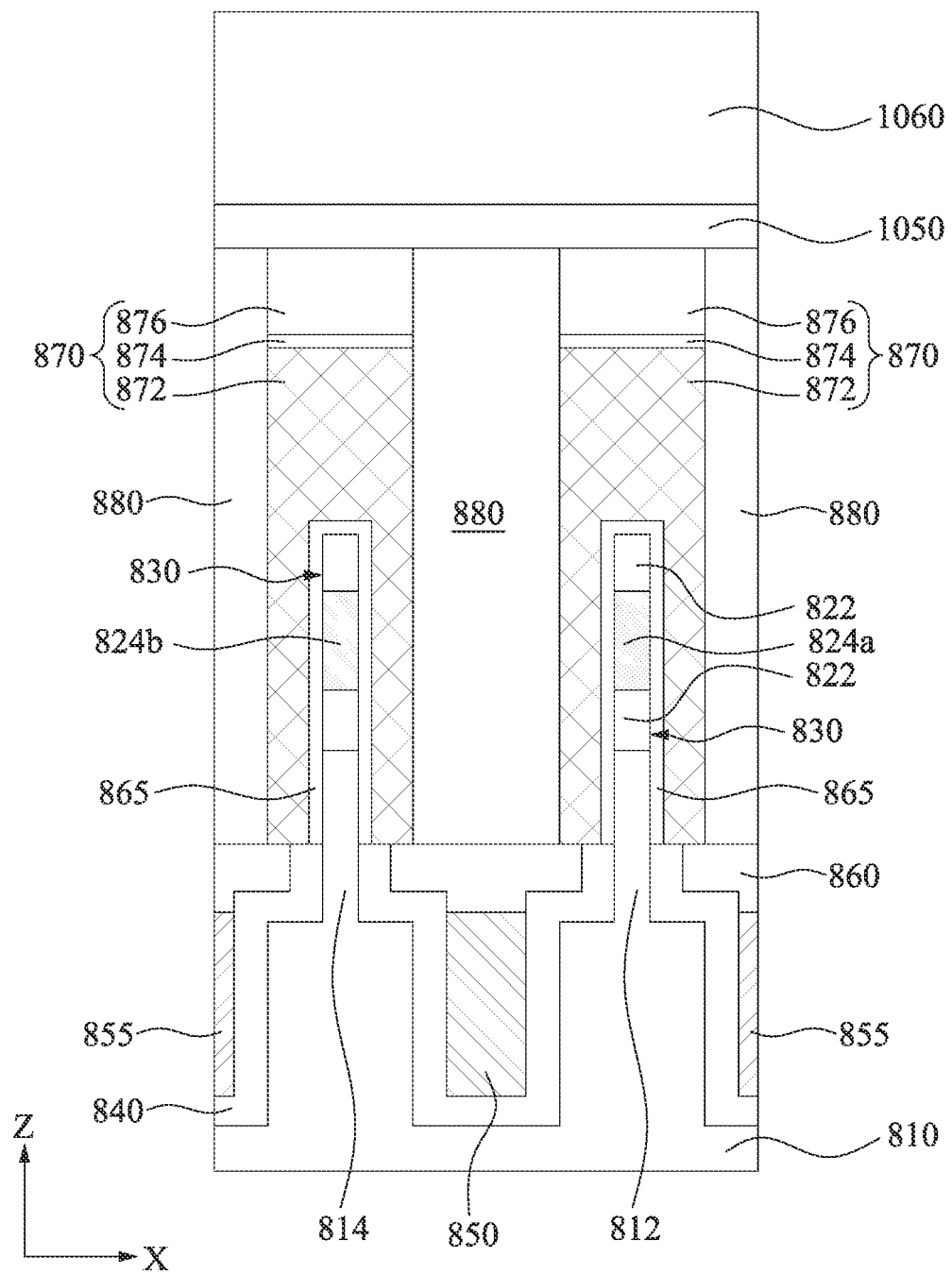
Figure 36D:
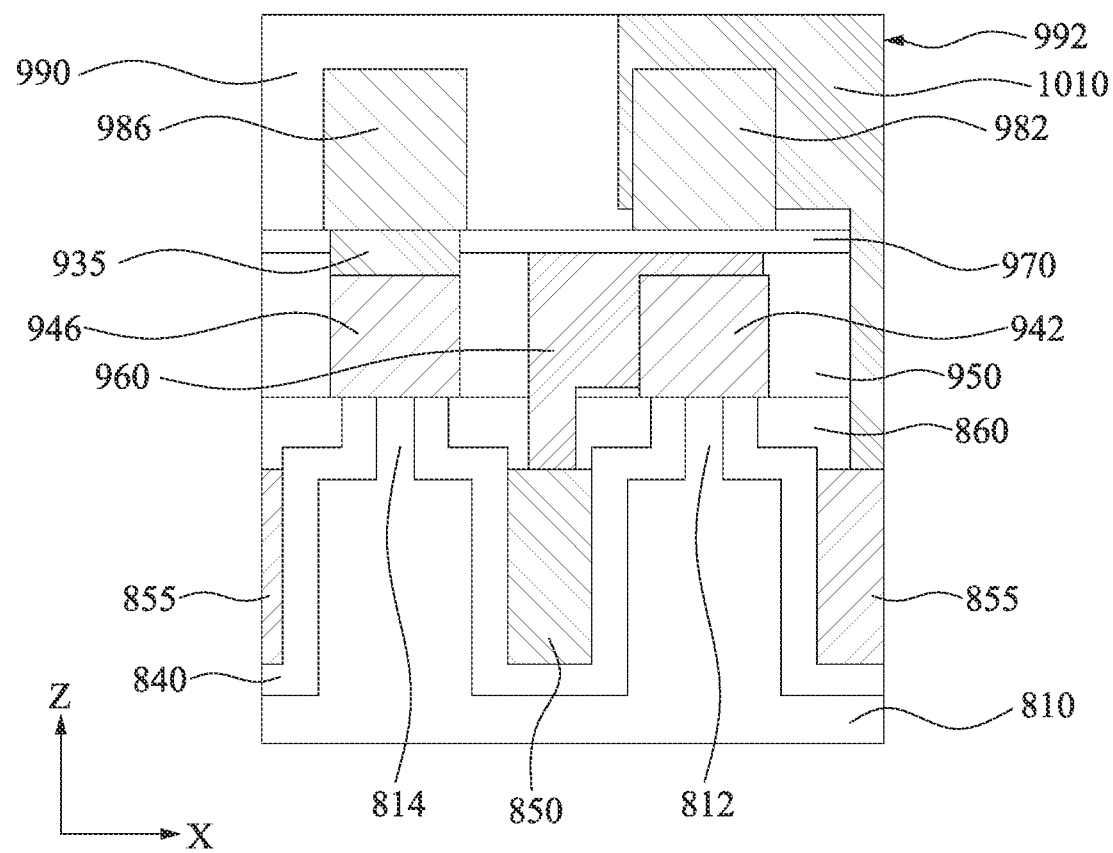

FIG. 36A is a top view of a memory cell at various stages in accordance with some embodiments of the present disclosure, FIG. 36B is a cross-sectional view taken along line B-B in FIG. 36A, FIG. 36C is a cross-sectional view taken along line C-C in FIG. 36A, and FIG. 36D is a cross-sectional view taken along line D-D in FIG. 36A. A third isolation layer 990 is formed above the source/drain features 982, 984, 986, and 988. For example, a dielectric material layer including one or more layers of insulating material is formed over the substrate 810 so that the source/drain features 982, 984, 986, and 988 are fully embedded in the dielectric material layer. The dielectric material for the dielectric material layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. Subsequently, a planarization operation, such as a chemical mechanical polishing (CMP) method or an etch-back method, is performed such that the upper surface of the dummy gate structures 870 are exposed from the dielectric material layer. The dielectric material layer is then recessed or etched back to form the third isolation layer 990 so that the upper portions of the dummy gate structures 870 and upper portions of the isolation blocks 880 are exposed. With this operation, the source/drain features 982, 984, 986, and 988 are electrically insulated from each other by the third isolation layer 990.

Next, openings 992 are formed in the third isolation layer 990. The openings 992 exposes the source/drain features 982 and 988 and the conductive lines 855. Conductive features 1010 and 1015 are respectively formed in the openings 992. As such, the conductive feature 1010 interconnects the source/drain feature 982 and the conductive line 855, and the conductive feature 1015 interconnects the source/drain feature 988 and the conductive line 855. In some embodiments, the conductive features 1010 and 1015 are made of metal, e.g., Ru, W, Cu, or other suitable materials.

Figure 37A:
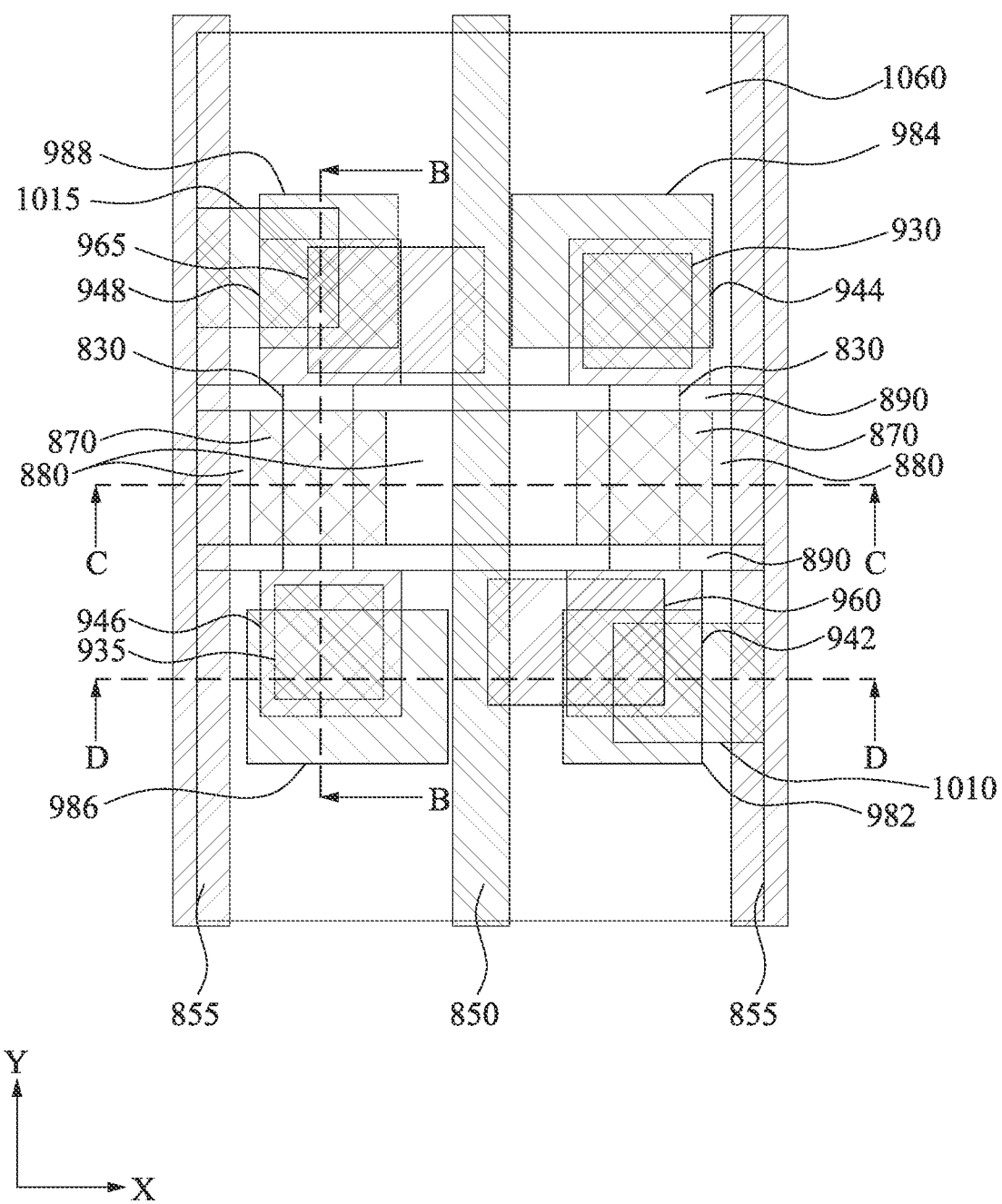
Figure 37B:
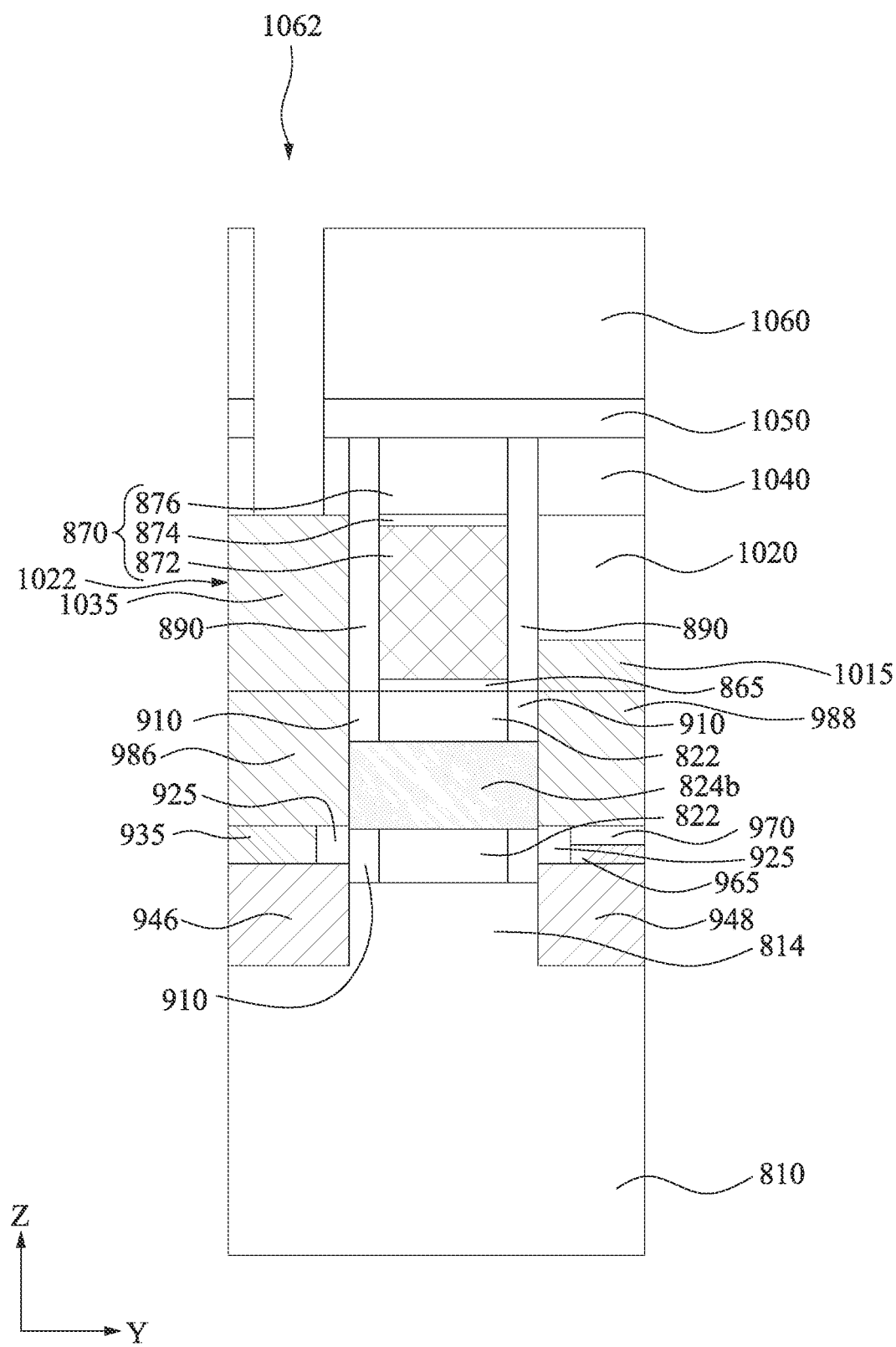
Figure 37C:
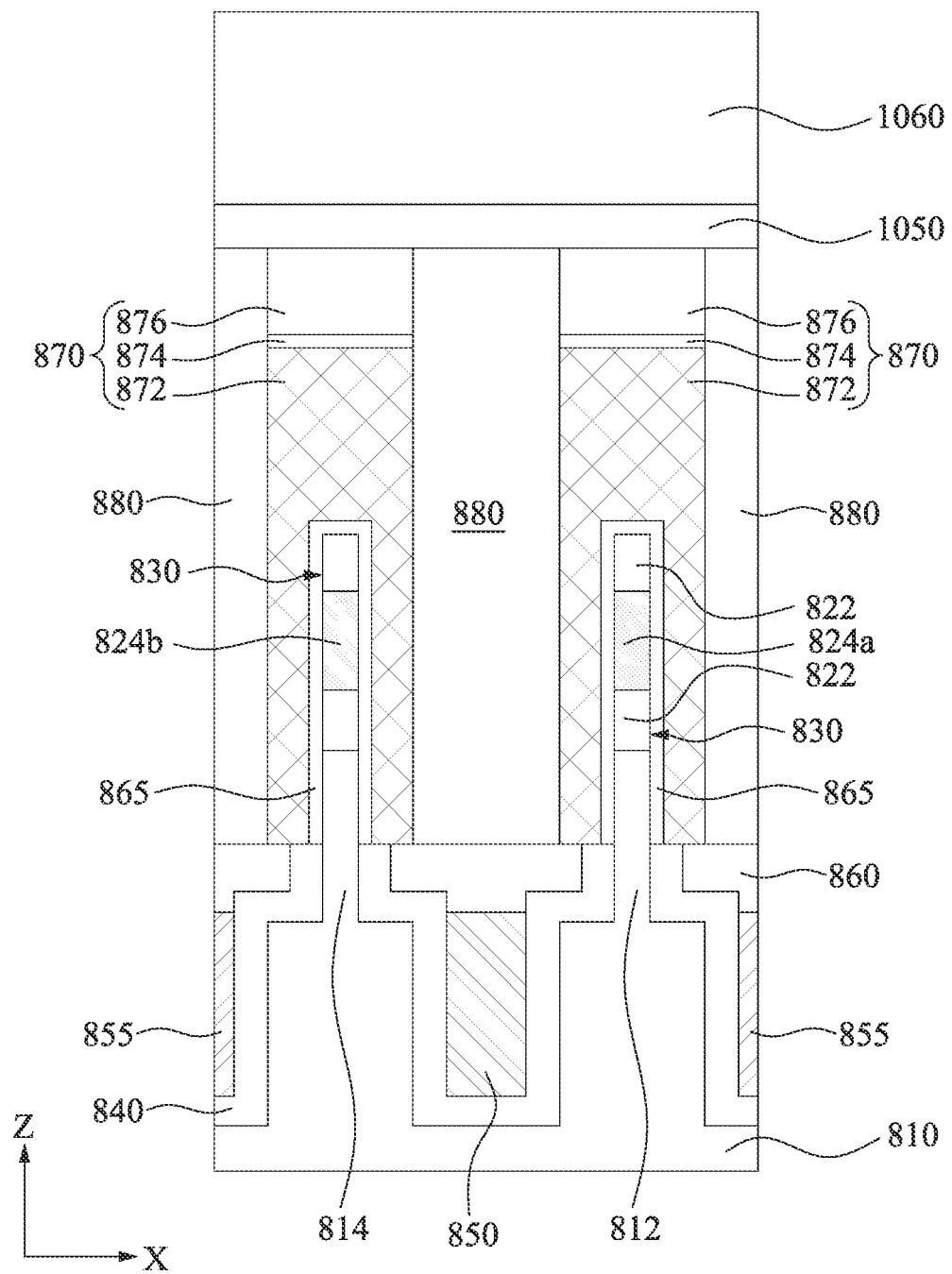
Figure 37D:
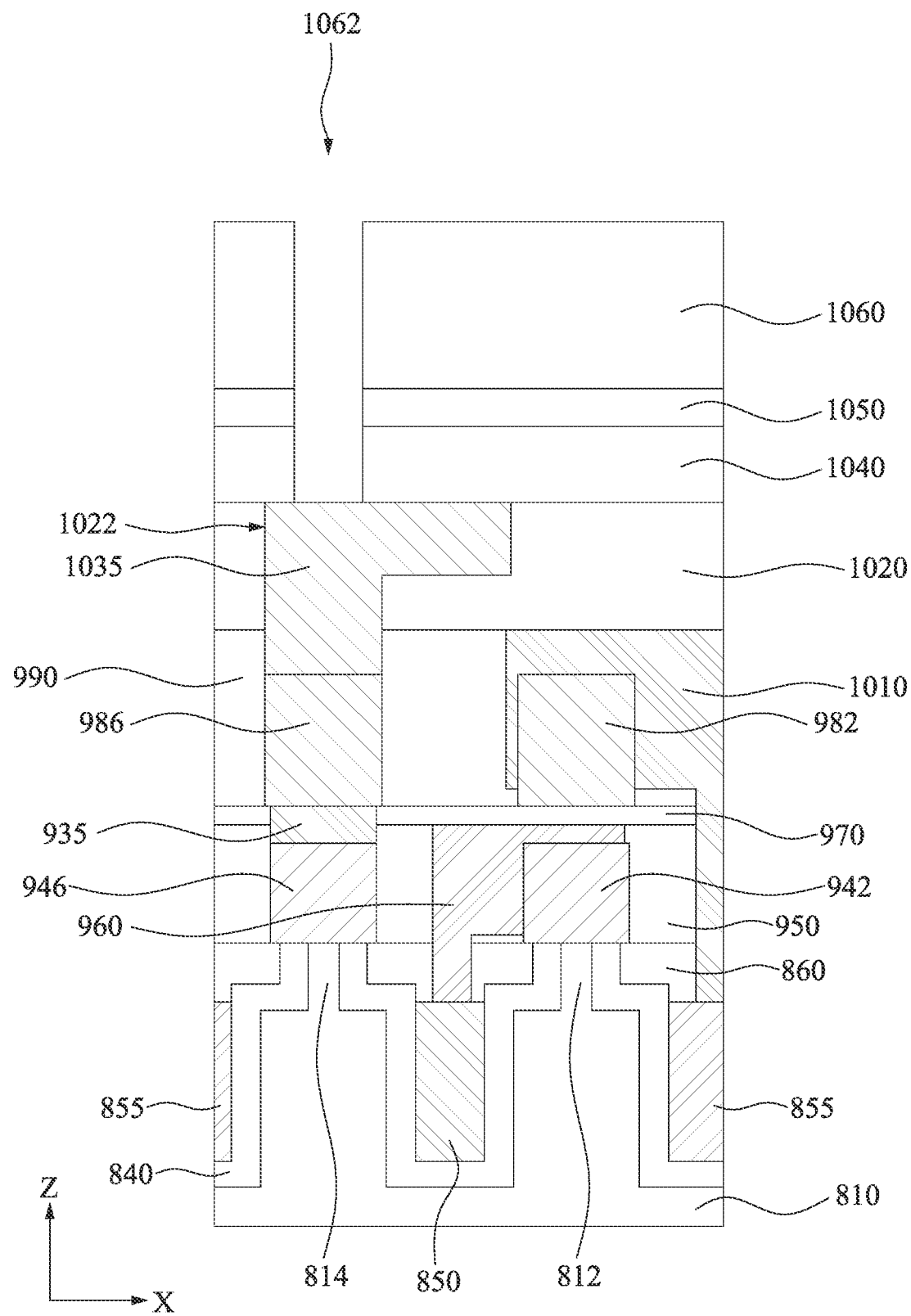

FIG. 37A is a top view of a memory cell at various stages in accordance with some embodiments of the present disclosure, FIG. 37B is a cross-sectional view taken along line B-B in FIG. 37A, FIG. 37C is a cross-sectional view taken along line C-C in FIG. 37A, and FIG. 37D is a cross-sectional view taken along line D-D in FIG. 37A. A fourth isolation layer 1020 is formed above the third isolation layer 990 and the conductive features 1010 and 1015. The materials and manufacturing details of the fourth isolation layer 1020 are the same or similar to that of the first isolation layer 950, and, therefore, a description in this regard will not be repeated hereinafter.

Next, openings 1022 are formed in the fourth isolation layer 1020. The openings 1022 expose the source/drain features 984 and 986. Conductive features 1030 and 1035 are respectively formed in the openings 1022. As such, the conductive feature 1030 is coupled to the source/drain feature 984, and the conductive feature 1035 is coupled to the source/drain feature 986. In some embodiments, the conductive features 1030 and 1035 are epitaxial structures and includes materials the same as or similar to the source/drain features 982, 984, 986, and 988. For clarity, the conductive features 1030 and 1035 are shown in FIGS. 37B and 37D (and FIG. 44E) and are omitted in FIG. 37A.

After the conductive features 1030 and 1035 are formed, a fifth isolation layer 1040, an ESL 1050, and a first ILD 1060 are sequentially formed above the fourth dielectric layer 1020 and the conductive features 1030 and 1035. The materials and manufacturing details of the fifth isolation layer 1040 are the same or similar to that of the first isolation layer 950, and, therefore, a description in this regard will not be repeated hereinafter. The materials and manufacturing details of the ESL 1050 and the first ILD 1060 are the same or similar to that of the ESL 410 and the first ILD 420 shown in FIGS. 10B-10D, and, therefore, a description in this regard will not be repeated hereinafter.

Next, a plurality of openings 1062 are formed in the first ILD 1060, the ESL 1050, and the fifth isolation layer 1040 to expose the conductive features 1030 and 1035, respectively. For clarity, the openings 1062 are shown in FIGS. 37B and 37D and are omitted in FIG. 37A.

Figure 38A:
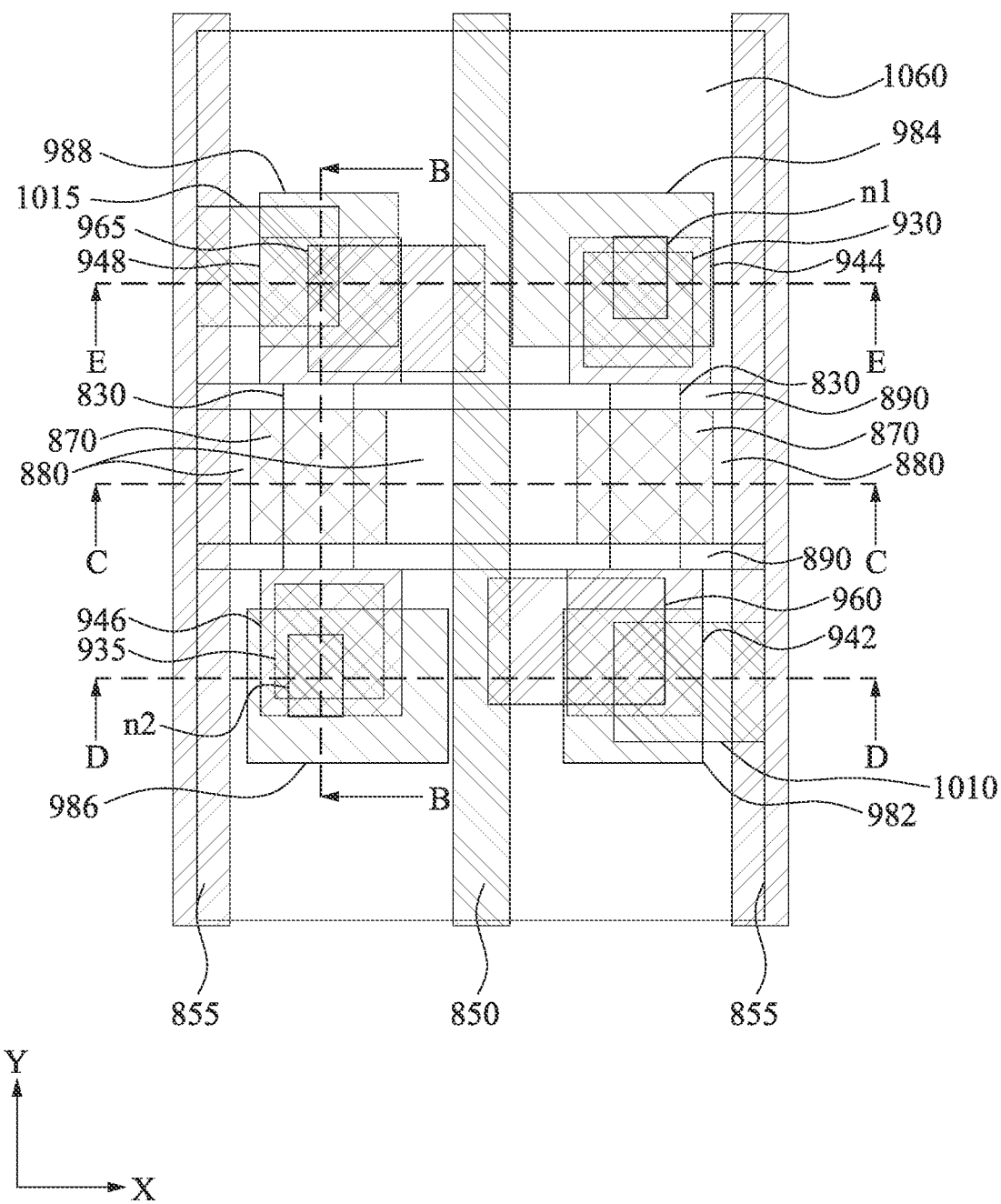
Figure 38B:
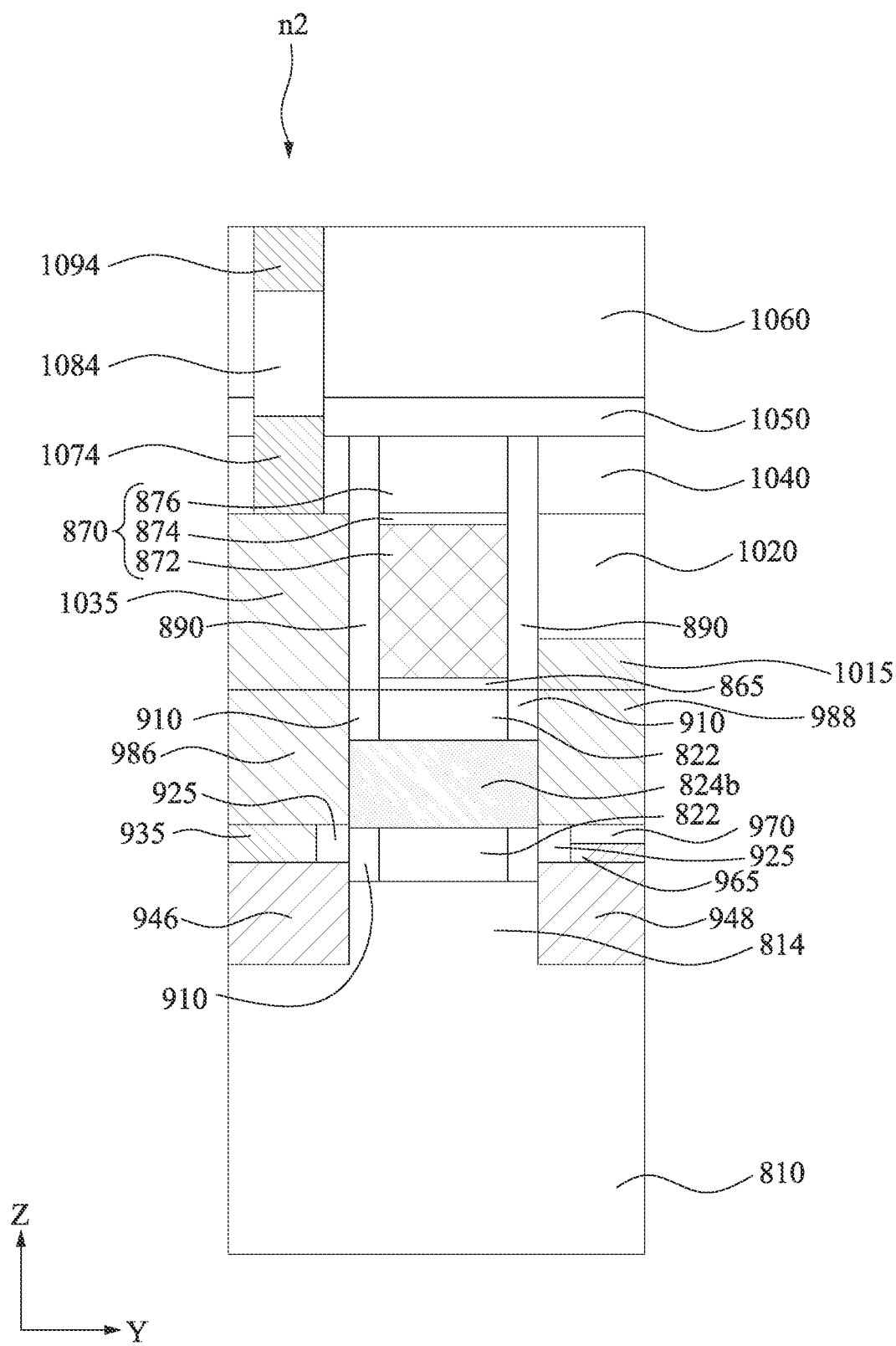
Figure 38C:
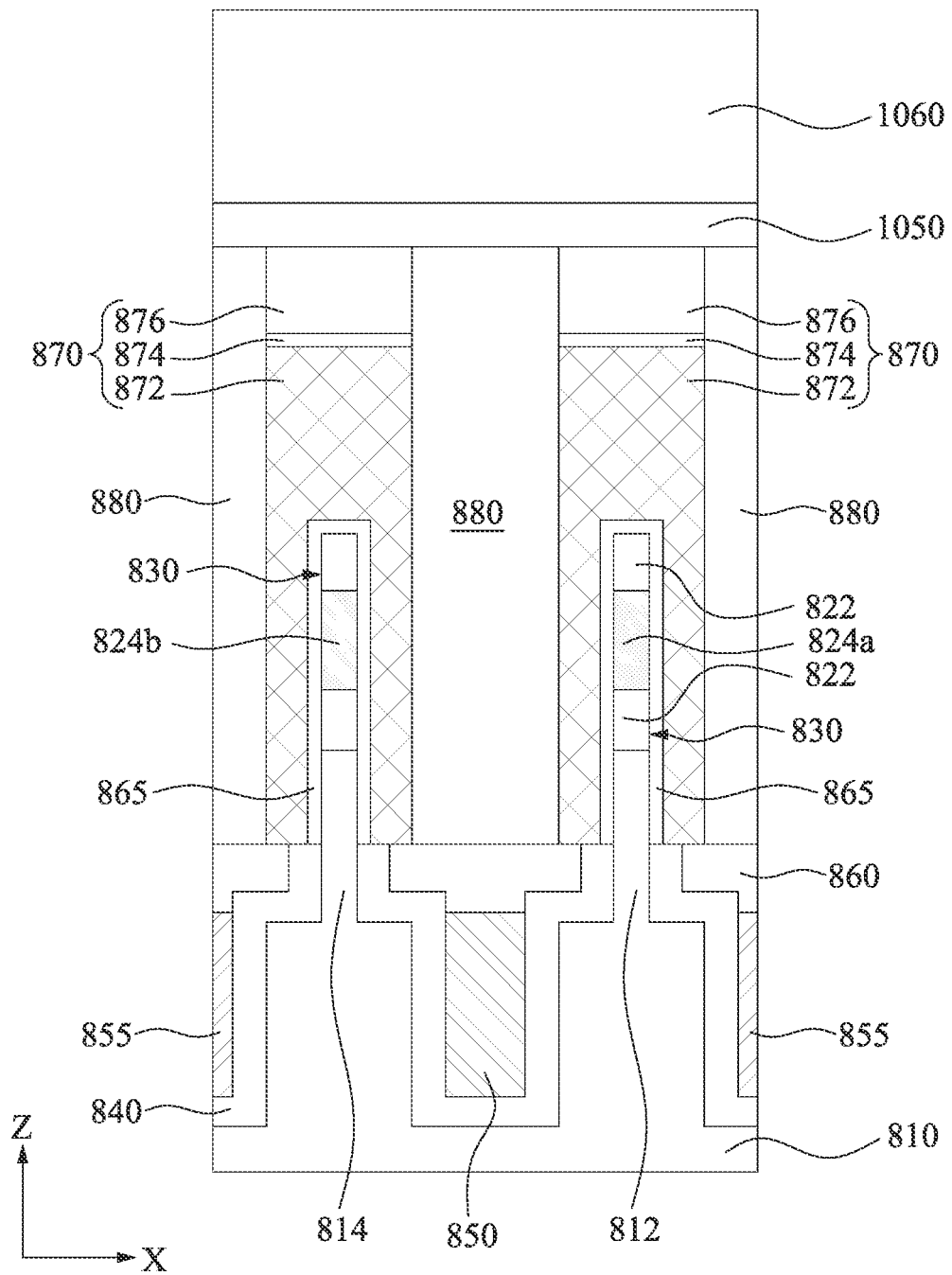
Figure 38D:
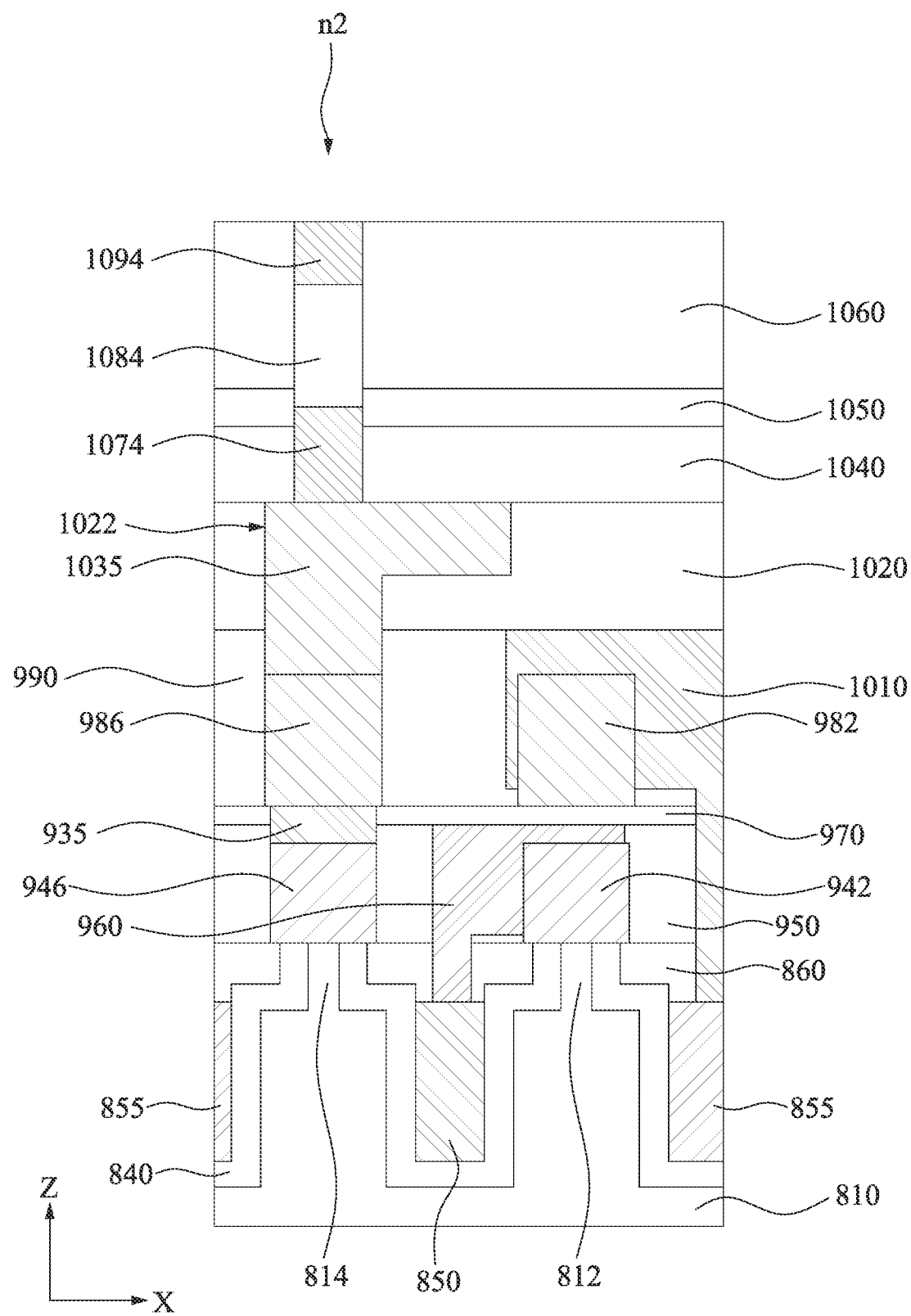
Figure 38E:
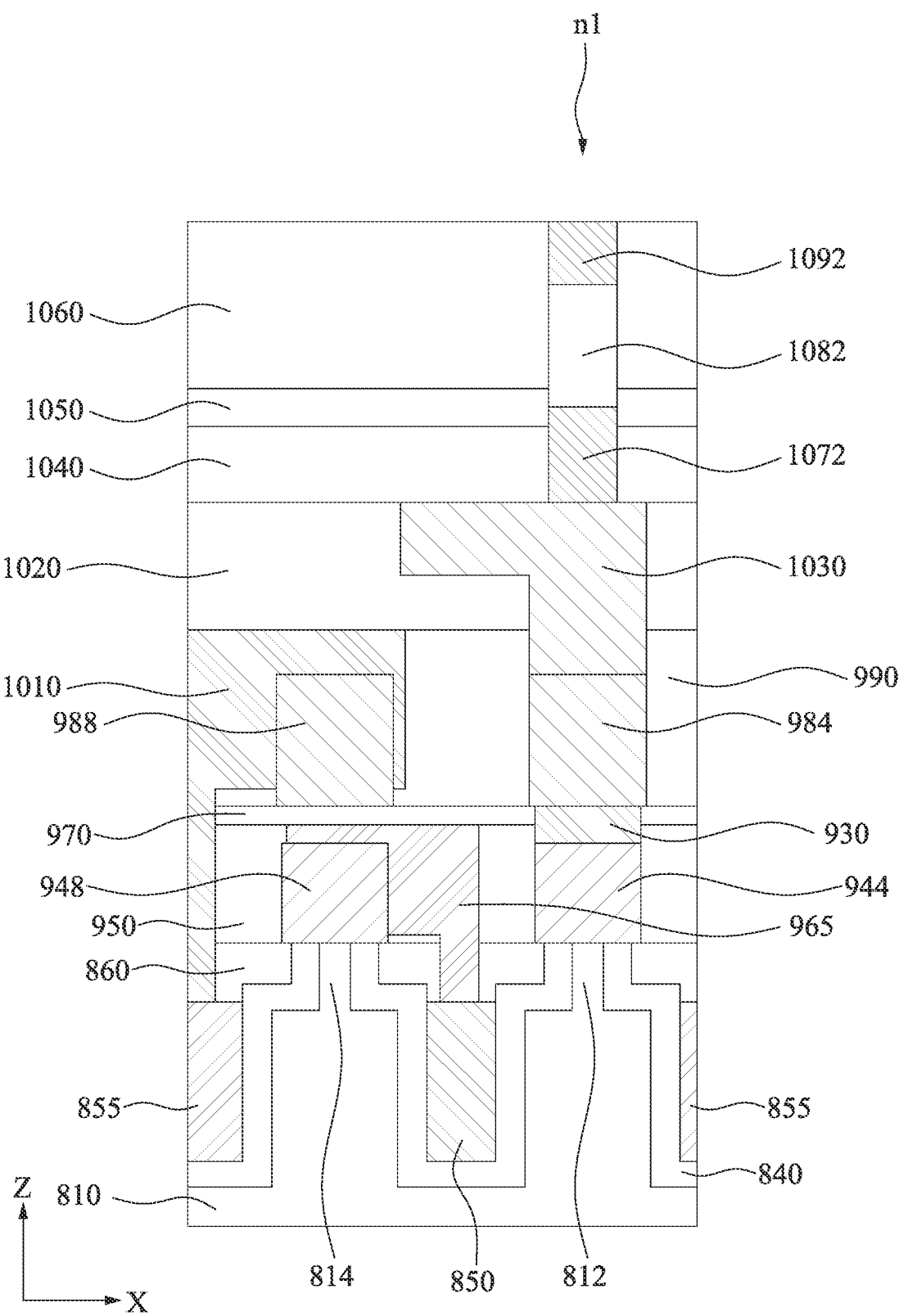

FIG. 38A is a top view of a memory cell at various stages in accordance with some embodiments of the present disclosure, FIG. 38B is a cross-sectional view taken along line B-B in FIG. 38A, FIG. 38C is a cross-sectional view taken along line C-C in FIG. 38A, FIG. 38D is a cross-sectional view taken along line D-D in FIG. 38A, and FIG. 38E is a cross-sectional view taken along line E-E in FIG. 38A. A plurality of bottom source/drain features 1072 and 1074 are respectively formed above the conductive features 1030 and 1035 and respectively in the openings 1062 (see FIGS. 37B-37D). In some embodiments, the bottom source/drain features 1072 and 1074 are grown on the conductive features 1030 and 1035 in a bottom-up manner. In some embodiments, the bottom source/drain features 1072 and 1074 have a conductivity type the same as that of the source/drain features 982, 984, 986, and 988. In some embodiments, the bottom source/drain features 1072 and 1074 have a material the same as that of the source/drain features 982, 984, 986, and 988. In some embodiments, the bottom source/drain features 1072 and 1074 have a doping concentration substantially the same as that of the source/drain features 982, 984, 986, and 988.

Subsequently, a plurality of channels 1082 and 1084 are respectively formed above the bottom source/drain features 1072 and 1074 and respectively in the openings 1062. In some embodiments, the channels 1082 and 1084 are grown on the bottom source/drain features 1072 and 1074 in a bottom-up manner. In some embodiments, the channels 1082 and 1084 are undoped. In some embodiments, the channels 1082 and 1084 have a material the same as that of the bottom source/drain features 1072 and 1074.

Subsequently, a plurality of top source/drain features 1092 and 1094 are respectively formed above the channels 1082 and 1084 and respectively in the openings 1062. In some embodiments, the top source/drain features 1092 and 1094 are grown on the channels 1082 and 1084 in a bottom-up manner. In some embodiments, the top source/drain features 1092 and 1094 have a conductivity type the same as that of the bottom source/drain features 1072 and 1074. In some embodiments, the top source/drain features 1092 and 1094 have a material the same as that of the bottom source/drain features 1072 and 1074. In some embodiments, the top source/drain features 1092 and 1094 have a doping concentration substantially the same as that of the bottom source/drain features 1072 and 1074.

As such, the bottom source/drain feature 1072, the channel 1082, and the top source/drain feature 1092 form a nanowire n1, and the bottom source/drain feature 1074, the channel 1084, and the top source/drain feature 1094 form a nanowire n2.

Figure 39A:
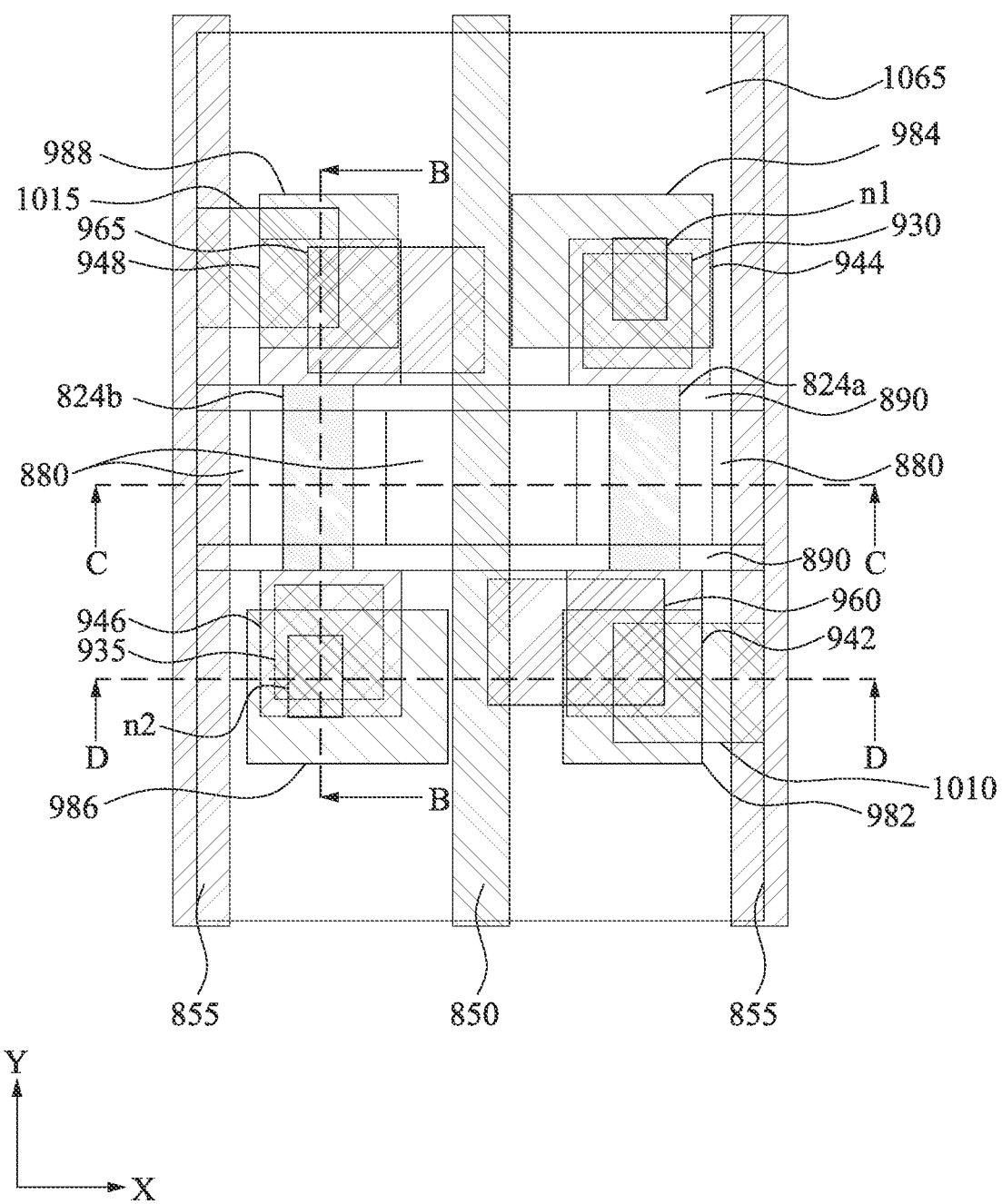
Figure 39B:
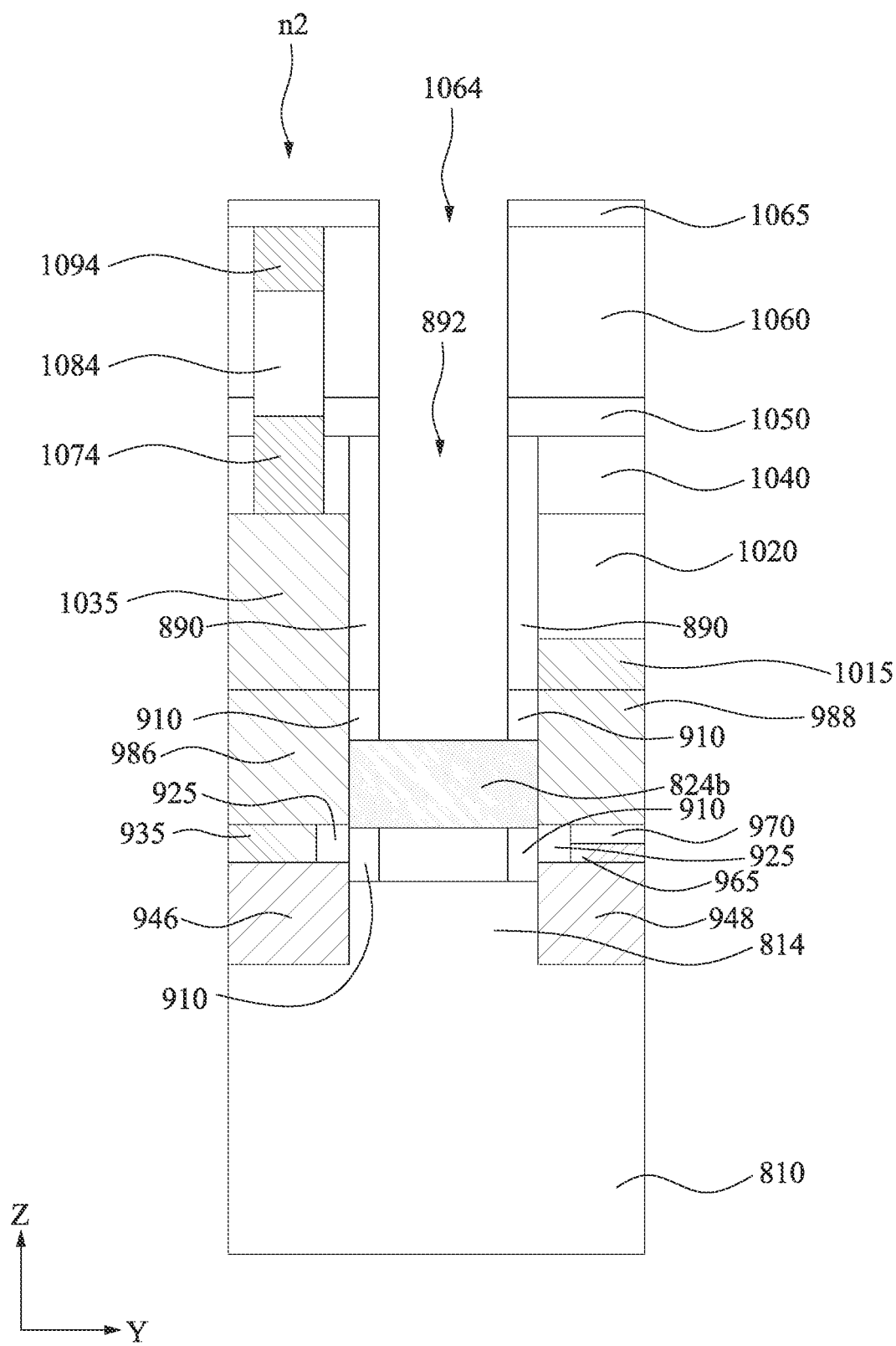
Figure 39C:
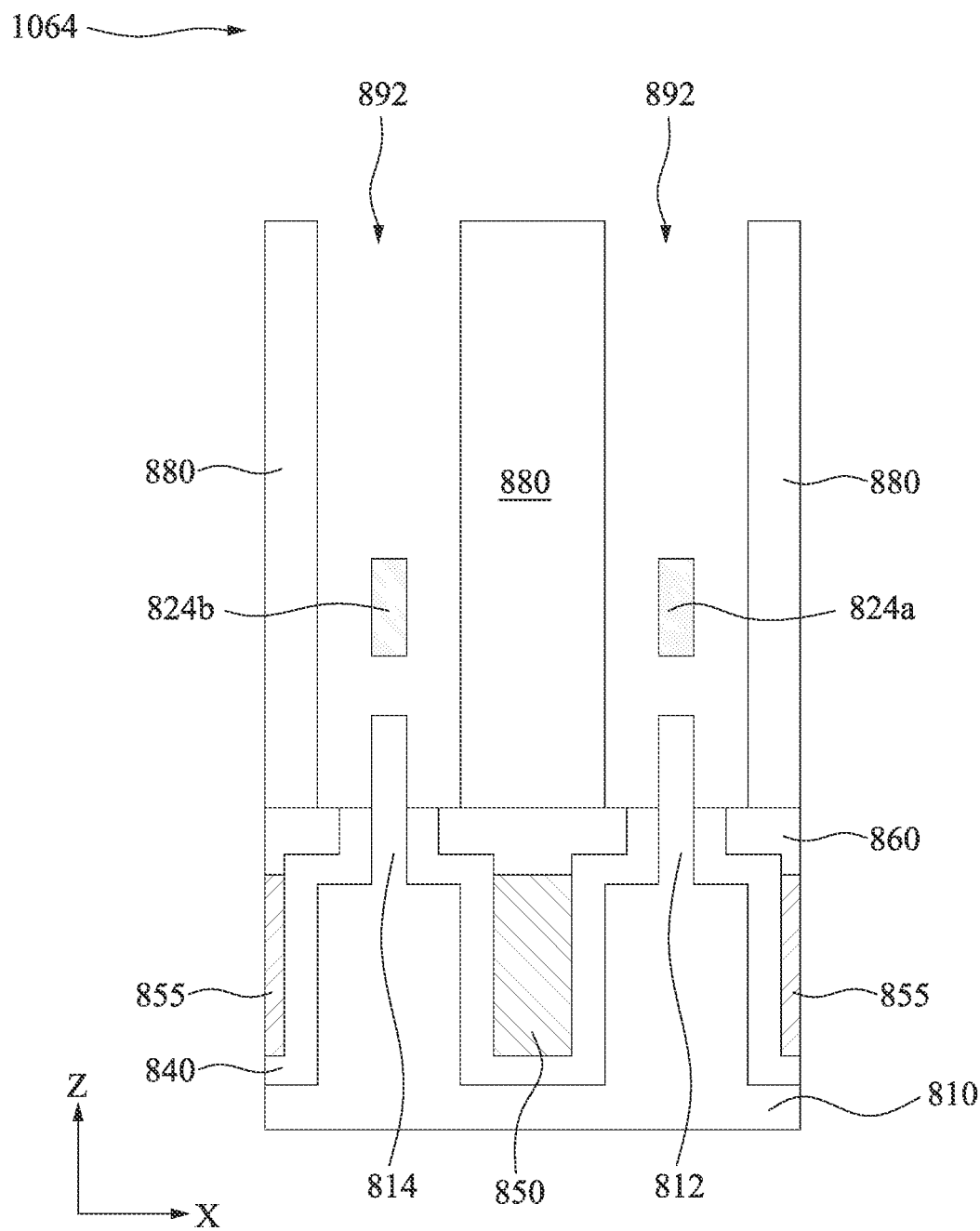
Figure 39D:
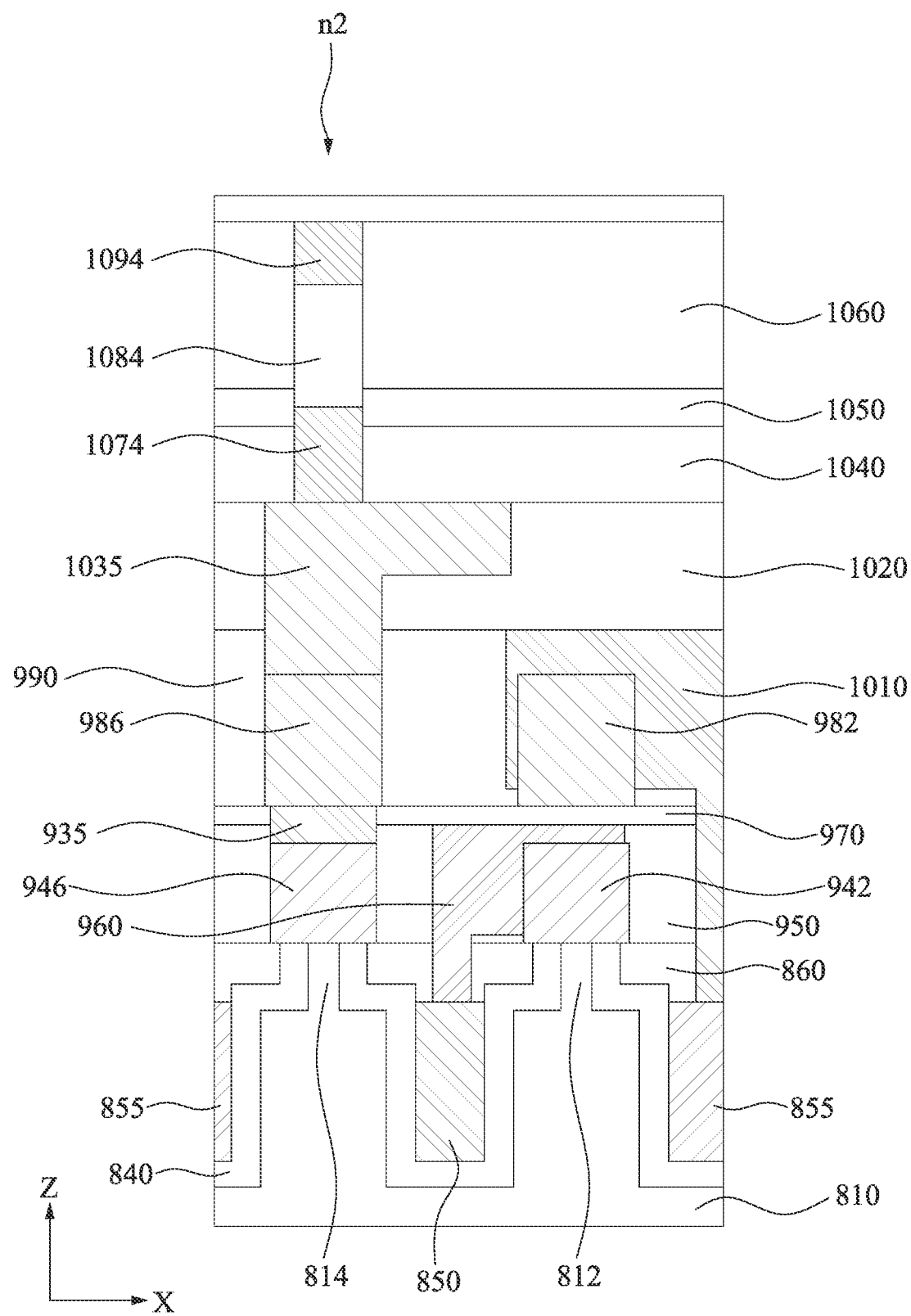

FIG. 39A is a top view of a memory cell at various stages in accordance with some embodiments of the present disclosure, FIG. 39B is a cross-sectional view taken along line B-B in FIG. 39A, FIG. 39C is a cross-sectional view taken along line C-C in FIG. 39A, and FIG. 39D is a cross-sectional view taken along line D-D in FIG. 39A. A sixth isolation layer 1065 is formed above the first ILD 1060 and the nanowires n1 and n2. The materials and manufacturing details of the sixth isolation layer 1065 are the same or similar to that of the first isolation layer 950, and, therefore, a description in this regard will not be repeated hereinafter.

Openings 1064 are formed in the sixth isolation layer 1065 and the first ILD 1060 and respectively right above the dummy gate structures 870. The openings 1064 expose portions of the ESL 1050, which are removed using the first ILD 1060 as an etching mask. The dummy gate structures 870 and the first semiconductor layers 822 (see FIGS. 38B and 38C) are then exposed and be removed as well, and gate trenches 892 are formed between the gate spacers 890.

Figure 40A:
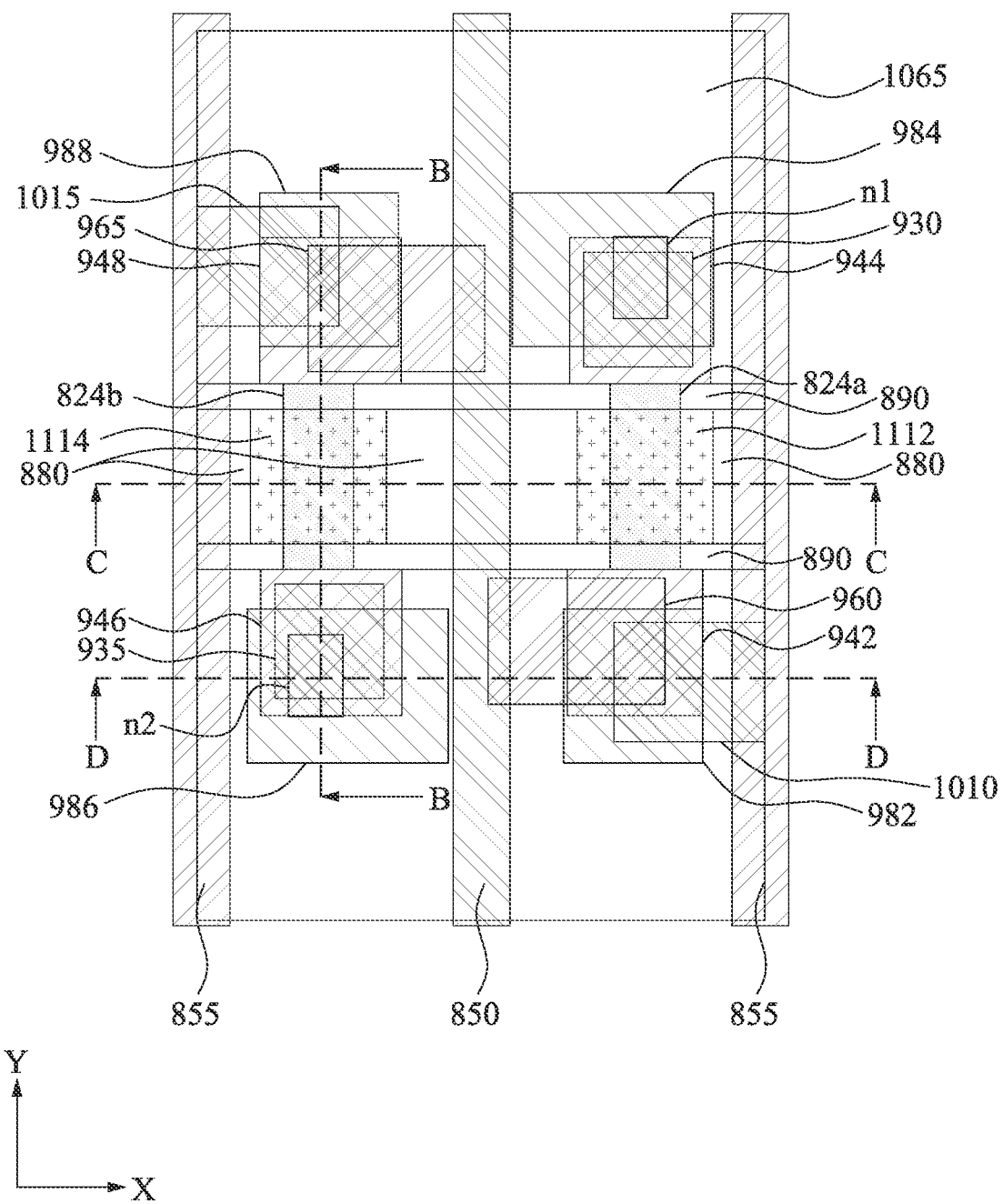
Figure 40B:
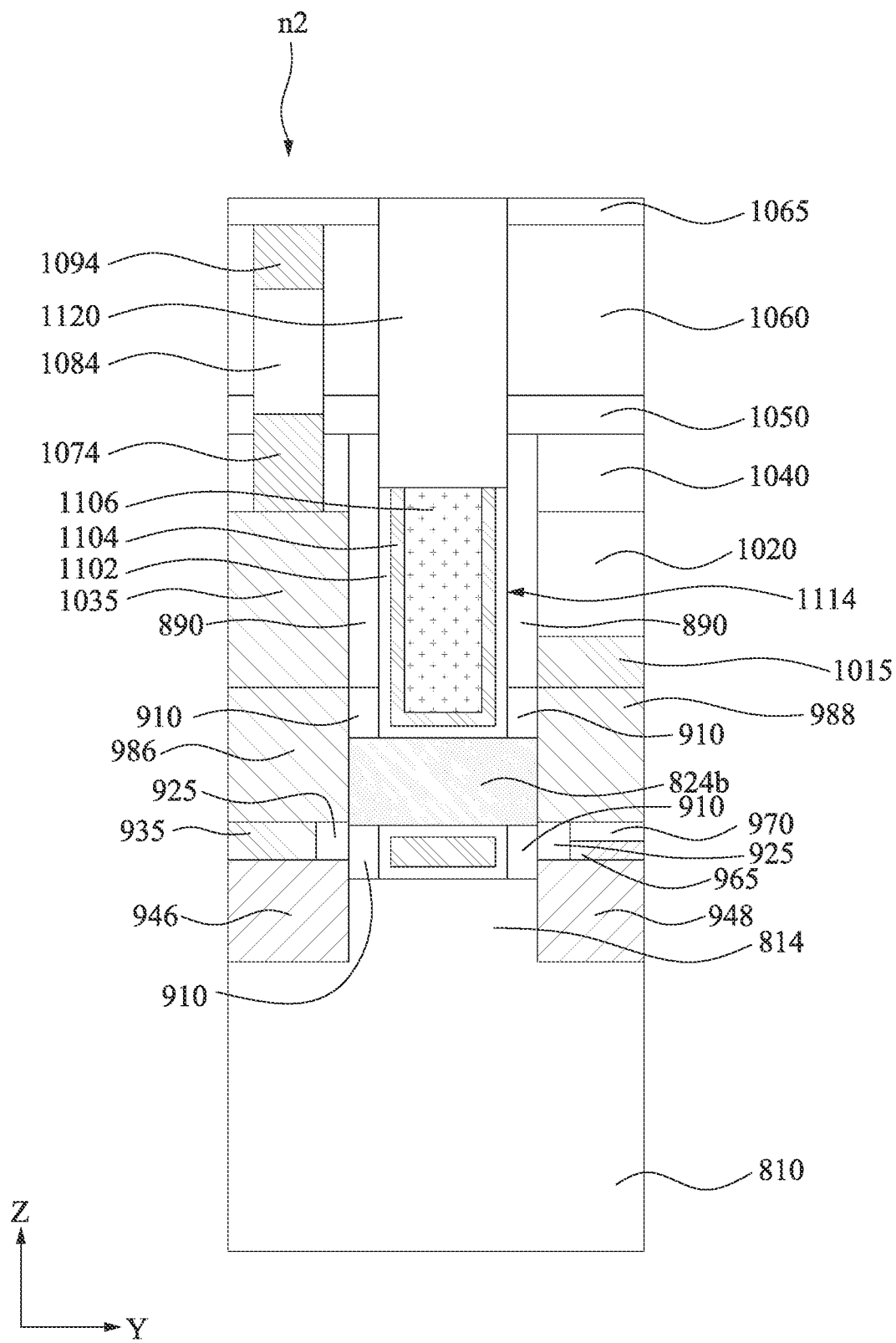
Figure 40C:
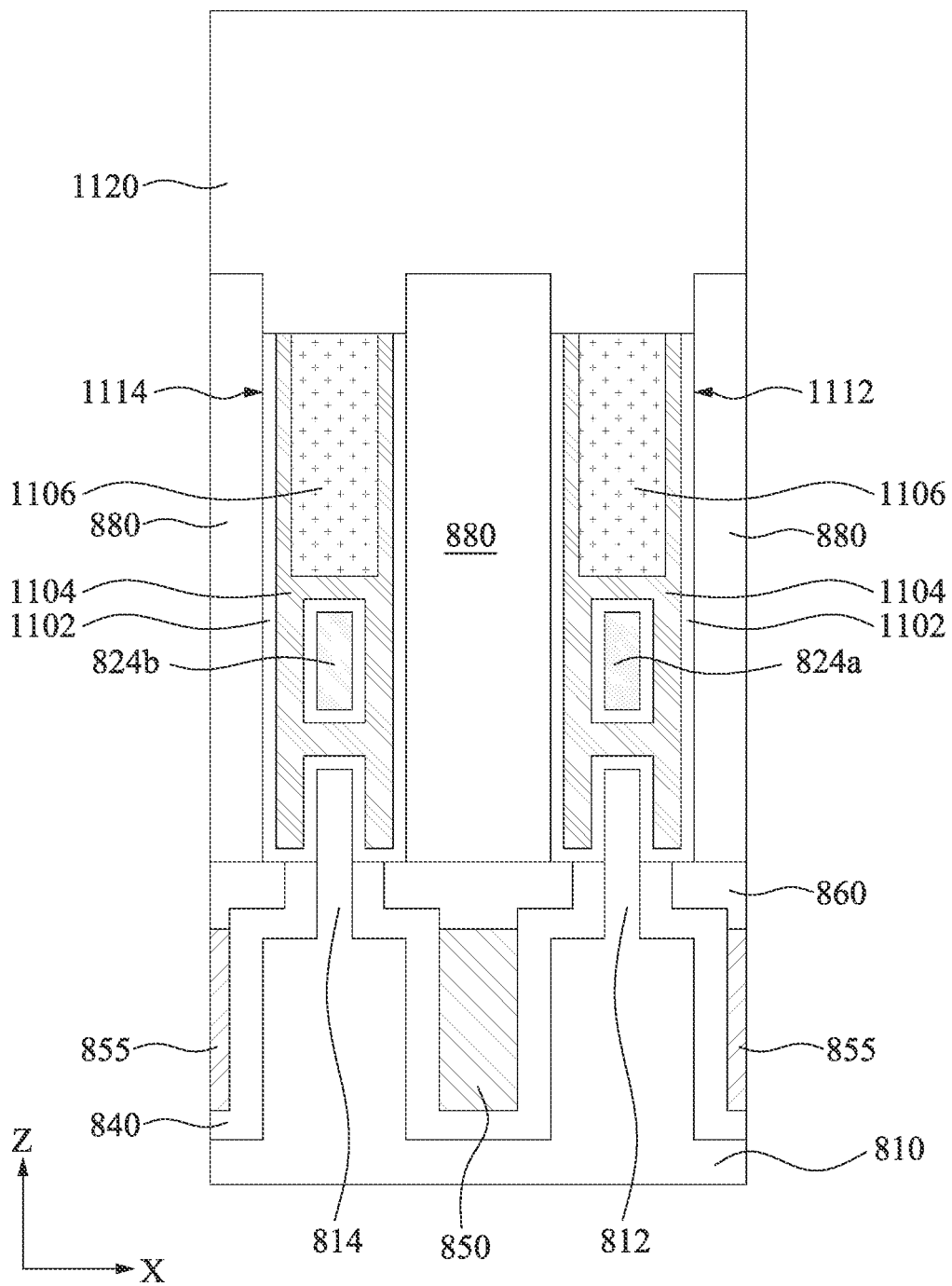
Figure 40D:
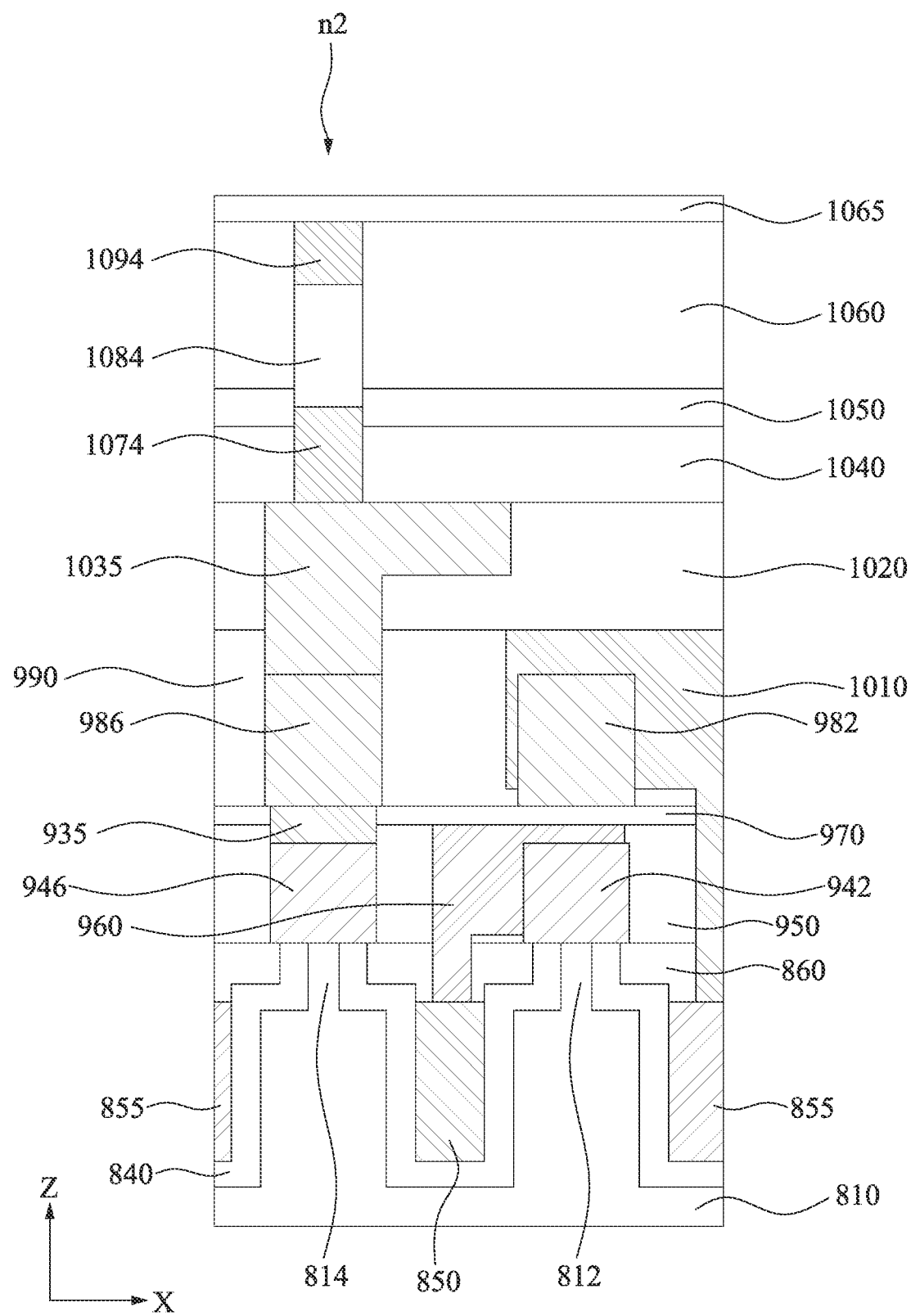

FIG. 40A is a top view of a memory cell at various stages in accordance with some embodiments of the present disclosure, FIG. 40B is a cross-sectional view taken along line B-B in FIG. 40A, FIG. 40C is a cross-sectional view taken along line C-C in FIG. 40A, and FIG. 40D is a cross-sectional view taken along line D-D in FIG. 40A. A first gate dielectric layer 1102 is conformally formed in the gate trenches 892 and lining exposed surfaces of the second semiconductor layers 824a and 824b. The materials and manufacturing details of the first gate dielectric layer 1102 are the same or similar to that of the gate dielectric layer 460 of FIGS. 14B-14D, and, therefore, a description in this regard will not be repeated hereinafter.

Subsequently, a first work function metal layer 1104 is conformally formed on the first gate dielectric layer 1102. The materials and manufacturing details of the first work function metal layer 1104 are the same or similar to that of the first work function metal layer 470 of FIGS. 14B-14D, and, therefore, a description in this regard will not be repeated hereinafter. For clarity, the first gate dielectric layer 1102 and the first work function metal layer 1104 are shown in FIGS. 40B-40C and not shown in FIG. 40A.

Subsequently, a first filling metal 1106 fills the remained space between the gate spacers 890. The first filling metal 1106 may include material such as tungsten or aluminum. After the deposition of the first filling metal 1106, an etching back process may be then performed to remove portions of the first filling metal 1106, the first work function metal layer 1104, and the first gate dielectric layer 1102 such that top surfaces of the first filling metal 1106, the first work function metal layer 1104, and the first gate dielectric layer 1102 are lower than top surfaces of the gate spacers 890. As such, gate structures 1112 and 1114 are formed. Specifically, the gate structure 1112 crosses the semiconductor fin 812 and surrounds the second semiconductor layer 824a, and the gate structure 1114 crosses the semiconductor fin 814 and surrounds the second semiconductor layer 824b.

Subsequently, a second ILD 1120 fills the remaining openings 892 and 1064 and cover the gate structures 1112, 1114. The materials and manufacturing details of the second ILD 1120 are the same or similar to that of the first ILD 420 shown in FIGS. 10B-10D, and, therefore, a description in this regard will not be repeated hereinafter.

Figure 41A:
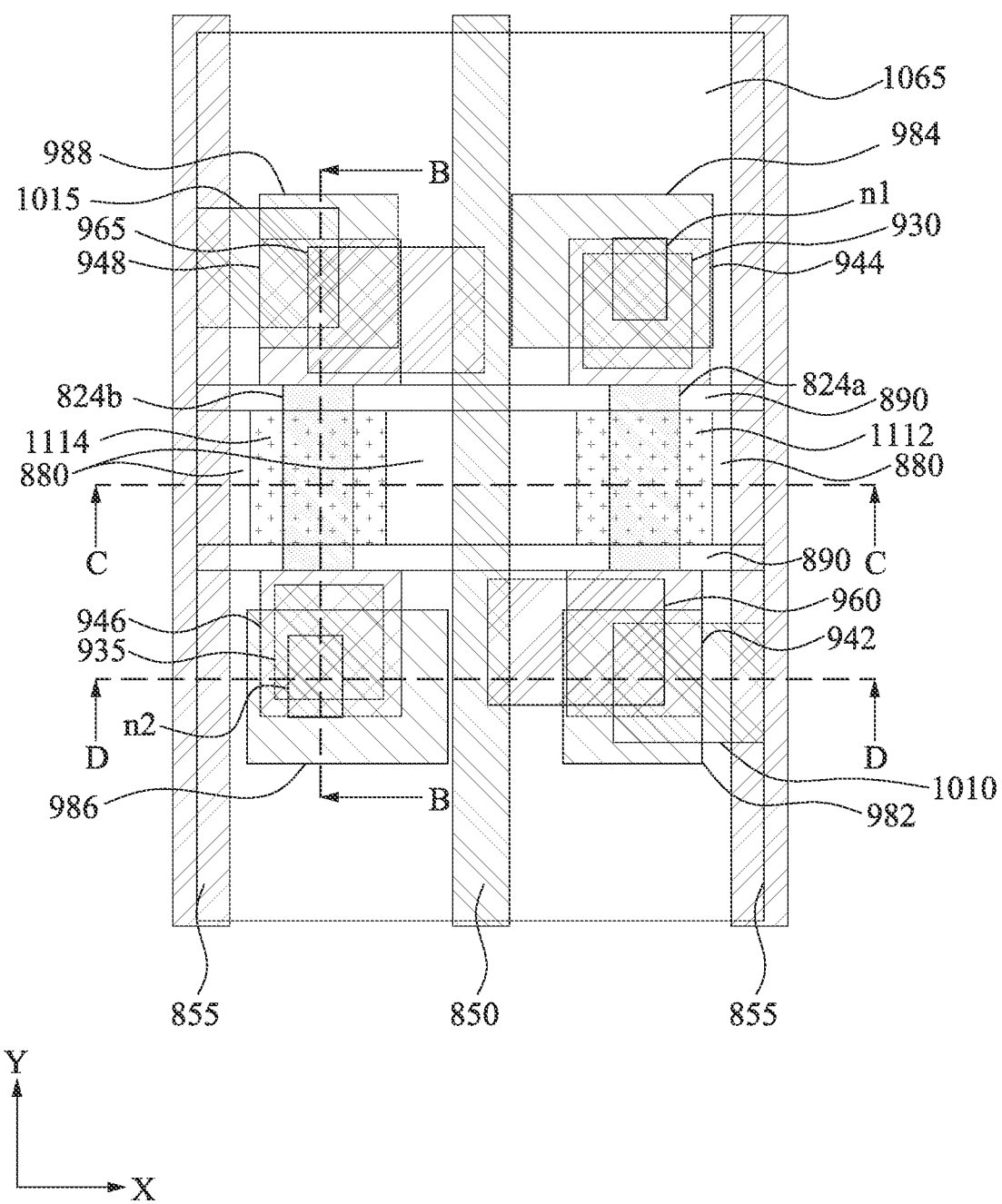
Figure 41B:
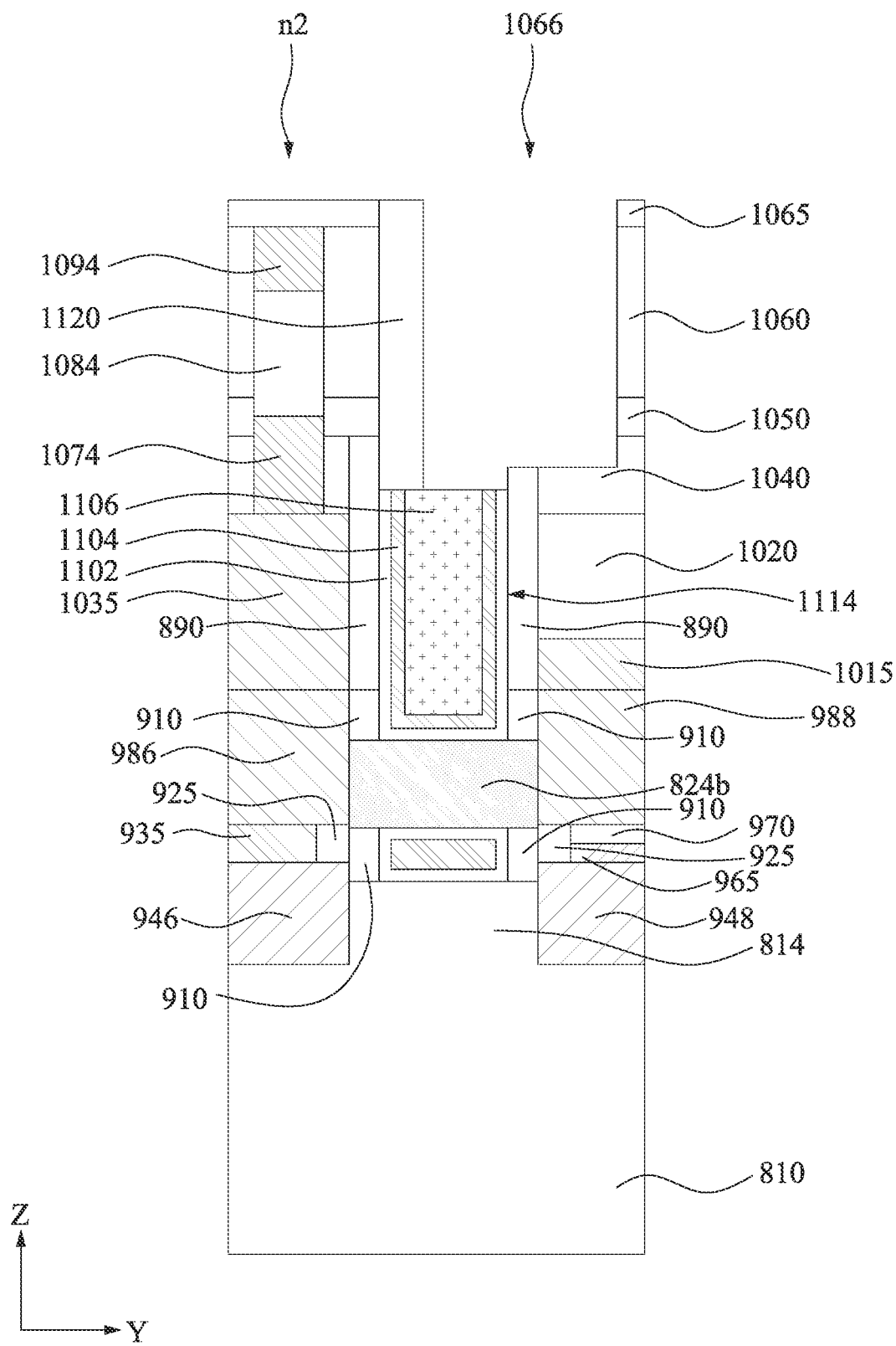
Figure 41C:
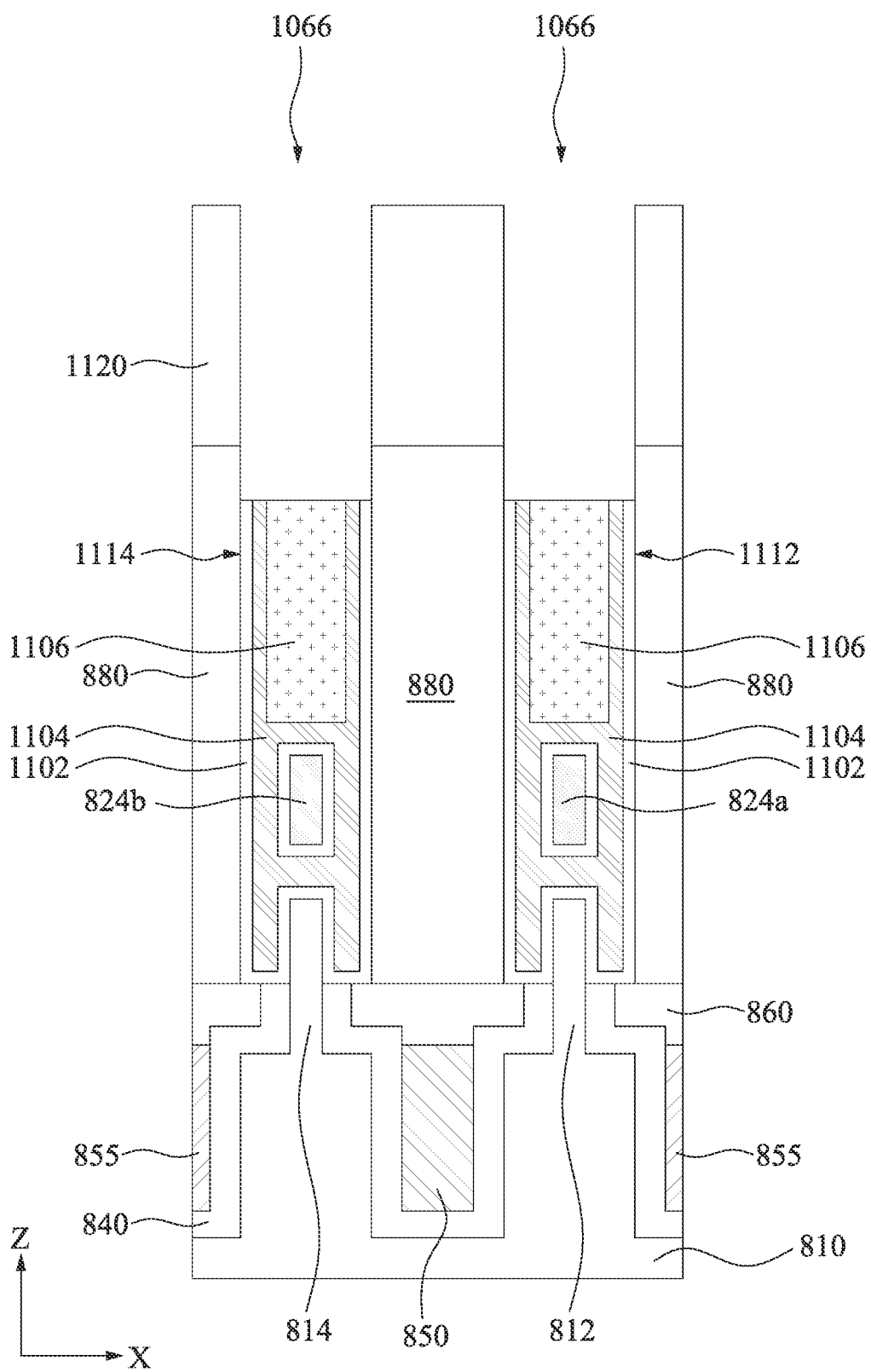
Figure 41D:
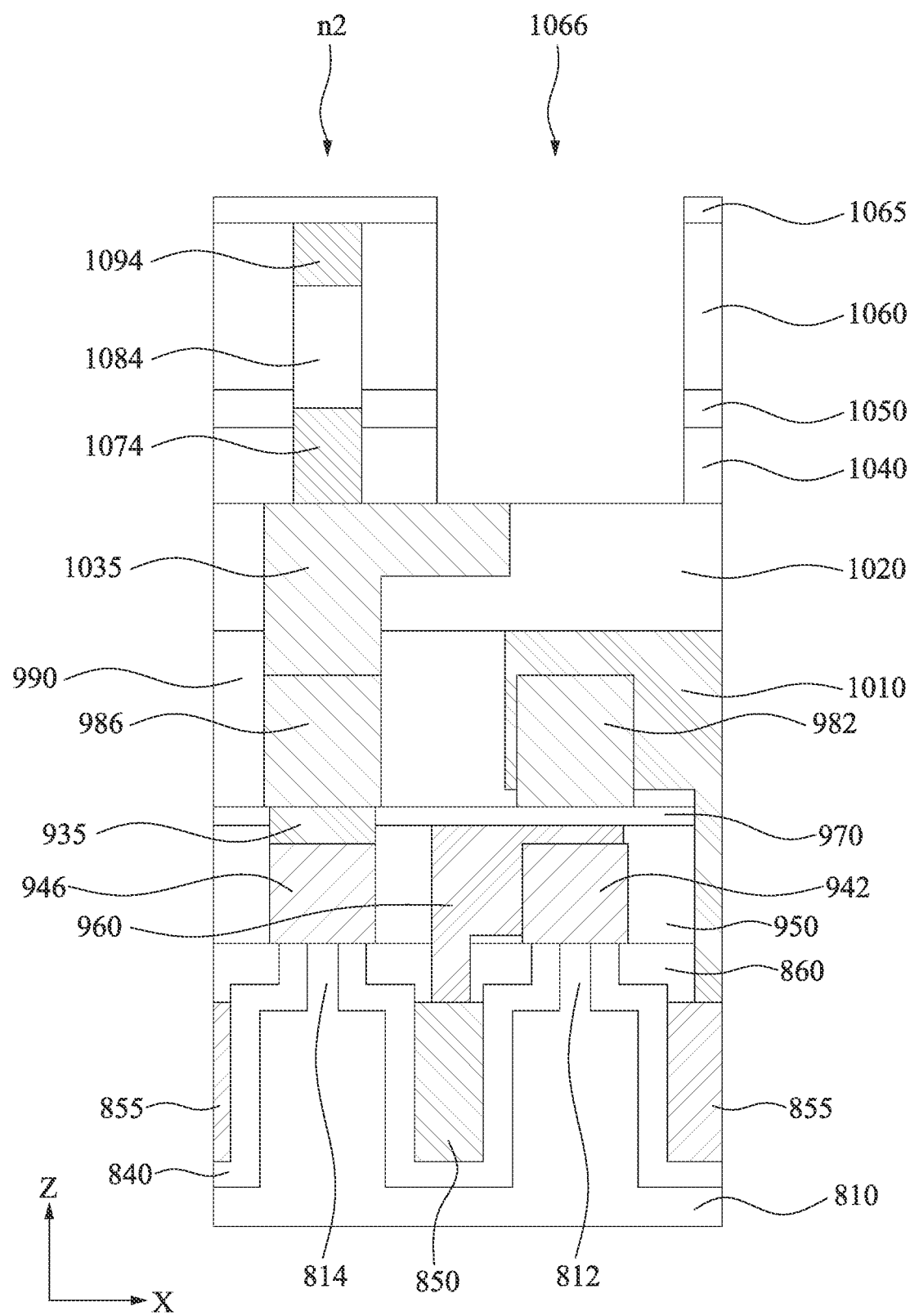

FIG. 41A is a top view of a memory cell at various stages in accordance with some embodiments of the present disclosure, FIG. 41B is a cross-sectional view taken along line B-B in FIG. 41A, FIG. 41C is a cross-sectional view taken along line C-C in FIG. 41A, and FIG. 41D is a cross-sectional view taken along line D-D in FIG. 41A. Openings 1066 are formed in the sixth isolation layer 1065 and the first ILD 1060. The openings 1066 exposes portions of the gate structures 1112 and 1114 and the conductive features 1030 and 1035. For clarity, the openings 1066 are shown in FIGS. 41B-41D and are omitted in FIG. 41A.

Figure 42A:
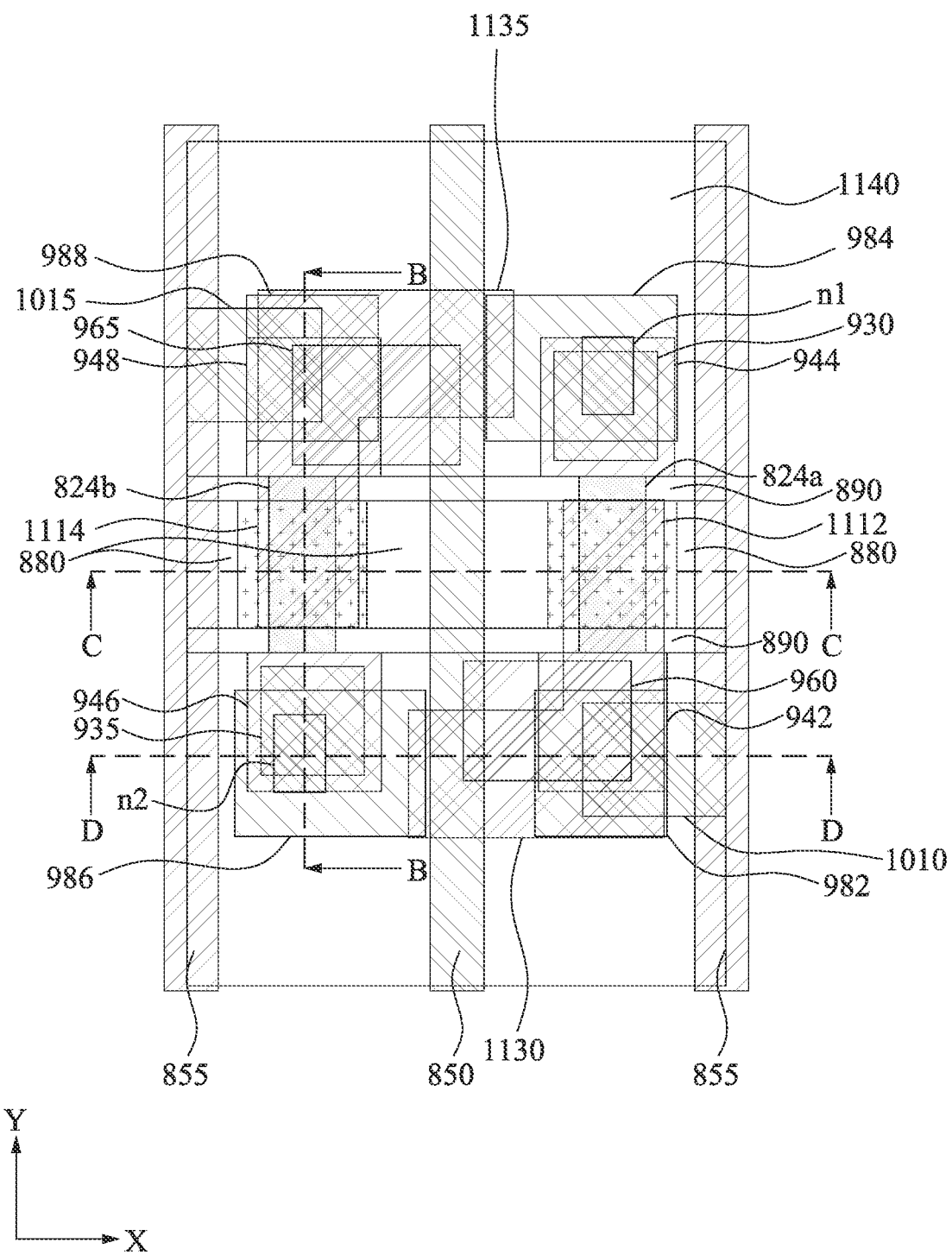
Figure 42B:
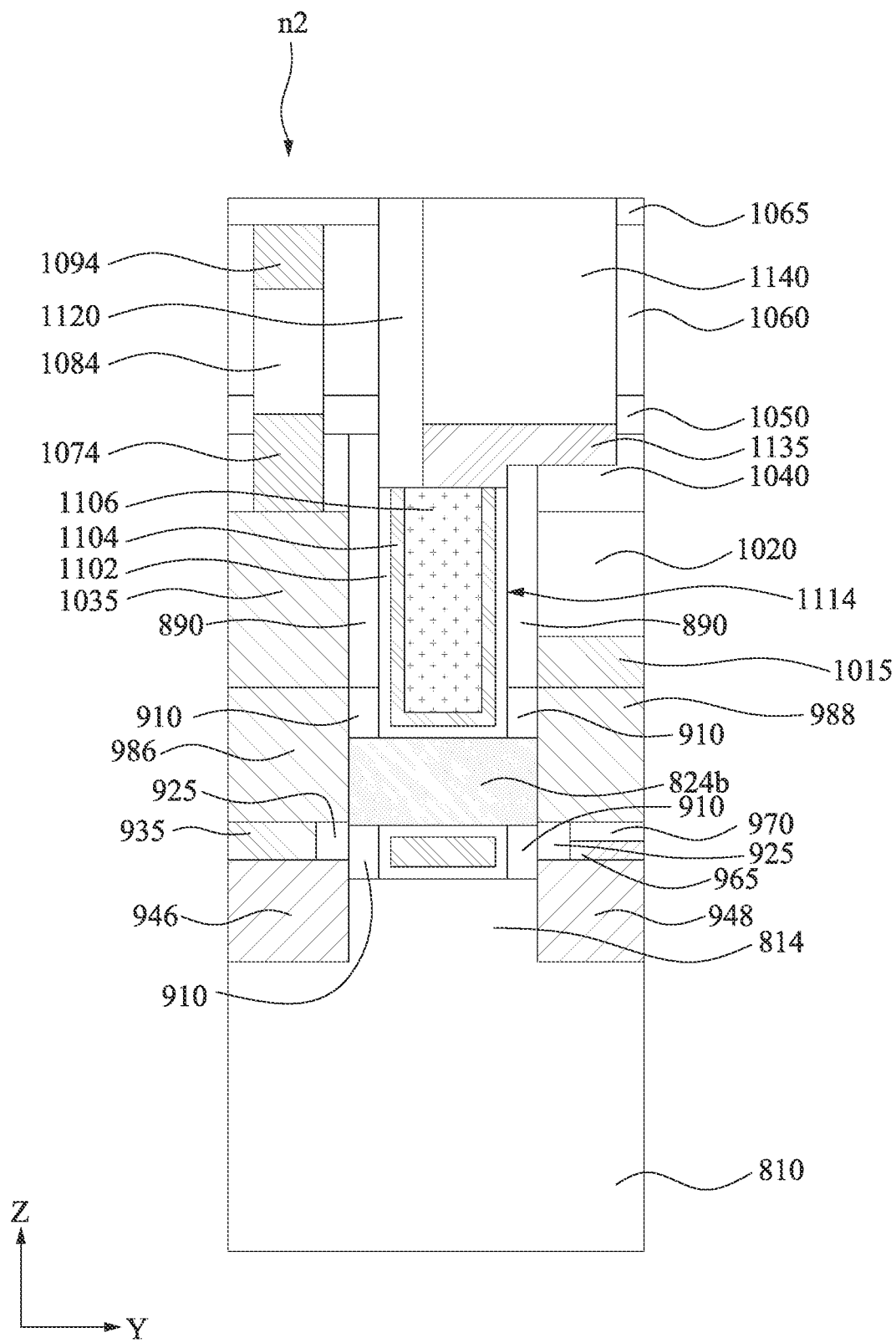
Figure 42C:
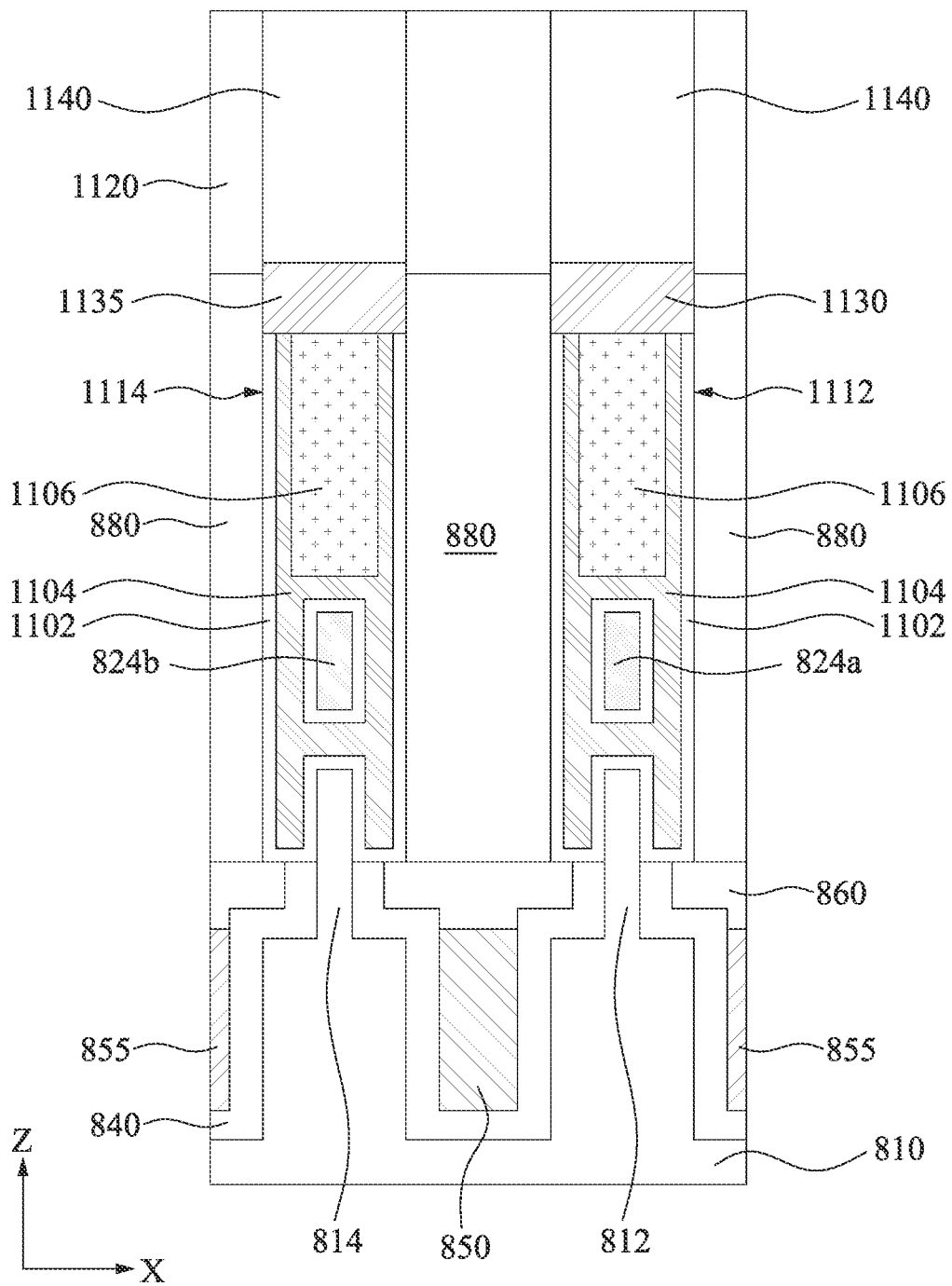
Figure 42D:
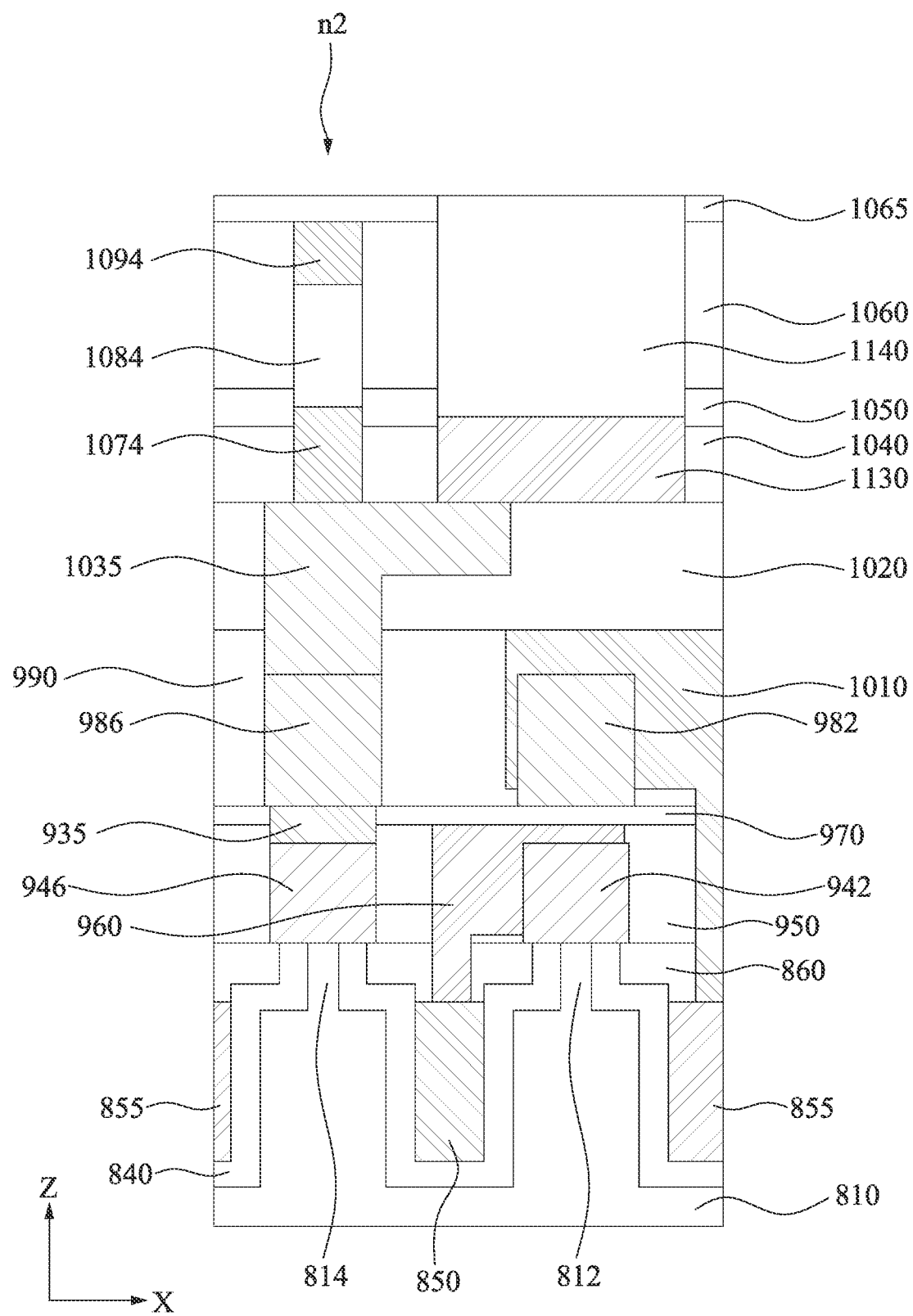

FIG. 42A is a top view of a memory cell at various stages in accordance with some embodiments of the present disclosure, FIG. 42B is a cross-sectional view taken along line B-B in FIG. 42A, FIG. 42C is a cross-sectional view taken along line C-C in FIG. 42A, and FIG. 42D is a cross-sectional view taken along line D-D in FIG. 42A. Conductive features 1130 and 1135 are respectively formed in the openings 1066 (see FIGS. 41B-41D). As such, the conductive feature 1130 interconnects the gate structure 1112 and the conductive feature 1035, and the conductive feature 1135 interconnects the gate structure 1114 and the conductive feature 1030. In some embodiments, the conductive features 1130 and 1135 are made of metal, e.g., Ru, W, Cu, or other suitable materials.

Subsequently, a third ILD 1140 fills the remaining openings 1066 and cover the conductive features 1130 and 1135. The materials and manufacturing details of the third ILD 1140 are the same or similar to that of the first ILD 420 shown in FIGS. 10B-10D, and, therefore, a description in this regard will not be repeated hereinafter.

Figure 43A:
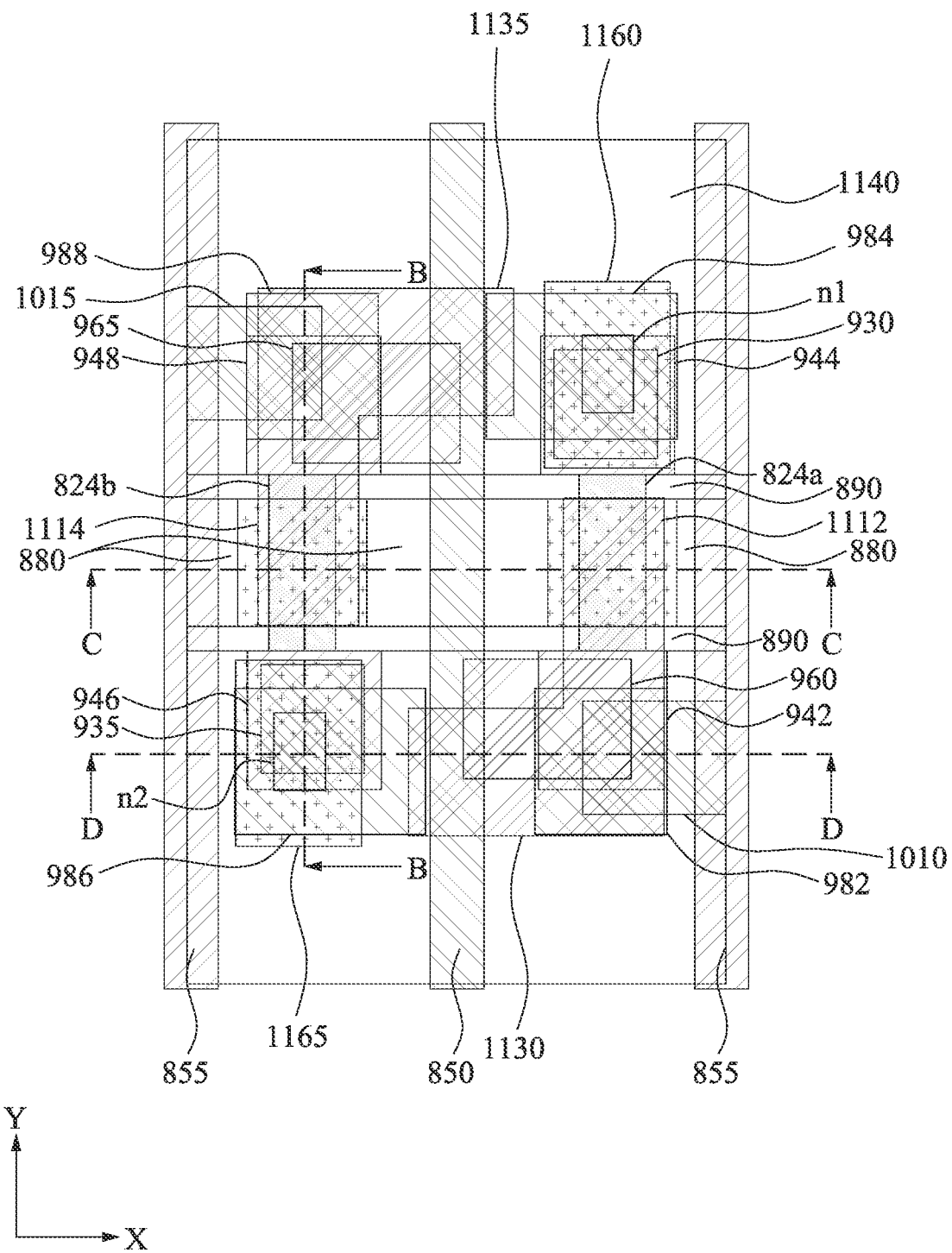
Figure 43B:
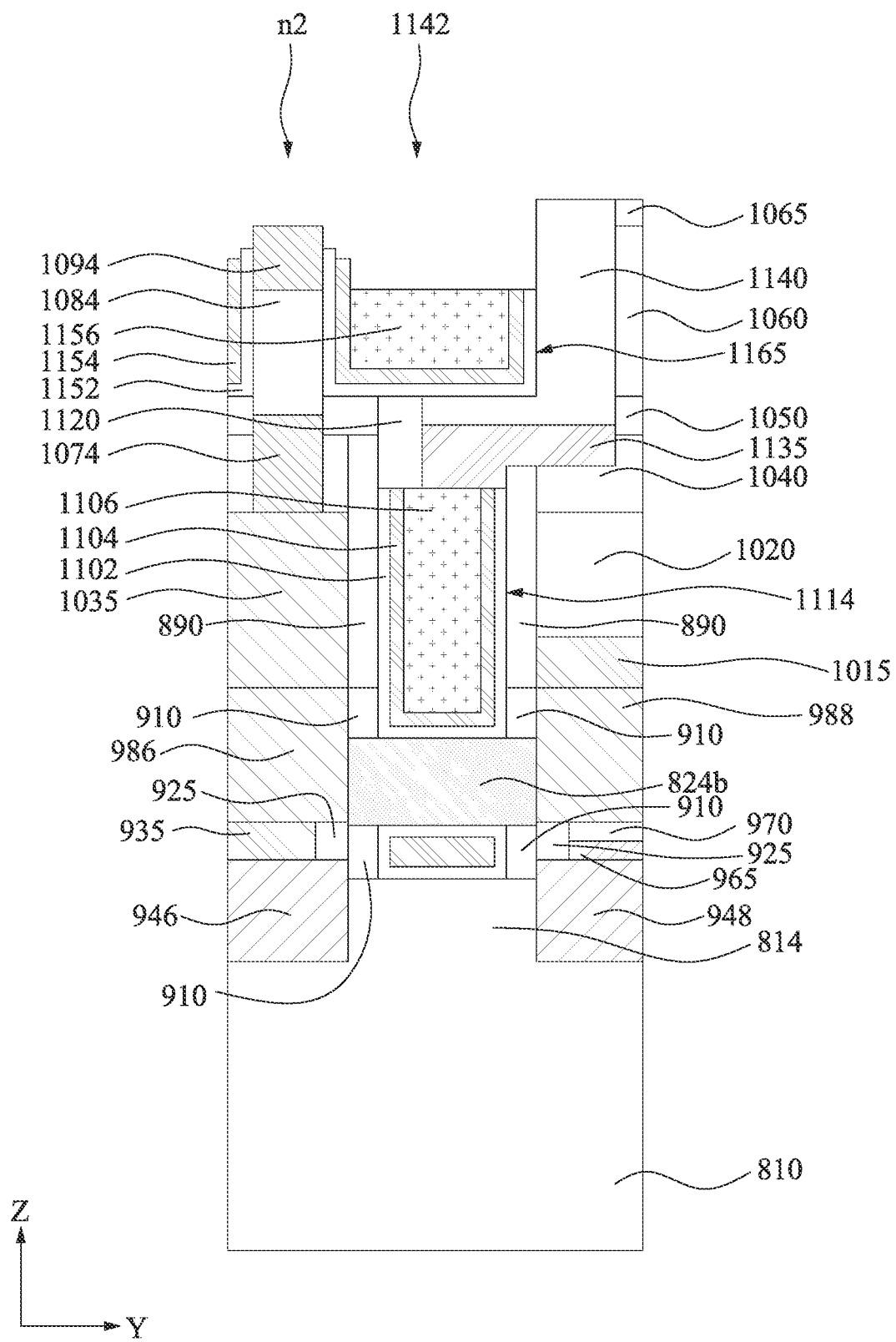
Figure 43C:
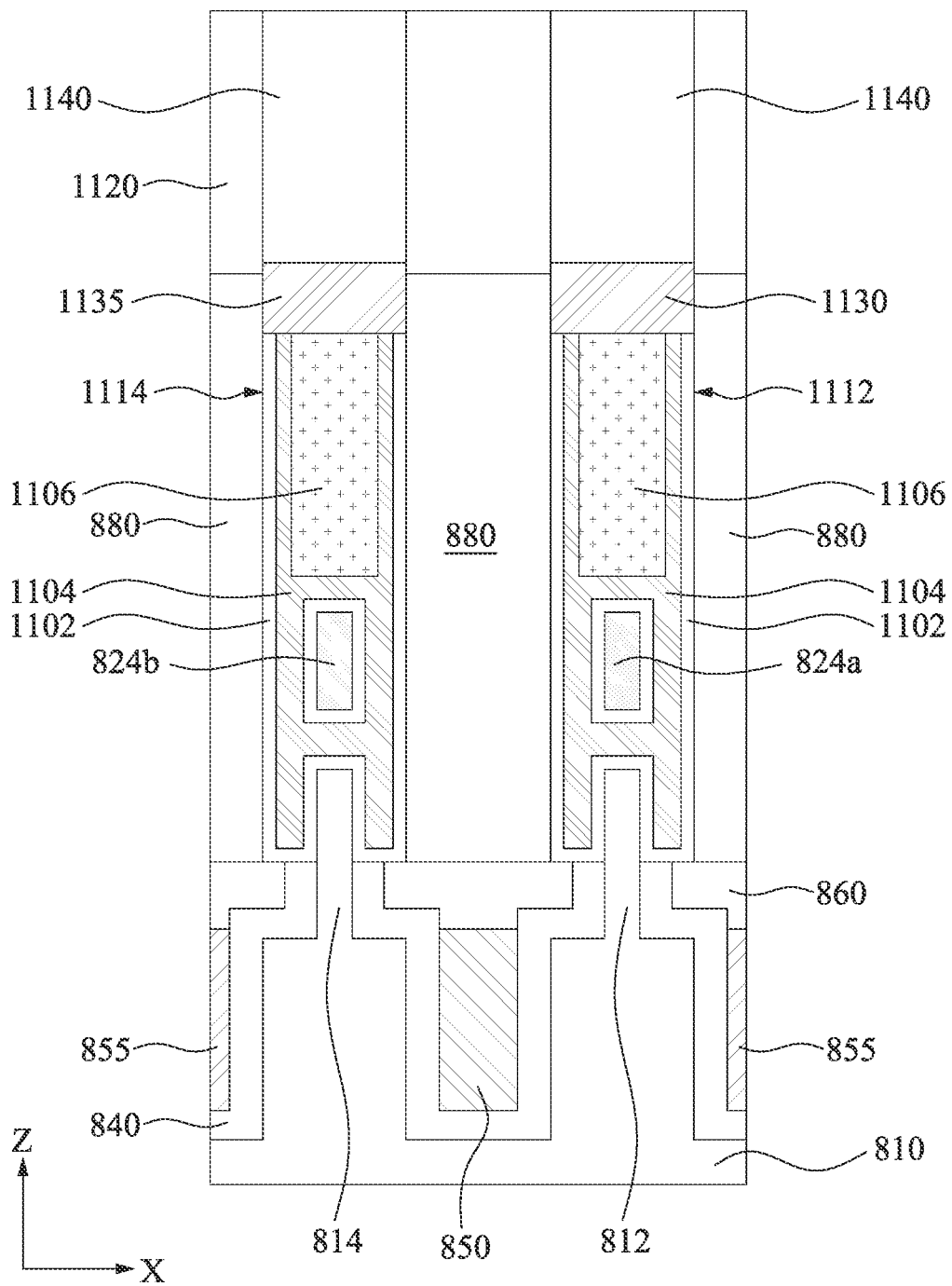
Figure 43D:
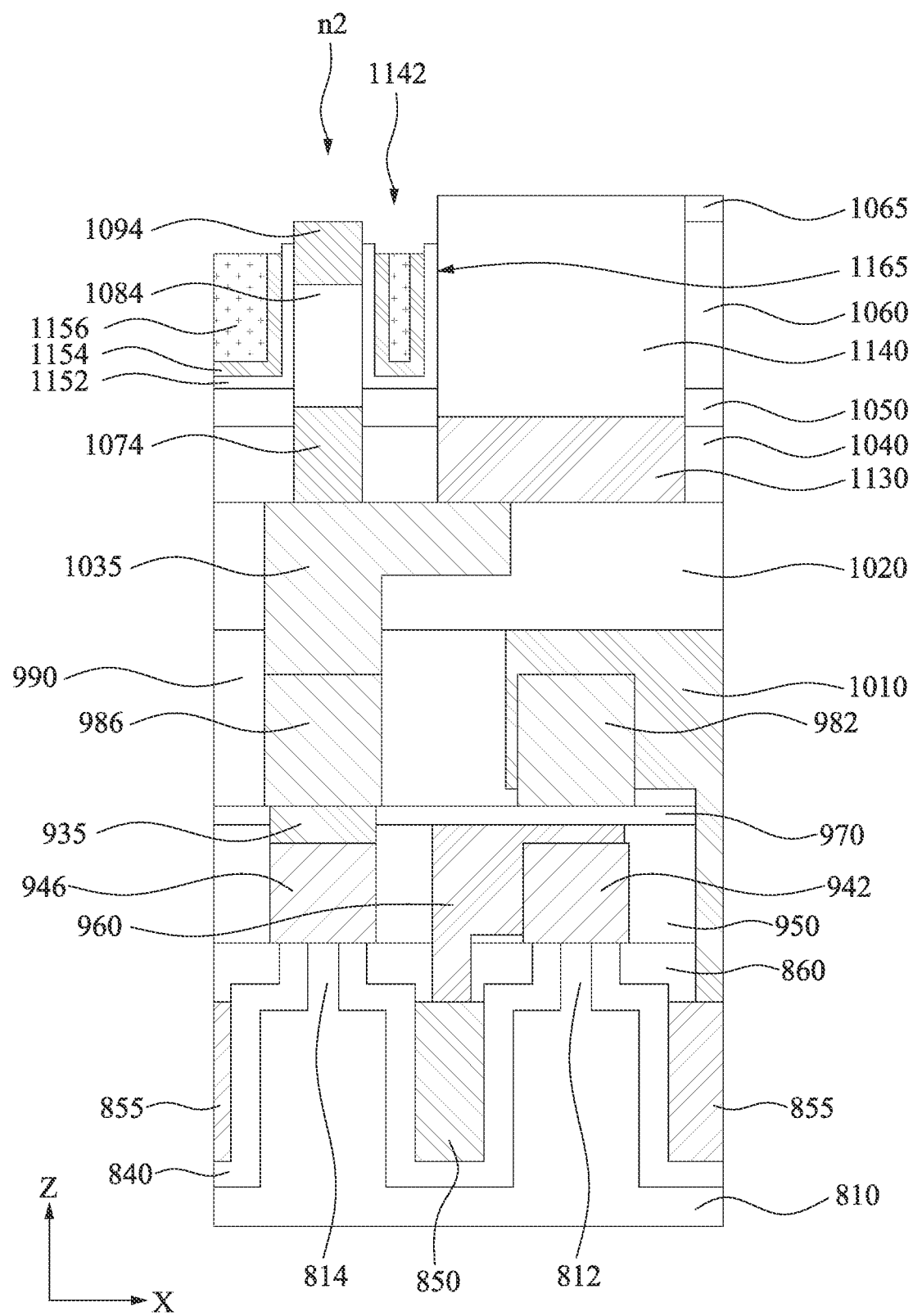

FIG. 43A is a top view of a memory cell at various stages in accordance with some embodiments of the present disclosure, FIG. 43B is a cross-sectional view taken along line B-B in FIG. 43A, FIG. 43C is a cross-sectional view taken along line C-C in FIG. 43A, and FIG. 43D is a cross-sectional view taken along line D-D in FIG. 43A. Openings 1142 are formed in the third ILD 1140. The openings 1142 expose portions of the nanowires n1 and n2, respectively. Further, the openings 1142 expose the ESL 1050. For clarity, the openings 1142 are shown in FIGS. 43B and 43D and are omitted in FIG. 43A.

Subsequently, a second gate dielectric layer 1152 is conformally formed in the openings 1142 and lining exposed surfaces of the nanowires n1 and n2. The materials and manufacturing details of the second gate dielectric layer 1152 are the same or similar to that of the gate dielectric layer 460 of FIGS. 14B-14D, and, therefore, a description in this regard will not be repeated hereinafter.

Subsequently, a second work function metal layer 1154 is conformally formed on the second gate dielectric layer 1152. The materials and manufacturing details of the second work function metal layer 1154 are the same or similar to that of the first work function metal layer 470 of FIGS. 14B-14D, and, therefore, a description in this regard will not be repeated hereinafter. For clarity, the second gate dielectric layer 1152 and the second work function metal layer 1154 are shown in FIGS. 43B and 43D and not shown in FIG. 43A.

Subsequently, a second filling metal 1156 fills the remained space of the openings 1142. The second filling metal 1156 may include material such as tungsten or aluminum. After the deposition of the second filling metal 1156, an etching back process may be then performed to remove portions of the second filling metal 1156, the second work function metal layer 1154, and the second gate dielectric layer 1152 such that top surfaces of the first second filling metal 1156, the second work function metal layer 1154, and the second gate dielectric layer 1152 are lower than top surfaces of the nanowires n1 and n2. As such, gate structures 1160 and 1165 are formed. Specifically, the gate structure 1160 surrounds the channel 1082, and the gate structure 1165 surrounds the channel 1084. For clarity, the second work function metal layer 1154 and the second gate dielectric layer 1152 are shown in FIGS. 43B and 43D and are omitted in FIG. 43A.

Figure 44A:
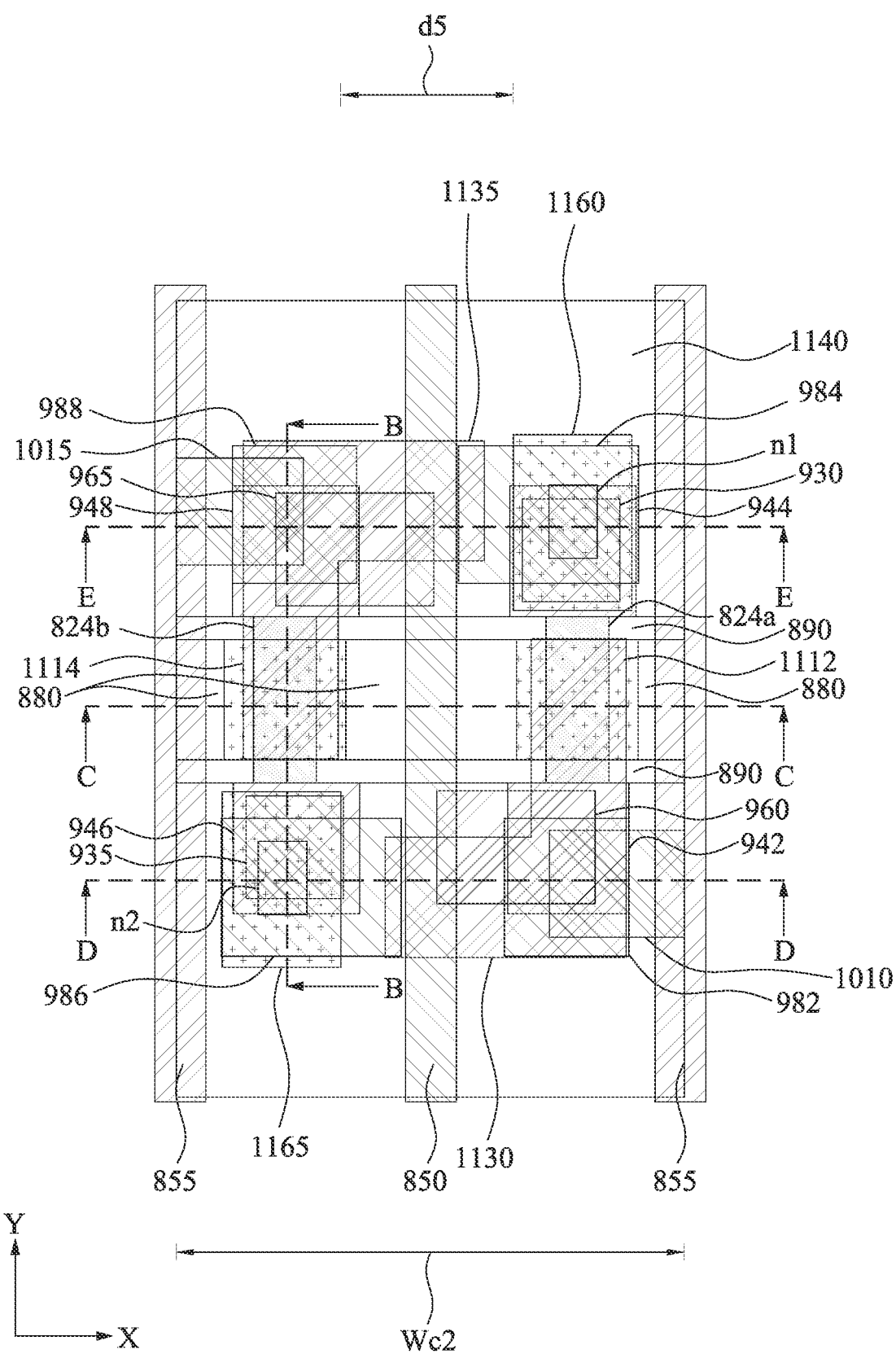
Figure 44B:
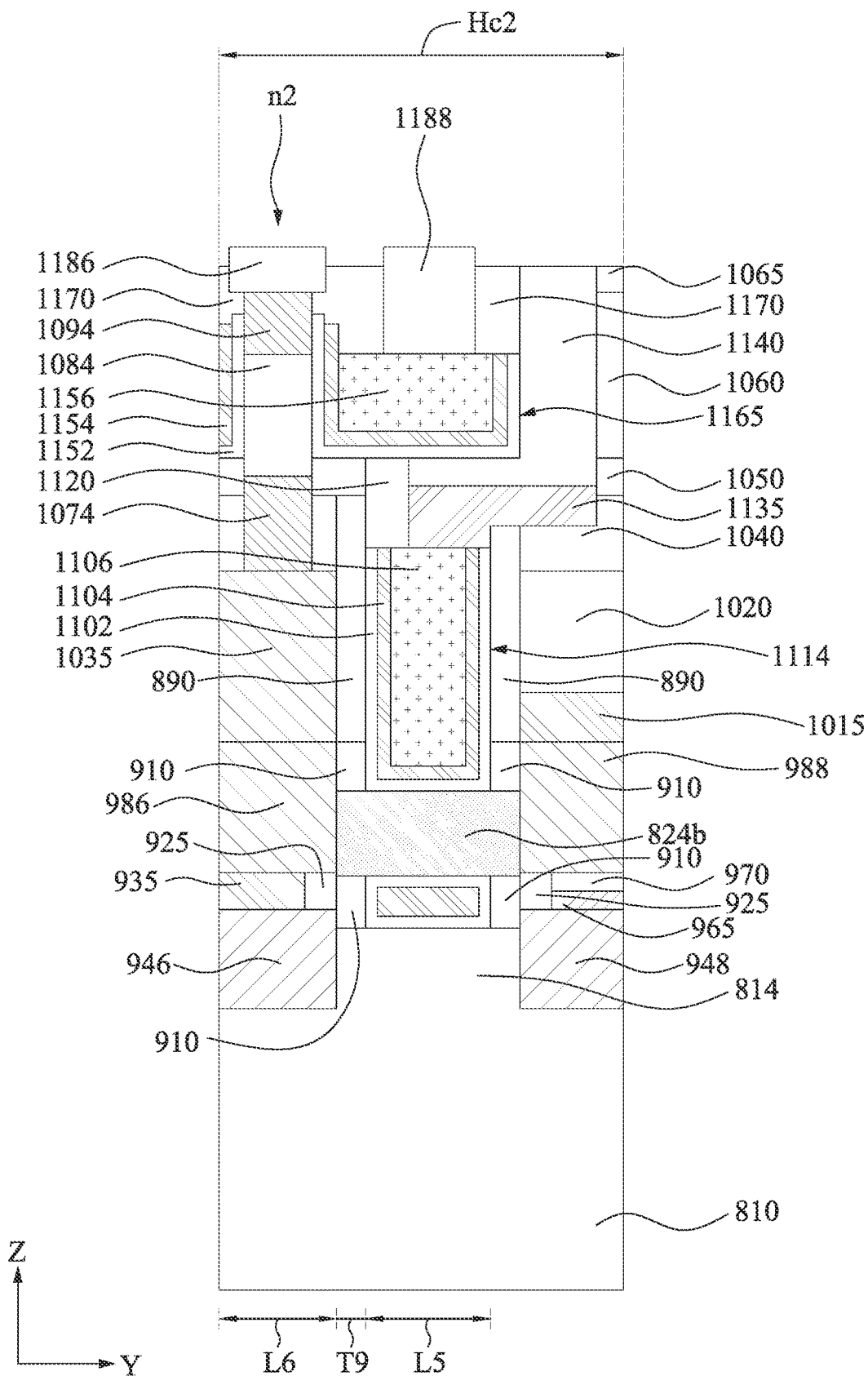
Figure 44C:
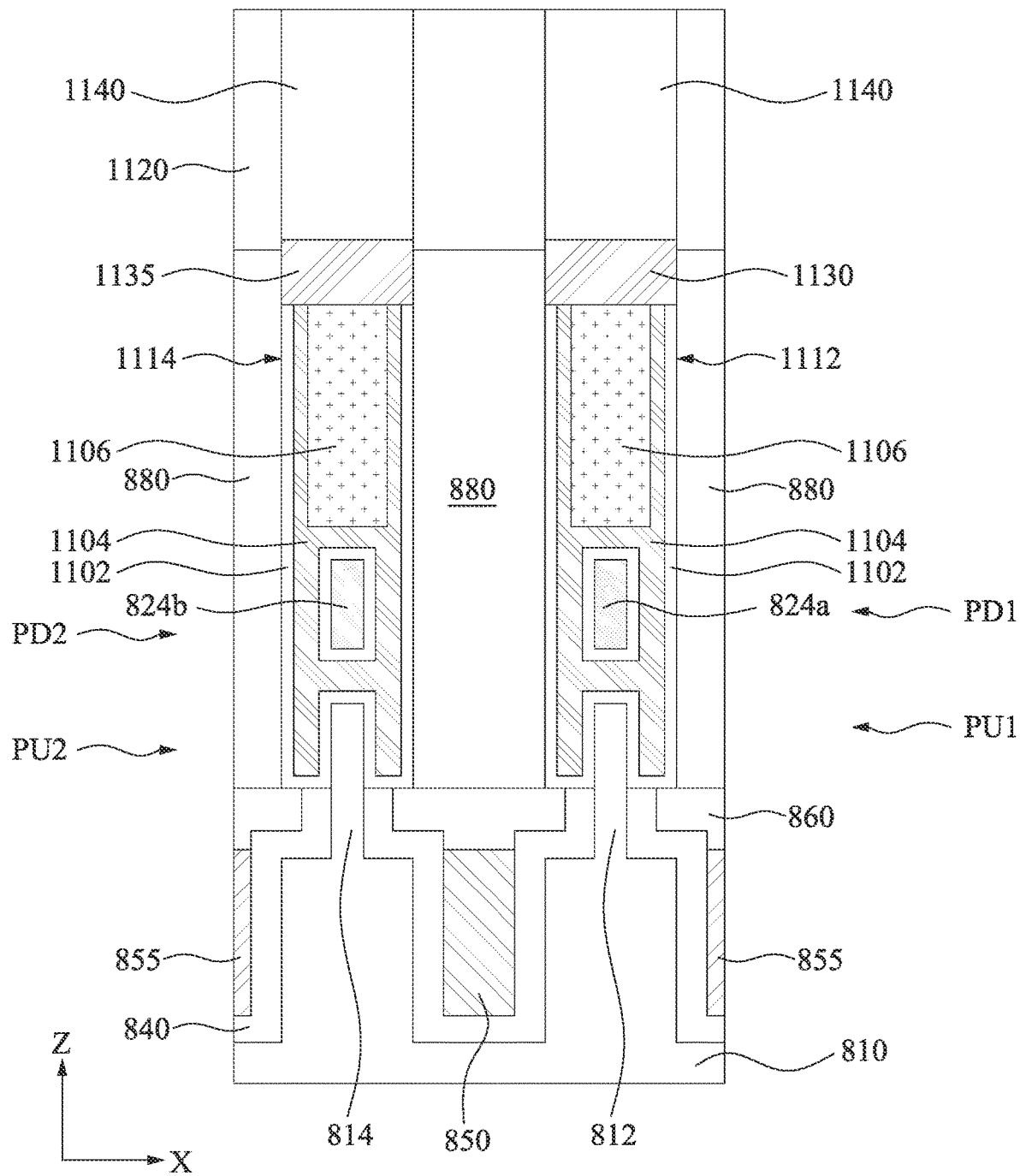
Figure 44D:
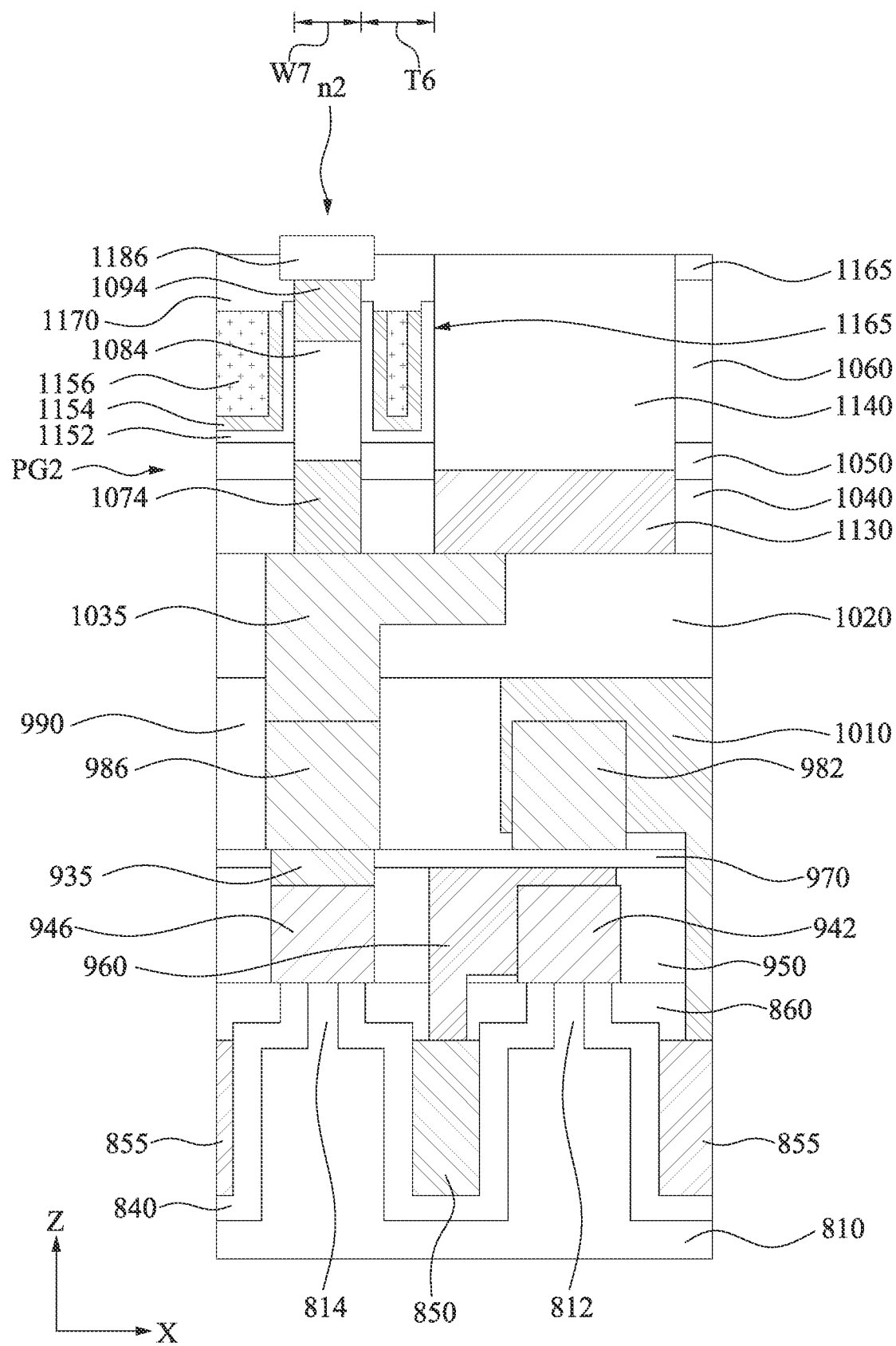
Figure 44E:
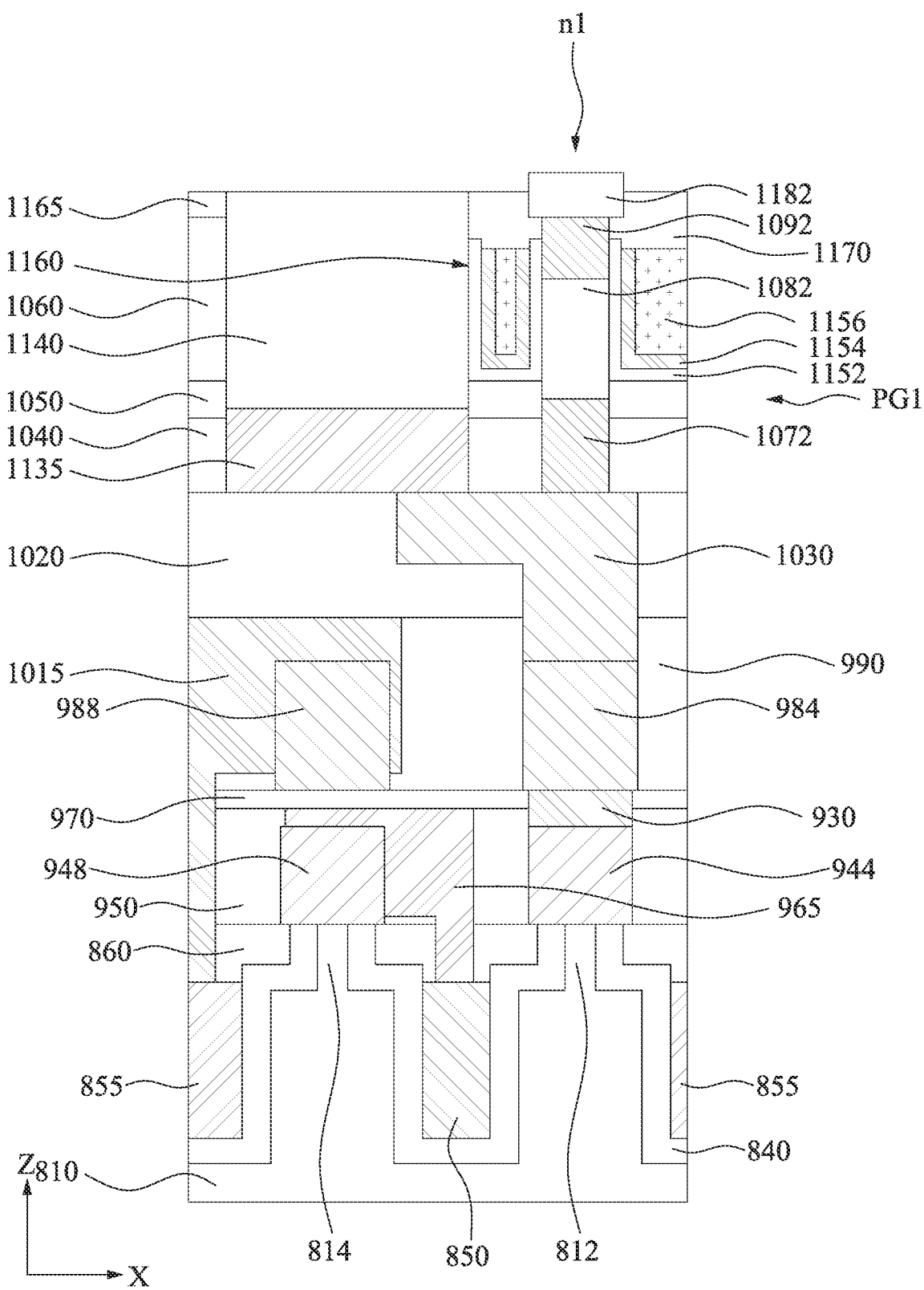

FIG. 44A is a top view of a memory cell at various stages in accordance with some embodiments of the present disclosure, FIG. 44B is a cross-sectional view taken along line B-B in FIG. 44A, FIG. 44C is a cross-sectional view taken along line C-C in FIG. 44A, FIG. 44D is a cross-sectional view taken along line D-D in FIG. 44A, and FIG. 44E is a cross-sectional view taken along line E-E in FIG. 44A. A fourth ILD 1170 fills the remaining space of the openings 1142. The fourth ILD 1170 covers the gate structures 1160 and 1165. The fourth ILD 1170 may include, for example, silicon oxide, low-k silicon oxide such as a porous silicon oxide layer, other suitable dielectric material, combinations thereof, or the like.

Subsequently, contacts 1182, 1186, and 1188 are respectively formed above the top source/drain features 1092, 1094, and the gate structure 1165. Further, another contact is formed above the gate structure 1160 (not shown). For example, a conductive layer is formed above the fourth ILD 1170. The conductive layer is then patterned to form the contacts 1182, 1186, and 1188. In some embodiments, the contacts 1182, 1186, and 1188 are metals such as tungsten, aluminum, copper, or other suitable materials. For clarity, the contacts 1182, 1186, and 1188 are shown in FIGS. 44B-44E and are omitted in FIG. 44A.

As such, the semiconductor fin 812, the source/drain features 942 and 944, and the gate structure 1112 form a first pull-up transistor PU1, the semiconductor fin 814, the source/drain features 946 and 948, and the gate structure 1114 form a second pull-up transistor PU2, the second semiconductor layer 824a, the source/drain features 982 and 984, and the gate structure 1112 form a first pull-down transistor PD1, the second semiconductor layer 824b, the source/drain features 986 and 988, and the gate structure 1114 form a second pull-down transistor PD2, the channel 1082, the source/drain features 1072 and 1092, and the gate structure 1160 form a first pass gate transistor PG1, and the channel 1084, the source/drain features 1074 and 1094, and the gate structure 1165 form a second pass gate transistor PG2.

In some embodiments, each of the nanowires n1-n2 have a width (or length or diameter) W7 in a range of about 5 nm to about 10 nm. Each of the gate structures 1160 and 1165 include a portion surrounding the corresponding nanowires n1-n2, and the portion has a minimum thickness T6 in a range of about 10 nm to about 15 nm. Further, a distance (space) d5 between adjacent gate structures 1160 and 1165 is in a range of about 15 nm to about 20 nm.

In some embodiments, a cell width Wc2 of the memory cell is:

$$Wc2=2(W7)+4(T6)+2(d5).$$

In some embodiments, the cell width Wc2 is in a range of about 50 nm to about 300 nm, e.g., about 100 nm.

In some embodiments, a cell height Hc2 of the memory cell is:

$$Hc2=2((L6)+(L5)+2(T9)),$$

where L6 (labeled in FIG. 44B) is a length of each of the source/drain structures 942, 944, 946, and 948, L5 (labeled in FIG. 44B) is a channel length of each of the semiconductor fins 812 and 814 and the semiconductor layers 824a and 824b, and T9 (labeled in FIG. 44B) is a thickness of each of the gate spacers 890. In some embodiments, the cell height Hc2 is in a range of about 50 nm to about 300 nm, e.g., about 100 nm.

In some embodiments, the first pass gate transistor PG1 and/or the second pass gate transistor PG2 are junctionless transistors. Take the nanowire n1 as an example. The bottom source/drain feature 1072, the channel 1082, and the top source/drain feature 1092 are made of the same material and have substantially the same doping concentration (or all are undoped). Similarly, the bottom source/drain feature 1074, the channel 1084, and the top source/drain feature 1094 are made of the same material and have substantially the same doping concentration (or all are undoped).

Figure 45A:
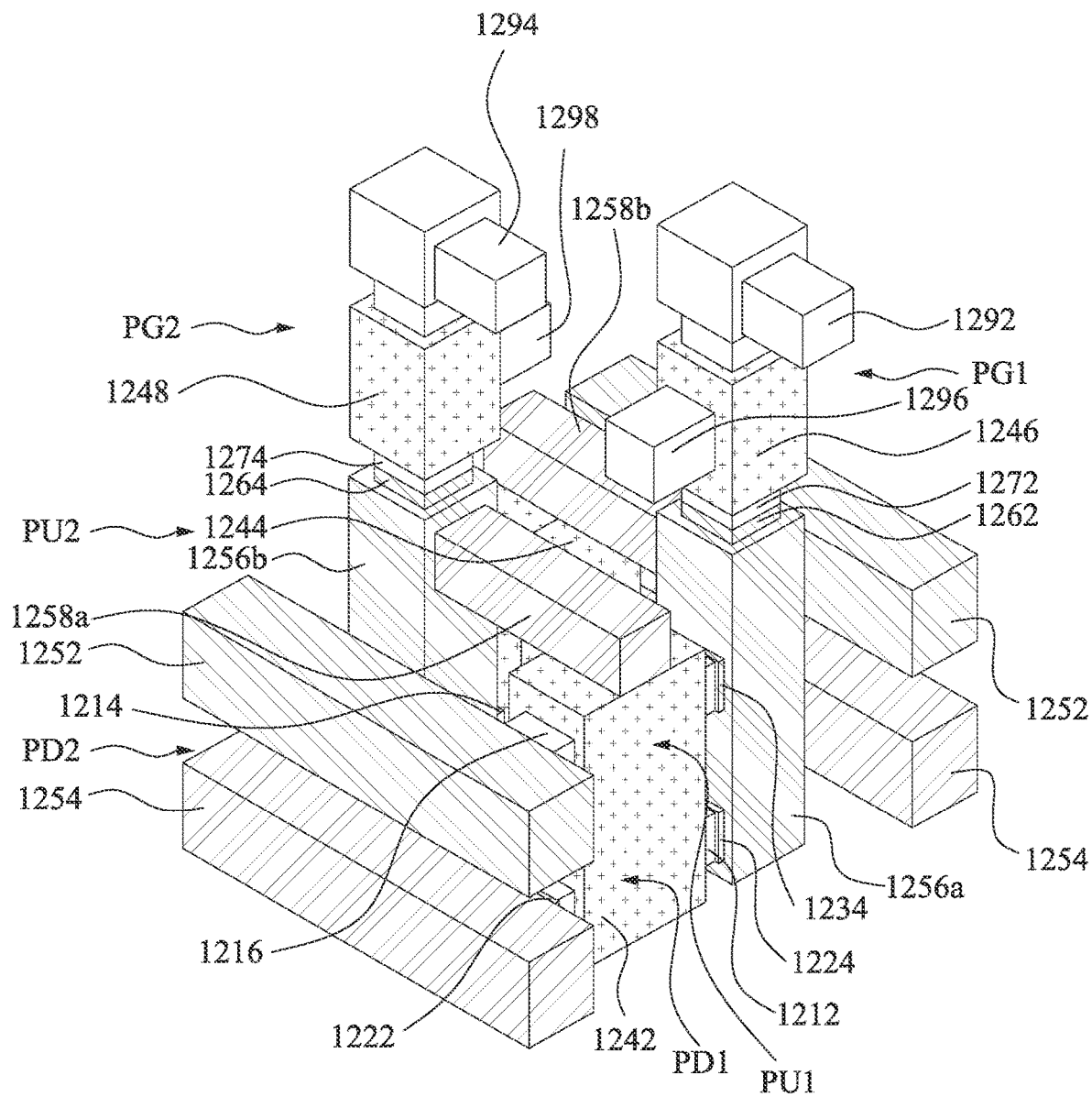
FIG. 45A is a schematic diagram of a perspective view of a layout structure corresponding to a memory cell, in accordance with some embodiments of the present disclosure.
Figure 45B:
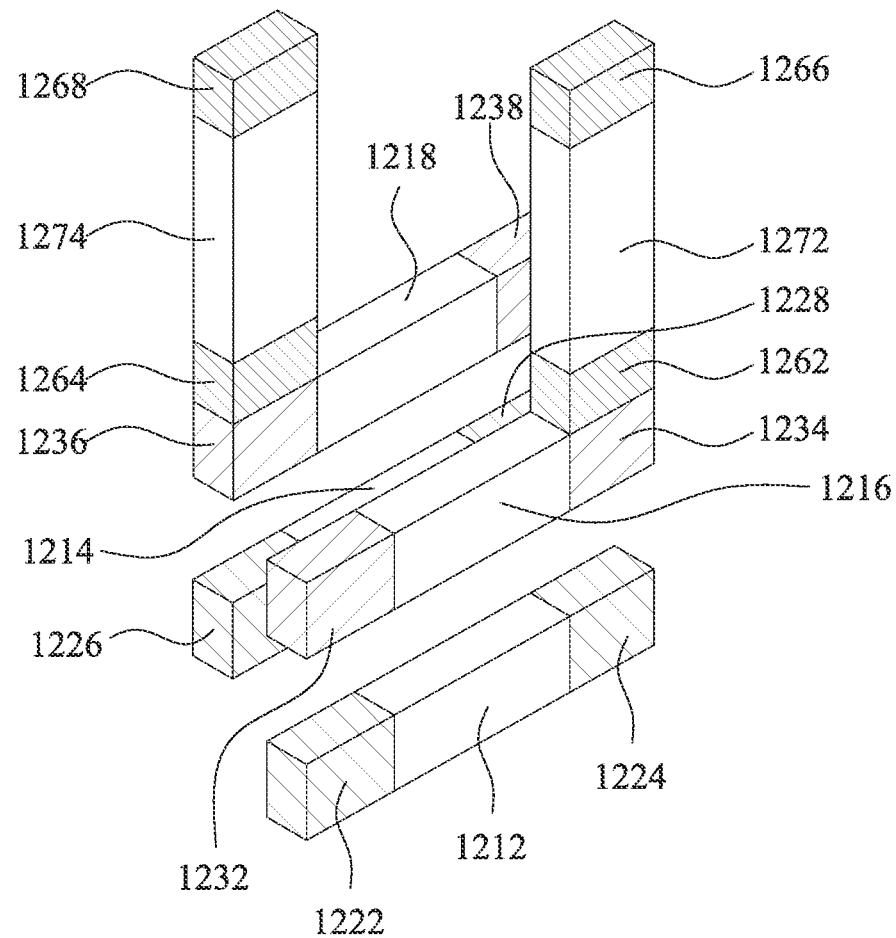
FIG. 45B is a schematic diagram of a perspective view of a layout structure of the memory cell without gate structures and conductive features, in accordance with some embodiments of the present disclosure.
Figure 45C:
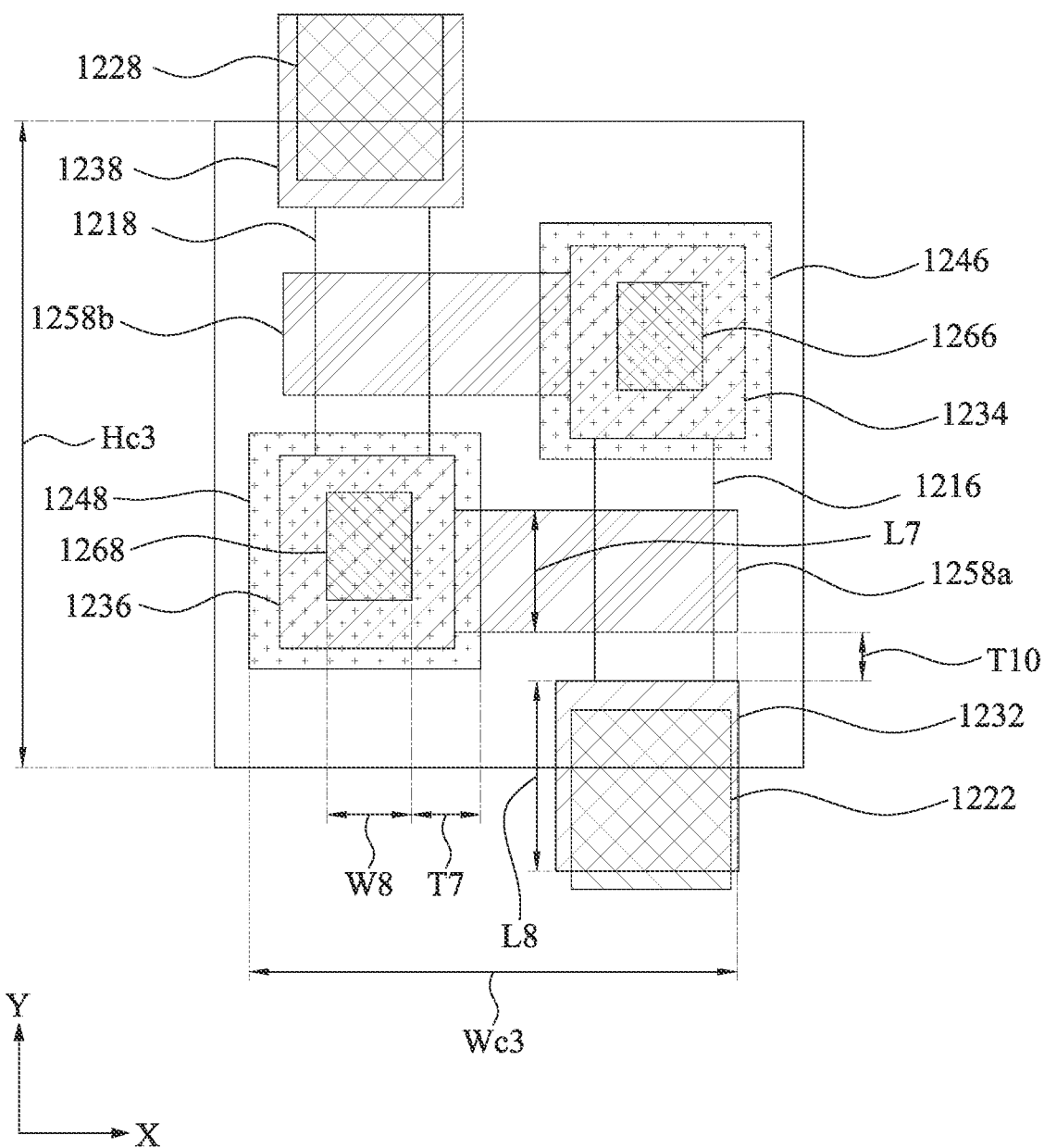
FIG. 45C is a top view of the memory cell in FIG. 45A.

FIG. 45A is a schematic diagram of a perspective view of a layout structure corresponding to a memory cell 1200, in accordance with some embodiments of the present disclosure, FIG. 45B is a schematic diagram of a perspective view of a layout structure of the memory cell 1200 without gate structures and conductive features, in accordance with some embodiments of the present disclosure, and FIG. 45C is a top view of the memory cell 1200 in FIG. 45A. In addition to the memory cell 1200, FIGS. 45A and 45B depict X-axis, Y-axis, and Z-axis directions. FIGS. 45A-45C depict a simplified version of the memory cell 1200 for the purpose of illustrating the general spatial relationships between the various features.

The memory cell 1200 may be an SRAM device. As illustratively shown in FIGS. 45A-45C, the memory cell 1200 includes a first horizontal channel 1212, a second horizontal channel 1214, a third horizontal channel 1216, and a fourth horizontal channel 1218 extending in the Y direction. The first horizontal channel 1212, the second horizontal channel 1214, the third horizontal channel 1216, and the fourth horizontal channel 1218 are spaced apart from each other. The first horizontal channel 1212 is offset from the second horizontal channel 1214. That is, ends of the first horizontal channel 1212 and the second horizontal channel 1214 are misaligned in the X direction. Similarly, the third horizontal channel 1216 is offset from the fourth horizontal channel 1218. That is, ends of the third horizontal channel 1216 and the third horizontal channel 1218 are misaligned in the X direction. The third horizontal channel 1216 is directly above the first horizontal channel 1212, and the fourth horizontal channel 1218 is directly above the second horizontal channel 1214. In some embodiments, the first horizontal channel 1212, the second horizontal channel 1214, the third horizontal channel 1216, and the fourth horizontal channel 1218 are fin structures. In some other embodiments, the first horizontal channel 1212, the second horizontal channel 1214, the third horizontal channel 1216, and the fourth horizontal channel 1218 are nanosheets, nanowires, or combinations thereof. For example, the first horizontal channel 1212 and the second horizontal channel 1214 are fin structures, and the third horizontal channel 1216 and the fourth horizontal channel 1218 are nanosheets, nanowires, or combinations thereof.

The memory cell 1200 further includes a first source/drain feature 1222, a second source/drain feature 1224, a third source/drain feature 1226, a fourth source/drain feature 1228, a fifth source/drain feature 1232, a sixth source/drain feature 1234, a seventh source/drain feature 1236, and an eighth source/drain feature 1238. The first source/drain feature 1222 and the second source/drain feature 1224 are on opposite sides of the first horizontal channel 1212, the third source/drain feature 1226 and the fourth source/drain feature 1228 are on opposite sides of the second horizontal channel 1214, the fifth source/drain feature 1232 and the sixth source/drain feature 1234 are on opposite sides of the third horizontal channel 1216, and the seventh source/drain feature 1236 and the eighth source/drain feature 1238 are on opposite sides of the fourth horizontal channel 1218. The first source/drain feature 1222, the second source/drain feature 1224, the third source/drain feature 1226, the fourth source/drain feature 1228, the fifth source/drain feature 1232, the sixth source/drain feature 1234, the seventh source/drain feature 1236, and the eighth source/drain feature 1238 are spaced apart from each other. In some embodiments, the first source/drain feature 1222, the second source/drain feature 1224, the third source/drain feature 1226, the fourth source/drain feature 1228, the fifth source/drain feature 1232, the sixth source/drain feature 1234, the seventh source/drain feature 1236, and the eighth source/drain feature 1238 are epitaxial structures or doped fin structures.

The memory cell 1200 further includes a first gate structure 1242 and a second gate structure 1244. The first gate structure 1242 surrounds the first and third horizontal channels 1212 and 1216, and the second gate structure 1244 surrounds the second and fourth horizontal channels 1214 and 1218. As such, the first horizontal channel 1212, the first and second source/drain features 1222 and 1224, and the first gate structure 1242 form a first pull-down transistor PD1, the second horizontal channel 1214, the third and fourth source/drain features 1226 and 1228, and the second gate structure 1244 form a second pull-down transistor PD2, the third horizontal channel 1216, the fifth and sixth source/drain features 1232 and 1234, and the first gate structure 1242 form a first pull-up transistor PU1, and the fourth horizontal channel 1218, the seventh and eighth source/drain features 1236 and 1238, and the second gate structure 1244 form a second pull-up transistor PU2.

The first pull-down transistor PD1, the second pull-down transistor PD2, the first pull-up transistor PU1, and the second pull-up transistor PU2 are horizontal FETs. In some embodiments, the first pull-up transistor PU1 and the second pull-up transistor PU2 are P-type transistors, and the first pull-down transistor PD1 and the second pull-down transistor PD2 are N-type transistors, or vise versa.

The memory cell 1200 further includes conductive features 1252, 1254, 1256*a*, 1256*b*, 1258*a*, and 1258*b*. The conductive features 1252 are respectively coupled to the fifth source/drain feature 1232 and the eighth source/drain feature 1238 and may be referred to as VDD power lines. The conductive features 1254 are respectively coupled to the first source/drain feature 1222 and the fourth source/drain feature 1228 and may be referred to as VSS power lines. The conductive feature 1256*a* is coupled to the second and sixth source/drain features 1224 and 1234, and the conductive feature 1256*b* is coupled to the third and seventh source/drain features 1226 and 1236. The conductive feature 1258*a* is coupled to the first gate structure 1242 and the conductive feature 1256*b*, such that the first gate structure 1242 is electrically connected to the third and seventh source/drain features 1226 and 1236. The conductive feature 1258*b* is coupled to the second gate structure 1244 and the conductive feature 1256*a*, such that the second gate structure 1244 is electrically connected to the second and sixth source/drain features 1224 and 1234.

The memory cell 1200 further includes a ninth source/drain feature 1262 and a tenth source/drain feature 1264 coupled to the sixth source/drain feature 1234 and the seventh source/drain feature 1236, respectively. The memory cell 1200 further includes a first vertical channel 1272 and a second source/drain feature 1274 coupled to the ninth source/drain feature 1262 and the tenth source/drain feature 1264, respectively. The memory cell 1200 further includes an eleventh vertical channel 1266 and a twelfth source/drain feature 1268 coupled to the first vertical channel 1272 and the second source/drain feature 1274, respectively. In some embodiments, the fifth, sixth, seventh, and eighth source/drain features 1232, 1234, 1236, and 1238 are epitaxial structures with a first conductivity type, and the first, second, third, fourth, ninth, tenth, eleventh, and twelfth source/drain features 1222, 1224, 1226 1228, 1262, 1264, 1266, and 1268 are epitaxial structures with second conductivity type. In some embodiments, the first conductivity type is P-type, and the second conductivity type is P-type, or vise versa.

The memory cell 1200 further includes a third gate structure 1246 surrounds the first vertical channel 1272 and a fourth gate structure 1248 surrounds the second vertical channel 1274. As such, the first vertical channel 1272, the ninth and eleventh source/drain features 1262 and 1266, and the third gate structure 1246 form a first pass gate transistor PG1, and the second vertical channel 1274, the tenth and twelfth source/drain features 1264 and 1268, and the fourth gate structure 1248 form a second pass gate transistor PG2. The first pass gate transistor PG1 and the second pass gate transistor PG2 are vertical FETs. In some embodiments, the first pass gate transistor PG1 and the second pass gate transistor PG2 are N-type transistors. In some other embodiments, the first pass gate transistor PG1 and the second pass gate transistor PG2 are P-type transistors.

The memory cell 1200 further includes conductive features 1292, 1294, 1296, and 1298. The conductive feature 1292 is coupled to the eleventh source/drain feature 1266 and is referred to as a bit line in some embodiments. The conductive feature 1294 is coupled to the twelve source/drain feature 1268 and is referred to as another bit line in some embodiments. The conductive feature 1296 is coupled to the third gate structure 1246 and is referred to as a word line in some embodiments. The conductive feature 1298 is coupled to the fourth gate structure 1248 and is referred to as another word line in some embodiments.

In FIG. 45C, each of the nanowires (or the eleventh vertical channel 1266 and the twelfth source/drain feature 1268) has a width W8 in a range of about 6 nm to about 10 nm. Each of the third and fourth gate structures 1296 and 1298 includes a portion surrounding the corresponding nanowires, and the portion has a minimum thickness T7 in a range of about 10 nm to about 15 nm. A distance d6 is between the gate structures 1296 and 1298.

In some embodiments, a cell width Wc3 of the memory cell is:

$$Wc3 = 2(W8) + 4(T7) + 2(d6).$$

In some embodiments, the cell width Wc3 is in a range of about 50 nm to about 200 nm, e.g., about 100 nm.

In some embodiments, a cell height Hc3 of the memory cell is:

$$Hc3=1.5((L8)+(L7)+2(T10)),$$

where L8 (labeled in FIG. 45C) is a length of each of the source/drain structures 1222, 1224, 1226, 1228, 1232, 1234, 1236, and 1238, L7 (labeled in FIG. 45C) is a channel length of each of the horizontal channels 1212, 1214, 1216, and 1218, and T10 (labeled in FIG. 45C) is a thickness of each of gate spacers on opposite sides of the gate structures 1242 and 1244. In some embodiments, the cell height Hc3 is in a range of about 50 nm to about 200 nm, e.g., about 75 nm.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the cell area of the semiconductor device is reduced since the semiconductor device includes horizontal transistors and vertical transistors. Another advantage is that the channel length of vertical transistors can be adjusted without increasing the cell area. Further, interconnection features (such as the conductive features 1258a and 1258b shown in FIG. 45A) can be formed directly above the horizontal transistors, such that the interconnection features do not increase the burden of cell area. Further, the source/drain features of the horizontal and vertical transistors are epitaxial structures, such that the formation of implantation well regions can be omitted.

According to some embodiments, a device includes a first semiconductor fin, a second semiconductor fin, first source/drain features, second source/drain features, a first gate structure, a second gate structure, a first vertical-gate-all-around (VGAA) transistor, and a second VGAA transistor. The first semiconductor fin and the second semiconductor fin are adjacent to each other. The first source/drain features are on opposite sides of the first semiconductor fin. The second source/drain features are on opposite sides of the second semiconductor fin. The first gate structure is over the first semiconductor fin. The second gate structure is over the second semiconductor fin. The first VGAA transistor is over one of the first source/drain features. The second VGAA transistor is over one of the second source/drain features.

According to some embodiments, an SRAM cell includes two pull-up (PU) transistors, two pass-gate (PG) transistors, and two pull-down (PD) transistors. The PU transistors and the PD transistors are configured to form two cross-coupled inverters. The PG transistors are electrically connected to the cross-coupled inverters. The PU transistors are HGAA transistors, and the PG transistors are VGAA transistors.

According to some embodiments, a method for manufacturing a device includes forming first and second semiconductor fins above a substrate. First and second dummy gate structures are respectively formed above the first and second semiconductor fins. Source/drain features are formed above the first and second semiconductor fins. First, second, third, and fourth channel regions are formed above the source/drain features. The first and second dummy gate structures are removed. A gate layer is formed to surround the first, second, third, and fourth channel regions and above the first and second semiconductor fins. The gate layer is patterned to form a first gate structure surround the first channel region and above the first semiconductor fin, a second gate structure surround the second channel region, a third gate structure surround the third channel region, and a fourth gate structure surround the fourth channel region and the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first horizontal-gate-all-around (HGAA) transistor and a second HGAA transistor adjacent to each other, wherein the first HGAA transistor is higher than the second HGAA transistor;
a first vertical-gate-all-around (VGAA) transistor over the first HGAA transistor; and
a second VGAA transistor over the second HGAA transistor, wherein a top surface of the first VGAA transistor is substantially coplanar with a top surface of the second VGAA transistor.

2. The device of claim 1, wherein a source/drain epitaxial structure of the second VGAA transistor is electrically connected to a gate structure of the first HGAA transistor.

3. The device of claim 1, further comprising a third HGAA transistor over the second HGAA transistor and under the second VGAA transistor.

4. The device of claim 3, wherein a source/drain epitaxial structure of the third HGAA transistor is electrically connected to a source/drain epitaxial structure of the first HGAA transistor.

5. The device of claim 1, wherein a source/drain epitaxial structure of the first HGAA transistor is aligned with a channel of the second HGAA transistor in a top view.

6. The device of claim 1, wherein the first VGAA transistor is aligned with a channel of the second HGAA transistor in a top view.

7. The device of claim 1, further comprising a third HGAA transistor under the first HGAA transistor.

8. A device comprising:
a first horizontal-gate-all-around (HGAA) transistor and a second HGAA transistor adjacent to each other;
a first vertical-gate-all-around (VGAA) transistor comprising:
a first bottom source/drain epitaxial structure connected to the first HGAA transistor;
a first nanowire over the first bottom source/drain epitaxial structure; and
a first top source/drain epitaxial structure over the first nanowire; and
a second VGAA transistor comprising:
a second bottom source/drain epitaxial structure connected to the second HGAA transistor and electrically isolated from the first VGAA transistor, wherein a portion of the second bottom source/drain epitaxial structure is suspended over the first HGAA transistor;
a second nanowire over the second bottom source/drain epitaxial structure; and
a second top source/drain epitaxial structure over the second nanowire.

9. The device of claim 8, wherein the first bottom source/drain epitaxial structure is electrically isolated from the second VGAA transistor.

10. The device of claim 8, wherein the second bottom source/drain epitaxial structure is electrically connected to a gate structure of the first HGAA transistor.

11. The device of claim 8, further comprising a third VGAA transistor connected to the first HGAA transistor.

12. The device of claim 11, wherein a source/drain epitaxial structure of the third VGAA transistor is connected to the first bottom source/drain epitaxial structure of the first VGAA transistor.

13. The device of claim 8, wherein a top surface of a source/drain epitaxial structure of the first HGAA transistor is wavy.

14. The device of claim 8, wherein the first bottom source/drain epitaxial structure is electrically connected to a source/drain epitaxial structure of the first HGAA transistor.

15. A static random access memory (SRAM) cell comprising:
two pull-up (PU) transistors;
two pull-down (PD) transistors; and
two pass-gate (PG) transistors above the PU transistors, wherein the PU transistors and the PD transistors are configured to form two cross-coupled inverters, the PG transistors are electrically connected to the cross-coupled inverters, one of the PU transistors and one of the PD transistors are horizontal-gate-all-around (HGAA) transistors, and one of the PG transistors is a vertical-gate-all-around (VGAA) transistor.

16. The SRAM cell of claim 15, wherein the PD transistors are over the PU transistors.

17. The SRAM cell of claim 15, wherein the PG transistors are over the PD transistors and the PU transistors.

18. The SRAM cell of claim 15, further comprising a power line under the PU transistors.

19. The SRAM cell of claim 18, further comprising a conductive feature interconnecting the power line and a source/drain epitaxial structure of said one of the PD transistors.

20. The SRAM cell of claim 15, wherein a source/drain epitaxial structure of said one of the PD transistors is directly between said one of the PD transistors and said one of the PG transistors.

* * * * *